(12) United States Patent
Batchko et al.

(10) Patent No.: US 7,755,840 B2
(45) Date of Patent: *Jul. 13, 2010

(54) FLUIDIC OPTICAL DEVICES

(76) Inventors: Robert G. Batchko, 500 Amherst Dr. NE., Albuquerque, NM (US) 87106; Justin D. Mansell, 9223 Silverwood Dr. NE., Albuquerque, NM (US) 87113; Andrei Szilagyi, 5341 Blackhawk Dr., Danville, CA (US) 94506; Allen F. Crabtree, IV, 41 Merwin Ave., Fairfax, CA (US) 94930

( * ) Notice: Subject to any disclaimer, the term of this patent is extended or adjusted under 35 U.S.C. 154(b) by 160 days.

This patent is subject to a terminal disclaimer.

(21) Appl. No.: 11/928,376

(22) Filed: Oct. 30, 2007

(65) Prior Publication Data
US 2009/0052049 A1 Feb. 26, 2009

Related U.S. Application Data

(63) Continuation of application No. 11/383,216, filed on May 14, 2006, now Pat. No. 7,646,544.

(60) Provisional application No. 60/680,632, filed on May 14, 2005, provisional application No. 60/683,072, filed on May 21, 2005, provisional application No. 60/703,827, filed on Jul. 29, 2005, provisional application No. 60/723,381, filed on Oct. 3, 2005, provisional application No. 60/747,181, filed on May 12, 2006.

(51) Int. Cl.
G02B 1/06 (2006.01)
(52) U.S. Cl. .................................. 359/665; 359/666
(58) Field of Classification Search ......... 359/665–667, 359/642
See application file for complete search history.

(56) References Cited

U.S. PATENT DOCUMENTS

| | | | |
|---|---|---|---|
| 696,788 A | 4/1902 | Allen | |
| 2,300,251 A | 10/1942 | Flint | |
| 2,504,039 A | 4/1950 | O'Leary | |
| 4,261,655 A | 4/1981 | Honigsbaum | |
| 4,444,471 A | 4/1984 | Ford, Jr. et al. | |
| 4,466,706 A | 8/1984 | Lamothe, II | |
| 4,514,048 A | 4/1985 | Rogers | |
| 4,783,155 A | 11/1988 | Imataki et al. | |
| 4,784,479 A | 11/1988 | Ikemori | |
| 4,890,903 A | 1/1990 | Treisman et al. | 359/666 |
| 5,672,001 A | 9/1997 | Bertling et al. | |
| 5,774,273 A | 6/1998 | Bornhorst | |
| 5,973,852 A | 10/1999 | Task | |
| 6,288,767 B1 | 9/2001 | Murata et al. | |

(Continued)

FOREIGN PATENT DOCUMENTS

WO   WO 99/18456   4/1999

OTHER PUBLICATIONS

Final Office Action dated Jan. 22, 2009 for U.S. Appl. No. 11/383,216, 18 pages.

(Continued)

*Primary Examiner*—Darryl J Collins
(74) *Attorney, Agent, or Firm*—Joshua D. Isenberg; JDI Patent

(57) ABSTRACT

A fluidic optical device, systems utilizing fluidic optical devices, methods for manufacturing fluidic optical devices and actuators are disclosed.

19 Claims, 91 Drawing Sheets

U.S. PATENT DOCUMENTS

| | | | |
|---|---|---|---|
| 6,369,954 | B1 | 4/2002 | Berge et al. |
| 6,542,309 | B2 | 4/2003 | Guy |
| 6,618,208 | B1 | 9/2003 | Silver |
| 6,860,601 | B2 | 3/2005 | Shadduck |
| 7,068,439 | B2 | 6/2006 | Esch et al. |
| 7,072,086 | B2 | 7/2006 | Batchko |
| 7,142,369 | B2 | 11/2006 | Wu et al. |
| 7,218,429 | B2 | 5/2007 | Batchko |
| 7,218,430 | B2 | 5/2007 | Batchko |
| 7,359,124 | B1 | 4/2008 | Fang et al. ............ 359/666 |
| 7,369,321 | B1 | 5/2008 | Ren et al. ............. 359/666 |
| 7,369,723 | B1 | 5/2008 | Mescher |
| 7,374,301 | B1 | 5/2008 | Simmers |
| 7,440,193 | B2 | 10/2008 | Gunasekaran et al. ....... 359/666 |
| 7,453,646 | B2 | 11/2008 | Lo ....................... 359/665 |
| 2004/0240076 | A1 | 12/2004 | Silver .................. 359/666 |
| 2004/0262645 | A1 | 12/2004 | Huff et al. |
| 2006/0077562 | A1 | 4/2006 | Silver |
| 2006/0126190 | A1 | 6/2006 | Berge et al. |
| 2006/0164731 | A1 | 7/2006 | Wu et al. |
| 2007/0030573 | A1 | 2/2007 | Batchko et al. |
| 2007/0211207 | A1 | 9/2007 | Lo et al. |
| 2007/0263293 | A1 | 11/2007 | Batchko et al. |
| 2008/0285143 | A1 | 11/2008 | Batchko et al. ........... 359/665 |
| 2009/0021823 | A1 | 1/2009 | Heim et al. ............. 359/290 |
| 2009/0040361 | A1 | 2/2009 | Heim et al. ............. 348/340 |

OTHER PUBLICATIONS

Notice of Allowance dated Mar. 10, 2009 for U.S. Appl. No. 11/747,845, 8 pages.
Notice of Allowance and Fee(s) Due dated Apr. 23, 2009 for U.S. Appl. No. 11/928,076, 7 pages.
Notice of Allowance and Fee(s) Due dated Apr. 9, 2009 for U.S. Appl. No. 11/383,216, 6 pages.
Office Action dated Apr. 28, 2009 for U.S. Appl. No. 12/117,625, 6 pages.
Office Action dated Mar. 5, 2009 for U.S. Appl. No. 11/928,216.
U.S. Appl. No. 60/916,739, filed May 8, 2007.
U.S. Appl. No. 60/680,632, filed May 14, 2005.
U.S. Appl. No. 60/683,072, filed May 21, 2005.
U.S. Appl. No. 60/703,827, filed Jul. 29, 2005.
U.S. Appl. No. 60/723,381, filed Oct. 3, 2005.
U.S. Appl. No. 60/747,181, filed May 12, 2006.
International Search Report and Written Opinion of the International Searching Authority for the International application No. PCT/US08/63107 dated Aug. 4, 2008, 7 pages.
U.S. Appl. No. 60/395,849, to Batchko, entitled "Digital Focus Lens System" filed Jul. 11, 2002.
U.S. Appl. No. 60/242,395, to Batchko, entitled "Combinatorial Optics" filed Oct. 20, 2000.
J. Chen et al., "Variable-Focusing Microlens with Microfluidic Chip", J. Micromech.Microeng. 14, p. 675-680, 2004.
S. Perichon et al. "Stretchable Gold Conductors on Elastomeric Substrate", Applied. Physics. Letter, vol. 82, No. 15, p. 2404-2406, Apr. 14, 2003.
Hongwen Ren et al. "Variable-Focus Liquid Lens by Changing Aperature", Applied Physics Letters, vol. 86, No. 21107, May 17, 2005, p. 211107-1-211107-3.
International Search Report and Written Opinion of the International Searching Authority dated Aug. 8, 2008—International Patent Application No. PCT/US08/63122, 9 pages.
Office Action dated Jul. 23, 2008 for U.S. Appl. No. 11/747,845, 9 pages.
Office Action dated Oct. 22, 2008 for U.S. Appl. No. 11/928,076, 8 pages.
Office Action dated Jun. 12, 2008 for U.S. Appl. No. 11/383,216, 22 pages.
Final Office Action dated Sep. 17, 2009 for U.S. Appl. No. 12/117,625 entitled "Fluidic Lens With Manually-Adjustable Focus".
Notice of Allowance dated Aug. 13, 2009 for U.S. Appl. No. 11/928,216 entitled "Fluidic Optical Devices".
Notice of Allowance dated Aug. 28, 2009 for U.S. Appl. No. 11/383,216 entitled "Fluidic Optical Devices".
Notice of Allowance dated Jul. 9, 2009 for U.S. Appl. No. 11/747,845 entitled "Fluidic Lens With Electrostatic Actuation".
Ex parte Quayle Action dated Aug. 20, 2009 for U.S. Appl. No. 11/928,076 entitled "Fluidic Optical Devices".
Notice of Allowance and Fee(s) Due dated Nov. 16, 2009 issued for U.S. Appl. No. 11/928,076.
Notice of Allowance and Fee(s) Due dated Nov. 20, 2009 issued for U.S. Appl. No. 12/117,625.

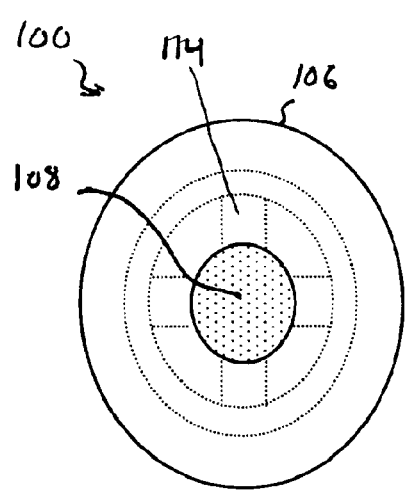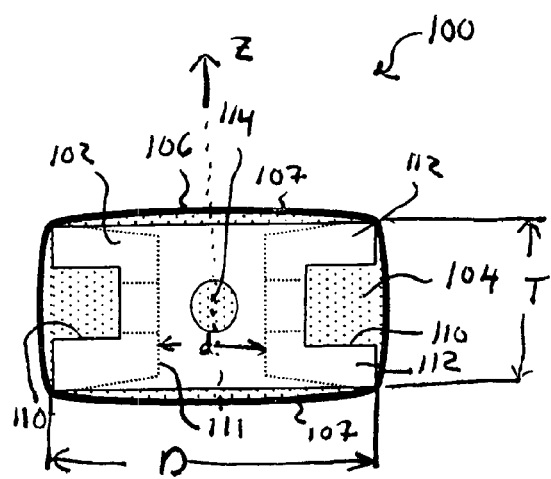
FIG. 1A  FIG. 1B
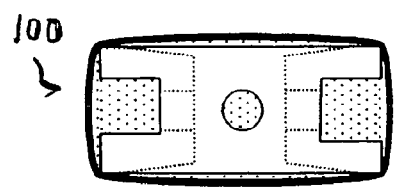
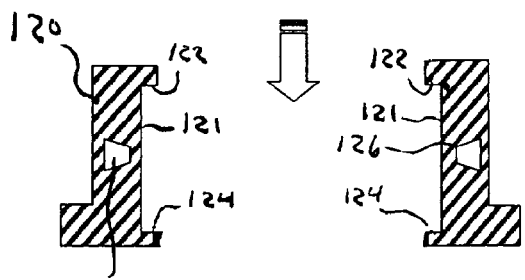
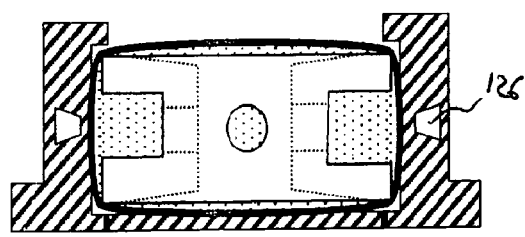
FIG. 2A  FIG. 2B
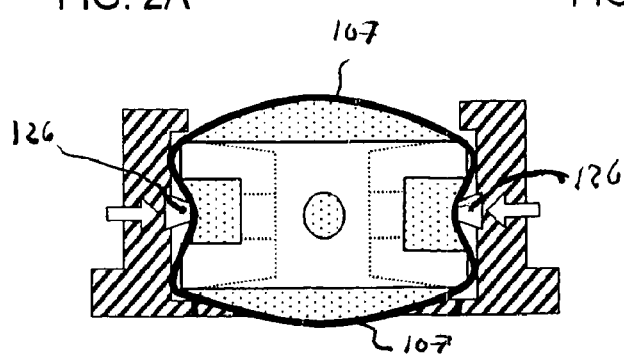
FIG. 2C

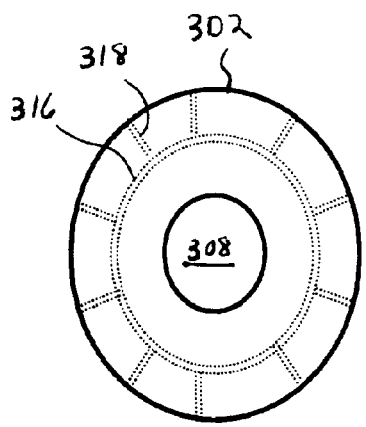
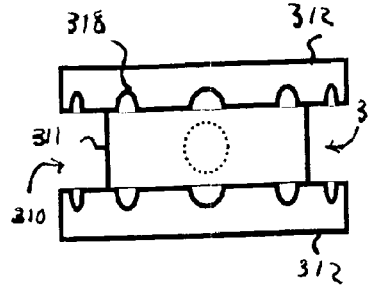
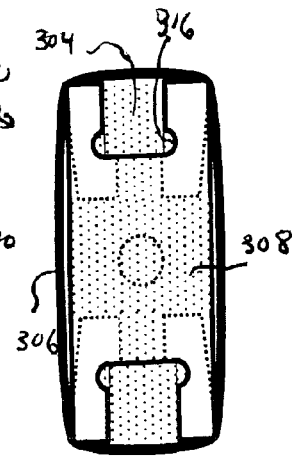
FIG. 3A  FIG. 3B  FIG. 3C
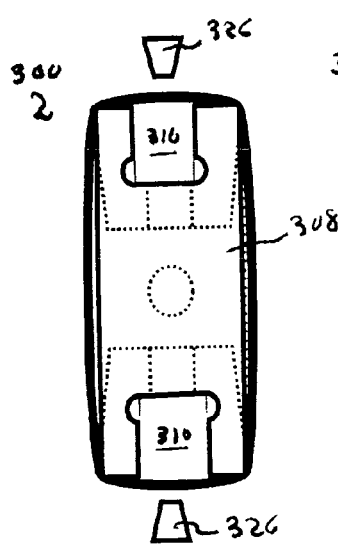
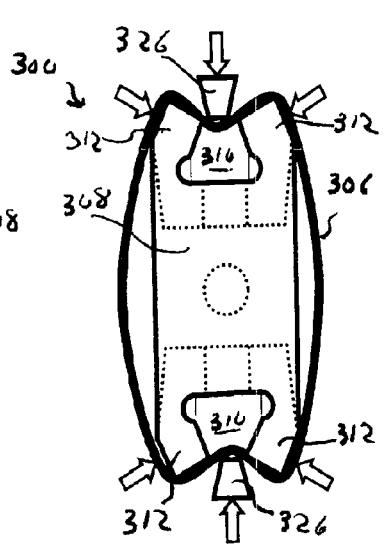
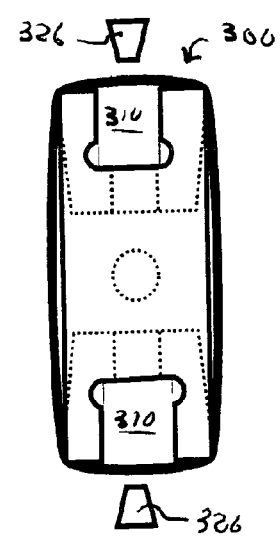
FIG. 4A  FIG. 4B  FIG. 4C

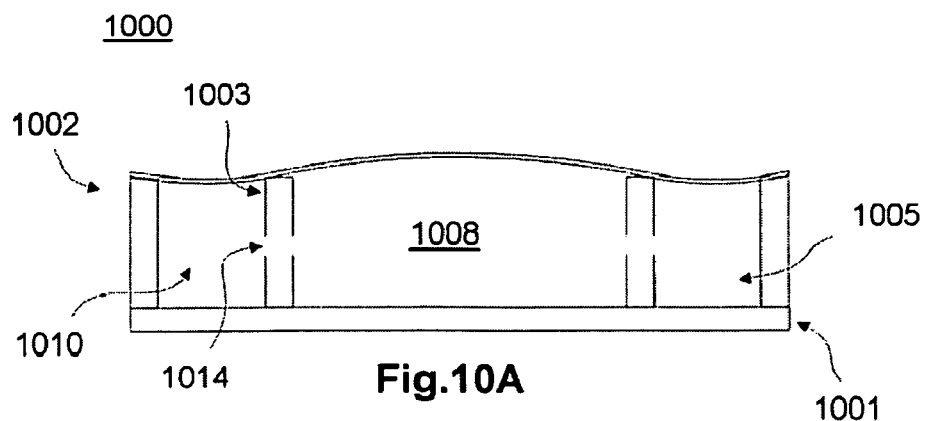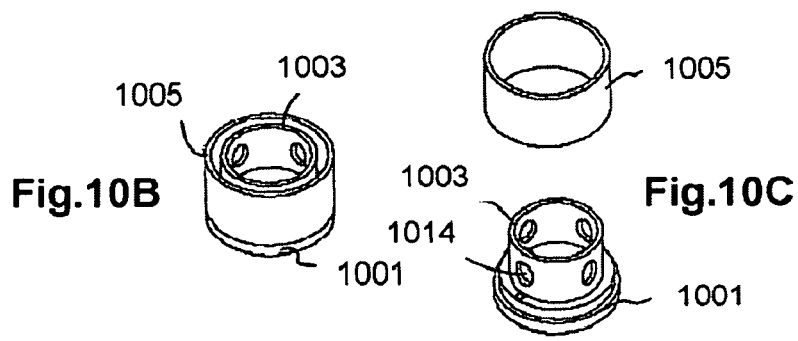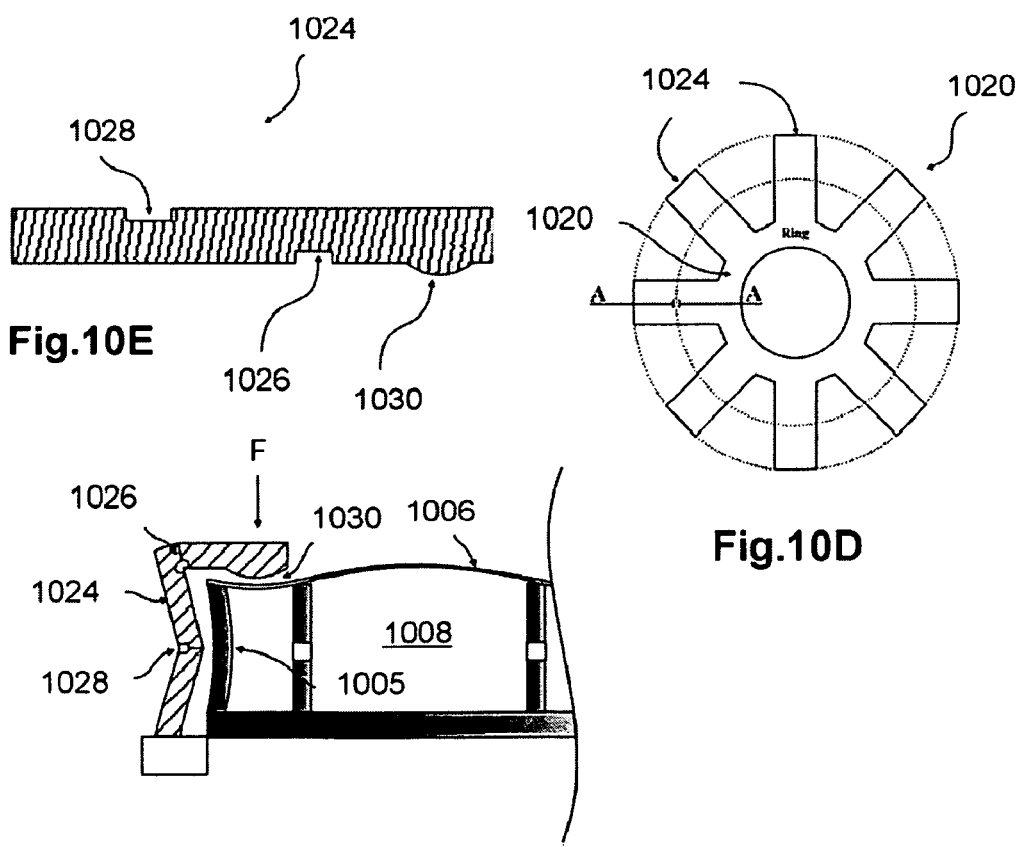

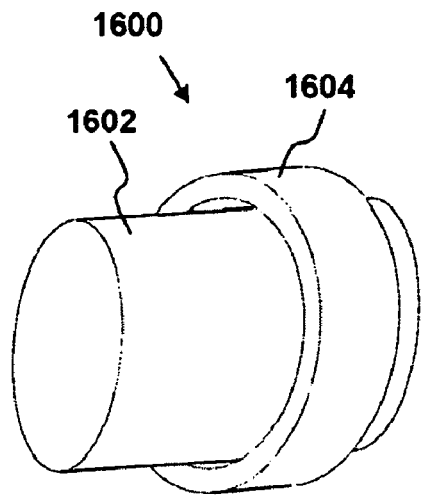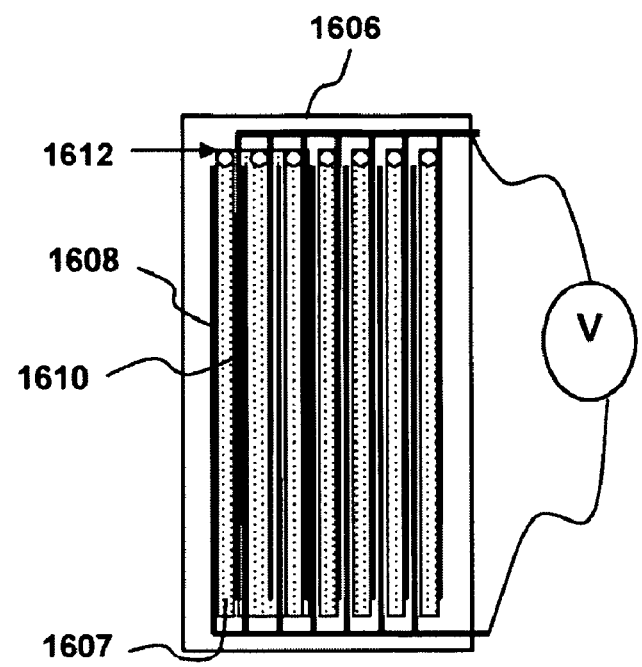
FIG. 16A  FIG. 16B
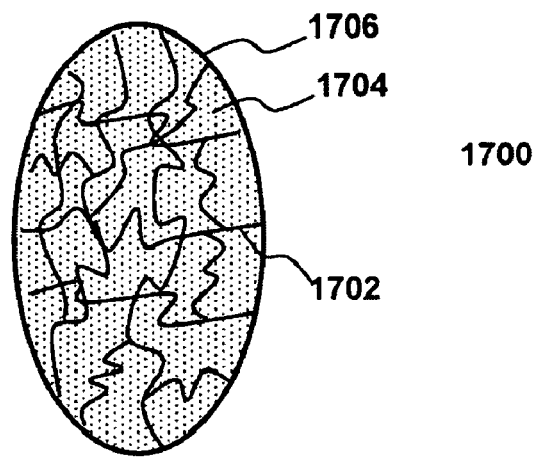
FIG. 17

Multi-singlet liquidic lens combinations

Multi-singlet liquidic lens combinations
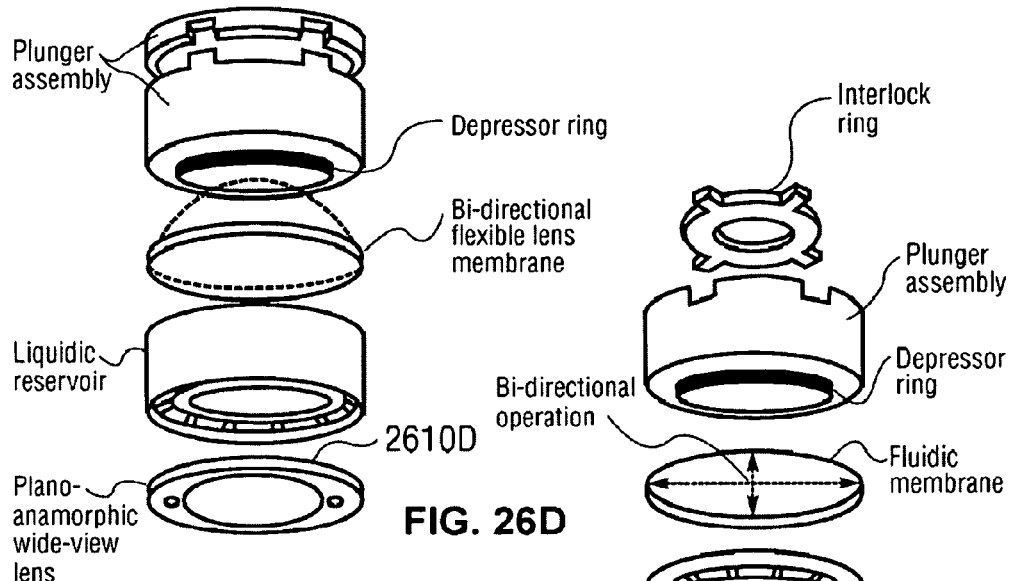
FIG. 26D
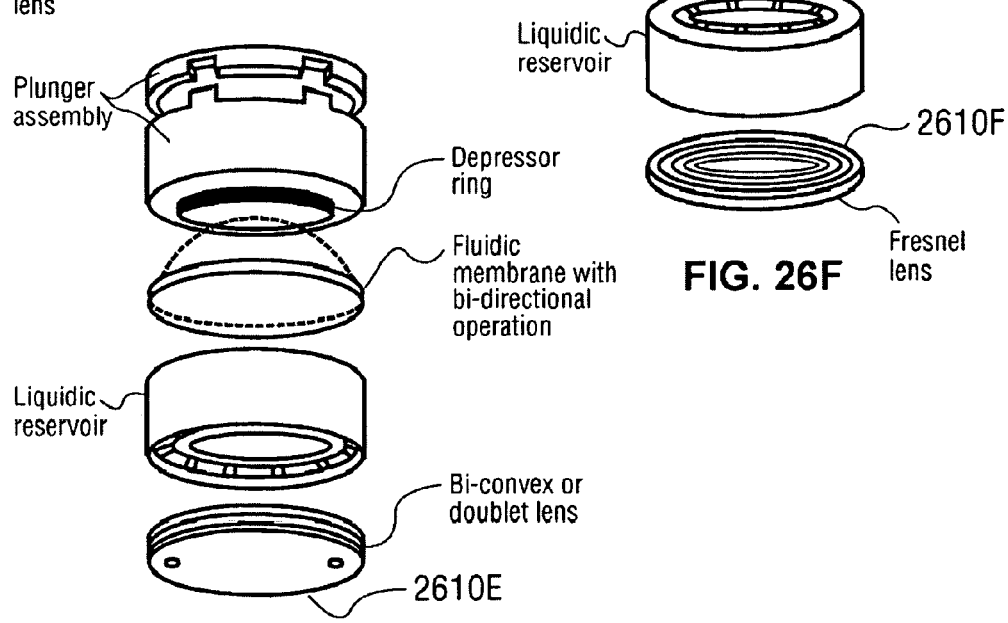
FIG. 26F
FIG. 26E

THE DUAL THROW, BI-DIRCTIONAL FLUIDIC LENS

2900

2900

2900

BI-FOCAL & TRI-FOCAL FLUIDIC LENS(S)

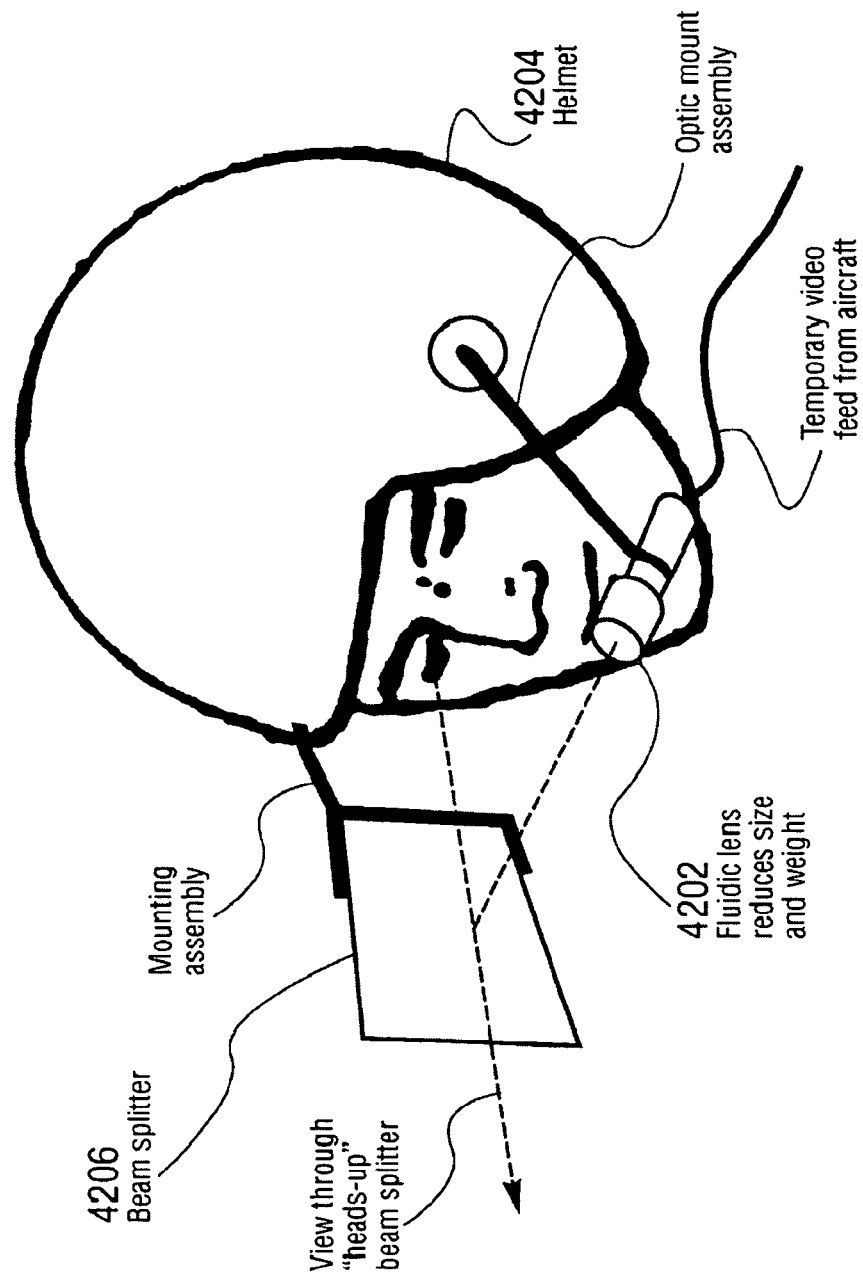

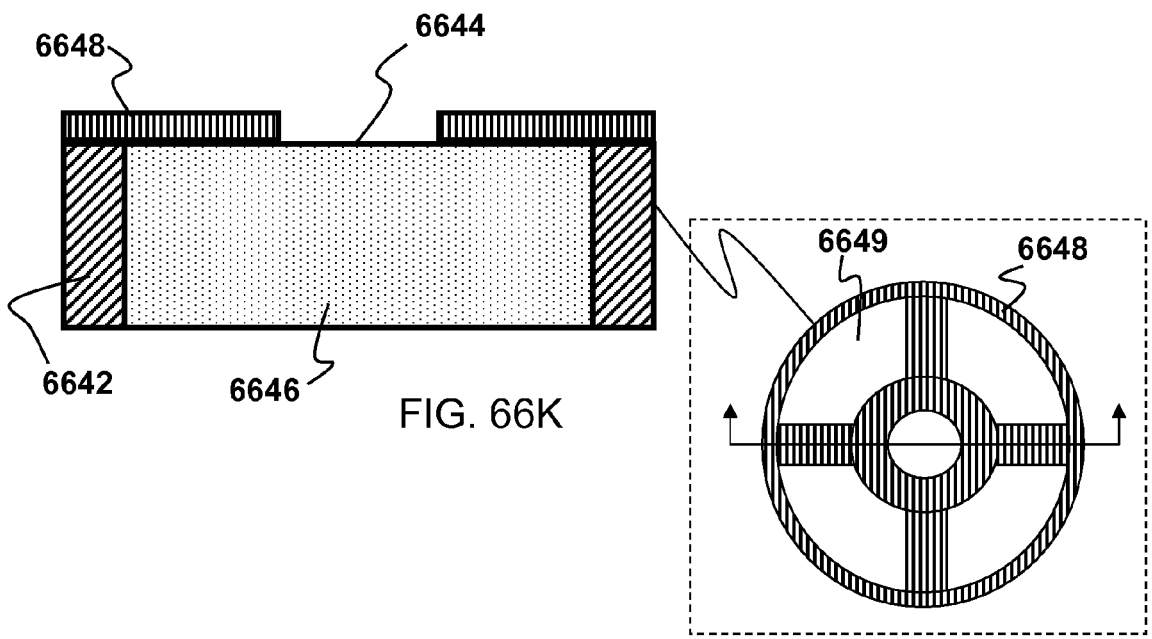
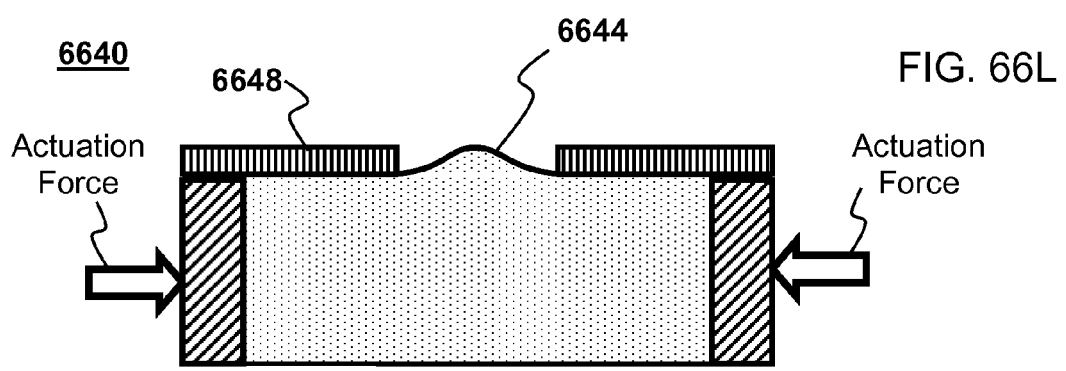

US 7,755,840 B2

FLUIDIC OPTICAL DEVICES

CROSS-REFERENCE TO RELATED APPLICATIONS

This application is a continuation of U.S. patent application Ser. No. 11/383,216, filed May 14, 2006 and published as US Patent Application Publication 2007/0030573 A1, the entire disclosures of which are incorporated herein by reference.

Application Ser. No. 11/383,216 claims the benefit of priority to U.S. Provisional Patent Application 60/680,632 to Robert G. Batchko et al., entitled "FLUIDIC OPTICAL DEVICES", filed May 14, 2005. This application claims the benefit of priority to U.S. Provisional Patent Application 60/680,632, the entire disclosures of which are incorporated herein by reference.

Application Ser. No. 11/383,216 claims the benefit of priority to U.S. Provisional Patent Application 60/683,072 to Robert G. Batchko et al., entitled "FLUIDIC OPTICAL DEVICES", filed May 21, 2005. This application claims the benefit of priority to U.S. Provisional Patent Application 60/683,072, the entire disclosures of which are incorporated herein by reference.

Application Ser. No. 11/383,216 claims the benefit of priority to U.S. Provisional Patent Application 60/703,827 to Robert G. Batchko et al., entitled "FLUIDIC OPTICAL DEVICES", filed Jul. 29, 2005. This application claims the benefit of priority to U.S. Provisional Patent Application 60/703,827, the entire disclosures of which are incorporated herein by reference.

Application Ser. No. 11/383,216 claims the benefit of priority to U.S. Provisional Patent Application 60/723,381 to Robert G. Batchko et al., filed Oct. 3, 2005. This application claims the benefit of priority to U.S. Provisional Patent Application 60/723,381, the entire disclosures of which are incorporated herein by reference.

Application Ser. No. 11/383,216 claims the benefit of priority to U.S. Provisional Patent Application 60/747,181 to Robert G. Batchko et al., entitled "Electrostatic Actuation of Fluidic Lens", filed May 12, 2006. This application claims the benefit of priority to U.S. Provisional Patent Application 60/747,181, the entire disclosures of which are incorporated herein by reference.

This application is related to commonly-assigned U.S. patent application Ser. No. 11/928,076, to Robert G. Batchko et al., entitled "FLUIDIC OPTICAL DEVICES", filed the same day as the present application, the entire disclosures of which are incorporated herein by reference in its entirety.

This application is related to commonly-assigned U.S. patent application Ser. No. 11/928,216, to Robert G. Batchko et al., entitled "FLUIDIC OPTICAL DEVICES", filed the same day as the present application, the entire disclosures of which are incorporated herein by reference in its entirety.

FIELD OF THE INVENTION

Embodiments of this invention are directed to variable optical devices and more particularly to fluidic optical devices and methods for making such optical devices.

BACKGROUND OF THE INVENTION

The prior art contains a number of references to fluidic lens systems. A notable example is provided by those based on the electro-wetting effect (see, e.g. Bruno Berge, et al., "Lens with variable focus", PCT Publication No. WO 99/18456). In that system, a lens-like volume of one refractive liquid is separated from its surroundings on at least one side by another immiscible refractive liquid. Although this yields a conveniently compact system, it is difficult to provide enough refractive index difference between the two liquids to provide adequate light-ray bending ability. A refractively superior system has also been demonstrated (see J. Chen et al., J. Micromech. Microeng. 14 (2004) 675-680) wherein only one lenticular body is provided, bounded on at least one side by an optically clear, compliant membrane. In that system, the refractive power of the lens is controlled by pumping in or out a controlled amount of fluid, thereby changing the curvature of the bounding membrane. Although improved, that system still suffers from the disadvantage that the pressurized fluid source is located remotely. This makes the form-factor of the whole system inconvenient.

Thus, there is a need in the art, for a fluidic lens that overcomes the above disadvantages.

BRIEF DESCRIPTION OF THE DRAWINGS

The teachings of the present invention can be readily understood by considering the following detailed description in conjunction with the accompanying drawings, in which:

FIG. 1A is a plan view schematic diagram of a fluidic lens according to an embodiment of the present invention.

FIG. 1B is a cross-sectional elevation taken along line B-B of FIG. 1A.

FIGS. 2A-2C are a sequence of cross-section schematic diagrams illustrating assembly and actuation of a fluidic of the type shown in FIGS. 1A-1B.

FIG. 3A is a top plan view schematic of an alternative skeleton for a fluidic lens according to an embodiment of the present invention.

FIG. 3B is a side elevation schematic of the skeleton of FIG. 3A

FIG. 3C is a side elevation schematic of a fluidic lens that utilizes the skeleton of FIGS. 3A-3B according to an embodiment of the present invention.

FIGS. 4A-4C are a sequence of cross-sectional schematic diagrams illustrating actuation of a fluidic lens of the type shown in FIG. 3C.

FIG. 10A is a cross-sectional schematic diagram of a partially assembled peripherally actuated fluidic lens according to an embodiment of the present invention.

FIG. 10B is a three-dimensional view of a portion of the fluidic lens of FIG. 10A.

FIG. 10C is an exploded view of the fluidic lens of FIG. 10B.

FIG. 10D is a top plan view of a peripheral actuator for use with the fluidic lens of FIGS. 10A-10C.

FIG. 10E is a cross-sectional view taken along line A-A' of FIG. 10D.

FIG. 10F is a cross-sectional view of a portion of the fluidic lens of FIGS. 10A-10C illustrating actuation with the peripheral actuator of FIGS. 10D-10E.

FIGS. 16A-16B are schematic diagrams illustrating a fluidic lens that utilizes microfluidic pump actuation according to an embodiment of the present invention.

FIG. 17 is a cross-sectional view of an optical device according to an alternative embodiment of the invention.

FIGS. 26A-26F are three-dimensional views of alternative fluidic micro lens assemblies according to embodiments of the present invention.

FIG. 42 illustrates application of fluidic optical devices to "heads-up" displays according to an embodiment of the present invention.

FIGS. 66K-66M are cross sectional schematic diagrams illustrating a fluidic optical device having a variable elasticity membrane that uses an overlay mask according to an embodiment of the present invention.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

A common inventive thread in each of the preferred embodiments of this invention is a compact arrangement of the actuator structure and fluidic lens. The task of reducing the profile of the actuator is facilitated in part by judicious choice of its mechanical interface with the compliant fluidic lens. In order to achieve efficient adjustment of the focal length of the fluidic lens (for example, maximizing the range of focal power of the lens while minimizing the work, mechanical motion or stroke required by the actuator), some means of mechanical amplification may be incorporated into one or more of the actuator, mechanical interface and fluidic lens. Such means of amplification form another common thread among the following embodiments. The following design principles guide the embodiments of the present invention: (i) it is desirable for a relatively small work load (or movement or stroke) of the actuator to result in a relatively large change in the optical properties of the fluidic lens. In this fashion, a relatively small stroke of the actuator results in a sufficient displacement of fluid contained in the lens, resulting in a relatively large change in the radius of curvature of one or more of the optical surfaces of the lens; (ii) it is desirable for the actuator to be disposed in the close proximity of the fluidic in order to reduce the overall size of the system; (iii) it is desirable for actuation forces to be distributed as uniformly as possible to minimize points of high stress, reduce optical aberrations, and/or increase product reliability and longevity; (iv) it is desirable that the physical size and mechanical complexity of the actuator and fluidic lens be reduced as much as possible; (v) it is desirable that the response time of the actuator and fluidic lens be minimized. In this fashion, the actuator should be able to adjust the focal length of the lens to any position within its range of operation in as short a time as possible; (vi) it is desirable that a small distortion or strain induced in the membrane results in a large range in focal power for the fluidic lens. By minimizing the strain induced on the membrane, the lifetime of the membrane can be increased and the membrane can be fabricated using a wider selection of materials; and (vii) these design principles are desirable but not to the extent that performance of any or all of the actuator, fluidic lens or system as a whole are compromised.

Figure 20:
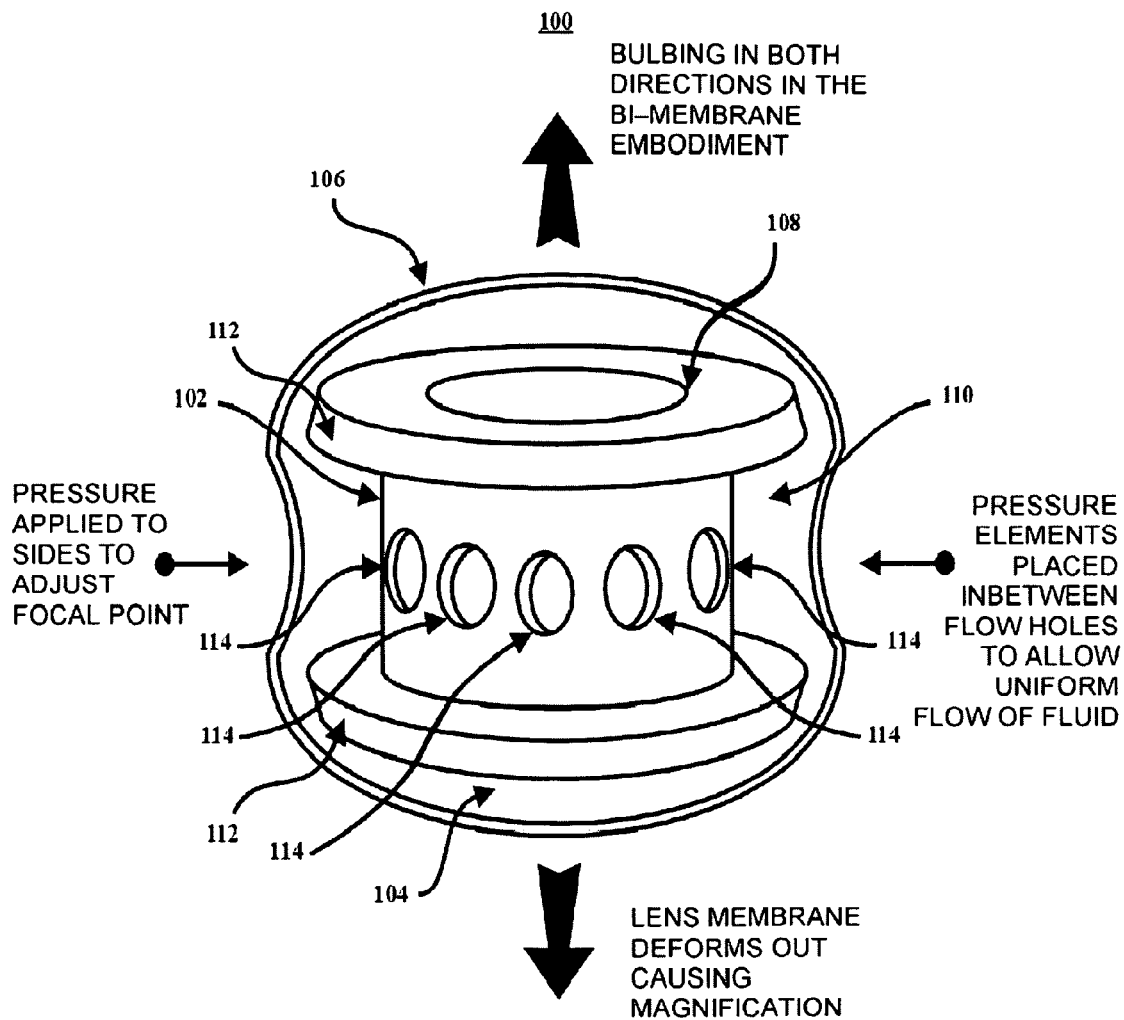
FIG. 20 is a three-dimensional diagram of a fluidic lens of the type depicted in FIG. 1B.

As depicted in FIGS. 1A-1B, a fluidic lens (or "lenslet") 100 has a lens skeleton (or "lens frame") 102 encapsulated in a filling fluid 104 and stabilized with a membrane 106. The skeleton 102 may have a form similar to that of a spool or a bobbin. The skeleton 102 may be characterized by a substantially cylindrical or disc-like shape having an aperture 108 and a fluid reservoir 110. By way of example as depicted in FIGS. 1A-1B, the fluid reservoir 110 may be in the form of an annular channel bounded by flanges 112 at opposite ends of a cylinder 111 having a central bore that forms the aperture 108. One or more flow holes 114 allow for fluid communication between the aperture 108 and reservoir 110. The flow holes 114 may be formed perpendicular to an axis of cylindrical symmetry z. Although in the example depicted in FIGS. 1A-1B, a single reservoir 110 and aperture 108 are depicted, the invention is not limited to such a configuration. The reservoir 110 may include two or more reservoirs in at least partial fluid communications with each other and with the aperture 108. Furthermore the reservoir 110 may be disposed at least partially inside the aperture 108 or vice versa. Additional detail of this type of fluidic lens 100 can be seen in the three dimensional drawings of FIG. 20. Pressure is applied to the sides of the fluidic lens 100 in order to adjust the focal length of the fluidic lens. The pressure elements may be placed at angular positions between the flow holes 114 in order to allow uniform flow of fluid 104. In this embodiment, the membrane bulges out at two sides of the lens.

In some embodiments, it is desirable for the lenslet 100 to be of a size suitable for use in digital cameras, cell phone cameras or other mobile devices. By way of example, the flanges 112 of the skeleton 102 may have an outer diameter D of about 5 to 6 millimeters, an aperture diameter d of about 3 to 5 millimeters and a thickness T of about 3 to 4 millimeters. In some embodiments, the flanges 112 may taper to accommodate an inward curvature of the membrane 106 under a net negative pressure, e.g., to achieve a negative focal length or bi-convex lens shape as described below.

The fluid 104 fills the aperture 108 and reservoir 110. The fluid 104 may have a refractive index between about 1.1 and about 3.0. The fluid 104 desirably has a viscosity of about 0.1 to about 100 centipoises over a temperature range from about −10° C. to about 80° C. By way of example, the fluid 104 may be silicone oil (e.g., Bis-Phenylpropyl Dimethicone). The fluid 104 and skeleton 102 may be index matched, i.e., have refractive indexes that are equal or nearly equal. Additionally, fluid 104 may include fluorinated polymers such as perfluorinated polyether (PFPE) inert fluid. One example of a PFPE fluid is Fomblin® brand vacuum pump oil manufactured by Solvay Solexis of Bollate, Italy. The chemical chains of PFPE fluids such as Foblin® include fluorine, carbon and oxygen and have desirable properties including low vapor pressure, chemical inertness, high thermal stability, good lubricant properties, no flash or fire point, low toxicity, excellent compatibility with metals, plastics and elastomers, good aqueous and non-aqueous solvent resistance, high dielectric properties, low surface tension, good radiation stability and are environmentally acceptable. The fluid 104 may include dopants, dyes, pigments, particles, nanoparticle and/or chemical elements that serve to modify the transmissive optical properties of the fluid. By way of example, it may be desirable in certain camera applications that the fluid 104 may include infrared absorbing particles or pigments that serve to prevent infrared wavelengths of about 670 nm and greater from being transmitted through the fluidic lens while allowing visible wavelengths to be transmitted generally without loss.

The membrane 106 defines one or more optical faces 107. Faces 107 act as optical interfaces disposed between the fluid 104 and the external environment within which the lenslet 100 is disposed. In many applications, the external environment will be air at standard atmospheric pressure. However in certain applications it may be desirable to dispose the lenslet 100 in other external environments, including, for example, vacuum, pressurized gas, plasma or liquid. At least one of the faces 107 is sufficiently flexible that it can elastically deform as a result of a change in pressure of the fluid 104. The membrane 106 preferably has properties suitable for use in a variable focal length lens. Specifically, the membrane 106 should be sufficiently elastic, rugged, and transparent to radiation in a frequency range of interest (for example, to visible light). The membrane 106 should be capable of stretching elastically, should be durable enough to have a lifetime suitable for its application. For example, in a cell phone camera application the membrane 106 should have a lifetime of several years and move than about one million cycles of operation. By way of example, and without limitation, the membrane 106 may be made of a silicone-based polymer such as poly(dimethylsiloxane) also known as PDMS or a polyester material such as PET or Mylar™. It is noted that if the fluid 104 and membrane 106 have sufficiently similar refractive indices, or include a suitable optical coating, scattering of light at their interface can be significantly reduced. Further, it may be desirable to select a membrane 106 having an index of refraction that serves to substantially impedance match the refractive indices of the fluid 104 and the external environment, thereby reducing optical scattering in the proximity of faces 107.

Operation of the lenslet 100 may be understood with respect to FIGS. 2A-2C. As shown in FIGS. 2A-2B, the lenslet 100 may be placed into an actuator package 120 that circumferentially constrains the expansion of the membrane 106. In the example depicted in FIGS. 2A-2C, the actuator package includes a circumferential sidewall 121 that is sized to receive the lenslet 100. The package 120 may further include an upper lip 122 and a lower lip 124 that axially retain the lenslet 100. The lips 122, 124 may define apertures that allow the optical faces 107 of the membrane 106 to expand. In a rest state, depicted in FIG. 2B, the optical faces 107 may be substantially parallel. The actuator package 120 includes an actuator 126 that exerts a force that tends to deform the membrane 106 in a way that tends to displace the fluid 104 in the reservoir 110. If the sidewall 121 sufficiently constrains the sides of the membrane 106 from expanding, the fluid 104 is displaced through the flow holes 114 into the aperture 108. The expanding volume of fluid 104 in the aperture 108 exerts deforming forces on the faces of the membrane 106 instead, thereby deforming the optical faces 107 as shown in FIG. 2C. The deforming force causes a change or deformation (for example, a change in the radius of curvature) of the optical faces 107, which results in a change in the optical properties (for example, the focusing properties or focal power) of the lenslet 100. By controlling the amount of force that the actuator 126 exerts, the deformation and focusing properties of the lenslet 100 may be adjusted in a predictable manner. By appropriate configuration of the skeleton 102, fluid 104, membrane 106, aperture 108 and reservoir 110, a movement or stroke of the actuator no more than about 0.05 mm can result in a change of a focusing power of the lens by about 25 diopters or more. There are many possible devices that can be used as the actuator 126. Examples of suitable actuator devices that may be adapted to exert a force on the fluid 104 in the reservoir 110 include, but are not limited to, electromagnetic actuators, voice coils, solenoids, DC motors, stepper motors, MEMS actuators, electrostatic actuators, two-position actuators, multi-step actuators, electro-thermal actuators, polymeric electro-active materials, piezoelectric actuators, piezoelectric tube, piezoelectric stacked actuators, ultrasonic motors, shape memory alloy (SMA) actuators, synthetic muscle material, wire SMA actuators, stepping SMA actuators, bimetallic actuators, hydrostatic actuators, pump actuators, micro-fluidic pumps, electro-wetting actuators, electro-wetting pumps, electrophoresis pumps and electrophoresis actuators. By way of example, a SMA wire such as Nitinol or Flexinol® may be wrapped around the reservoir and activated by heating the wire, possibly by passing current through it. Flexinol® is a trademark of Dynalloy Corporation of Costa Mesa, Calif. An implementation of such a device may, naturally, have additional design features such as additional restoring force means to fully extend the wire upon cooling, and control means, to overcome hysteresis effects known to practitioners of the art.

Figure 2D:
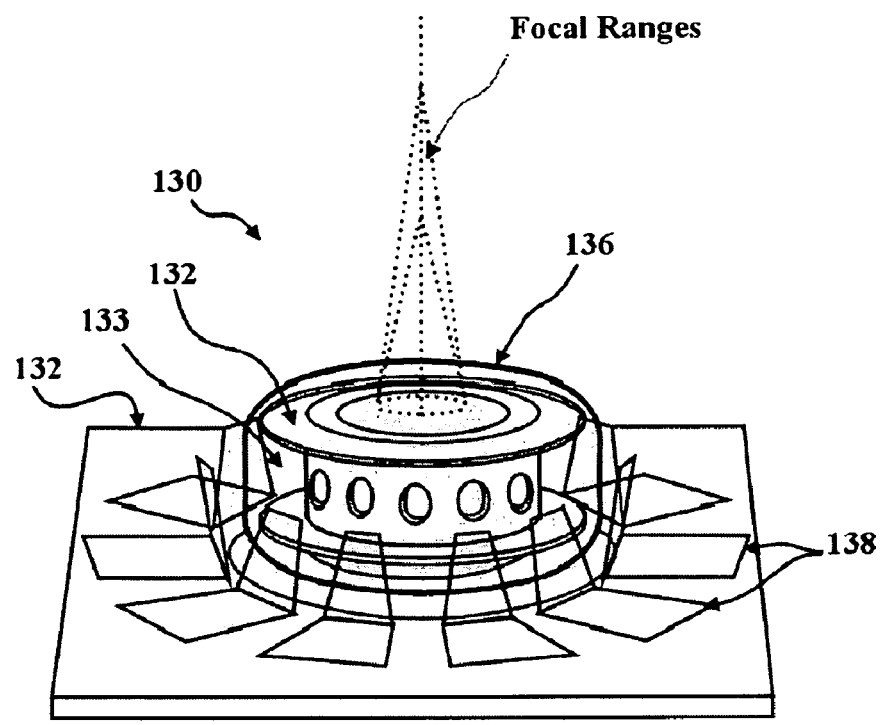
FIGS. 2D-2L are three-dimensional schematic diagrams illustrating examples of fluidic lenses that uses shape memory alloy members for actuation.
Figure 2E:
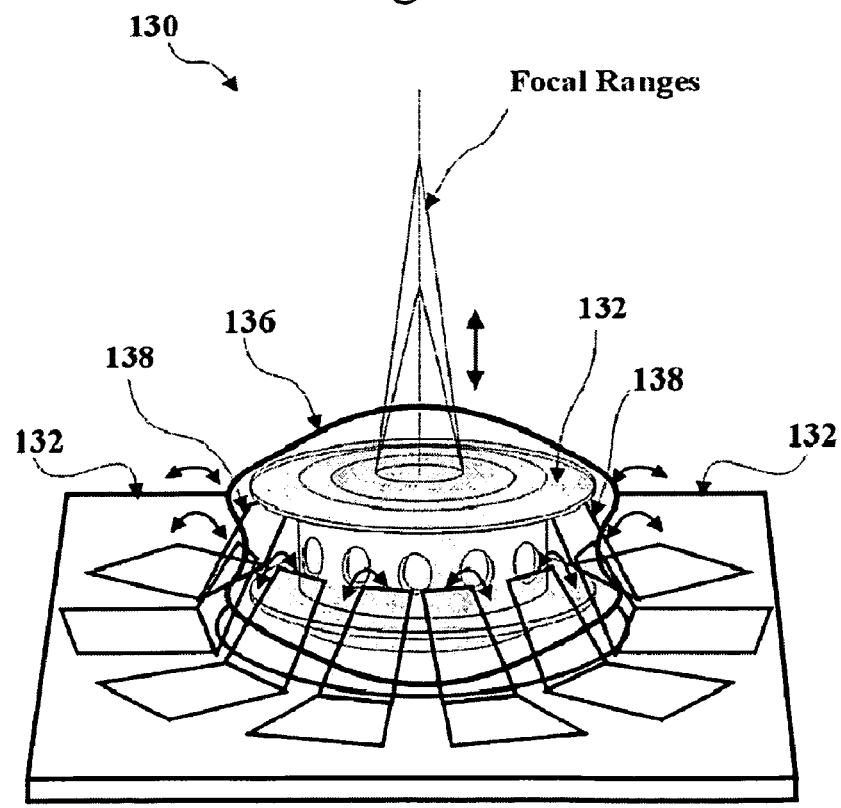

FIGS. 2D-2E illustrates an example of a fluidic lens 130 that incorporates a number of SMA members in order to perform actuation. The lens 130 generally includes a spool-shaped skeleton 132 having flanges and an aperture. The skeleton 132 is filled with fluid 133 and enclosed in a membrane 136 as described above. A plurality of strips of shape actuator material, for example, SMA, 138 are disposed peripherally around the skeleton 132 and make contact or are in mechanical communication with the membrane 136. The strips 138 may be secured to a chip base 134 having an aperture. As shown in FIG. 2D, the strips 138 are in a bent position when the lens is in a rest state in which the membrane 136 is minimally flexed. When heat or electric current is applied to the strips 138 they attempt to return to a straightened position, thereby exerting pressure on the membrane 136 and fluid as shown in FIG. 2E. The pressure from the strips 138 causes the membrane 136 to bulge, which changes the focal length of the lens 130.

Figure 2F:
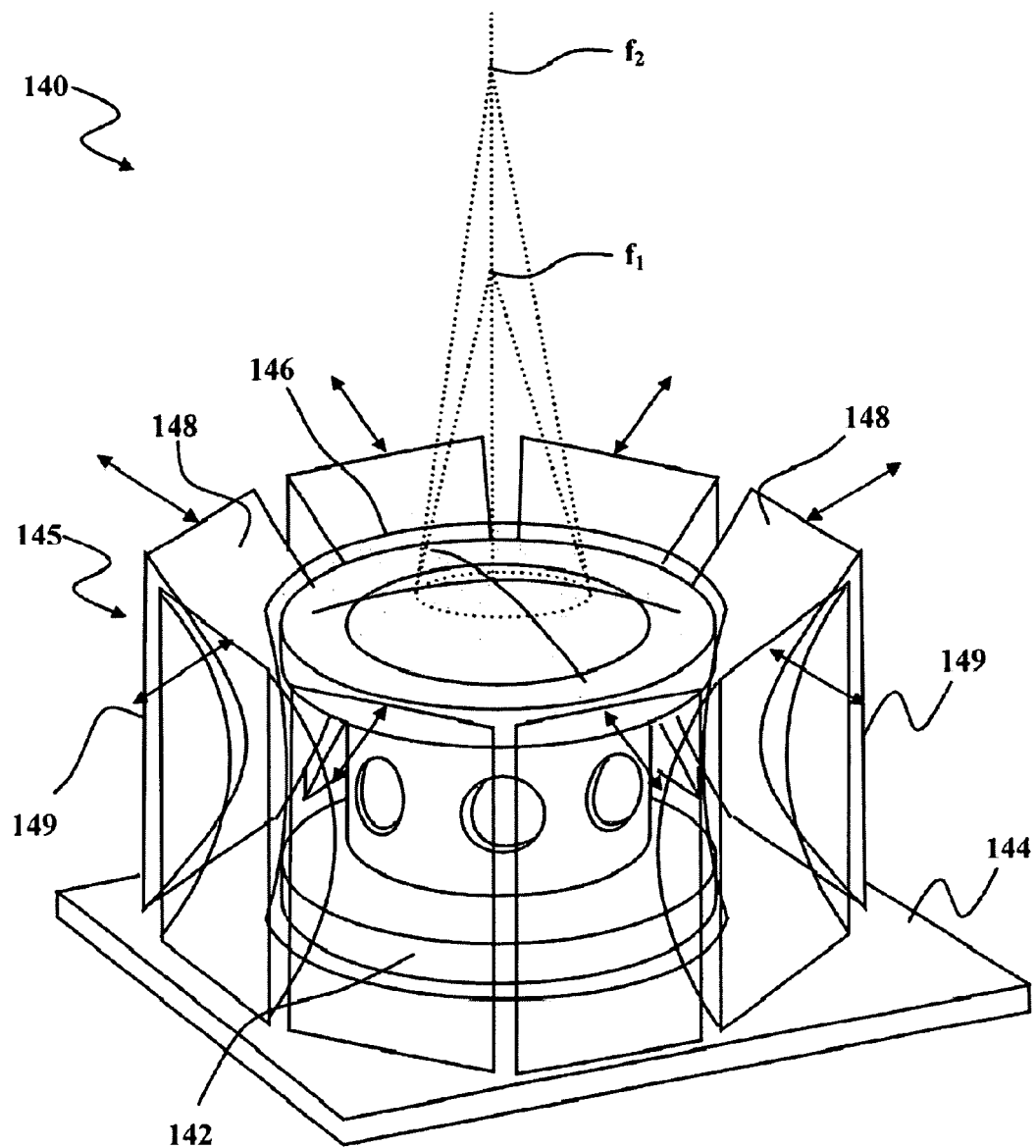
Figure 2G:
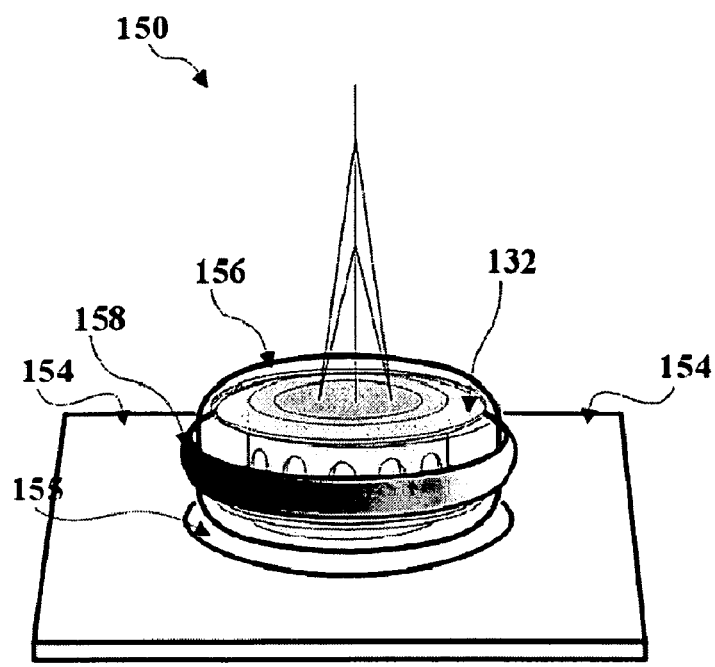
Figure 2H:
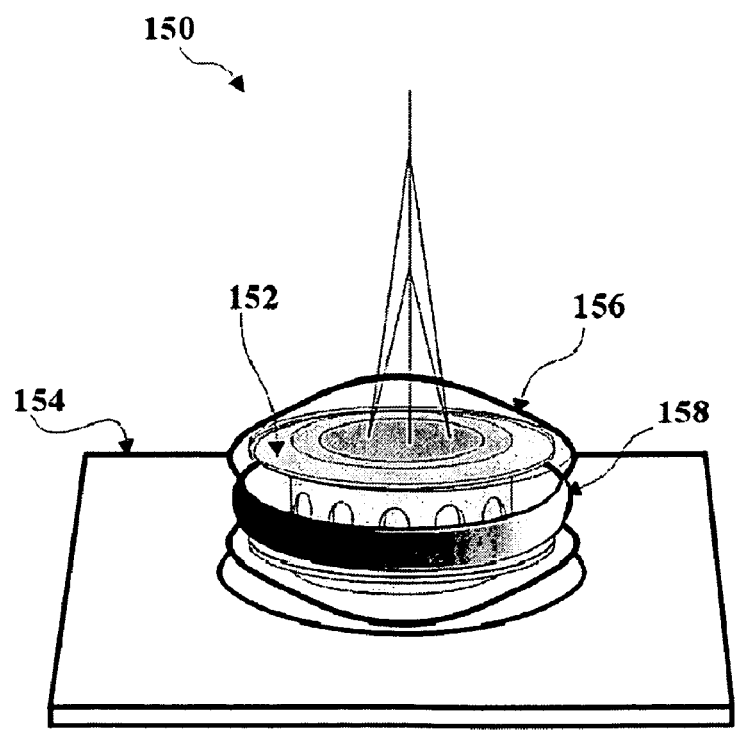
Figure 24:
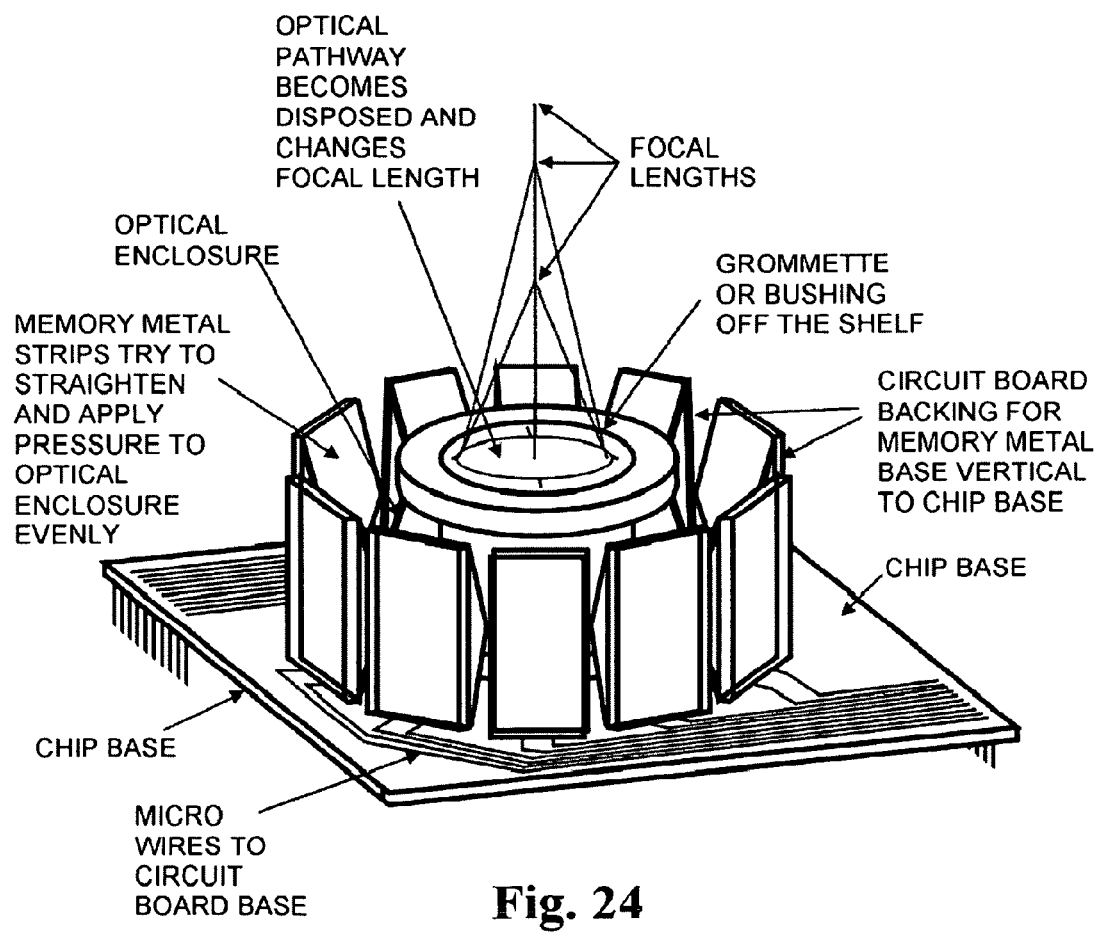
FIG. 24 is an alternative three-dimensional view of the fluidic lens depicted in FIG. 2F.

FIGS. 2F and 24 illustrate a fluidic lens 140 that is a variation on the fluidic lens 130 of FIGS. 2D-2E. The lens 140 includes a spool-shaped skeleton 142 and membrane 146. The skeleton 142 may be made from an off the shelf elastomer grommet or bushing. A plurality of triangular-shaped members ("triangles") 145 having two sides 148 made of actuator material (e.g., shape memory alloy) are disposed peripherally around the skeleton 142. The two actuator material sides 148 join at a vertex that makes contact with the membrane 146. A third side of the triangle may be made of circuit board material and may include wire leads that connect to a circuit board base 144 to which the triangles may be affixed. When heat or electric current is applied to the actuator material sides 148 they return to the memorized high-temperature shape such that the vertices contacting the membrane 146 move radially in a fashion such that there is a change in pressure that is exerted on the membrane 146 and fluid. FIGS. 2G-2H illustrate fluidic lens 150 that is another variation on the fluidic lens 130. The lens 150 has a spool shaped skeleton 152 and fluid filled membrane 156. The lens 150 may be mounted to a chip base 154 having an aperture 155. The lens 150 uses a constricting band 158 as an actuator. The constricting band 158 can be made of a variety of materials including a material that expands and contracts with temperature variations or a synthetic muscle material, like ionic polymer metal composites (IPMCs). Examples of such materials include flexinol, nitinol, and polymeric electroactive materials. The constricting band can be actuated many different ways including thermally, electrically, or hydrostatically. Actuation constricting band 158 decreases its diameter, which exerts pressure radially inward on the membrane 156. Again, it should be understood by those skilled in the art, that the illustrations provided herewith are of a symbolic nature, envisioning that the various necessary subsystems (such as heat, electrical power and control) are to be appended by the designer, as needed.

Figure 2I:
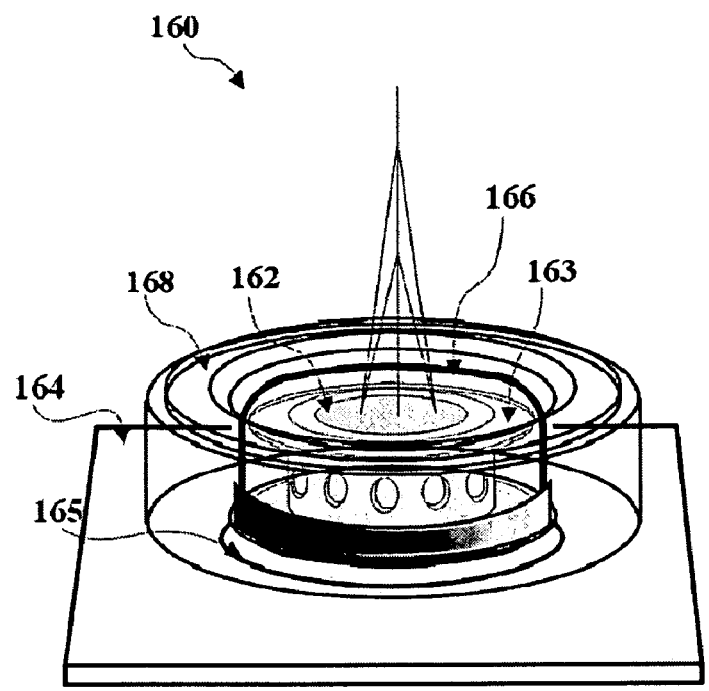
Figure 2J:
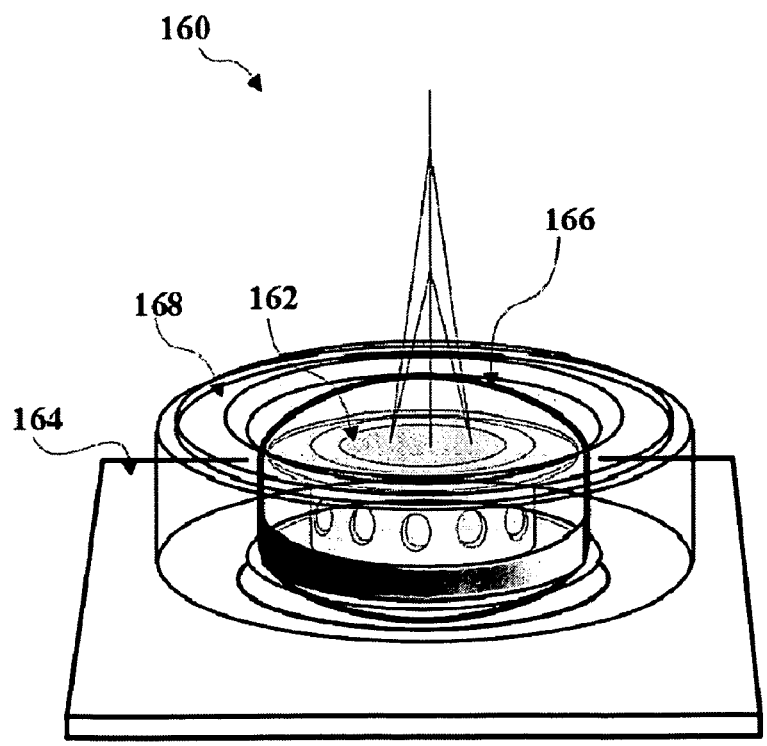
Figure 2K:
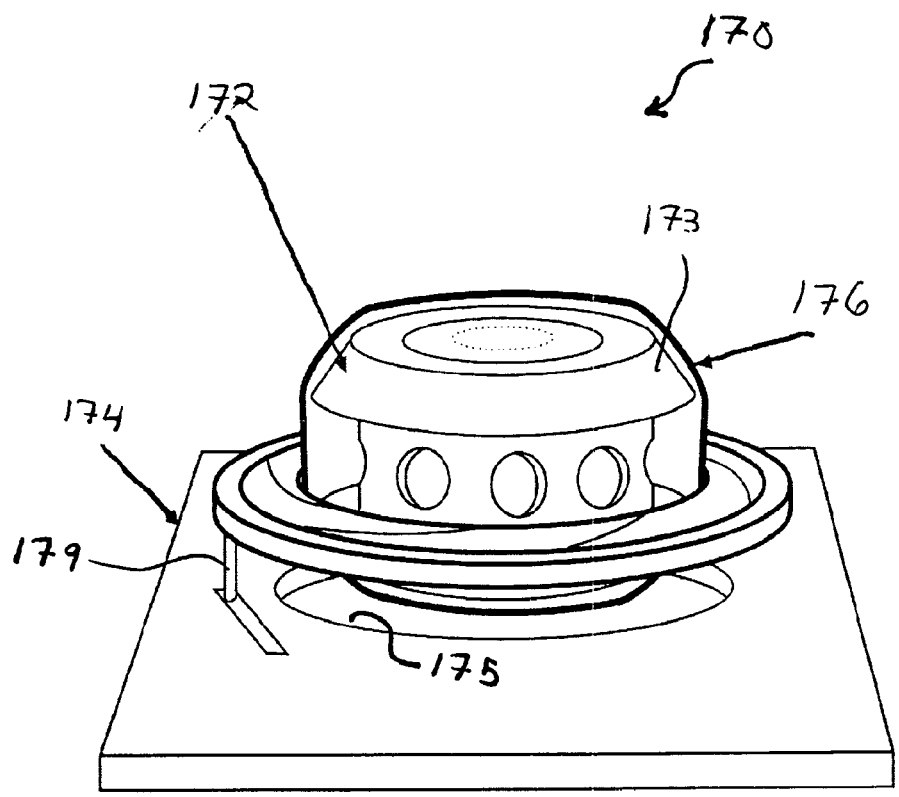
Figure 2L:
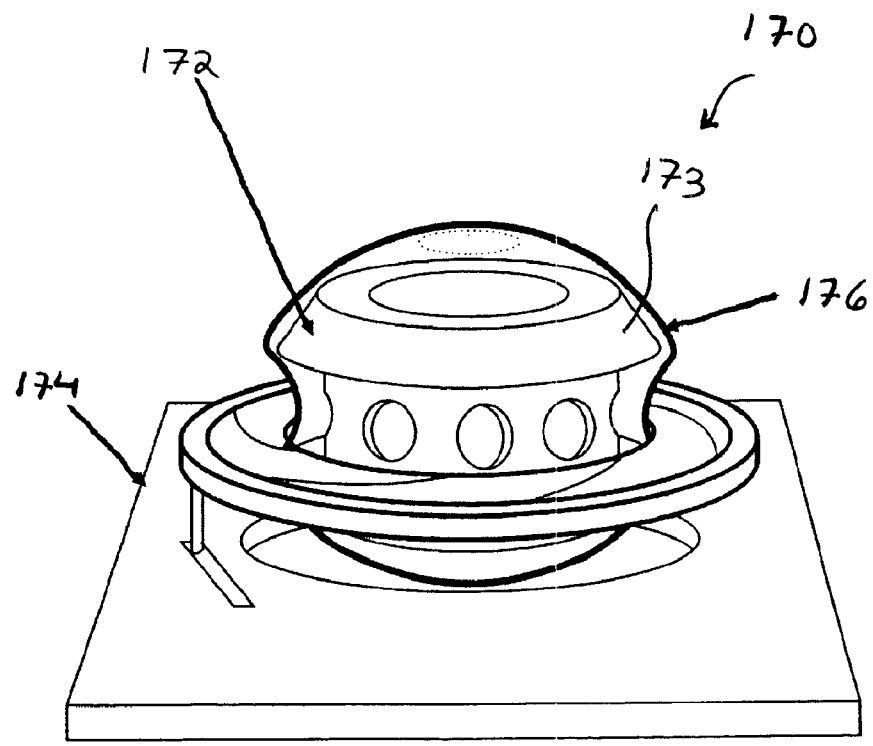

FIGS. 2I-2J illustrate fluidic lens 160 that is another variation on the fluidic lens 130. The lens 160 has a spool shaped skeleton 162 with flexible flanges 163 and a fluid filled membrane 166. The lens 160 may be mounted to a chip base 164 having an aperture 165. The lens 160 uses a piezoelectric ring 168 as an actuator. The piezoelectric ring 168 could be comprised of a variety of materials including but not limited to lead zirconium titanate. Application of a voltage to electrodes on the piezoelectric material decreases the diameter of the ring 168, which exerts pressure radially inward on the membrane 166. Alternatively, the piezoelectric ring may be configured as a tube, adapted to either provide radial constriction or axial compression upon the flexible flanges of the lens skeleton. FIGS. 2J-2K illustrate fluidic lens 170 that is another variation on the fluidic lens 130. The lens 170 has a spool shaped skeleton 172 with flexible flanges 173 and a fluid filled membrane 176. The lens 170 may be mounted to a chip base 174 having an aperture 175. The lens 170 uses a mechanical iris 178 which may be controlled by a linear actuator 179 like a piston solenoid that can be actuated electrically. The iris 178 may be of a type such as might be found in a variable aperture camera lens. The iris 178 has a number of plates with curved edges that define an opening. Movement of the linear actuator 179 causes the plates to move in such a way that the opening of the iris 178 is forced to decrease in diameter and exert pressure radially inward on the membrane 166.

There are many variations on the fluidic lenses described above. For example, portions of the lens skeleton may be deformable in order to enhance the deformation of the fluid reservoir during actuation. For example, as shown in FIGS. 3A-3C and 4A-4C a lenslet 300 may be constructed with flexible flanges 312 disposed on a skeleton 302 where the flanges 312 may be constructed with flexure grooves 316,318 whereby an actuation force results in a predetermined deformation of the flanges along the flexure grooves 316, 318. Such flexures and predetermined deformation may serve certain functions including: (i) maximizing the change in volume of a reservoir 310 and, hence, the displacement of fluid 308 resulting from the actuation force; and (ii) providing an elastic deformation of the flange whereby, upon removal of the actuation force, the deformed flange has sufficient restoration force to return the flange to its rest position and, hence, return the displaced fluid 308 to its rest condition. FIGS. 3A-3C illustrate the construction of such a lenslet 300. As depicted in FIG. 3A and FIG. 3B, the lenslet 300 includes a skeleton 302 that is similar in construction to the skeleton 102 described above. The skeleton 302 includes a cylindrical portion 311 having a central bore that forms an aperture 308. A channel between flanges 312 at opposite ends of the cylinder 311 forms a fluid reservoir 310. Flow holes 314 communicate between the reservoir 310 and aperture 308. A transparent compliant membrane 306 encapsulates a transparent fluid 304 within the aperture 308 and reservoir 310, e.g., as shown in FIG. 3C. The flanges 312 each include an annular groove 316 proximate junctions between the cylinder 311 and flanges 312 and one or more radial grooves 318. The grooves 316, 318 facilitate deformation of the flanges 312 under the influence of an actuation force. It is desirable that the flanges 312 be made of a material that can elastically deform. As used herein, elastic deformation generally refers to a situation wherein an object can deform under the influence of a deforming force and tends to return to its original shape upon removal of the deforming force.

FIGS. 4A-4C illustrate operation of the lenslet 300. Specifically, one or more actuators 326 are adapted to exert a force that tends to displace the fluid 304 in the reservoir 310 as shown in FIG. 4A. The flanges 312 remain in non-deformed (or, "rest") shape with no application force by the actuator 326. As the actuator 326 applies deforming force the membrane 306 deforms displacing fluid from the reservoir 310 as described above. However, in addition to the deformation of the membrane 306, the flanges 312 also deform due to the annular and radial grooves 316, 318. Deformation of the flanges 312 causes a reduction of the volume of the reservoir 310 thereby assisting in the forcing of fluid 304 into the aperture 308. When actuator force is removed, flanges 312 return to their original shape, as shown in FIG. 4C,—thereby providing restoring force on the membrane 306. This reduces the stress on the membrane 306 and may ease its mechanical requirements and increase its lifetime and resistance to failure.

It may be desirable to fabricate optical devices of the type described above with a seamless membrane providing a closed surface that encapsulates the lens skeleton. A seamless membrane results in lower stress, higher optical quality and fewer defects. It may be further desirable to fabricate devices of the type described above in a high-yield manufacturing process that is scalable to manufacture hundreds of millions of lenslet units at a manufacturing cost per device of between about $0.001 and about $0.10.

Figure 5A:
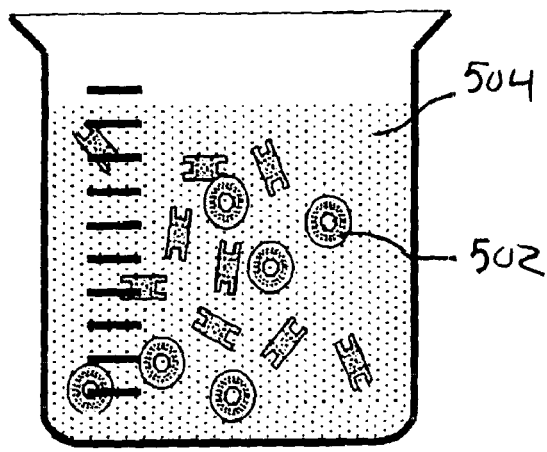
FIGS. 5A-5D are a sequence of schematic diagrams illustrating fabrication of a fluidic lens according to an embodiment of the present invention.

There are a number of possible approaches to making a crosslinked shell of PDMS around oil wetted lens skeletons. One possible approach, among others, is to douse the lens skeletons in vinylated PDMS and push them into an aqueous phase so that the fluid immiscibility and relative surface energies of the PDMS/plastic and PDMS/water keep a shell of oil around the plastic piece. FIGS. 5A-5D schematically depict an example of such a process. The process begins by fabricating the skeletons 502 for the lenslets. By way of example, the skeletons 502 may be injected molded from a polymer, polycarbonate, plastic or other material. The skeletons 502 may be made in one piece or in two or more pieces that are adhered together. The mold may be configured to produce multiple skeletons (or skeleton parts) in a single injection molding operation. The skeletons 502 are mixed in a bath containing the fluid 504 as shown in FIG. 5A. Preferably, the fluid 504 is of a type that can wet the surface of the skeleton 502. The wetting is dependent on the type of fluid and the material of the skeleton. By way of example, the fluid 504 may be silicone oil (e.g., Bis-Phenylpropyl Dimethicone, which may be obtained commercially as part SF1555 from Dong Yang Silicone, GEPK Building 4FL., 231-8, Non-hyung-Dong, Kangnam-Ku, SEOUL, KOREA) and the skeleton 502 may be made of a polycarbonate or plastic material. The fluid is expected to wet the surface of the skeleton if the surface energy of the fluid 504 is sufficiently lower than the surface tension of the skeletons 502. By way of example, a difference of approximately 10 dyne/cm is expected to be sufficient. The bath may be heated and stirred to mix the filling fluid 504 into the skeletons 502. Low surface energy allows the fluid 504 to fully wet the surfaces of the skeletons 502, as described above.

Figure 5B:
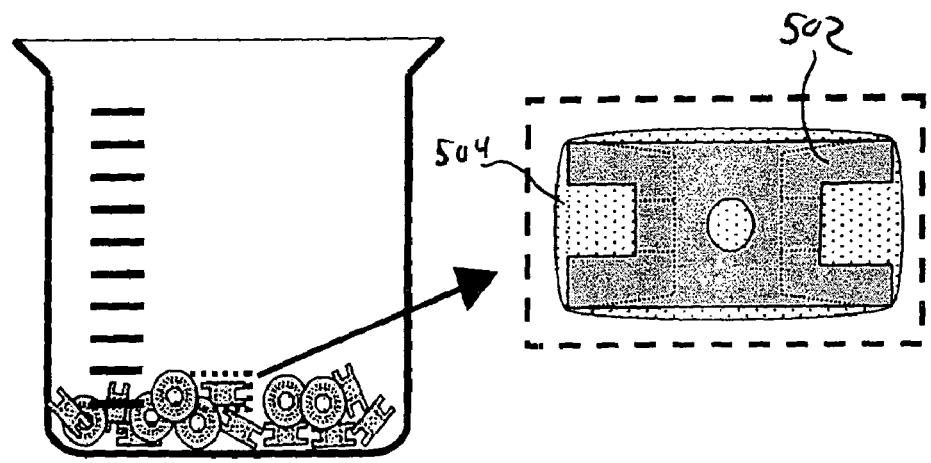
Figure 5C:
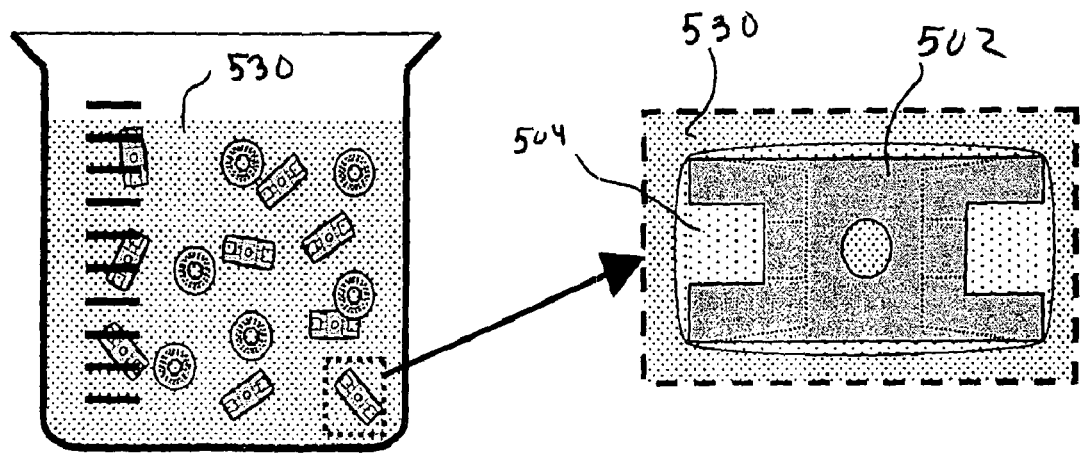
Figure 5D:
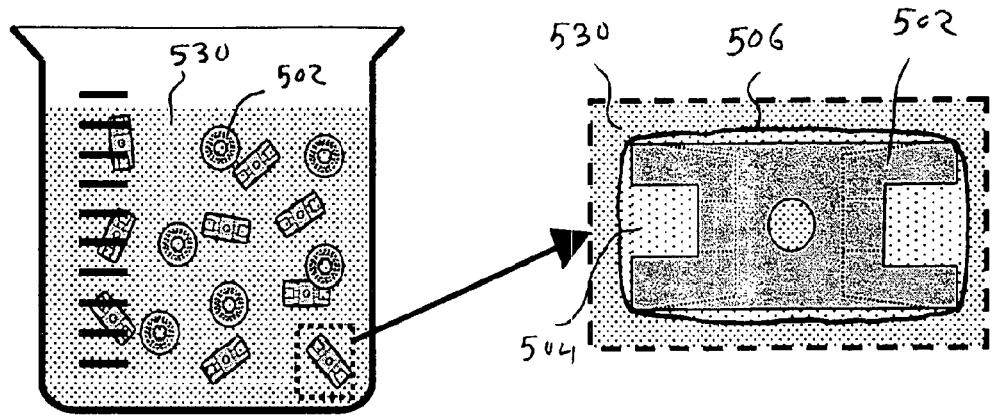

Once the fluid 504 wets the skeletons 502, the excess fluid 504 may be drained as shown in FIG. 5B. Each skeleton 502 remains encapsulated in the fluid 504 due to the high surface tension of the skeleton 502 and the low surface energy of the fluid 504. Membranes may now be formed to individually encapsulate each of the skeletons 502 and fluid 504 as shown. By way of example, and without limitation, the bath containing the fluid encapsulated skeletons may be filled with an aqueous solution 530 as shown in FIG. 5C. The aqueous solution may contain a cross-linkable component (e.g., an ethoxylated surfactant or a vinyl group). If the surface energy of the fluid 504 is less than the surface energy of the aqueous solution 530 should remain encapsulated in the fluid 504. In addition, the specific gravities of the aqueous solution 530 and fluid 504 may be controlled and balanced such that the fluid does not tend to float or sink out of the skeletons 502. Alternatively, the specific gravities may be selected such that the aqueous solution 530 floats above the fluid 504 or vice versa. Individual encapsulation of the fluid 504 and skeletons 502 may then be accomplished by mixing in an activator that activates cross-linking of the cross-linkable component at a boundary of the fluid 504 and aqueous solution 530. The cross-linking activation may be triggered by suitable means, including thermal activation and/or photo-activation. After a sufficient degree of cross-linking, the skeletons 502 and fluid 504 can be encapsulated in a rugged, stable, elastic and transparent polymer membrane 506. If a thermally activated, water soluble crosslinking agent is pre-dissolved in the aqueous phase, then the solution 530 can be heated to get the surface of the PDMS to crosslink. One possible crosslinking agent is azobis (cyanovaleric acid), which is desirable due to its ready water solubility and low thermal decomposition temperature. The crosslink density would control the ability of the "skin" to hold in the oil, as well as controlling the flexibility of the membrane 506. Under certain conditions, the latter may be a generally delicate balance. Process variables such as crosslinker concentration in the aqueous phase, crosslinking temperature, and reaction time can be adjusted to tune the crosslink density.

Another approach to manufacturing PDMS lenses is to simply cast lenses out of crosslinked PDMS and to squeeze them in a controlled way to change the focal lengths. For example, PDMS can be cast over a Fresnel lens. After sufficient cross-linking, the PDMS layer can be peeled away and used as a lens. If the cast PDMS is squeezed isotropically, the lens' focal length could be changed in a simple manner. Depending on the degree of cross-linking, cast PDMS may serve as both a fluid and a membrane for the purposes of embodiments of the present invention. It is to be noted that very small features can be fabricated using cast PDMS. For example, Whitesides et al have used a mechanical strategy in PDMS soft lithography to achieve a desired structure having very small feature sizes. A microchip master is generated by conventional lithography PDMS is cast on the microchip master to make a rubber stamp that is the negative of the desired structure. Then the master is isotropically squeezed in order to physically reduce the size of the cast and a new reduced size master can be made using polyurethane. PDMS can then be cast on the new polyurethane master, and the cast PDMS can be mechanically squeezed down to make a new master. By repeating the process it is possible to make a rubber stamp for soft lithography that would give ~10-50 nm lines on a substrate. Such a stamp can be used to produce PDMS lenses on a large scale.

Figure 6A:
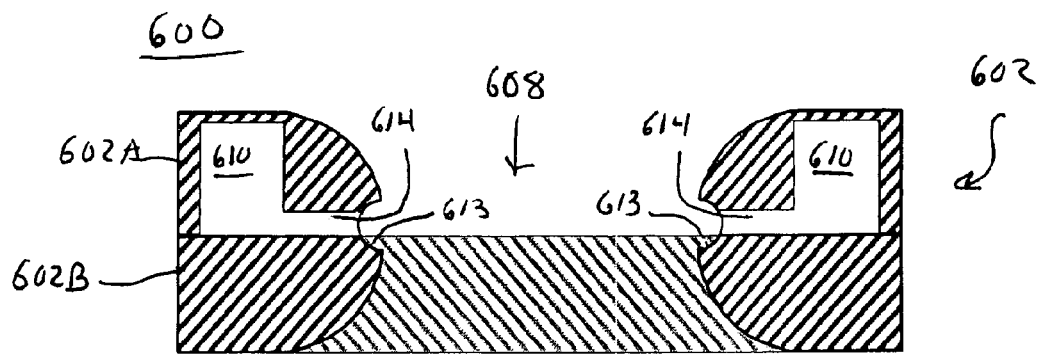
FIGS. 6A-6B are a sequence of cross-sectional schematic diagrams illustrating fabrication of a fluidic lens according to an alternative embodiment of the present invention.
Figure 6B:
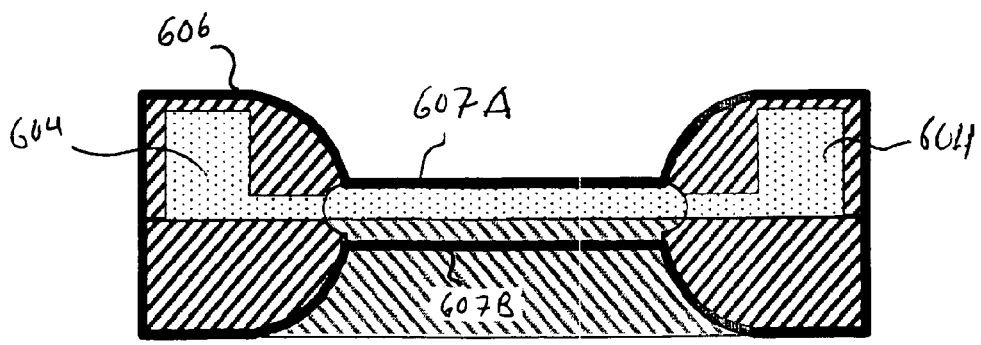
Figure 6C:
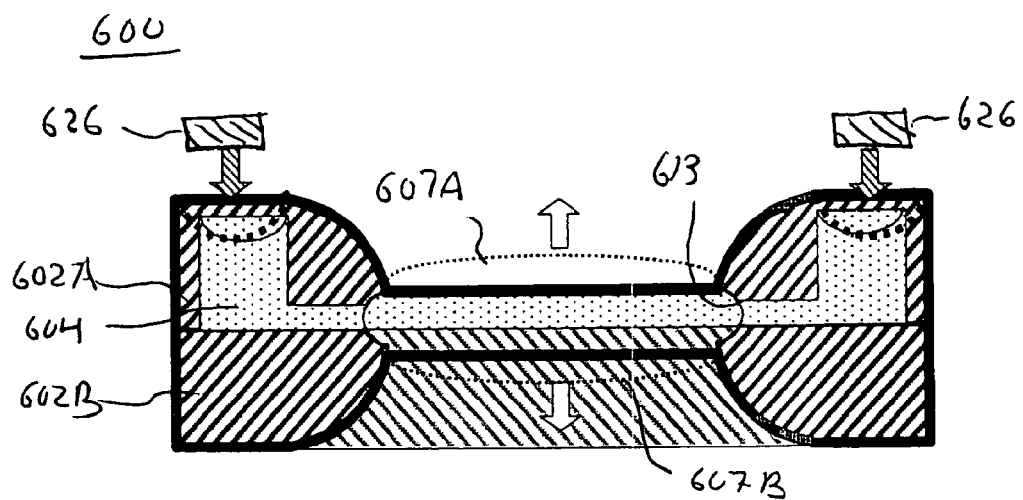
FIG. 6C is a cross-sectional schematic diagram illustrating operation of the fluidic lens of FIGS. 6A-6B.

Although much of the preceding discussion deals with lenslets having a flanged skeleton, the invention is in no way limited to this particular design. For example, FIGS. 6A-6C illustrate an embodiment of a fluidic lens 600 having a different design. The lens 600 includes a skeleton 602 having an upper portion 602A and a lower portion 602B. The upper and lower portions include matching openings that provide an aperture 608. In this example, the upper portion 602A is made of a compliant material, e.g., an elastomer. An annular reservoir 610 is formed within the upper portion 602A. The reservoir 610 communicates with the aperture 608 via a channel 614. A rounded groove 613 is formed at an intersection of the channel 614 and aperture 608. As shown in FIG. 6A and the aperture 608 and reservoir 610 are filled with a transparent fluid 604 and the upper and lower portions 602A, 602B are covered by a compliant membrane 606. In this particular embodiment, the membrane 606 has two optical surfaces 607A, 607B that are substantially flat and parallel when the lenslet 600 is in a rest state, i.e., with no displacing force applied to the fluid reservoir 610. The flange-less design of the skeleton 602 allows the two optical faces 607A, 607B to be quite close to each other, e.g., the thickness of the fluid between them may be about 50 microns or less.

When a displacing force is applied to the upper portion 602A (e.g., as indicated by the shaded arrows in FIG. 6C) the volume of the reservoir 610 is compressed forcing fluid 604 into the aperture 608. In the example depicted in FIG. 6C, a ring-shaped piston 626, which may be actuated by any suitable mechanism such as those described above, applies the displacing force. In the example shown, the actuation force is directed substantially perpendicular to a plane of the membrane 606 when it is in the rest position. As a result of increased fluid volume in the aperture 608, the membrane 606 expands, e.g., as indicated in phantom, leading to a changed curvature of the optical surfaces 607A, 607B and a correspondingly changed focal power. The rounded groove 613 can provide a contact angle for the surface of the fluid 604 that facilitates a desired curvature of the optical surfaces 607A, 607B.

Figure 7:
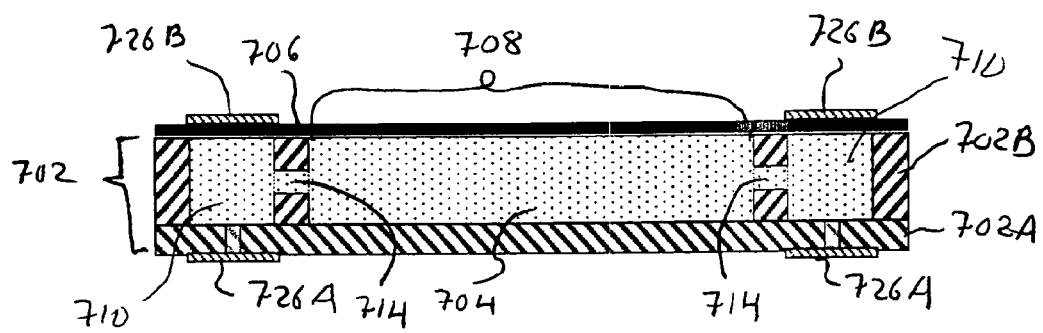
FIG. 7 is a cross-sectional schematic diagram of an electrostatically actuated fluidic lens according to an alternative embodiment of the present invention.

In some embodiments of the invention, a lenslet may have a rigid optical surface. FIG. 7 depicts an example of an alternative optical device 700 according to an alternative embodiment of the invention. The device 700 includes a lens skeleton 702 that is formed in two parts. The lens skeleton 702 includes a rigid transparent substrate 702A, a reservoir portion 702B. The substrate 702A may be made of any suitable rigid transparent material, e.g., glass, plastic, polymer, polycarbonate, and the like. By way of example, the substrate 702A may be made of glass between about 0.7 mm and about 0.2 mm in thickness. The substrate 702A provides a first optical surface 707A. The reservoir portion 702B includes an annular reservoir 710 defined by inner and outer walls that surround an aperture 708. A transparent fluid 704, e.g., as described above, fills the aperture 708 and reservoir 710. Channels 714 formed in the inner wall provide fluid communication between the aperture 708 and reservoir 710. A transparent compliant membrane 706 covers the aperture 708 and reservoir 710 such that the fluid is enclosed between the membrane 706 and the substrate 702A. The membrane 706 provides a second optical surface 707B. One or more electrodes 726A may be deposited or otherwise formed on the substrate 702A proximate the reservoir 710 and one or more corresponding electrodes 726B may be deposited or otherwise formed on the membrane 706 proximate the reservoir. The electrodes 726A, 726B can serve as an electrostatic actuator as described below with respect to FIGS. 9A-9C. The electrodes 726A, 726B and corresponding portion of the membrane 706 may be regarded as an elastic capacitor section of the lenslet 700 while the aperture and corresponding portion of the membrane 706 may be regarded as an elastic lens section of the device 700.

Figure 8A:
FIGS. 8A-8F are a sequence of cross-sectional schematic diagrams illustrating fabrication of an electrostatically actuated fluidic lens of the type depicted in FIG. 7.
Figure 8B:
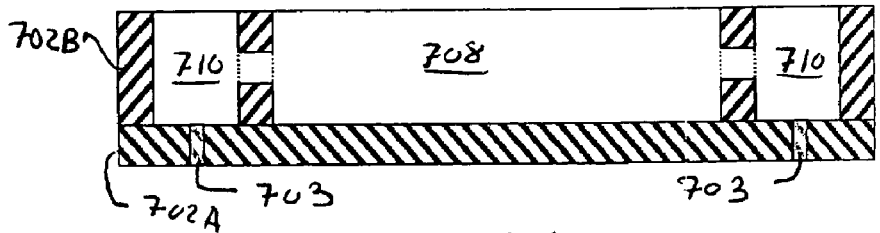
Figure 8C:
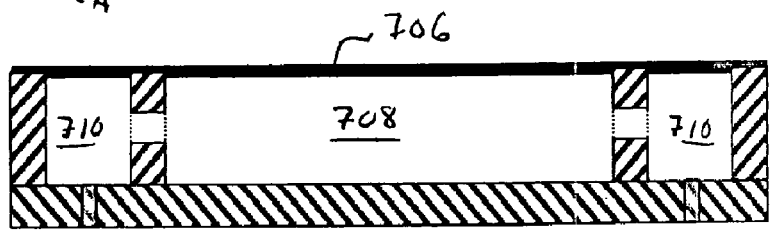
Figure 8D:
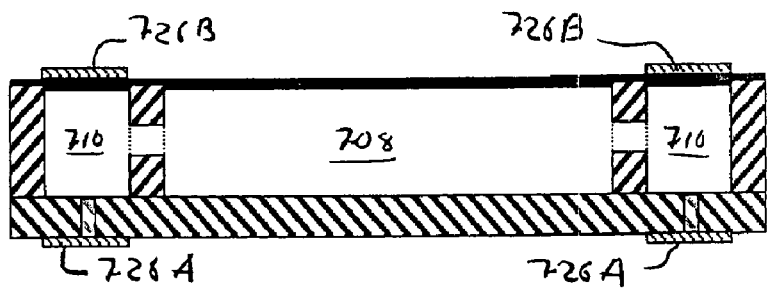
Figure 8E:
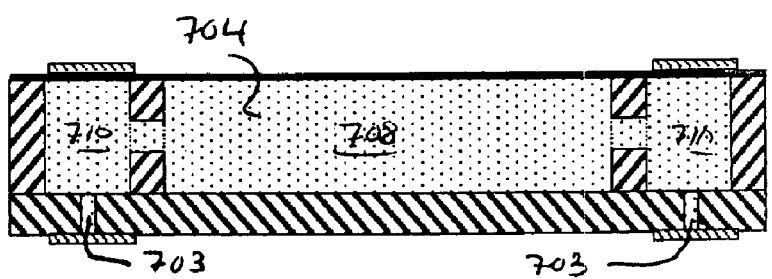
Figure 8F:
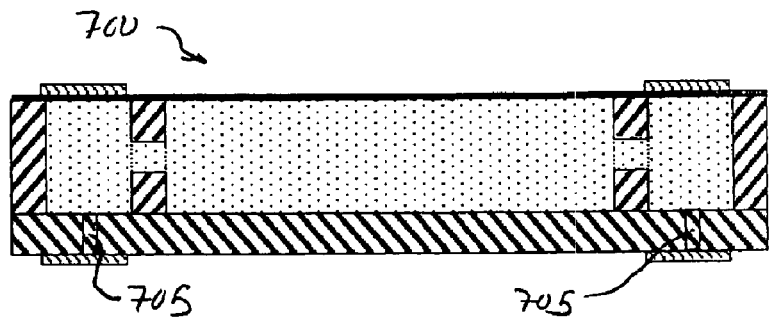

FIGS. 8A-8F illustrate one possible sequence of steps in making the device 700 of FIG. 7. As shown in FIG. 8A, the substrate 702A is formed first, e.g., by cutting glass to a suitable shape. One or more fill holes 703 may be formed through the substrate at this stage. As shown in FIG. 8B, the inner and outer walls of the reservoir portion 702B are formed and bonded to the substrate 702A. The reservoir portion 702B may be formed in a single piece or in two or more separate pieces. Next, as shown in FIG. 8C, the membrane 706 is attached to the reservoir portion 702A covering the aperture 708 and reservoir 710. Next, as depicted in FIG. 8D, the lower electrodes 726A are formed on the substrate 702A and the upper electrodes 726B are formed on the membrane 706. The aperture 708 and reservoir 710 may then be filled with fluid 704 via the fill holes 703, as depicted in FIG. 8E. In some embodiments, the aperture and reservoir may be evacuated and filled through a single hole 703. In other embodiments, two or more holes may be used. For example, fluid may be supplied through one hole and air allowed to escape through another hole. After the aperture 708 and reservoir 710 have been filled, the holes 703 are sealed with plugs 705 as depicted in FIG. 8F. The device 700 is now ready for operation.

Figure 9A:
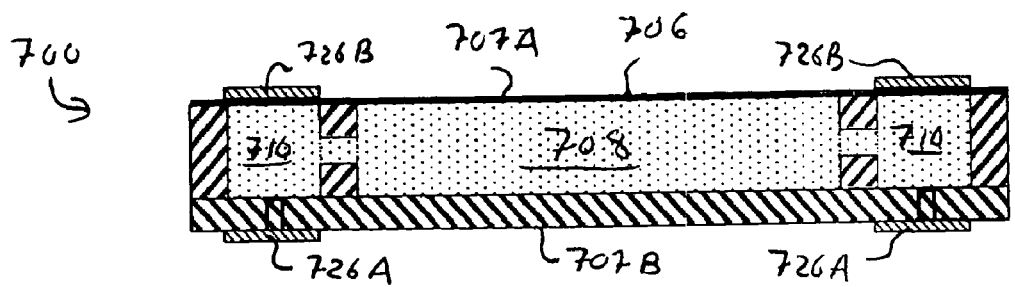
FIGS. 9A-9C are a sequence of cross-sectional schematic diagrams illustrating operation of an electrostatically actuated fluidic lens of the type depicted in FIG. 7.
Figure 9B:
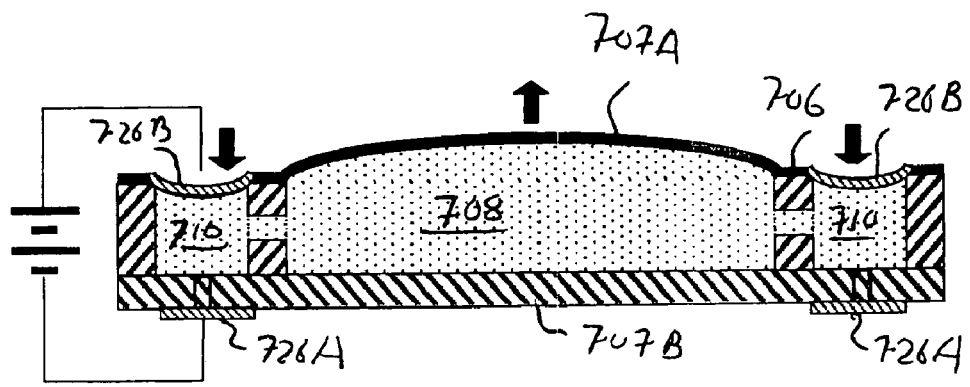
Figure 9C:
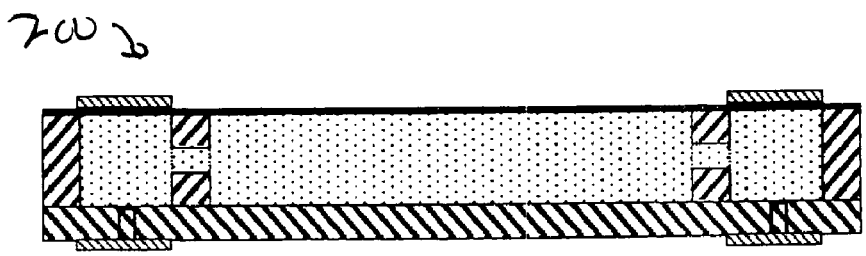

Operation of the device 700 as a lens may be understood by referring to FIGS. 9A-9C. With no voltage applied between the lower electrodes 726A and the upper electrodes 726B, the lens 700 is in rest state as depicted in FIG. 9A. In this state, the membrane is substantially planar and the first and second optical surfaces 707A, 707B are substantially parallel to each other. As depicted in FIG. 9B, when a voltage (DC) is applied between the lower and upper electrodes 726A, 726B electrostatic forces pull the electrodes toward each other. These forces on the upper electrodes 726B push part of the membrane 706 into the reservoir 710. As a result, fluid 704 is forced from reservoir 710 into the optical aperture 708. Due to increased fluid volume in the aperture 708, the membrane deforms thereby changing the curvature of the second optical surface 707B and the focal properties of the device 700. Those of skill in the art will recognize that appropriate adjustment of the voltage applied between the upper and lower electrodes can control the focal properties of the device 700. When the voltage is removed the membrane 706 returns to the rest position as depicted in FIG. 9C.

Figure 10G:
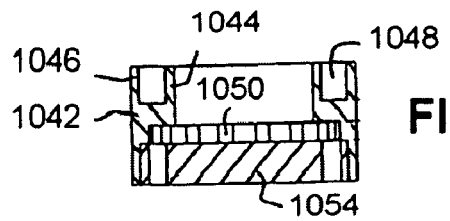
FIG. 10G is a cross-sectional view of a portion of an alternative frame for a fluidic lens.

Applying actuation forces around the periphery of the actuator serves the design principle of a small reservoir wall displacement resulting in large optical surface deflection because the resulting volume displacement is generally proportional to the outer circumference, which is larger than any other circularly symmetrical feature of the lens. Combining axial displacement and radial displacement further enhances the actuation mechanical amplification effect. These attributes are incorporated into a peripherally actuated fluidic lens 1000 depicted in FIGS. 10A-10G. As shown in FIGS. 10A-10C, the lens 1000 generally includes a lens skeleton 1002 having a rigid base 1001 and an inner wall 1003. The inner wall 1003 and a transparent portion of the base 1003 define an aperture 1008. A compliant outer wall 1005 peripherally surrounds the inner wall 1003. A reservoir 1010 is defined between the inner wall 1003, outer wall 1004 and the base 1001. A transparent fluid fills the aperture 1008 and reservoir 1010. Channels 1014 formed in the inner wall provide fluid communication between the aperture 1008 and reservoir 1010. A compliant membrane 1006 is located over the aperture 1008 and reservoir 1010.

As shown in FIGS. 10D-10F, a mechanical interface 1020 referred to herein as a "spider" is used in order to apply a displacing force against the compliant outer wall 1005. The spider 1020 generally includes a substantially flat ring 1022 with leg-like extensions 1024 disposed radially outward in the plane of the ring 1022. As indicated in FIG. 10E, each leg 1022 has a first narrow recess 1026 near a junction between the leg 1024 and the ring 1022. The leg 1022 has a second recess 1028 near the middle of its length. The recesses 1026, 1028 are disposed on opposite sides of the spider 1020 and are adapted to serve as flexible hinges or flexures. The flexed configuration is achieved when the spider 1020 and the lens 1000 are assembled coaxially in preparation for the application of an axial actuation force indicated as F in FIG. 10F. It is seen that in the assembled configuration, the spider legs 1024 are arranged in a substantially axial direction. The orientation of the flexure recess 1028 in the middle of the legs 1024 is such that the axial force F would result in a buckling action, thrusting the "knee" portion of the legs radially inward. The resulting radial force exerted by the "knee", in turn, compresses the outer wall 1005 of the lens 1000 radially inward, thus adding to the displaced fluid volume and resulting in amplified motion of the optical surface of the lens. The ring 1022 may be augmented with a projection 1030 on its bottom side. This projection 1030 is designed to impinge on the portion of the membrane 1006 located over the fluid reservoir 1010, thereby adding to the volume of fluid displaced from the reservoir. It is clear that force F may be applied by any convenient means such as electrostatic, electromagnetic, piezoelectric, thermally, etc., subject to meeting the basic requirements of force, stroke, available power, speed, cost and other such constraints.

Figure 10H:
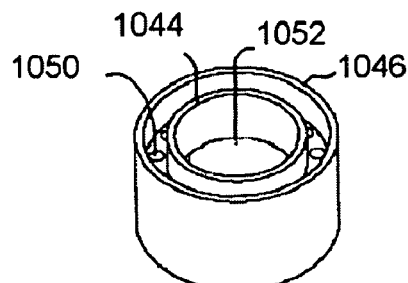
FIGS. 10H-10I are three-dimensional views of the alternative frame of FIG. 10G.
Figure 10I:
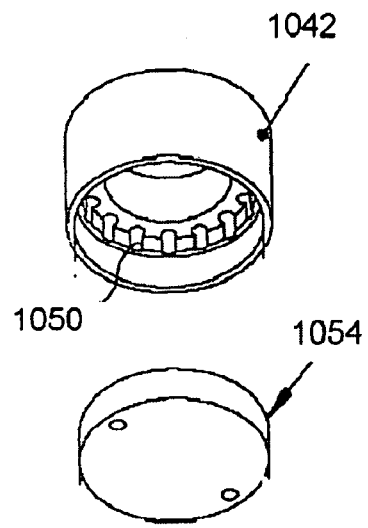

The fluidic lens of FIGS. 10A-10F can be varied in a number of ways. For example, FIGS. 10G-10I depict a partially assembled fluidic lens 1040 having a unitary lens skeleton 1042 with an inner wall 1044 and an outer wall 1046 with a reservoir channel 1048 between them. Holes 1050 in the floor of the channel 1048 communicate with an aperture 1052. A round optical component 1054 provides one optical surface for the lens 1040. This component may be conveniently chosen with or without optical power. A compliant membrane (not shown) provides the other optical surface as described above.

Figure 25:
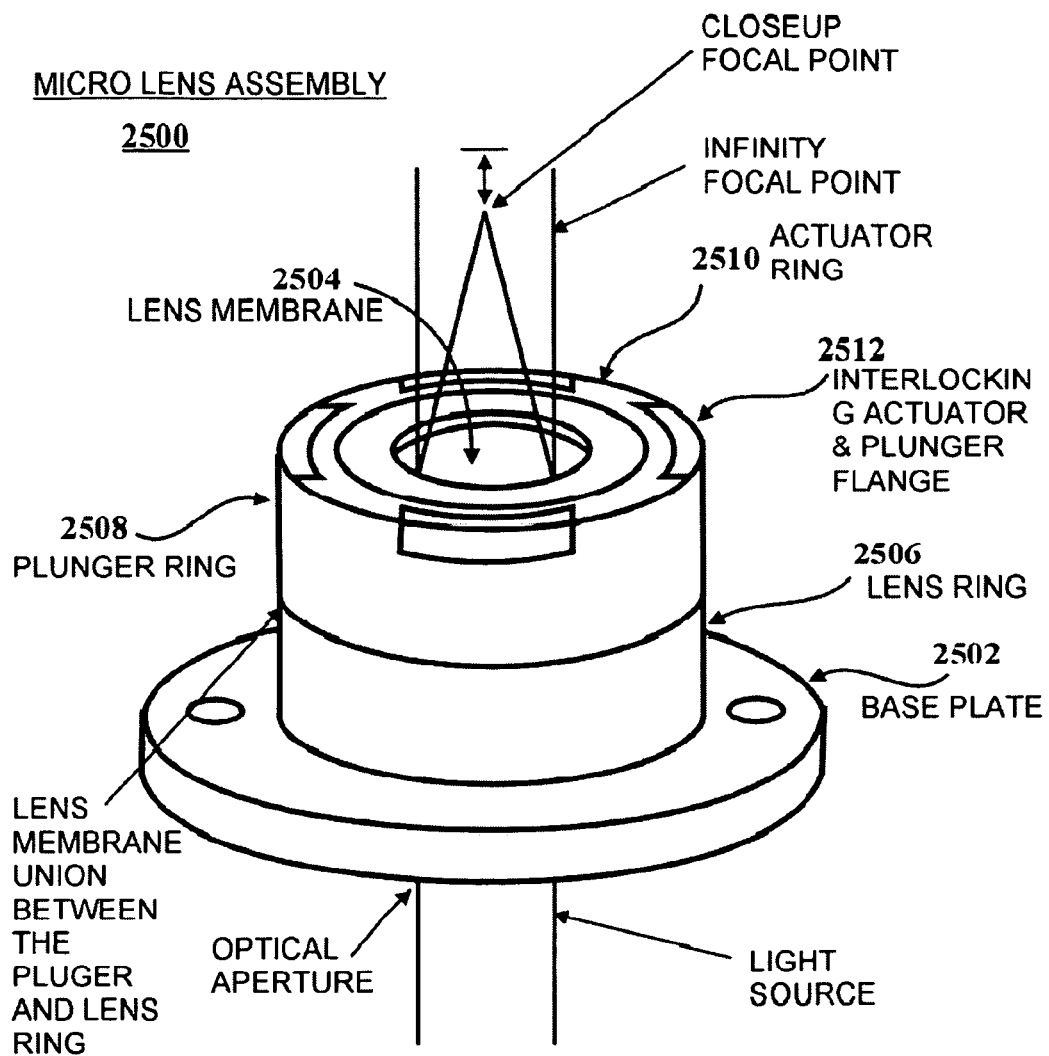
FIG. 25 is a three-dimensional view of a fluidic micro lens assembly similar to that depicted in FIGS. 10A-10F.

FIG. 25 depicts a micro lens assembly 2500 that is a variation on the devices described above with respect to FIGS. 10A-10F. The microlens assembly includes a base plate 2502, a lens membrane 2504, a lens ring 2506, a plunger ring 2508 and an actuator ring 2510. The lens ring 2506 may have inner and outer rings that define an aperture with an annular reservoir for fluid between them in fluid communication with the aperture as described above with respect to FIGS. 10G-10H. The plunger ring 2508 (or a portion thereof) fits within the annular reservoir to provide fluid displacement. The lens membrane covers the aperture and is disposed between the plunger ring 2508 and the lens ring 2506. The base 2502 may include a flange to facilitate attachment of the fluidic lens to the rest of an optical device or system. The plunger ring 2506 and actuator ring 2510 interlock via tabs 2512 on the plunger ring 2508 and corresponding slots on the actuator ring 2510. Actuation of the plunger ring 2508 through an axial force applied to the actuator ring 2510 ring displaces fluid from the reservoir causing the membrane 2504 to expand.

In the embodiments depicted in FIGS. 10A-10F and 25, there is only one deformable membrane. However, embodiments of the present invention are not limited to such a configuration. A portion or all of the base plate may be replaced with or incorporate a second deformable membrane. Likewise, one or more of a second actuator ring, lens ring, plunger and actuator may be similarly used with a second deformable membrane.

Figure 11A:
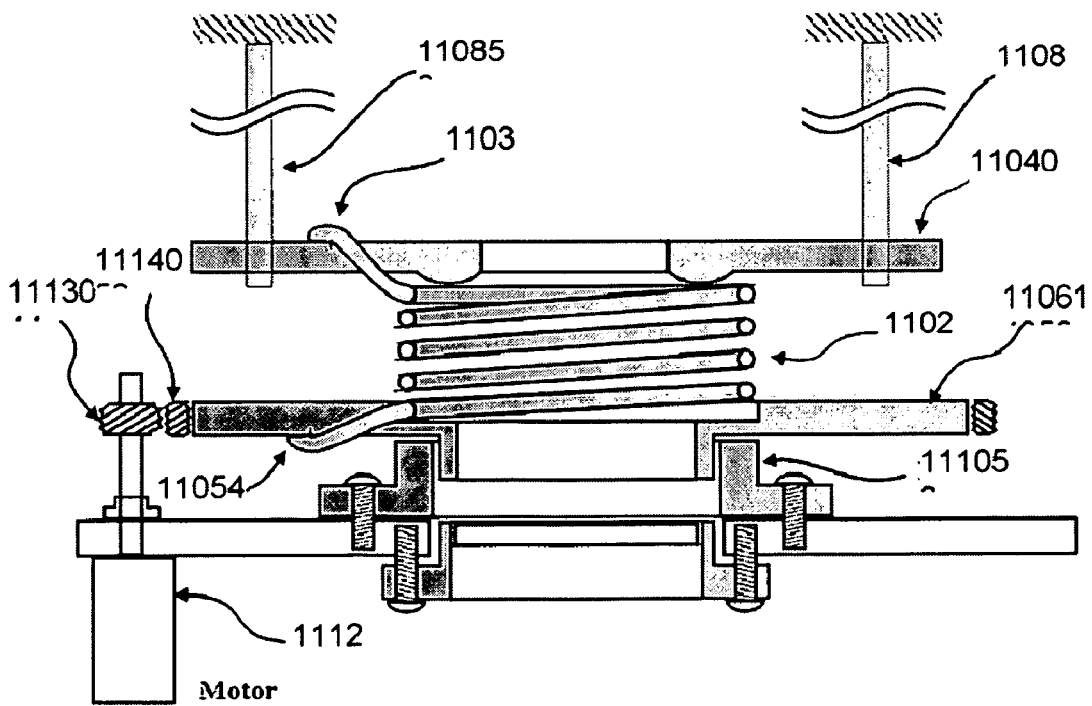
FIG. 11A is a cross-sectional schematic diagram of a fluidic lens having a helical spring actuator according to an embodiment of the present invention.

As described above, both peripheral and axial compression may be used to enhance the volume compression of the fluidic lens 1000. There are a number of different mechanisms that may be used to achieve both peripheral and axial compression. For example, FIG. 11A depicts a helical coil actuator 1100, which may be used to actuate a fluidic lens, e.g. of the type described above. The actuator 1100 uses a helical spring 1102, which can be wrapped around the flexible side wall of a lens, such as lens 1000 of FIGS. 10A-10C. The spring 1102 is anchored at its two ends between two rings like structures, an upper ring 1104 and a lower ring 1106, which are sized and shaped to enclose the lens. In its unloaded state the loops of the spring 1102 lightly touch the side wall of the lens. The upper ring 1104 rests on top of the fluid reservoir with its bottom side projection in contact with the lens membrane. The spring 1102 may be secured to the upper and lower rings ring by anchors 1103, 1105. The upper ring 1104, when actuated, may undergo axial translation, but is prevented from rotating by guiding means 1108, e.g., one or more axially oriented and lubricated alignment pins. The bottom ring 1106, when actuated is free to rotate around the common lens axis while being guided by a bearing means 1110, for example, a sleeve bearing. The lower ring 1106, when rotated in a direction that winds the spring 1102 down more tightly, causes the loops 1102 of the spring to move radially inward while pulling the upper ring 1104 axially downward. Rotation of the bottom ring in the opposite direction reverses the previous action. The bottom ring may be rotated by any convenient means, e.g., a small motor 1112 coupled by a spur-gear 1113 to a gear 1114 affixed to the bottom ring 1106. By way of example, the motor 1112 may be an ultrasonic piezoelectric motor coaxially disposed with the bottom ring 1106, and constructed so that its rotor is solidly joined with the bottom ring 1106. Other motors may work as well and are to be regarded as falling within the scope of the present invention. A more compact alternative results when the helical spring is itself constructed of a shape memory alloy. In this case the bottom ring would be mechanically fixed with no other motor required. Ohmic heating of the helix, obtained by passing a current through the wire, would be used to vary the radial and axial forces exerted onto the lens. Auxiliary elastic restoring means (such as an additional axially disposed passive helical spring) could be employed to restore the actuator to the undeflected condition.

Figure 11B:
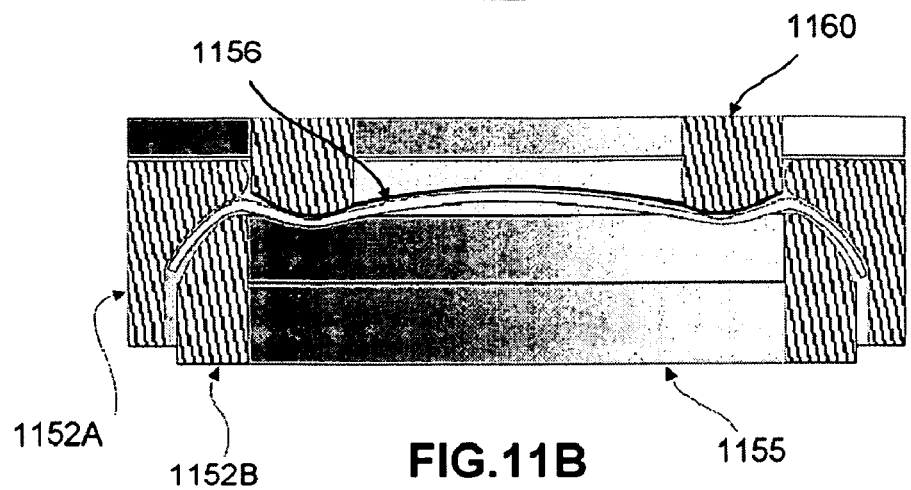
FIG. 11B is a cross-sectional view of an axially actuated fluidic lens according to an embodiment of the present invention
Figure 11C:
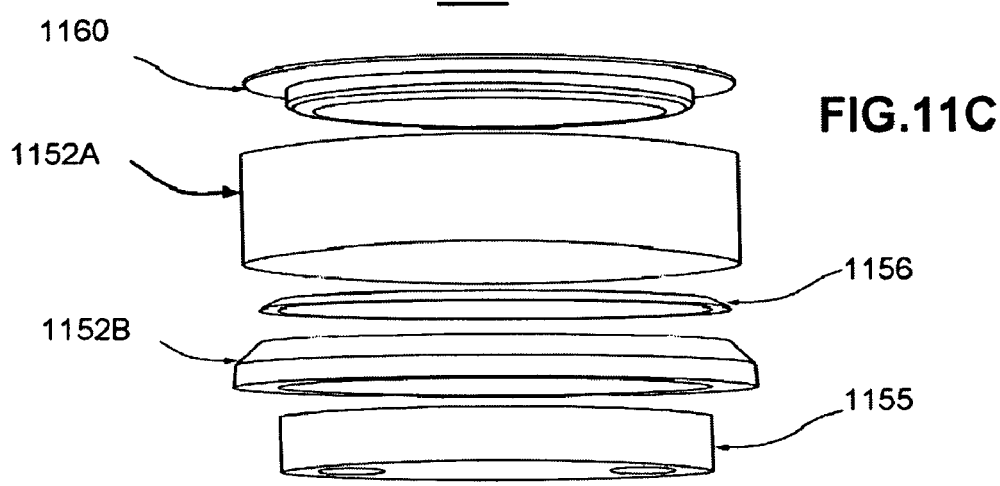
FIG. 11C is an exploded three-dimensional view of the fluidic lens of FIG. 11B.
Figure 11D:
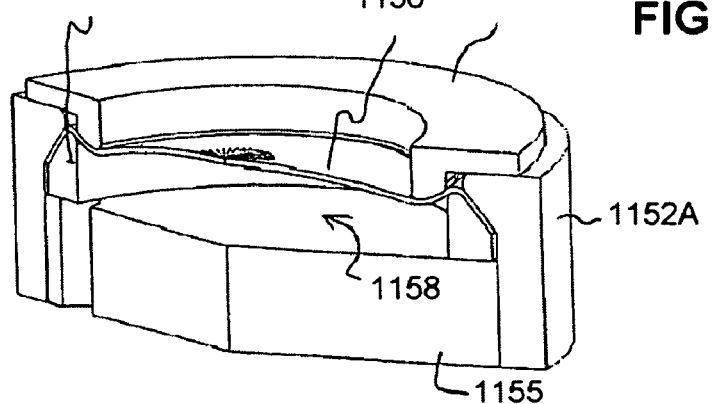
FIG. 11D is a cutaway three-dimensional view of the fluidic lens of FIG. 11B and FIG. 11C.

Although many of the above embodiments constrict the reservoir peripherally, the invention is in no way limited by such a feature. Furthermore, although in many embodiments the reservoir and aperture sections of the skeleton are separated by some sort of wall or barrier the invention is in no way limited by this feature. In such a case, the reservoir may be regarded as that portion of the fluid filled membrane upon which the actuator exerts a fluid-displacing force. For example, FIGS. 11B-11D depict a fluidic lens 1150 having skeleton made from an outer ring 1152A and inner ring 1152B. A compliant membrane 1156 having an edge roll 1107 is retained between the inner and outer rings. The membrane 1156 provides a first optical surface. In this embodiment, only the optical surface provided by the membrane 1156 is actuated. In the example depicted in FIGS. 11B-11C, the membrane has an edge roll that conforms to an outer edge of the inner ring 1152B and an inner edge of the outer ring 1152A. A round optical component 1155 provides a second optical surface. The rings 1152A, 1152B, component 1155, and membrane 1156 enclose a volume 1158 that can be filled with a fluid. As shown in FIG. 11C, a ring shaped piston 1160 includes a protrusion 1162 sized to fit within the inner ring 1152B. When the piston 1160 is pushed axially against the membrane 1156 the projection 1162 engages the membrane 1156 and displaces some of the fluid in the volume 1158. As a result of the fluid displacement, the membrane 1156 expands. As the protrusion 1162 engages the membrane 1156, the membrane will strain (or stretch). Depending on the dimensions of the various elements of the fluidic lens 1150, the strain may be distributed non-uniformly across the membrane 1156. For example, the region of the membrane 1156 exterior to the projection 1162 may encounter significantly greater strain than the region interior to the projection 1162 resulting in an increased likelihood of damage to the exterior region of the membrane 1156. Therefore, it may be desirable to specify the dimensions of elements of the fluidic lens 1150, including the projection 1162, ring shaped piston 1160, outer ring 1152A and inner ring 1152B, such that the strain (and other forces) across the membrane is generally balanced (or uniform) over a wide range of actuation stroke (or thrust) by the piston 1160. Such balancing of the strain (and other forces) in various regions of the membrane 1156 can reduce the regions of high strain and therefore decrease the likelihood of damage to the membrane 1156 as well as in the piston 1160 and other elements of the fluid lens 1150.

Figure 21:
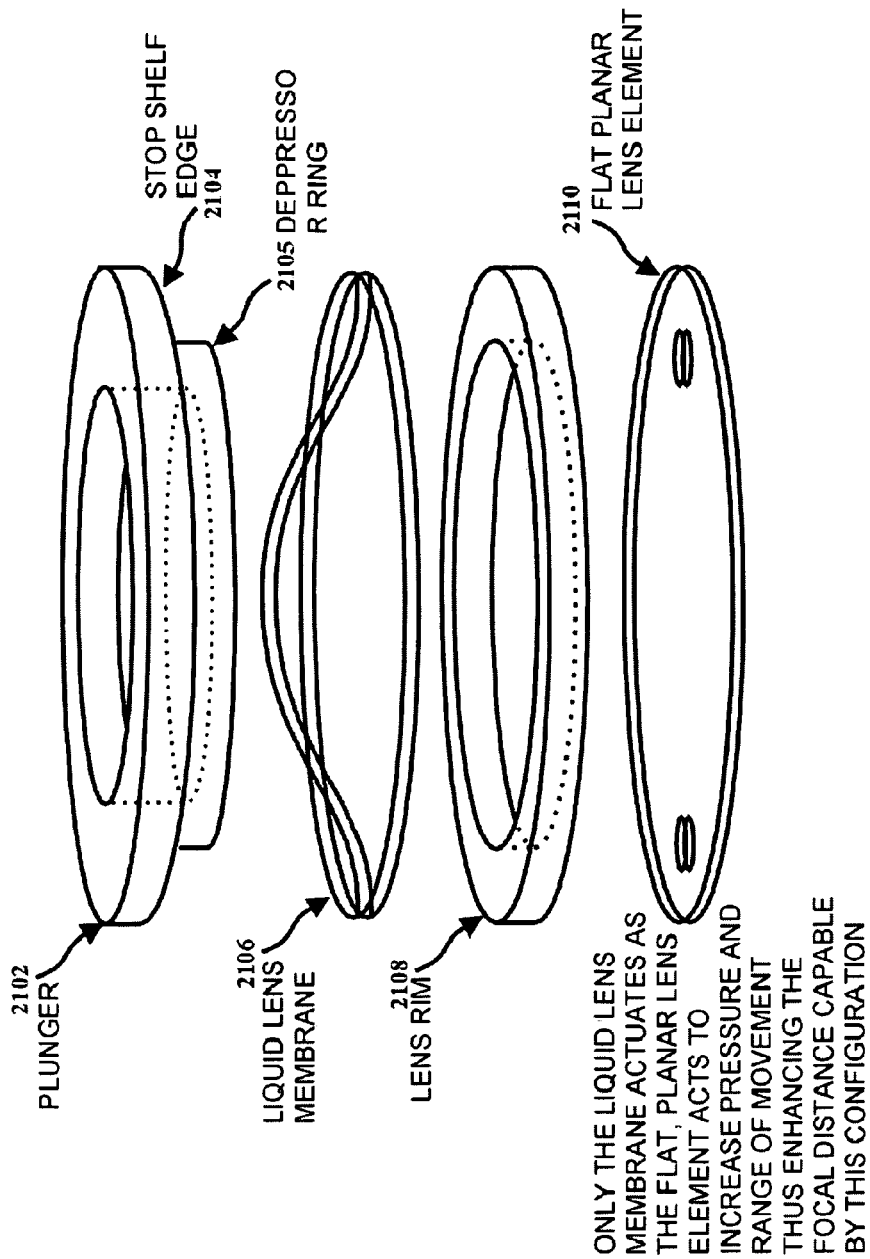
FIG. 21 is an exploded three-dimensional schematic diagram of an axially actuated fluidic lens according to an embodiment of the present invention similar to that shown in FIG. 11B.

Additional detail of a variation on this type of fluidic lens can be seen in the three-dimensional drawing of FIG. 21, which depicts a fluidic lens 2100 having a plunger 2102, membrane 2106, lens rim 2108 and flat planar lens element 2110. The membrane 2106 is disposed between the plunger 2102 and the lens rim 2108. Fluid occupies the space between the membrane 2106, lens rim 2108 and planar element 2110. The plunger 2102 includes a depressor ring, which may be integral to the plunger, and a stop shelf 2105. The depressor ring fits within an inside diameter of the lens rim 2108 and engages the membrane 2106 causing displacement of fluid. The stop shelf 2105 has a larger diameter than the lens rim and limits displacement of the plunger. Only the membrane 2106 actuates as the flat planar lens element 2110 acts to increase pressure and range of movement thus enhancing the range of focal distances obtainable with this configuration.

Figure 12A:
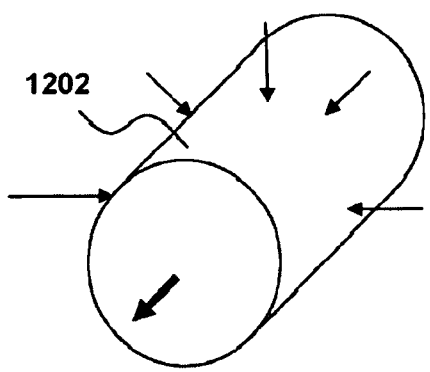
FIGS. 12A-12H are schematic diagrams illustrating fluidic lenses employing constriction actuators according to embodiments of the present invention.

Additional embodiments of the invention may utilize a number of different constriction-type actuators in lenses having a transparent fluid encapsulated in a transparent compliant membrane with or without a lens skeleton. By way of example, as depicted in FIG. 12A, a fluidic lens may employ an actuator that applies a constricting force on the sides of a tube-shaped fluid-filled membrane 1202 in a radial direction as indicated by the arrows. The constricting force induces the ends of the membrane 1202 to bulge into a lens shape. Suitable actuators for applying the constricting force may be electrostatic, electrostrictive, magnetostrictive, electromagnetic, thermal/SMA, piezoelectric, electrowetting, or motors (e.g., electromagnetic or ultrasonic).

Figure 12B:
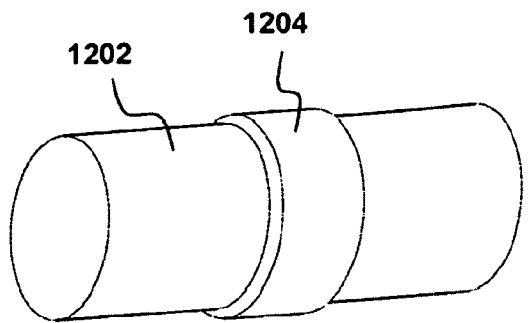
Figure 12C:
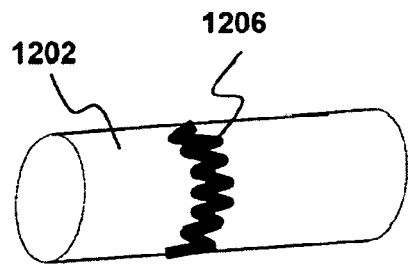
Figure 12D:
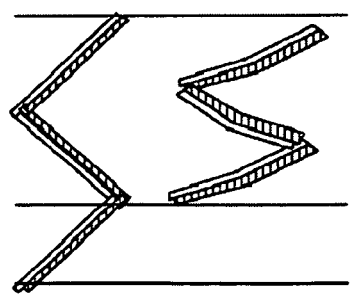
Figure 12E:
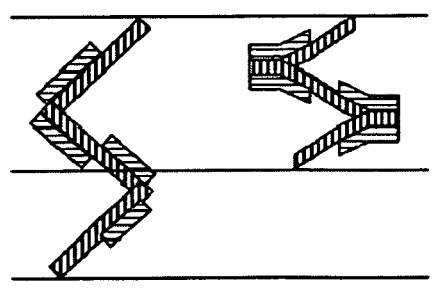

There are a number of actuator designs that may be used to provide such a radial constricting force. For example, FIG. 12B depicts a fluidic lens using a single band wrapper 1204 in conjunction with the fluid-filled tube 1202. Contraction of the wrapper 1204 induces bulging of the ends of the tube. The wrapper 1204 may contract under the influence of thermal expansion, magnetostrictive or piezoelectric effects. FIG. 12C depicts a lens using a zigzag wrapper 1206 in conjunction with the fluid filled tube 1202. The zigzag wrapper 1206 has multiple folds that can contract under the influence of thermal expansion, piezoelectric, magnetostrictive or electrostatic forces. FIG. 12D illustrates a close-up of a portion of a zigzag wrapper 1208 that works by differential thermal expansion. The folds of the wrapper are made of two materials 1210, 1212, e.g., two different metals, having different coefficients of thermal expansion. In this example, material 1210 has a greater coefficient of thermal expansion than material 1212. As a result, the folds tend to contract when heated. FIG. 12E illustrates a close-up of a portion of a zigzag wrapper 1214 that works by electrostatic force. Electrically isolated electrodes 1216, 1218 are placed on opposite sides of the folds of the wrapper 1214. When appropriate voltage are applied between the electrodes 1216, the folds collapse under the resulting electrostatic forces.

Figure 12F:
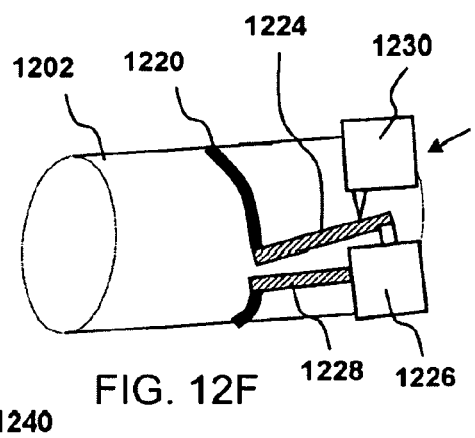

FIG. 12F illustrates a fluidic lens using a constricting band 1220 in conjunction with a lever actuator 1222 and fluid-filled tube 1202. The lever actuator 1222 includes a lever arm 1224 attached to one end of the constricting band 1220. The other end of the constricting band 1220 is secured to an anchor 1226 via a flexure 1228. An actuator 1230 exerts a force on the lever arm 1224 that causes the constricting band to radially constrict the fluid-filled tube 1202. The actuator 1230 may operate by thermal expansion, piezoelectric, magnetostrictive, or electrostatic effect.

Figure 12G:
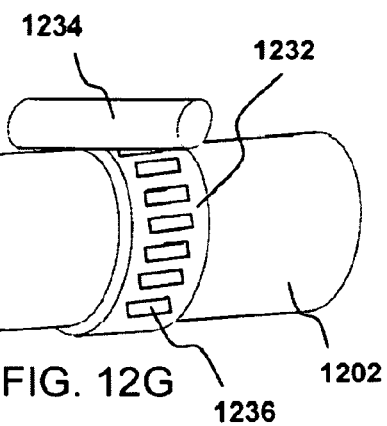

FIG. 12G illustrates a lens using a slotted constricting band 1232 in conjunction with a worm gear 1234 to radially constrict the fluid-filled tube 1202. Threads of the worm gear engage slots 1236 formed in the band 1232. Rotation of the worm gear 1234 tightens the band 1232, which radially constricts the tube 1202. Rotation of the worm gear 1234 can be implemented by a motor or any of the actuation mechanisms discussed above.

Figure 12H:
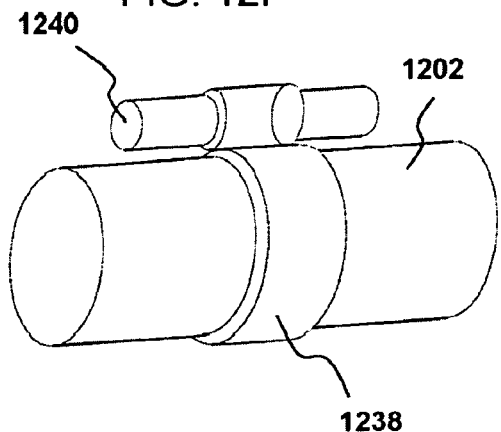

FIG. 12H illustrates a lens using a constricting band 1238 in conjunction with a winding axle 1240. The tube 1202 and axle 1240 are oriented with their respective axes substantially parallel (e.g., within a few degrees of parallel) to each other. The constricting band is attached to the axle 1240 in such a way that when the axle 1240 rotates about its axis it pulls on the band 1238 causing the band 1238 to radially constrict the tube 1202. A motor or any of the actuation mechanisms discussed above may be used to rotate the axle 1240.

Figure 13A:
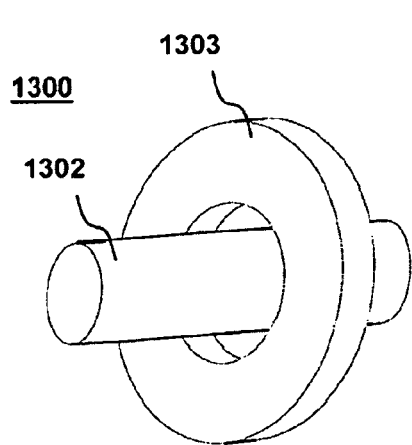
FIGS. 13A-13B are schematic diagrams of fluidic lenses that utilize constricting ring actuators according to an embodiment of the present invention.
Figure 13B:
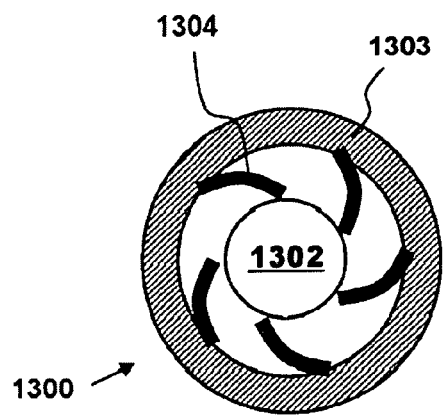

A variation on the constricting band actuators described above is a constricting ring actuator, examples of which are depicted in FIGS. 13A-13B. The constricting ring actuator 1300 generally includes a support ring 1303 and plurality of actuator arms 1304 that engage an edge of a fluid-filled compliant (e.g., elastomer) lens tube 1302. The actuator arms are connected to the support ring 1303 and make contact with the lens tube 1302. The actuator arms 1304 move inward toward the lens tube 1302 thereby applying a radially constricting force in a manner similar to the operation of a mechanical iris, such as might be found in a variable aperture camera lens. By way of example, the actuator arms 1304 may bend inward by differential thermal expansion. Alternatively, the actuator arms may be thin sheets having curved edges, as in a mechanical iris. Simultaneous rotation of the actuator arms can constrict the lens tube 1302.

Figure 14A:
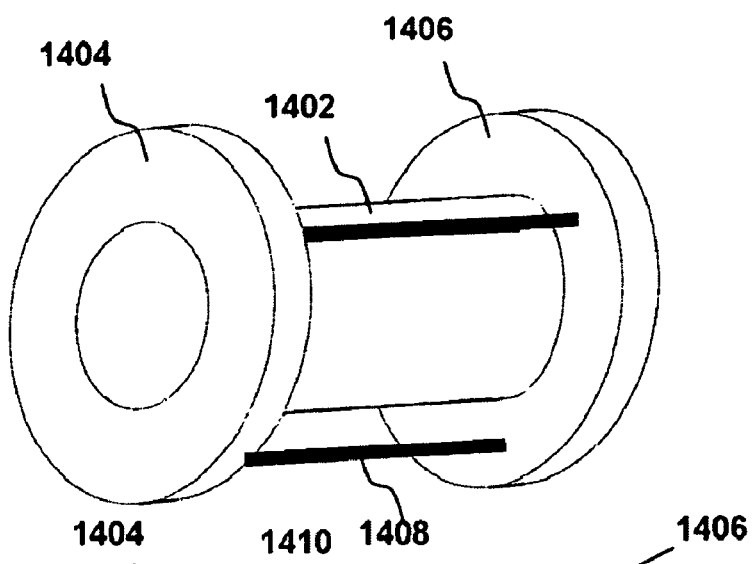
FIGS. 14A-14B are three-dimensional schematic diagrams illustrating fluidic lenses employing axial constriction actuators according to embodiments of the present invention.
Figure 14B:
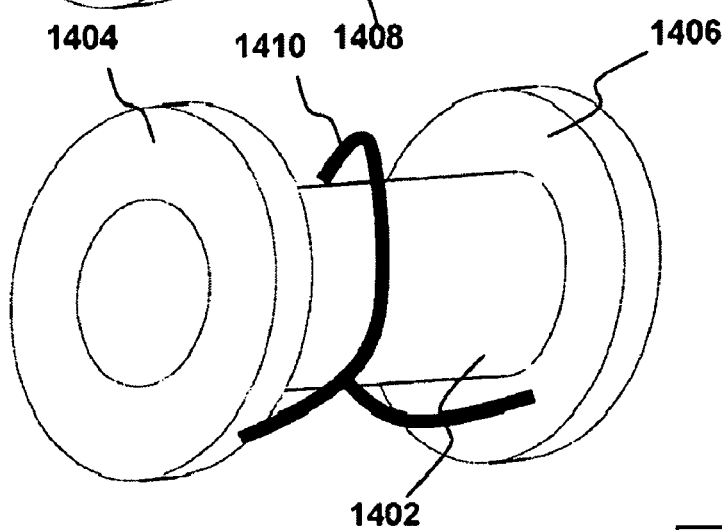

In other embodiments, the actuator may operate by axial constriction. For example, FIGS. 14A-14B illustrate examples of axial constriction of a fluid-filled compliant lens tube 1402 between first and second rings 1404, 1406 located at or near the ends of the tube 1402 and co-axially aligned with the tube 1402. An actuator applies an axial force on one or both rings 1404, 1406 causing the fluid in the tube 1402 to bulge the ends of the tube 1402. The actuator may be in the form of one or more arms that constrict and draw one ring axially toward the other. The actuator arm may operate by thermal expansion, piezoelectric, magnetostrictive, electromagnetic, electrostatic effect, or by any of the actuator mechanisms described above. There are a number of different actuator arm configurations. For example, in FIG. 14A linear actuator arms 1408 disposed more or less parallel to a common axis of the rings 1404, 1406 are used. In FIG. 14B one or more spiral actuator arms 1410 are used. Alternatively, the arms may be linkages pivotally connected to the two rings. When one of the rings rotates with respect to the other (or the two rings rotate in opposite directions) the linkages form the outline of a hyperboloid surface having a reduced diameter waist and a reduced distance between rings. This results in a beneficial combination of axial and radial squeezing of the reservoir wherein a greater volume of fluid is displaced (and hence, a greater range of focal power for the fluidic lens is achieved) for the generally the same actuation stroke when compared with only axial constriction of the tube 1402.

Figure 15:
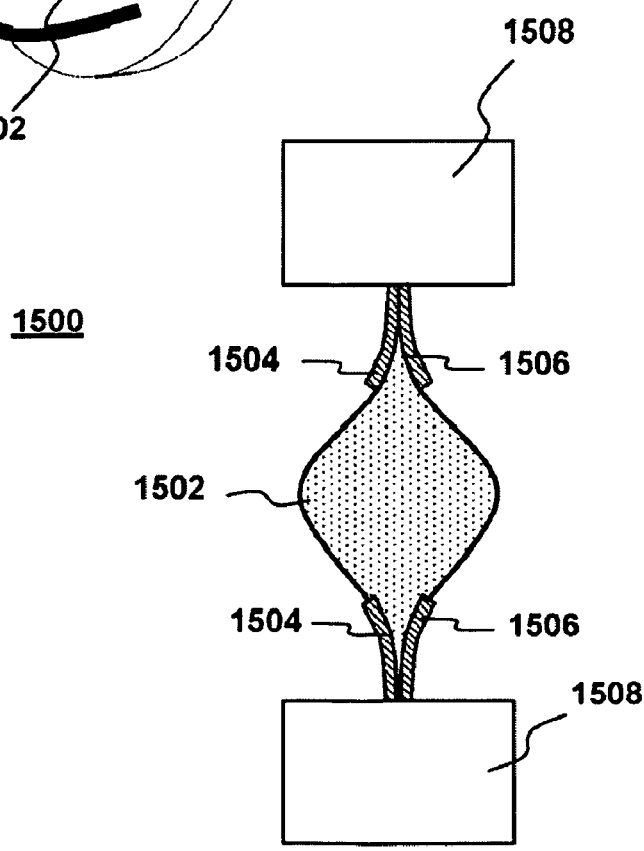
FIG. 15 is a cross-sectional schematic diagram illustrating a fluidic lens that utilizes edge constriction actuation according to an embodiment of the present invention.

Additional embodiments also utilize combinations of radial and axial constriction for enhanced fluid displacement. For example, FIG. 15 depicts a fluidic lens 1500 that uses a fluid-filled compliant (e.g., elastomer) membrane in the form of a tube 1502 constricted between peripheral electrodes 1504, 1506. The electrodes 1504, 1506 are connected to a mounting ring 1508. The ring 1508 and electrodes 1504, 1506 retain the tube 1502. When a voltage is applied between the peripheral electrodes 1504, 1506, the electrodes are attracted toward each other as shown in FIG. 15. The resulting force exerted on the tube 1502 can have both a radial component and an axial component. This force causes the fluid-filled tube 1502 to bulge.

Other actuation schemes may be implemented that do not require the constriction of the fluid-filled membrane. For example, FIGS. 16A-16B depict a fluidic lens 1600 having a fluid-filled membrane 1602 surrounded by and fluidly coupled to an annular reservoir 1604. A micro-fluidic pump 1606 is connected between the reservoir 1604 and membrane 1602. The pump 1606 delivers extra fluid from the reservoir 1604 to the membrane 1602 by electrowetting or electrophoresis or other pumping actuation mechanisms described above. The extra volume of fluid causes the membrane 1602 to bulge, producing a change in its focusing properties. The reservoir 1604 can be sized and shaped to restrict radial expansion of the membrane, such that only the end faces bulge outward. As shown in FIG. 16B, the microfluidic pump 1606 may contain a plurality of microfluidic channels 1607 disposed between interdigitated electrodes 1608, 1610. Vias 1612 allow for fluid communication between the reservoir 1604 and the membrane 1602. When a voltage is applied between the electrodes 1608, 1610 fluid flows from the reservoir to the membrane 1602. When the voltage is removed, forces, including elastic, electrowetting and electrophoresis restoring forces, exerted by the membrane 1602 push the fluid back to the reservoir 1604. The microfluidic pump 1606 and channels 1607 may alternatively include a plurality of pumps and channels that are configured to be actuated independently of each other (e.g., each pair of electrodes for each channel may be coupled to an individually controllable source of voltage). The pump 1606 and channels 1607 may be disposed on or near a perimeter of the fluidic lens aperture of the membrane 1602.

Many of the preceding embodiments describe the skeleton as being external to the membrane or, in some cases, where a distorted, strained or stretched elastic membrane provides restoring forces that act on the fluid. However, the invention is not limited to just these embodiments. It is also possible for a fluidic lens or optical device to have an internal skeleton that provides the restoring forces. For example, FIG. 17 depicts a fluidic optical device 1700 having a voluminous membrane 1706. In this embodiment, the entire volume bounded (or partially bounded) by the membrane 1702 may be both a reservoir and an aperture. Within the membrane 1706 is a polymer network of polymerized monomers 1702. Spaces between the polymerized monomers 1702 form a network of interconnected reservoirs that can be distributed throughout an optical aperture of the device 1700. At least a portion of these reservoirs are filled with a fluid 1704. At least some of the polymerized monomers 1702 can exert restoring forces on the membrane 1706. The polymerized monomers 1702 can act as a resilient internal skeleton. If the membrane 1706, fluid 1704 and polymerized monomers 1702 are sufficiently transparent and generally index matched in order reduce unwanted reflections and optical loss, the structure of the device 1700 is an analogous to the structure of the lens in an eye. The device 1700 may include an actuator, e.g., of any of the types described above, to provide a displacing force to the fluid 1706. The device 1700 may be integrated into any of the embodiments described above.

Figure 18A:
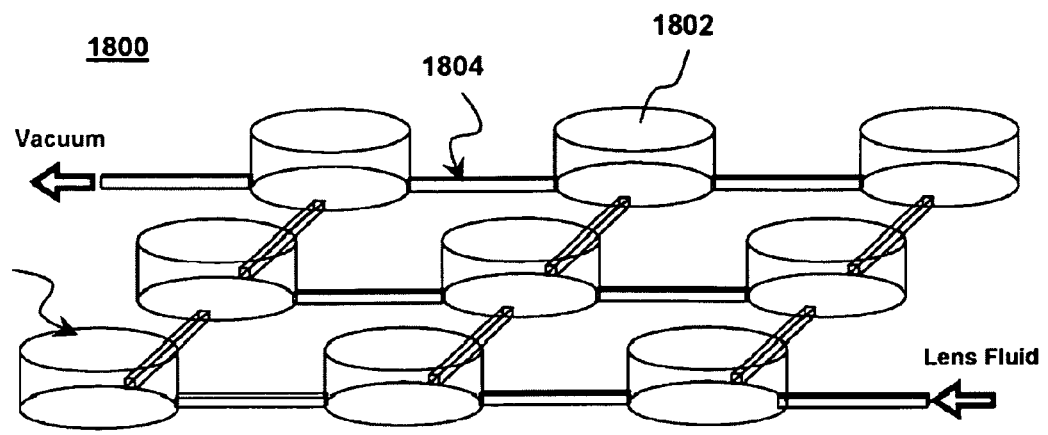
FIGS. 18A-18D are a series of three-dimensional schematic diagrams illustrating fabrication of an array of fluidic lenses according to an embodiment of the present invention.

Fluidic optical devices, e.g., lenses, of the various types depicted above may be advantageously produced in high volume using arrayed fabrication. FIGS. 18A-18D depict an example of an embodiment of such arrayed fabrication. As shown in FIG. 18A an array 1800 of partially fabricated optical devices 1802 of any of the types described above is fabricated e.g., by injection molding. By way of example and without limitation the devices 1802 may be fluidic lenslets. Although the term "lenslet" is often used herein to refer to a miniature lens, a in the context of FIGS. 18A-18D, the plural term "lenslets" is also used to refer to a matrix of miniature lenses, molded or formed onto a common frame or base. The lenslets 1802 are connected by breakable bridges, tabs or similar connectors 1804. The connectors 1802 can be hollow, thus allowing lenslets 1802 in the array 1800 to be in fluid communication with one another. Consequently, the lenslets 1802 in the array 1800 can be filled (or back-filled) with lens fluid using processes similar to those used for filling arrays or liquid crystal displays.

Figure 18B:
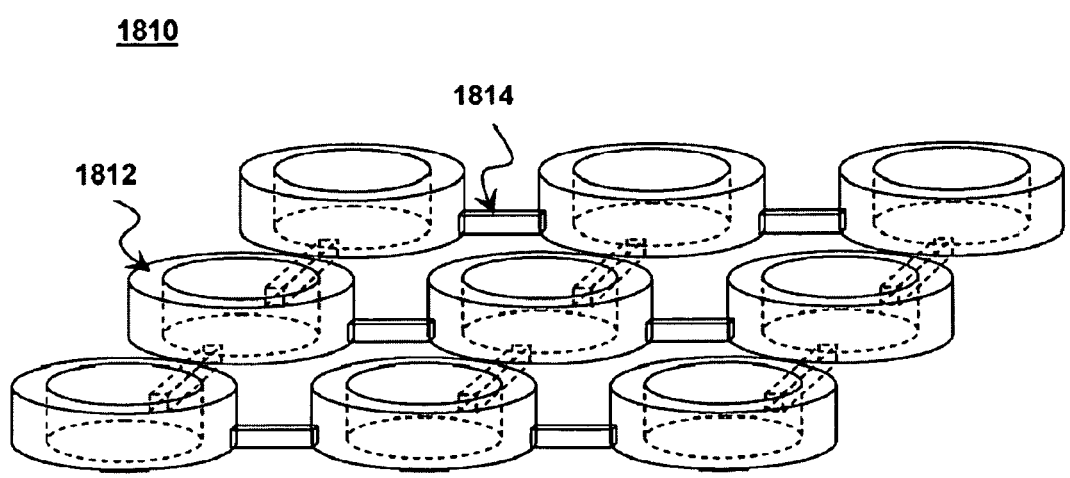
Figure 18C:
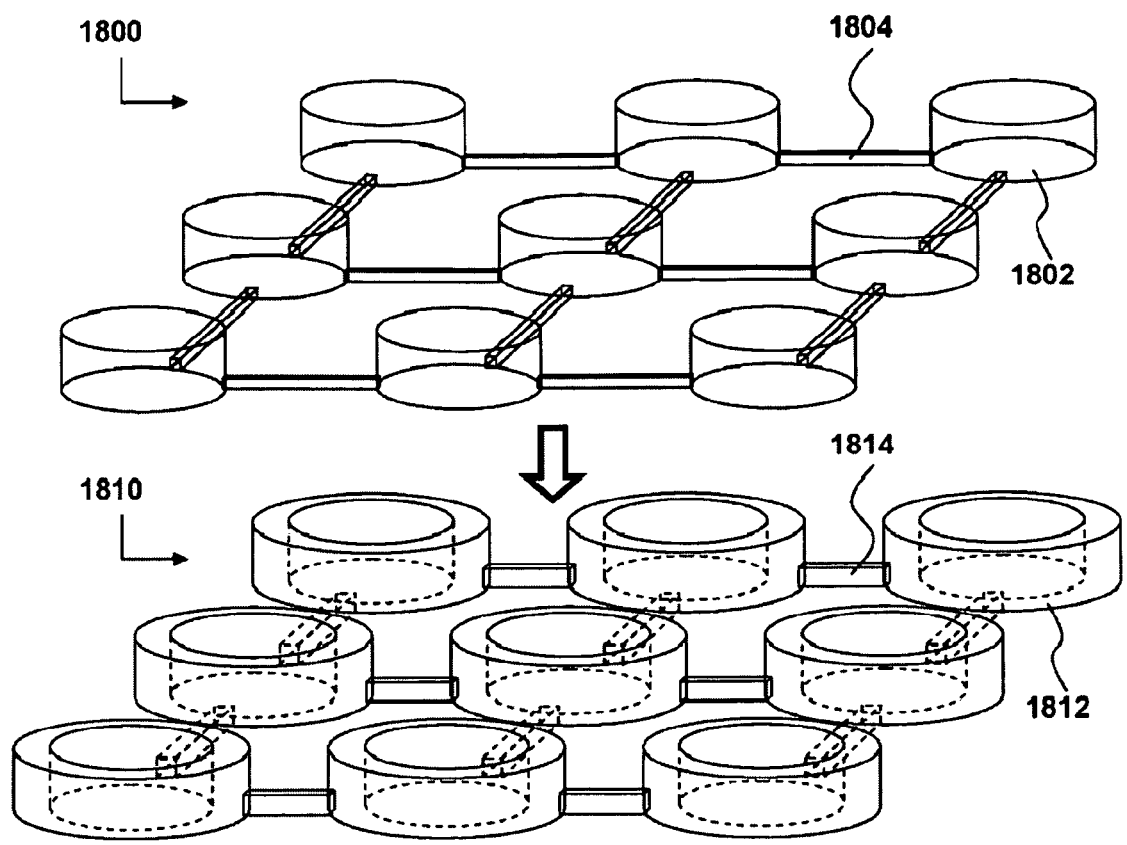

As shown in FIG. 18B, an array 1810 of housings 1812 can be fabricated, e.g., by injection molding. Each housing 1812 is positioned within the array 1812 such that it fits around a corresponding lenslet 1802 in the lenslet array 1800. Actuators (not shown) can be disposed in the housings 1812. The housings 1812 are connected by breakable bridges, tabs or connectors 1814. The housing connectors 1814 can be hollow or have U-shaped cross-section to allow the lenslet connectors 1804 to fit inside them. The housings 1812 may include slots that accommodate the lenslet connectors 1804 so that the lenslet array 1800 can nest within the housing array as shown in FIG. 18C.

Figure 18D:
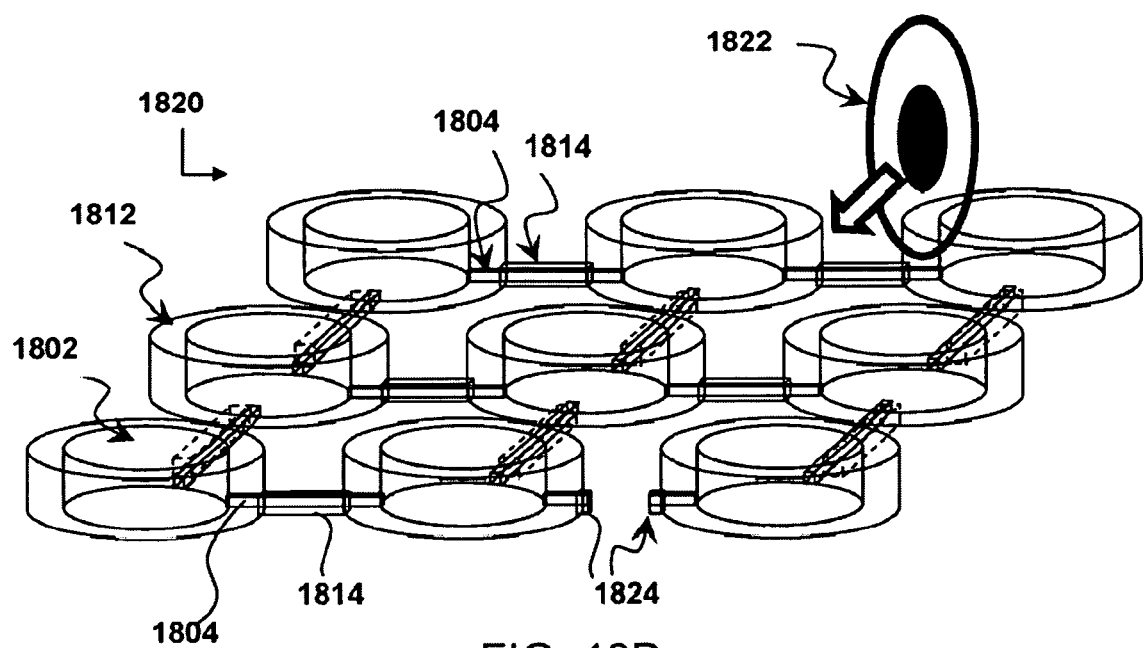
Figure 19A:
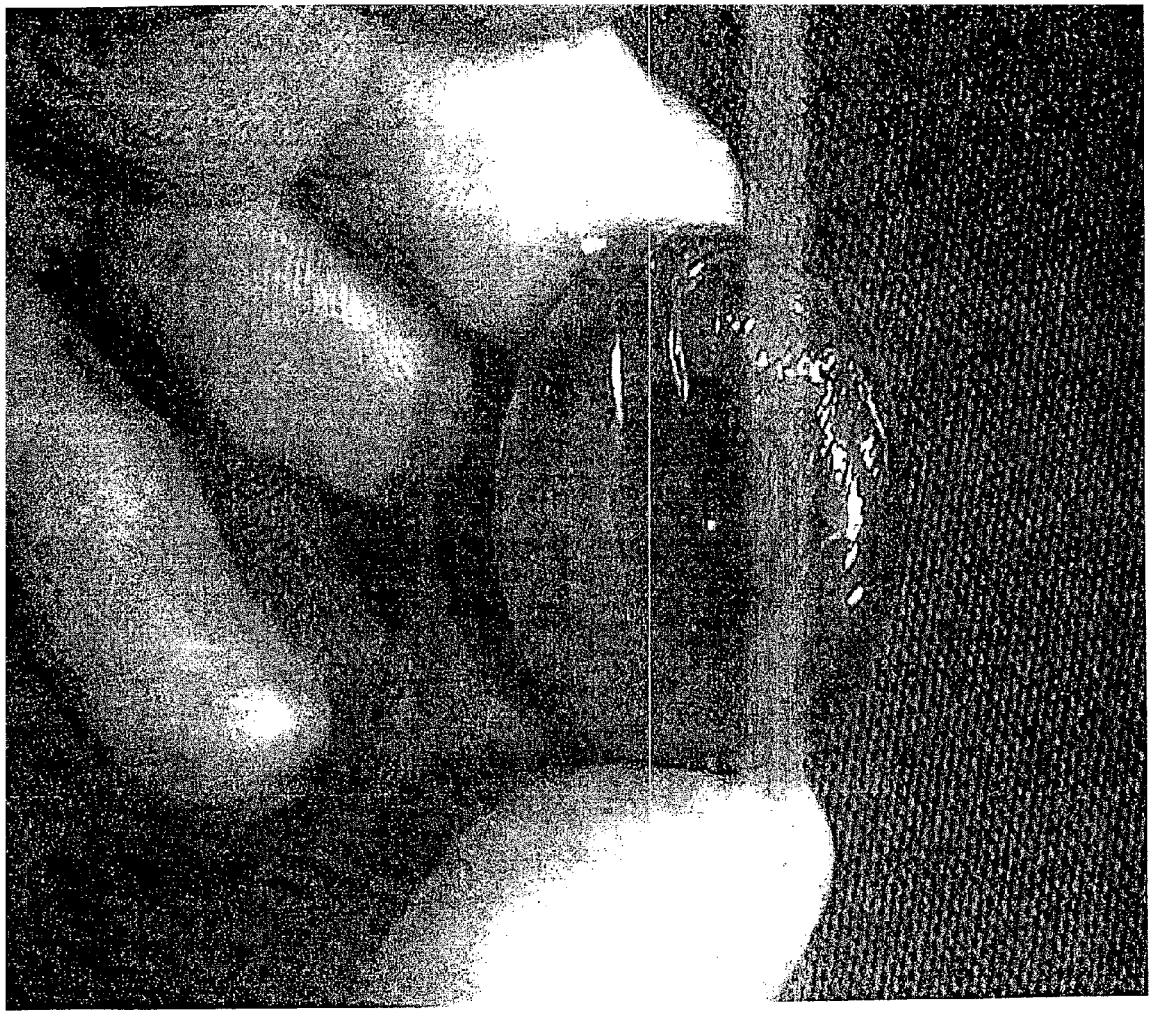
FIGS. 19A-19E are photographs of a fluidic lens according to an embodiment of the present invention.
Figure 19B:
Figure 19C:
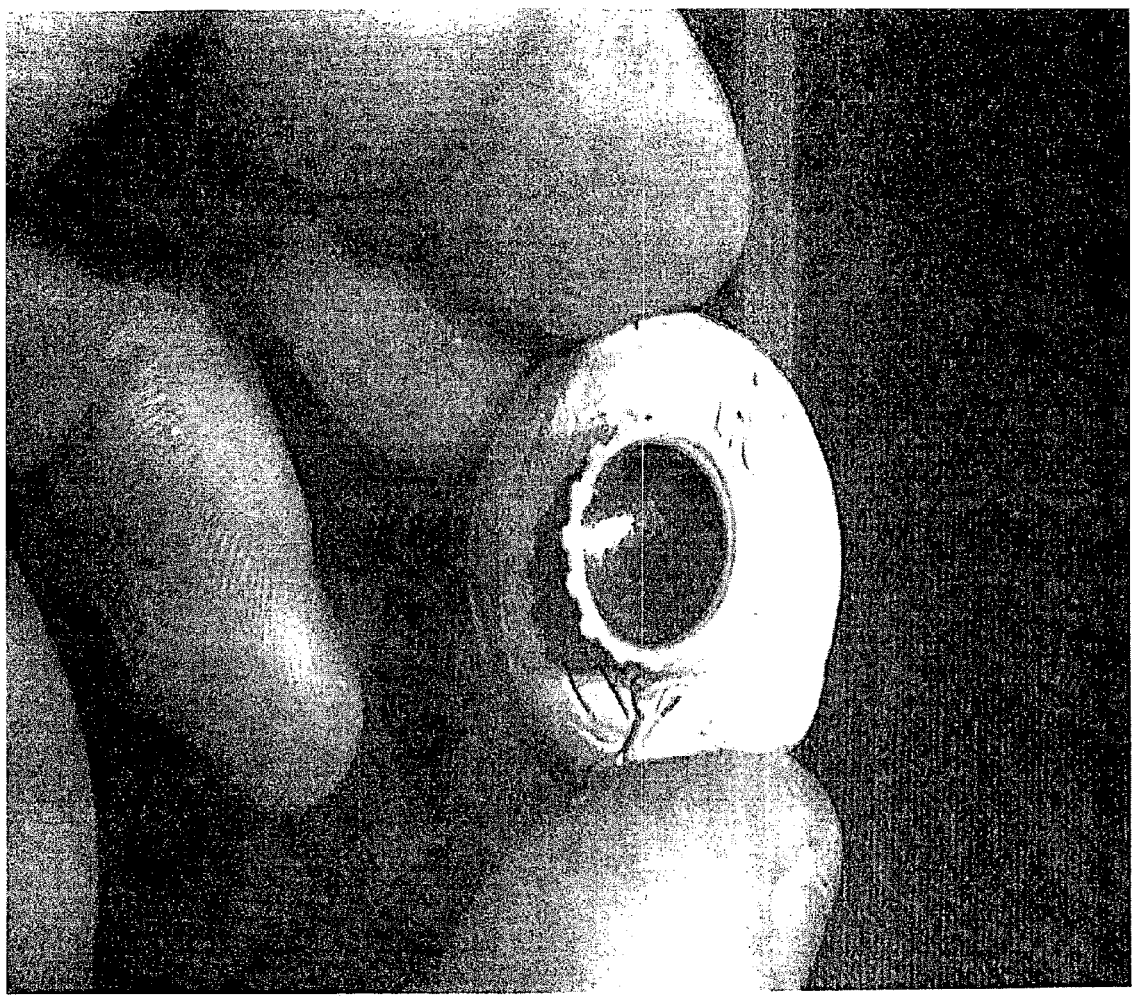
Figure 19D:
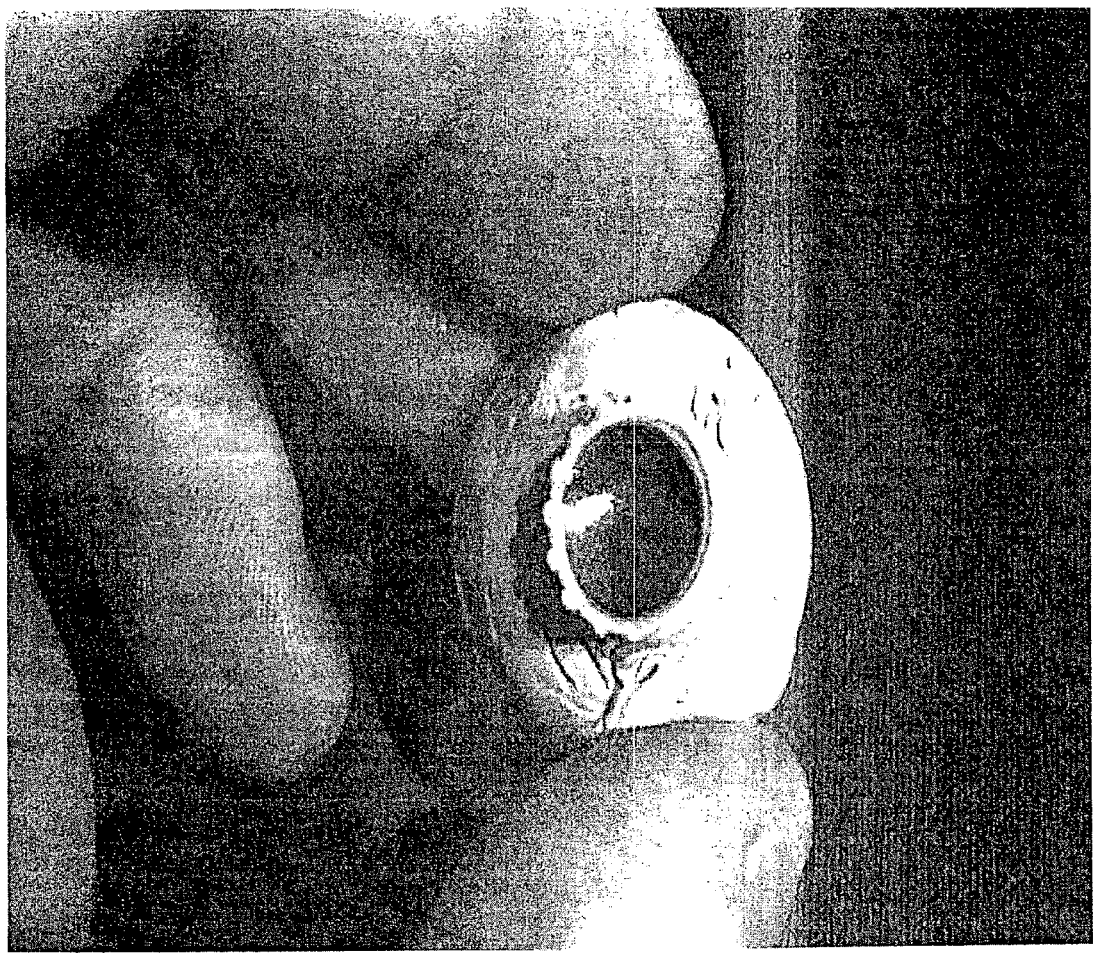
Figure 19E:
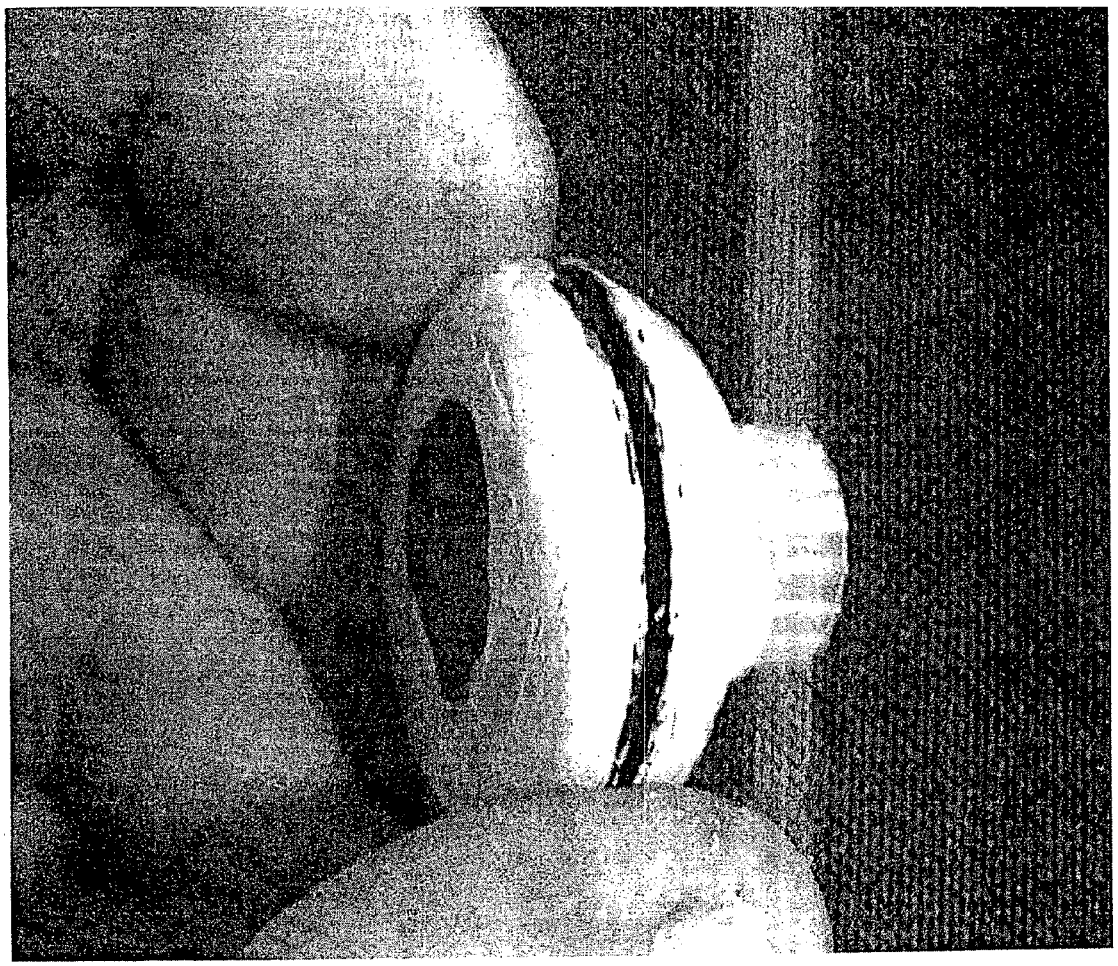

After the lens and housing arrays are nested together the assembled fluidic lenses 1820 containing the lenslets 1802 and the housings 1812 can be can be diced and sealed. For example, as depicted in FIG. 18D, the lenses 1820 can be separated by a hot knife or wheel 1822. The hot knife 1822 cuts the connectors 1804, 1814 and melts the ends 1824 thus sealing each lens 1820. Alternatively, the assembled fluidic lenses 1820 may be remain as an array and used as an array of optical devices with the devices being arrayed along axes substantially perpendicular, or at other angles, to their optical axes. Many variations in the volume fabrication process can be implemented; e.g., the lenslets 1802 can be filled after the lens array has been nested in the housing array.

FIGS. 19A-19E depicts photographs of an example of a fluidic lens according to an embodiment of the present invention. The lens skeleton was made from a rubber grommet. A groove in the outside of the grommet acts as a reservoir. Holes were drilled in the groove provide fluid communication with an aperture in the center of the grommet. The grommet was filled with water and encapsulated in Saran Wrap as the membrane.

Furthermore, although much of the preceding discussion addresses fluidic lenses, those of skill in the art will recognize that the features described herein can be applied to other optical devices such as variable mirrors, variable prisms, variable diffractive optics, variable irises, variable optical phase delays and adaptive optics. For example, in any of the above embodiments, one of the optical surfaces, e.g., an inside or outside surface of the compliant membrane may be coated with a reflective material such that the device is a variable mirror. In addition, embodiments of the present invention may include static optical components, e.g., lenses, diffraction gratings, reflective surfaces, optical filters, wave plates, holograms, optical wedges, prisms and the like incorporated within or in the proximity of a fluidic optical device. Such components may be incorporated, e.g., into the substrate 702A of the device 700 depicted in FIGS. 7, 8A-8F and 9A-9C or the base 1001 of the devices depicted in FIGS. 10A-10F. FIGS. 11A-11C and FIG. 25.

For example, referring again to FIG. 7, if part of the elastic membrane 706 is opaque, e.g., an annular region surrounding a central aperture transparent region 708, the device 700 may act as a variable iris or f-stop in addition to its other optical functions. For example, as the membrane expands due to fluid pressure or force from the actuator, the annular region can likewise expand, thereby increasing the diameter of the transparent region 708, similar to a variable iris. The opaque annular region may be disposed on the membrane 706 in a number of way; e.g., it may be printed or coated on or in the proximity of the membrane 706. If the membrane 706 expands such that the thickness of the fluid 704 between membrane 706 and substrate 702A changes when the distorting force is applied to the reservoir, the device 700 may act as a variable phase delay. If the membrane 706 includes diffractive elements, e.g., ruled lines or rings, formed on its, expansion of the membrane 706 can change the diffractive properties of the device. Furthermore, if the membrane 706 includes, or is pre-formed with, regions of varying thickness, such as a convex or concave lens surface, it can augment the focal power (or, refractive power) of the device 700.

Figure 26A:
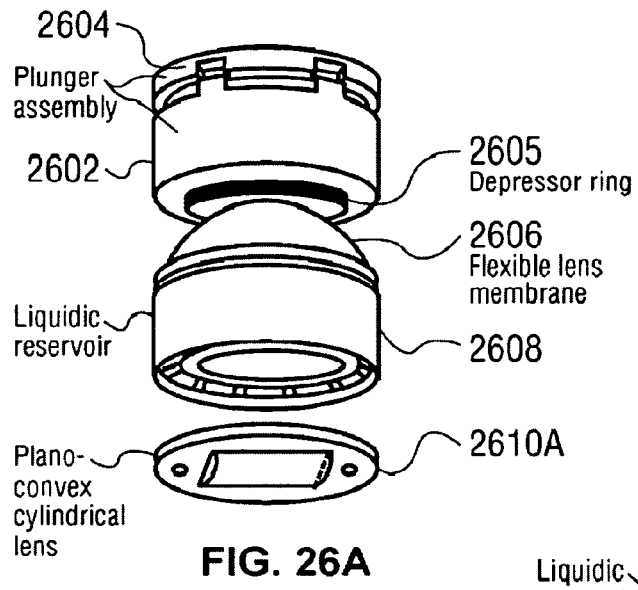
Figure 26C:
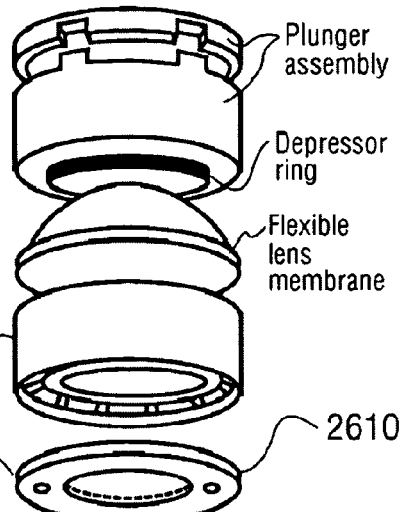
Figure 26B:
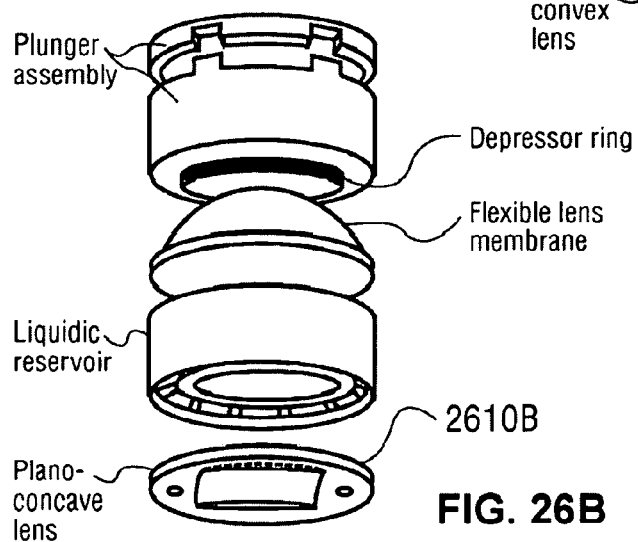

In alternative embodiments of the invention, it is possible to have a static optical component incorporated into a fluidic optical device. For example, FIG. 26 depicts several different versions of multi-singlet lens combinations based on the device illustrated and described above with respect to FIGS. 10A-10F, 11A-11C and 25. Each device generally includes a plunger assembly with a plunger ring 2602 and actuator ring 2604, a flexible membrane 2606, a reservoir 2608 and one or more static lenses. In FIG. 26A, the static lens 2610A is a plano-convex cylindrical lens, in FIG. 26B, the static lens 2610B is a plano-concave lens. In FIG. 26C, the static lens 2610C is a plano-convex lens. In FIG. 26D, the static lens 2610D is a plano-amorphic wide-view lens. In FIG. 26E, the static lens 2610E is a bi-convex or doublet lens. In FIG. 26F, the static lens 2610F is a fresnel lens. Those of skill in the art will recognize that other types of lenses or optical elements may be used in lieu of those described with respect to this embodiment. Furthermore, fluidic lenses of the types shown in FIG. 26A through FIG. 26F may incorporate features of other lens designs depicted herein. For example, the plunger ring 2602 may include a depressor ring 2605 that fits within an inside diameter of the reservoir 2608 in a manner similar to that described above with respect to FIG. 21.

Figure 27:
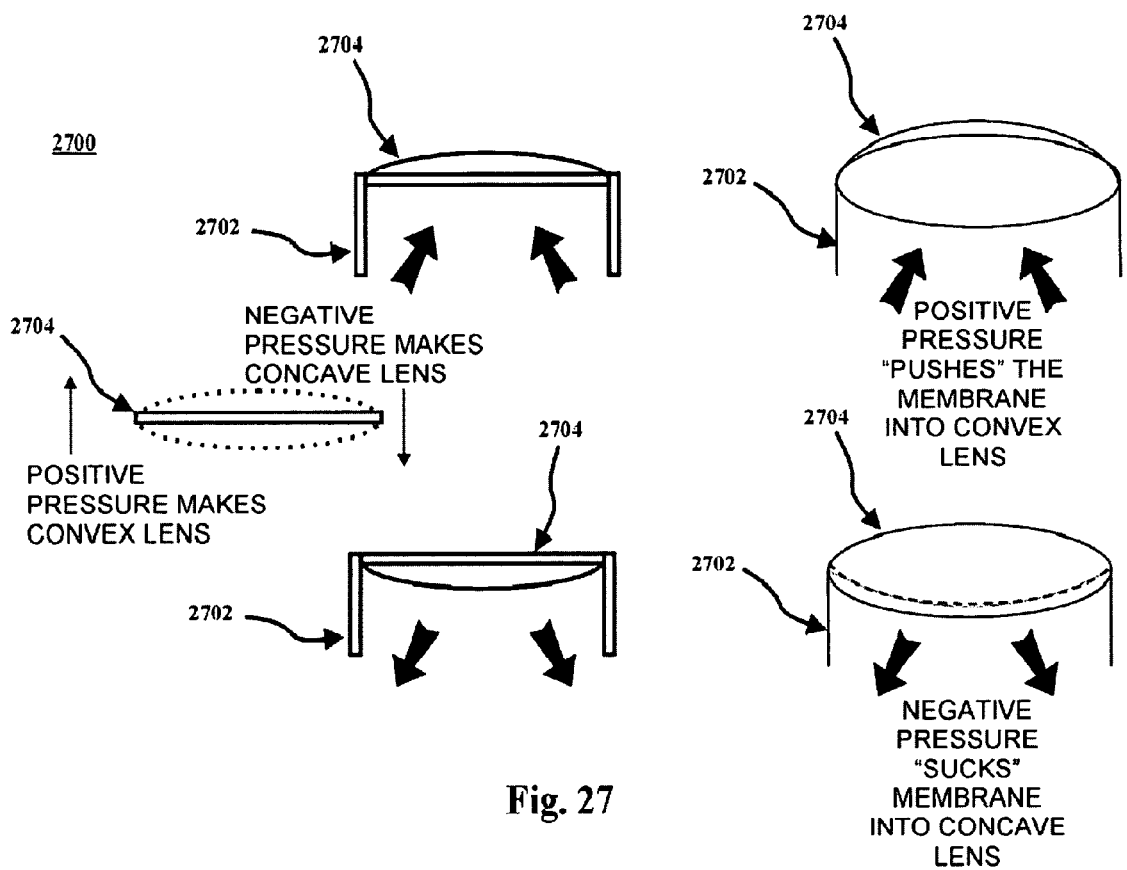
FIG. 27 is a schematic diagram illustrating operation of a dual throw fluidic lens according to an embodiment of the present invention.

In many of the preceding embodiments, application of a force on the fluid to the reservoir resulted in a deformation of a membrane to form a convex lens. However, embodiments of the invention are not limited by such a feature. Both convex and concave lens shapes may be obtained with embodiments of the present invention. For example, as depicted in FIG. 27, an optical device 2700 may have a cylindrical reservoir/aperture 2702 filled with fluid and covered by a membrane 2704. If there is a net positive pressure on the membrane 2704, e.g., the pressure of the fluid within the reservoir/aperture 2702 exceeds the atmospheric, elastic pressure of the membrane itself or other pressure from outside the membrane, fluid displacement pushes the membrane 2704 outward shaping the membrane into a convex lens. If there is a net negative pressure, e.g., the atmospheric/elastic pressure exceeds the fluid pressure, the fluid displacement "sucks" the membrane 2704 into a concave lens shape. The membrane may be in convex, planar or concave shape in the absence of an actuating force depending on how the device is filled with fluid. For example the reservoir/aperture 2702 may be sufficiently filled with fluid and the membrane 2704 sufficiently taut that it is planar at atmospheric pressure. By withdrawing some fluid from the aperture/reservoir 2702 the membrane may assume a concave shape and by adding fluid to the reservoir the membrane may assume a convex shape.

Figure 28:
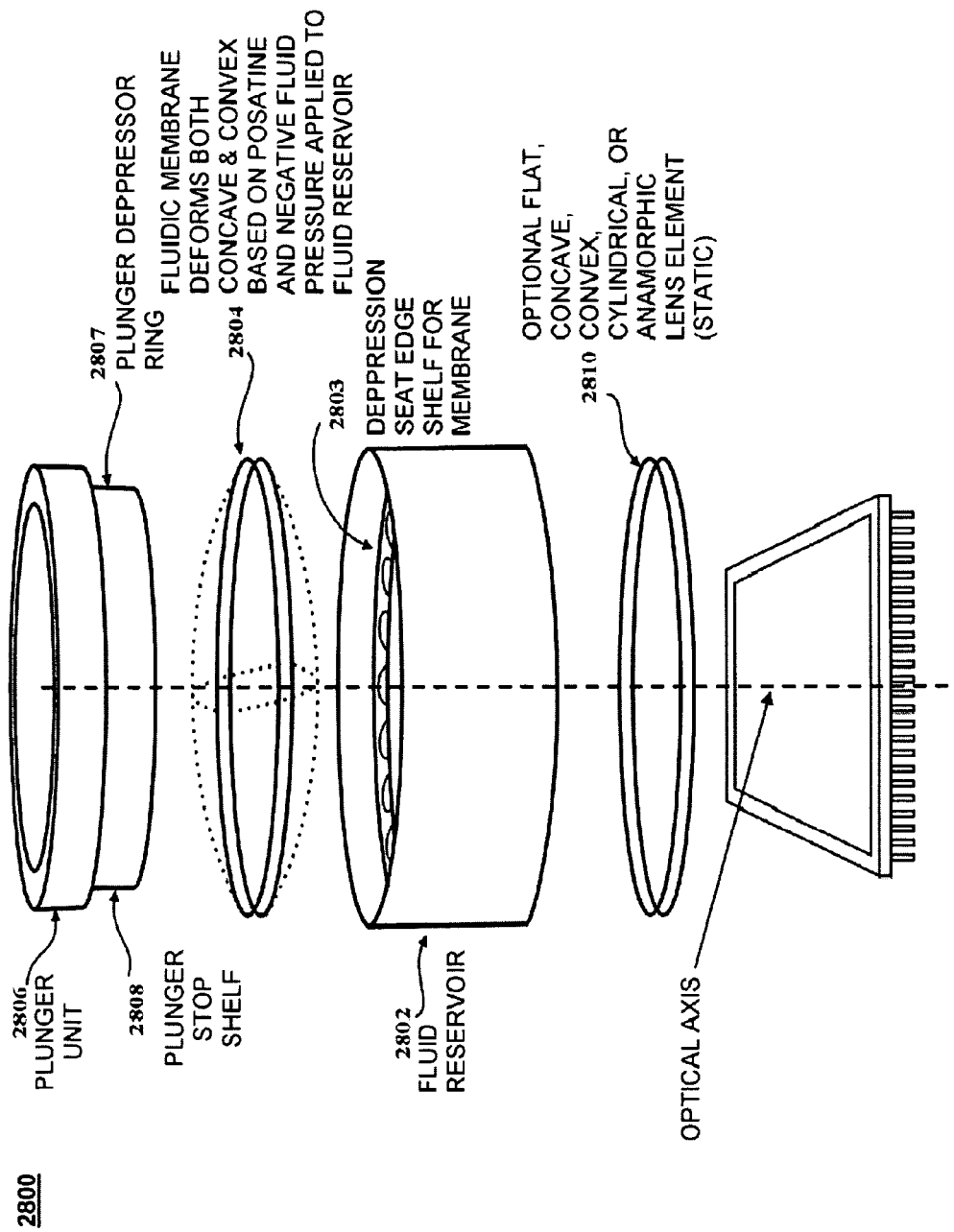
FIG. 28 is a three-dimensional exploded schematic diagram of a bi-directional single surface fluidic lens according to an embodiment of the present invention.

A fluidic lens 2800 with bi-directional actuation as described above may be constructed as depicted in FIG. 28. The lens may have the general construction described above with respect to FIG. 10A-10F, 11A-11C, 25 or 26. Fluid is contained in a reservoir 2802 that is covered by a membrane 2804 and has a base 2808, which may be an optical flat, a concave, convex, cylindrical or anamorphic lens element. A plunger 2806 exerts pressure on the fluid through the membrane 2804. The membrane 2804 can deform in either a convex or concave fashion depending on whether a net positive or negative pressure is applied to the fluid in the reservoir 2802.

Figure 54:
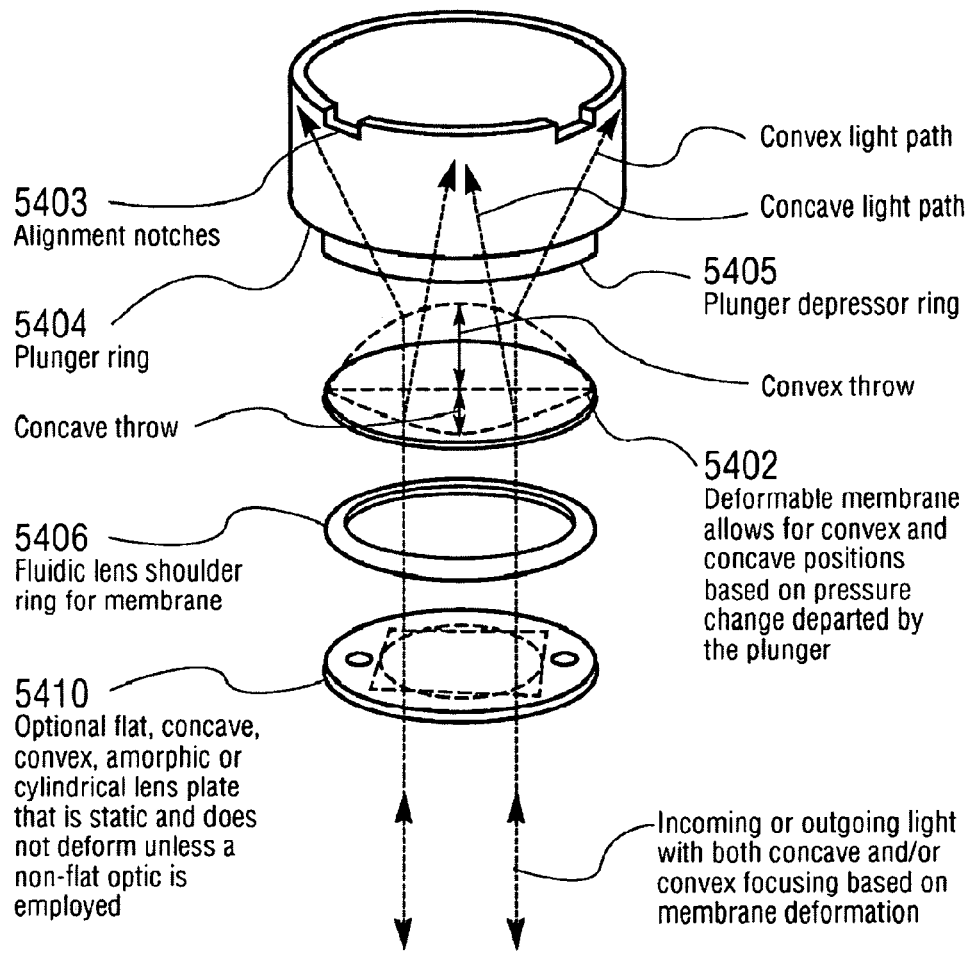
FIG. 54 depicts a bi-directional fluidic lens according to an embodiment of the present invention.

FIG. 54 depicts an alternative design of a fluidic lens 5400 with bi-directional actuation. This lens design is similar to that depicted in FIG. 21. The lens 5400 includes deformable membrane 5402 between a plunger ring 5404 and shoulder ring 5406. The plunger ring 5404 includes alignment notches 5403 and a depressor ring 5405 that fits within an inside diameter of the shoulder ring 5406 and engages the membrane 5402. Fluid is contained between the membrane 5402, shoulder ring 5406 and a base plate 5410, which may be an optical flat, concave, convex, anamorphic or cylindrical lens that is static and does not deform. The membrane 5402 allows for convex and concave deformation based on the pressure and fluid displacement imparted by the plunger ring 5404.

Figure 65A:
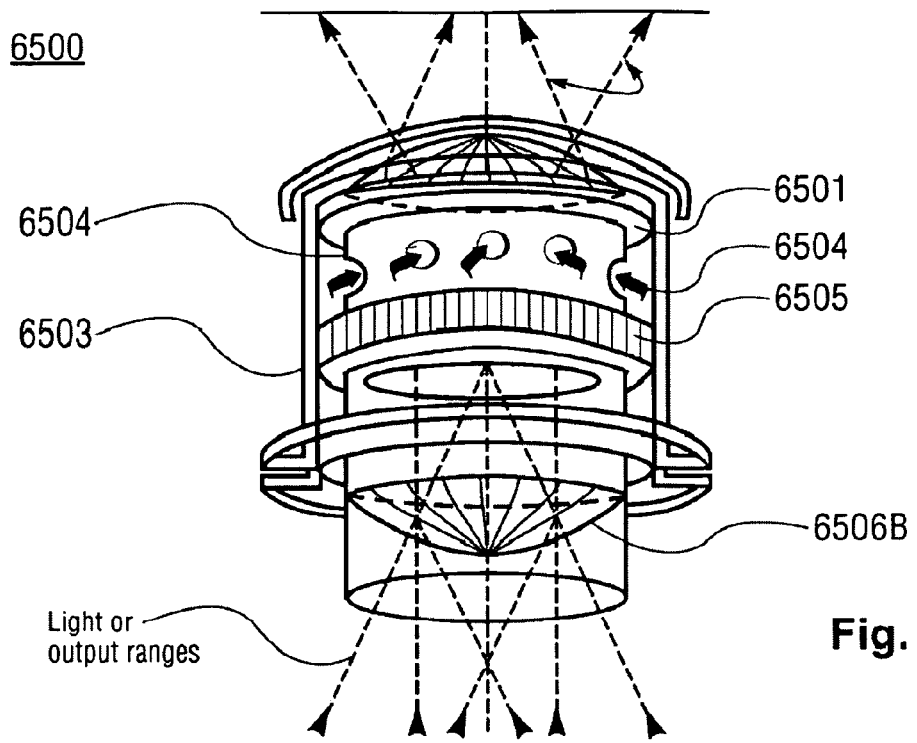
FIGS. 65A-65B depict an example of a fluidic lens having dissimilar lens surfaces according to an embodiment of the present invention.
Figure 65B:
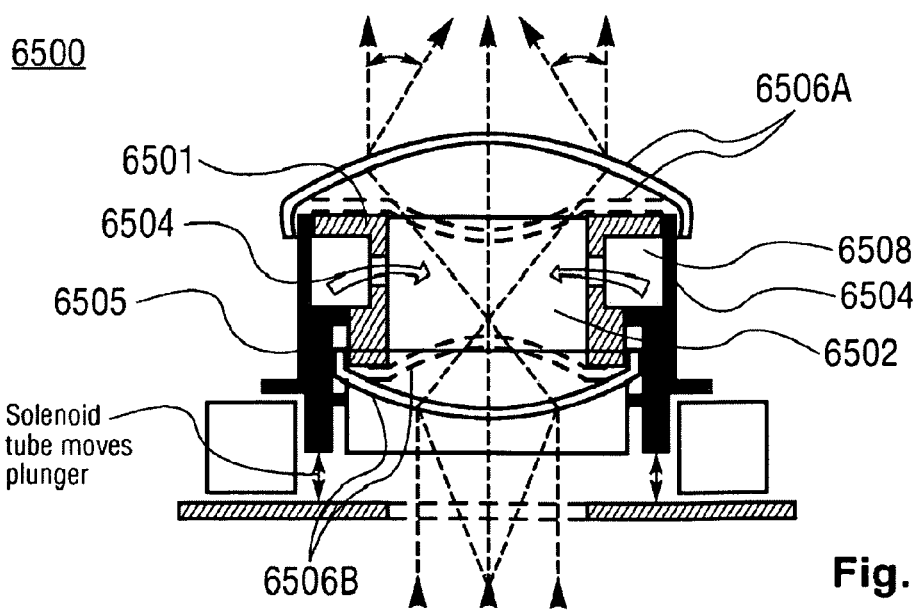

Additional embodiments of the present invention include fluidic devices having dissimilar deformable optical surfaces. For example, FIGS. 65A-65B depict a fluidic lens 6500 having dissimilar lens surfaces. The lens 6500 generally includes a spool-shaped skeleton 6502. The skeleton 6502 is disposed within an outer case 6503. A fluid reservoir 6508 is defined between a flange 6501 of the skeleton, the outer case and a plunger 6505 having a plunger ring and a plunger tube. Flow holes 6504 provide fluid communication between the reservoir 6508 and a central aperture. Openings at either end of the skeleton 6502 are covered with deformable membranes. A larger bi-directional membrane 6506A covers the end near the flange. A smaller bi-directional membrane 6506B covers the opposite end. The smaller membrane 6506B fits within the plunger 6505. A fluid fills the volume bounded by the membranes, outer case, skeleton and plunger. An actuator, e.g., a solenoid coil and magnet ring assembly coupled to the plunger tube, moves the plunger ring causing a positive or negative displacement of the fluid thereby causing the membranes to assume a convex, planar or concave shape.

Figure 29A:
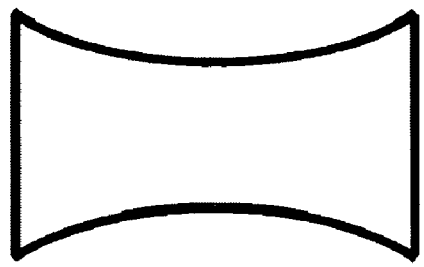
FIGS. 29A-29C is a sequence of schematic diagrams illustrating operation of an alternative dual through fluidic lens according to an embodiment of the present invention.
Figure 29B:
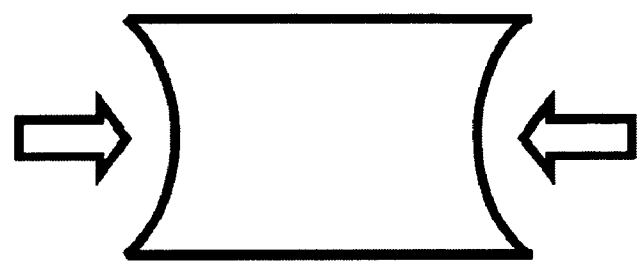
Figure 29C:
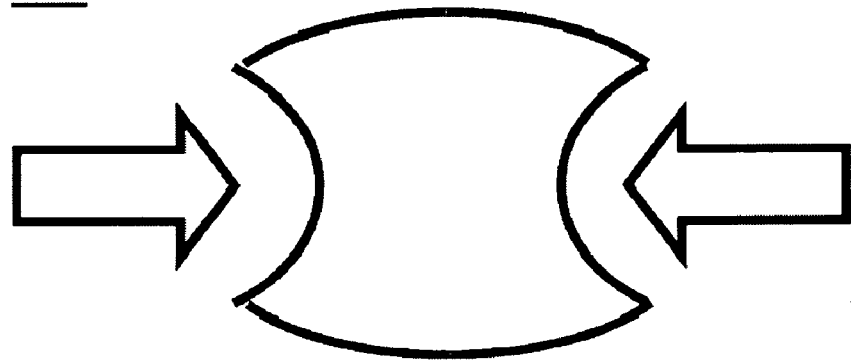

FIG. 29A, FIG. 29B and FIG. 29C respectively illustrate planar, concave and convex shapes for a fluidic lens 2900 of the type described above, e.g., with respect to FIGS. 1A-1B, 2A-2L and 24. In FIG. 29A, the lens 2900 is in a planar rest state with no actuation force applied. In this case the fluidic lens 2900 is under negative pressure in the rest state, e.g. due to withdrawal of some fluid after an initial filling. The fluidic lens 2900 shown in bi-concave state, shown for the sake of example. The lens 2900 has a negative focal length in the rest state. In FIG. 29B, the lens 2900 is in an intermediate state. A slight actuation force (represented by arrows) is applied, e.g., by a peripheral constriction. The optical surfaces of the lens are planar and parallel (plano-plano). In this state, the fluidic lens has a generally infinite focal length. In FIG. 29C, the lens is in a state of maximum applied actuation force. The greater actuation force applied causes the membrane to assume a bi-convex state in this example. As a result the fluidic lens has a positive focal length.

The previous embodiments can be utilized in order to help realize some of the design principles discussed above; specifically, minimizing the strain induced in the membrane while maximizing the resulting range in focal power for the fluidic lens. In such an embodiment, the maximum volume of fluid that can be displaced is a generally fixed value. The fluidic lens is fabricated such that with no actuation force applied (and, hence, no displacement of fluid) the membrane is concave and thereby contributes negative focal power to the fluidic lens. With the application of a medium actuation force corresponding to a displacement of a volume of fluid approximately equal to half of the maximum fluid displacement, the membrane generally flattens out and thereby contributes generally zero focal power to the fluidic lens. When the maximum actuation force is applied (resulting in the maximum displacement of fluid) the membrane is concave and thereby contributes positive focal power to the fluidic lens. In this fashion, the maximum volume of fluid that can be displaced is fully utilized in order to realize a large range of focal power. Likewise, by causing the sign of the strain on the membrane to alternate as the membrane moves between the concave and convex states, the maximum absolute value of strain that is induced on the membrane is reduced. As described above, static lenses can be used in conjunction with the fluidic lens and can be used in order to add or subtract a static amount of focal power to or from the fluidic lens.

Figure 30A:
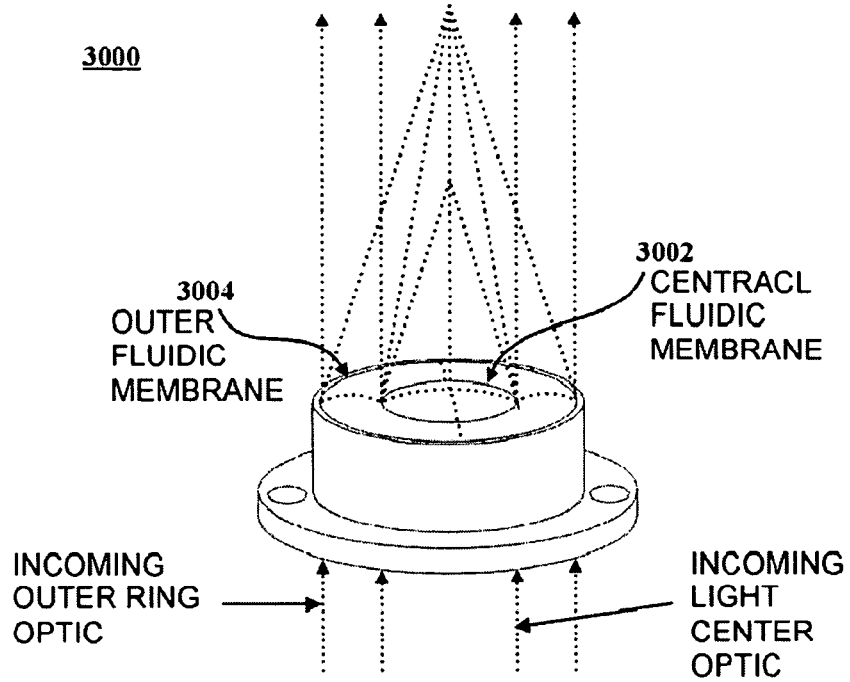
FIG. 30A is a three-dimensional schematic diagram of a bi-focal fluidic lens according to an embodiment of the present invention.

Furthermore, although in embodiments described above the membrane deforms in such a way as to provide a single focus it is possible to configure fluidic lenses as multiple focus, e.g., bi-focal or tri-focal lenses. For example, FIG. 30A depicts an example of a bi-focal fluidic lens 3000. The lens 3000 includes a central fluidic membrane 3002 and an outer fluidic membrane 3004 in the form of an annular sheet that surrounds the central membrane 3002. The inner and outer membranes are respectively part of inner ring and outer ring optics. The two membranes are sufficiently mechanically decoupled from each other to such a degree that they deform in a manner that provides different focal properties for light entering the inner and outer ring optics. The mechanical decoupling of the membranes may be accomplished by a stiffening ring that acts as a physical boundary to separate a single membrane in to the inner and outer sections.

Figure 30B:
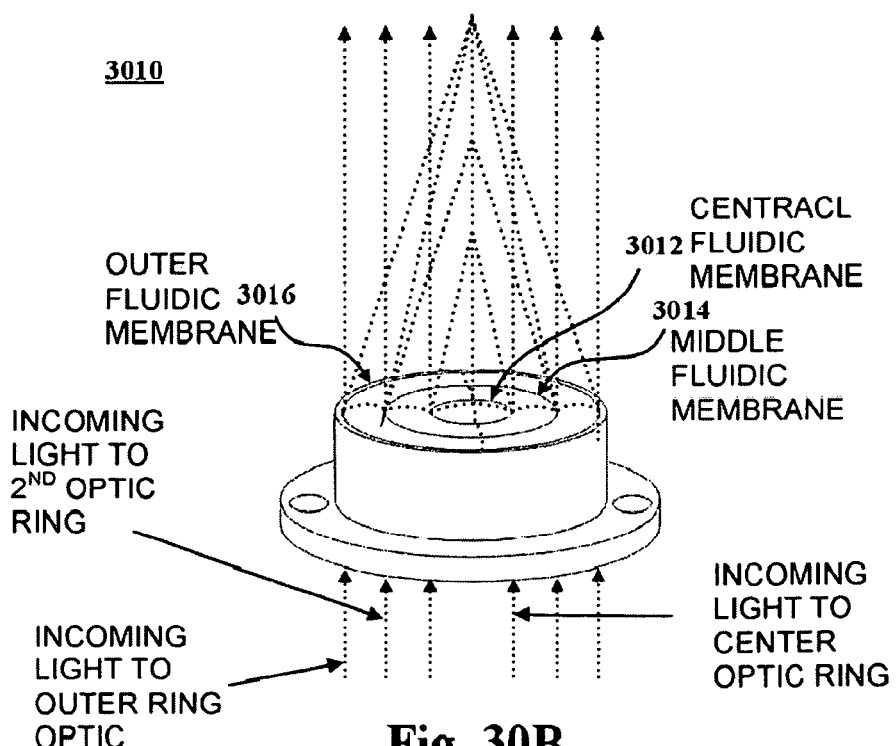
FIG. 30B is a three-dimensional schematic diagram of a tri-focal fluidic lens according to an embodiment of the present invention.

FIG. 30B depicts a tri-focal fluidic lens 3010 having central 3012, middle 3014 and outer 3016 fluidic membranes that respectively are part of central, middle and outer ring optics. The three membranes 3012, 3014, 3016 are sufficiently mechanically decoupled from each other that they deform in a manner that provides different focal properties for light entering their respective regions.

Variations on the concepts described above with respect to FIG. 30 and FIG. 30B may be used to address optical aberrations. Many optical systems are limited in their performance by optical aberrations. These aberrations can be compensated by the addition of an optical element that provides the exact opposite aberrations as the system induces. This technique has been applied successfully for many different optical systems in several different ways. Sometimes this compensation can be applied with a static optic if the aberrations do not vary with time. One example is a Schmidt-Cassegrain telescope which uses a static refractive plate at the front surface of the telescope to compensate for the spherical aberration induced by the spherical telescope primary mirror.

When the aberrations vary with time, an active control technique called adaptive optics can be applied. In adaptive optics, a sensor like a Shack-Hartmann wavefront sensor or an interferometer measures the aberrations and an adjustable optic like a deformable mirror or liquid crystal spatial phase modulator to compensate the aberrations. A simple version of this system is in every compact disk (CD) player. In such a system, a sensor is used to determine the focus of the beam reflected from the CD and an electromagnetic actuator is used to move the position of a lens to compensate for the focus. More complex versions exist at almost every large astronomical observatory to compensate for the aberrations induced by the atmosphere.

Unfortunately, the complexity and cost increase between the adaptive optics system in a commercial product such as a CD player and that used in an astronomical observatory is substantial. Typical CD players sell for less than $30 today. Complex adaptive optics systems in observatories are often more than $10 million. It is this cost that has prohibited the introduction of adaptive optics into lower end optical systems like lasers and microscopes. A substantial portion of this cost is the deformable mirror. Embodiments of the present invention allow for a low-cost alternative to the deformable mirror using fluidic optics. Fluidic optics can be tailored to produce the higher-order aberration compensation.

Figure 66A:
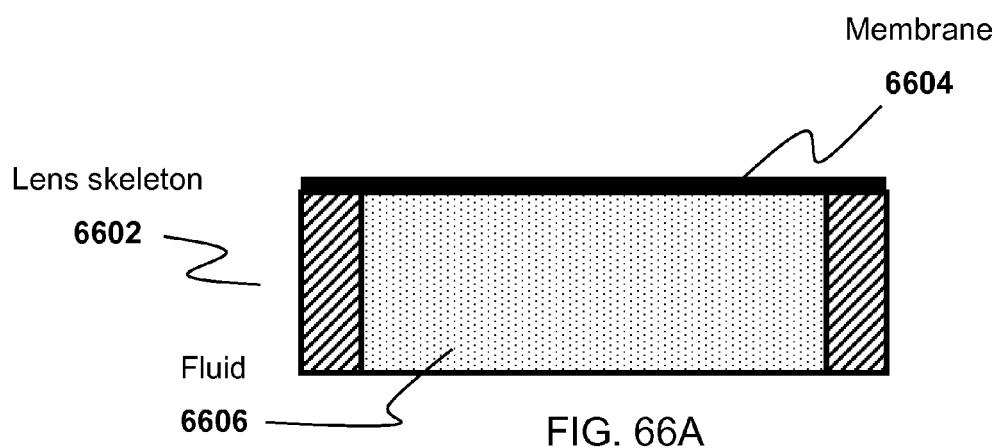
FIGS. 66A-66B are cross-sectional views of a fluidic lens having a variable elasticity membrane according to an embodiment of the present invention.
Figure 66B:
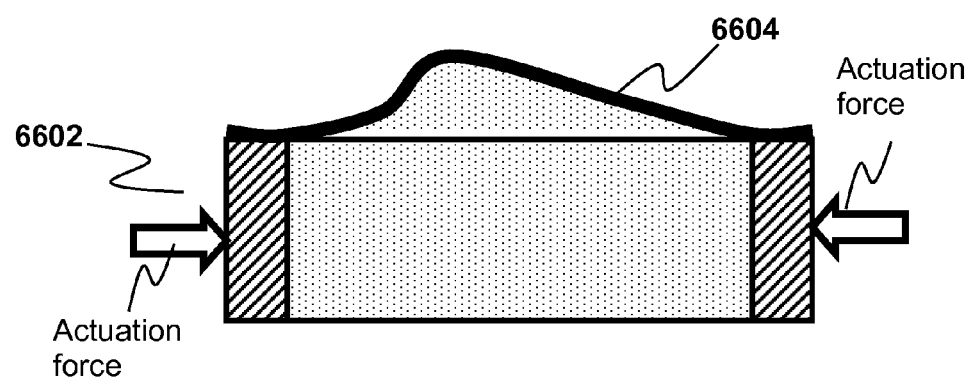

For example, in alternative embodiments of the invention, the elasticity and other mechanical and physical properties of the membrane can spatially vary over any portion of its surface, including but not limited to portions disposed in or near the clear optical aperture. For example, FIGS. 66A-66B depict a fluidic lens 6600 having a lens skeleton 6602 and a variable elasticity membrane 6604. A volume bounded by the skeleton 6602 and the membrane 6604 is filled with a fluid 6606. An elasticity of the membrane 6604 varies spatially over its surface. As shown in FIG. 66B, due to the variable elasticity, the membrane 6604 deforms under an actuation force in a way that allows for control of the shape of wavefronts of radiation refracted (or reflected) by the membrane 6604 and fluid 6606. The fluidic lens 6600 can perform spherical, aspheric, parabolic, high-order aberration, or other optical functions for the purpose of controlling or modifying the phase, amplitude and frequency of light transmitted through the lens.

Figure 66C:
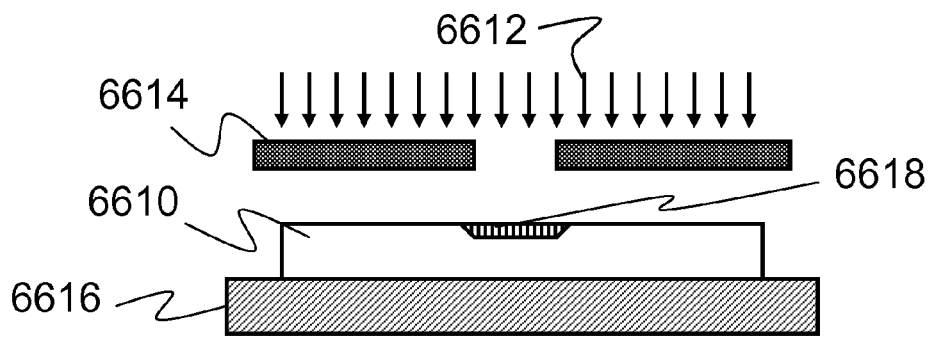
FIG. 66C is a schematic cross-sectional diagram illustrating doping to make a variable elasticity membrane according to an embodiment of the present invention.

There are a number of different approaches to giving the membrane a variable elasticity. For example as depicted in FIG. 66C, the composition of a membrane material 6610 may be changed during formation via the incorporation of a dopant 6612 that stiffens the membrane material 6610. The stiffening may be patterned by implanting the dopant through openings in a mask 6614 as the membrane material is held in a mold 6616. Regions of doped membrane material 6618 are stiffened as a result of the doping. This assumes that the membrane is cast from a liquid into a solid and that a dopant can be added either during the formation of the membrane or implanted into the cast membrane.

Figure 66D:
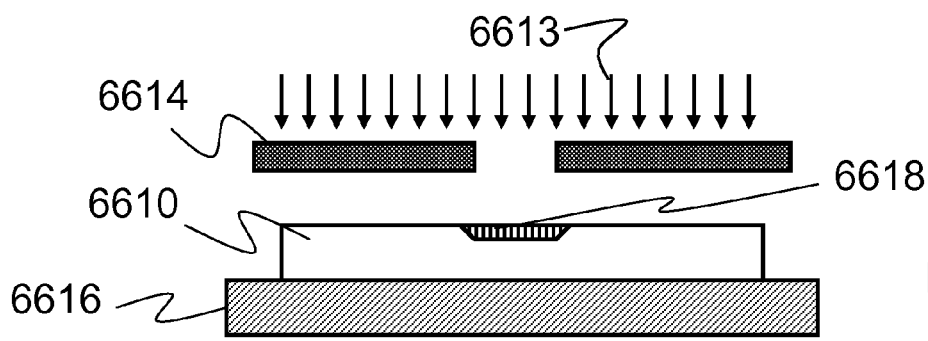
FIG. 66D is a schematic diagram illustrating the use of spatially varying ultraviolet to make a variable elasticity membrane according to an embodiment of the present invention.

Alternatively, as depicted in FIG. 66D, the membrane material 6610 may be selectively stiffened by changing its crosslink density. For example, if the membrane material 6610 is UV curable, it may be exposed to a spatially modulated intensity of UV radiation as the membrane material is held in a mold 6616. In the example depicted in FIG. 66D, the spatial intensity of UV radiation is varied through the use of a mask disposed between the membrane material 6610 and the source of UV radiation. Regions 6618 that are exposed to the UV radiation are stiffened as a result.

Figure 66E:
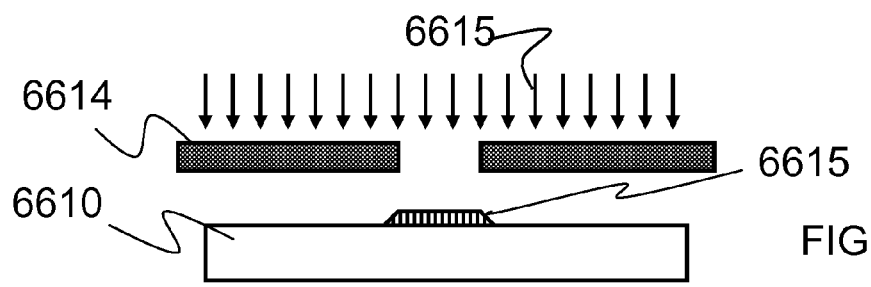
FIG. 66E is a schematic diagram illustrating deposition of a stiffer material to make a variable elasticity membrane according to an embodiment of the present invention.

Alternatively, as depicted in FIG. 66E, the membrane material 6610 may be selectively stiffened by deposition of a stiffer second material 6615 on the membrane 6610 after the membrane has been formed. The stiffer material 6615 might be deposited through a mask 6614 as shown in FIG. 66E or can be patterned lithographically.

Figure 66F:
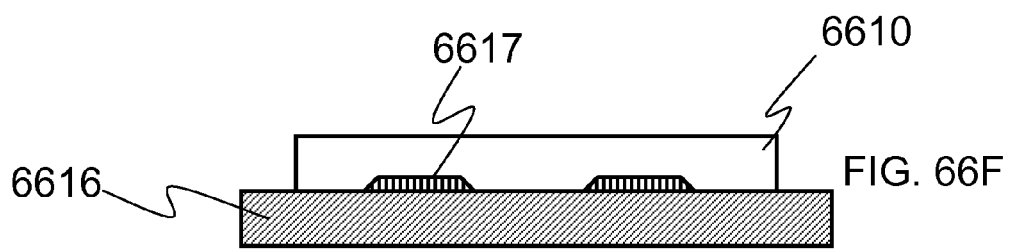
FIG. 66F is a schematic diagram illustrating incorporation of a second material into a membrane to make a variable elasticity membrane according to an embodiment of the present invention.

In addition, as depicted in FIG. 66F, the membrane may be stiffened by incorporation of a second material 6617 into the membrane material 6610 during casting. This assumes that the membrane is cast from a liquid into a solid and that a second material can be incorporated into the membrane material 6610 during the casting, possibly by just casting the membrane over the top of the material. Of course, the material should be of very similar refractive index so that it disappears in the membrane. The second material 6617 e.g., fiberglass, might be cast from a liquid as well onto the mold or might be formed elsewhere and placed onto the mold.

Figure 66G:
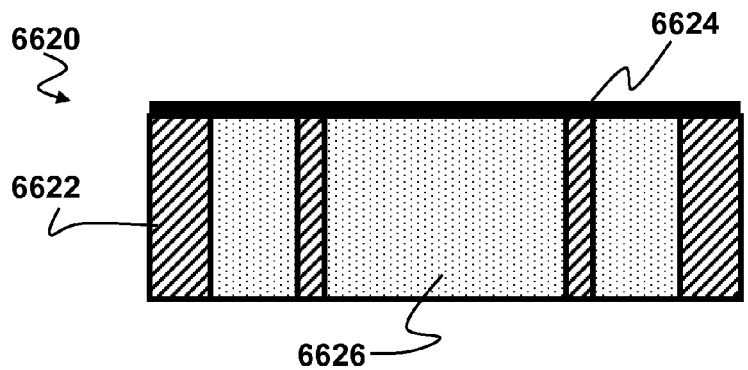
FIGS. 66G-66H are schematic cross-sectional diagrams illustrating a fluidic optical device having a constrained, variable elasticity membrane.
Figure 66H:
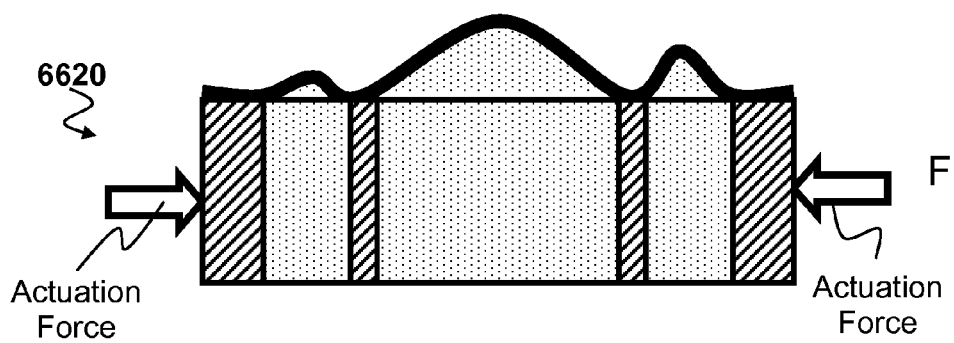

Other approaches to variable elasticity membranes include selective constraint of the membrane. For example, FIGS. 66G-66H depict a fluidic lens 6620 having a skeleton 6622 and membrane 6624 that enclose a fluid 6626 and define a clear optical aperture. Portions of the membrane 6624 can be constrained including but not limited to portions disposed in or near the clear optical aperture. This can be achieved by fixing selected portions of the membrane 6624 to the lens skeleton 6622 or other rigid structure or a structure that can be actuated. Upon application of an actuation force, the membrane deforms in a patter that depends on the pattern of constraint, as depicted in FIG. 66H.

Figure 66I:
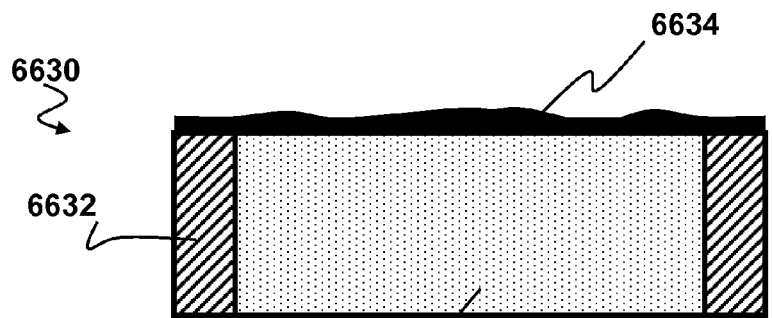
FIGS. 66I-66J are schematic cross-sectional diagrams illustrating a fluidic optical device having a variable thickness membrane.
Figure 66J:
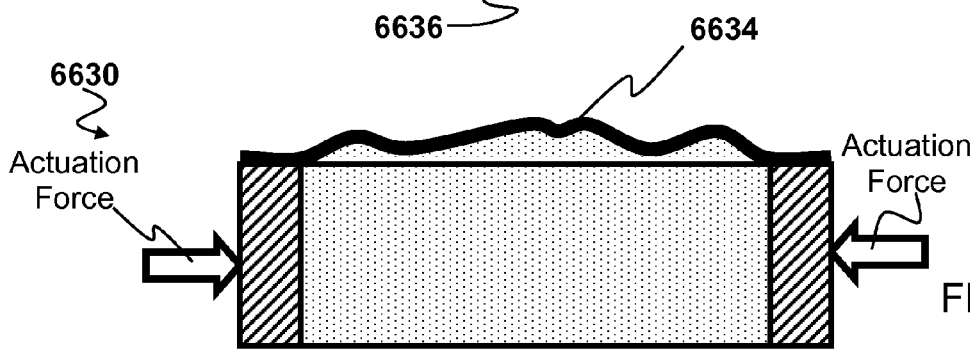

An alternative approach to variable elasticity membranes is to vary the membrane thickness. For example, FIGS. 66I-66J depict a fluidic lens 6630 having a skeleton 6632 and membrane 6634 that enclose a fluid 6636 and define a clear optical aperture. The membrane 6634 has a variable thickness. The thickness of the membrane 6634 can spatially vary over any portion of its surface, including but not limited to portions disposed in or near the clear optical aperture. Generally speaking, the thicker portions are less elastic than the thinner portions. Thus, the membrane 6634 deforms non-uniformly when an actuation force is applied as shown in FIG. 66J. There are a number of different approaches to varying the thickness of the membrane 6634. For example, the membrane 6634 may simply be molded with a variable thickness using a variable depth mold. Alternatively, a combination of lithography and binary optics may be used to from a variable thickness membrane as described in U.S. Pat. No. 4,895,790 to W. Weldkamp, the disclosures of which are incorporated herein by reference. The membrane may alternatively be build up as is done in formation of binary optics. A combination of gray-scale lithography and etching (e.g., in an $O_2$ plasma) may also be used to make a variable thickness membrane. Furthermore, membrane material may be sprayed through a mask with very fine holes of varying pitch (duty cycle) to form the desired variable thickness pattern.

Yet another possibility for providing a variable elasticity fluidic lens is to combine an elastic membrane with a patterned overlay. For example, FIGS. 66K-66M illustrate an example of a fluidic lens 6640 having a skeleton 6642 and membrane 6644 that enclose a fluid 6646. A patterned overlay 6648 is disposed proximate the membrane 6644 with the membrane being between the fluid 6646 and the overlay 6648. Openings 6649 in the overlay 6648 allow portions of the membrane 6644 to expand when an actuation force is applied. However, as shown in FIG. 66M, the solid portions of the overlay 6648 constrain other portions of the membrane 6644 thereby producing a desired deformation pattern.

Figure 67B:
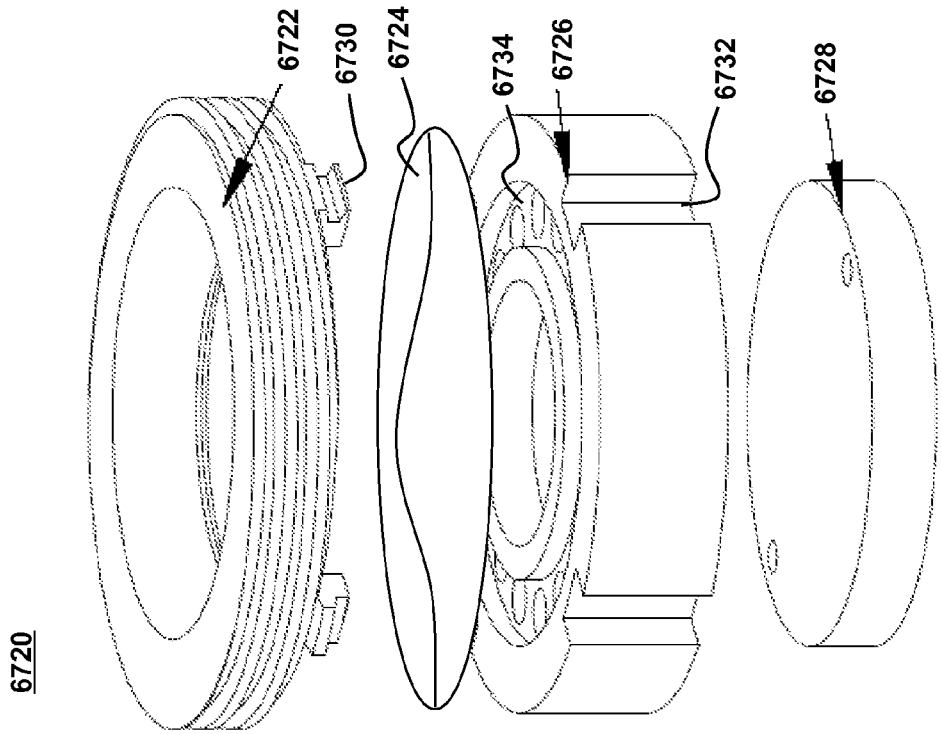
FIGS. 67A-67B are exploded view diagram of a fluidic lens according to an alternative embodiment of the present invention.
Figure 67A:
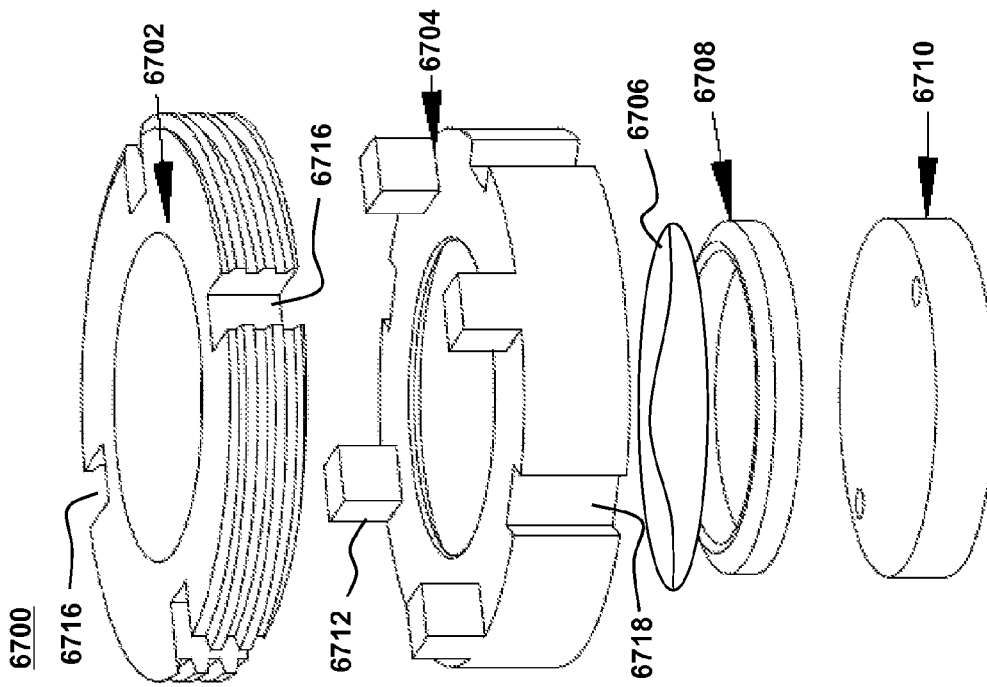
Figure 67C:
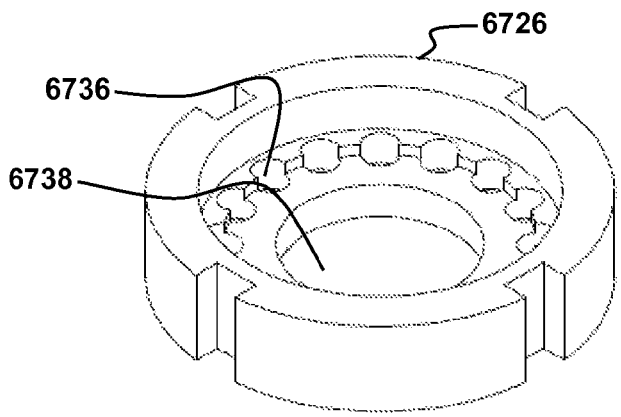
FIG. 67C is a three-dimensional diagram of a lens skeleton used in the fluidic lens of FIG. 67B.
Figure 67D:
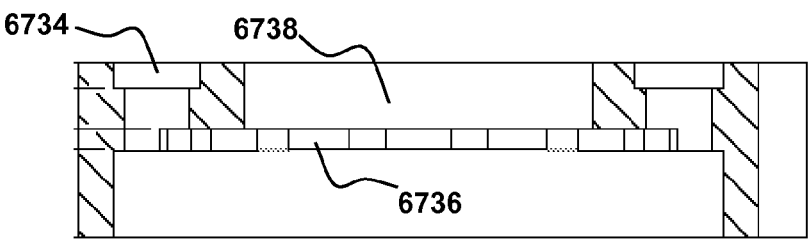
FIG. 67D is a cross-sectional diagram of the lens skeleton of FIG. 67C taken along line D-D.

There are a number of mechanical actuation schemes for fluidic devices of the types described above. One particular scheme, amongst others, uses a lead screw mechanism to provide the actuation force. FIGS. 67A-67B illustrate two different possible constructions for such devices. The device 6700 of FIG. 67A uses an externally threaded lead screw 6702, an outer ring 6704, an inner ring 6708 and a round blank 6710. A flexible membrane 6706 is disposed between the inner and outer rings. The inner ring 6708 may be similar or identical in structure to the inner ring 1152A of FIGS. 11B-11D. The inner ring 6708 may be made of materials including ABS plastic, silicone, metal and glass. The outer ring 6704 may be made of materials including metal and a plastic, e.g., in the acetal family, such as Delrin. A fluid is enclosed by the membrane 6706 inner ring 6708 and round blank 6710. The round blank 6710 may be at least partially transparent to light transmitted through the fluidic lens. Round blank 6710 may be made of materials including glass, plastic and PDMS. Round blank 6710 may additionally include optical coatings or dopants which serve to modify the reflection, absorption and/or transmission properties of the fluidic lens at specific wavelengths of light. By way of example, round blank 6710 may be made of BK-7 glass and may include one or more of an anti-reflection coating in the visible spectrum (e.g., from wavelengths of about 450 nm to 650 nm, and a high-reflection coating in the infrared spectrum (e.g., at wavelengths greater than about 670 nm), Round blank 6710 may be substantially flat on both sides (e.g., "plano-plano) or may include nonplanar surfaces and elements that serve to modify the light being transmitted through the fluidic lens such as concave, convex, spherical and/or aspheric surfaces, gratings, fresnel patterns and/or achromats. In some embodiments, the inner ring 6708 and the round blank 6710 may be integrally formed as a single piece. Projections 6712 on the outer ring 6704 mate with corresponding slots 6716 on the lead screw 6702. The outer ring may also include slots 6718 on its outer side. The lead screw 6702, outer ring 6704 membrane 6706, inner ring 6708 and round blank 6710 may fit within a recess in a base plate 6800 illustrated in FIG. 68D.

Figure 68A:
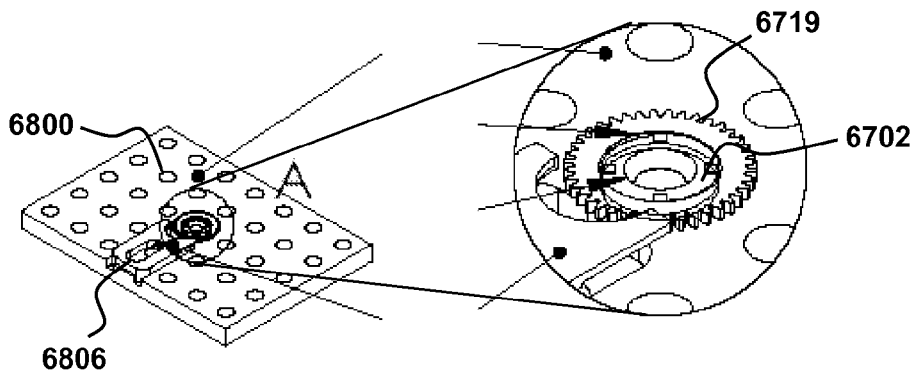
FIG. 68A is a three-dimensional diagram illustrating a fluidic lens assembly using the fluidic lens of FIG. 67A.

As shown in FIG. 68A, an internally threaded spur gear lead screw 6719 engages external threads on the externally threaded lead screw 6702. The internally threaded lead screw 6719 fits within a stepped recess 6804 that is coaxial with the recess 6802. A retainer 6806 shown in FIG. 68C fits within a slot in the base plate 6800 and retains the fluidic lens 6700 and lead screw 6719 within their respective recesses. Through a slot 6810 a spur 6808 of the retainer 6806 can engage the slots 6718. The engagement of the spur 6808 and slots 6718 prevents the outer ring 6704 from rotating about its central axis. The engagement of the projections 6712 on the outer ring 6704 and the slots 6716 on the externally threaded lead screw 6702 similarly constrain the lead screw 6702. Thus, as the internally threaded lead screw 6719 rotates, e.g., under motion imparted by another spur gear or rack mechanism, the lead screw 6702 may be made to apply pressure to the fluid via squeezing of one or more of the outer ring 6704 the inner ring 6708 and/or the membrane 6706.

Figure 68B:
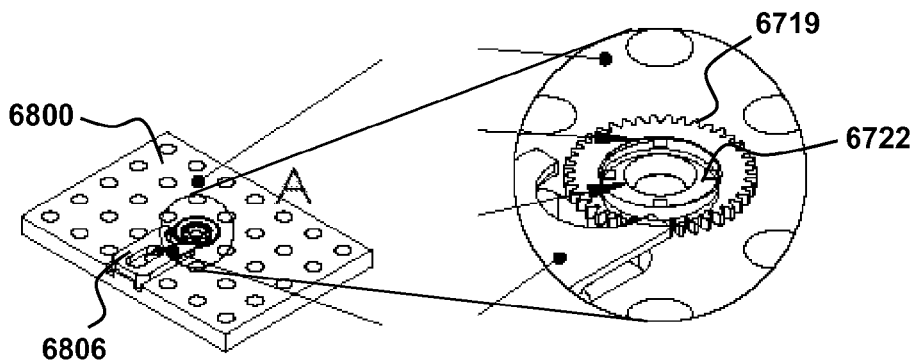
FIG. 68B is a three-dimensional diagram illustrating a fluidic lens assembly using the fluidic lens of FIG. 67B.
Figure 68C:
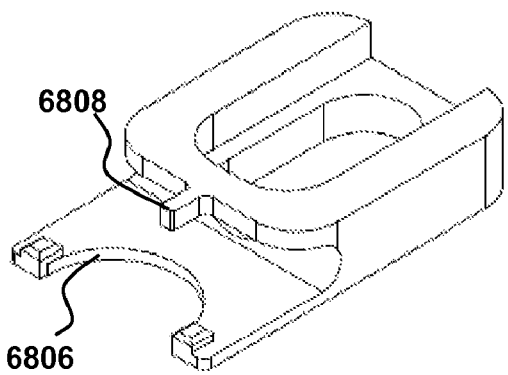
FIG. 68C is a three-dimensional diagram of a retainer used in the fluidic lens assemblies of FIGS. 68A-68B.
Figure 68D:
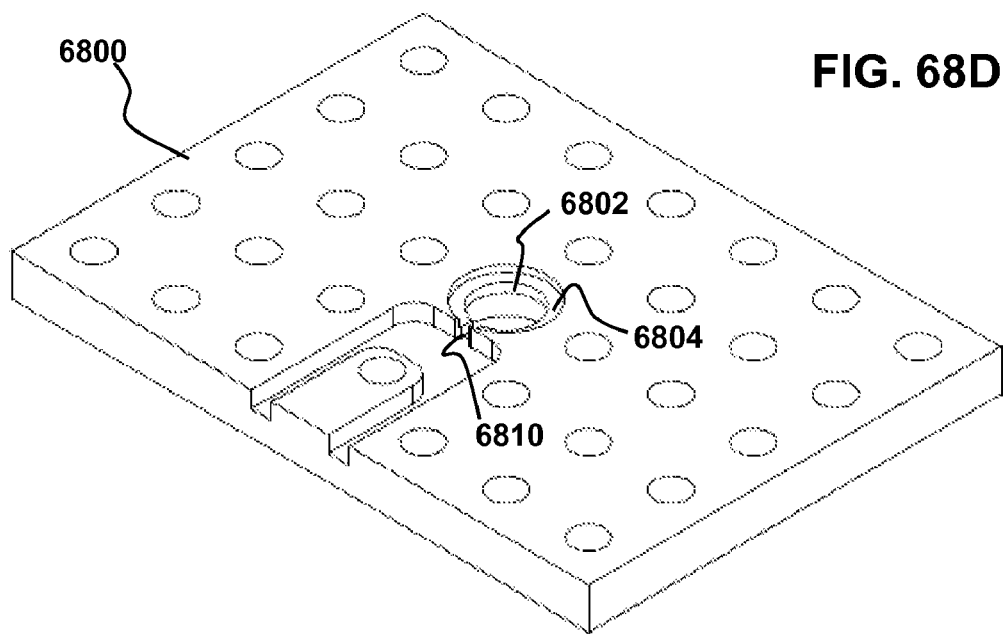
FIG. 68D is a top view three-dimensional diagram of a base plate used in the fluidic lens assemblies of FIGS. 68A-68B.
Figure 68E:
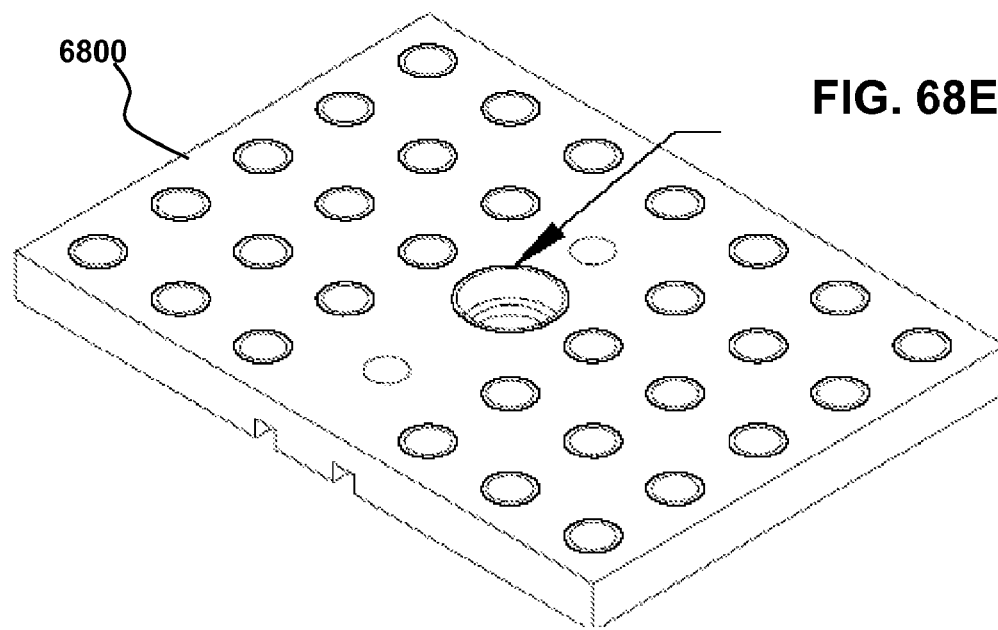
FIG. 68E is a bottom view three-dimensional diagram of the base plate of FIG. 68D.

FIG. 67B illustrates a fluidic lens 6720 that is a variation on the fluidic lens 6700. The lens 6720 includes lead screw 6722 membrane 6724, a double-rim frame 6726 and a round blank 6728. Projections 6730 on the lead screw 6722 engage slots 6732 on the frame 6726. The lead screw 6722, membrane 6724, frame 6726 and blank 6728 fit within the recess 6802 of the baseplate 6800. The spur 6808 on the retainer 6806 restrains the frame 6726 from rotating about its axis by engagement with one of the slots 6732. As shown in FIG. 68B, turning of the spur gear lead screw 6719 engages external threads on the lead screw 6722 to apply pressure to the membrane 6724. The compression of the membrane 6726 forces fluid from an annular reservoir 6734 through holes 6736 into an aperture 6738 to deform the membrane 6724.

Although many of the mechanical actuation schemes for the fluidic lens designs described above are practical, more compact actuators are desirable to deflect the surface of the fluid reservoir used in a fluidic lens optical system as described herein. Such actuators may also be used to transport a coaxially mounted standard lens or any other such object. In a preferred embodiment depicted in FIG. 69A a fluidic lens 6900 may include an inventive actuator 6902 that surrounds an annular piston 6904 used to deflect a compliant membrane bounding one surface of a fluid reservoir. The annular piston 6904 may be similar or identical in form to the externally-threaded lead screws 6702, 6722 shown in FIGS. 67A-67B. For purposes of illustration, the actuator 6902 is shown in the form of a cylinder with a somewhat exaggerated wavy surface. The waviness is intended to suggest the presence of a surface vibration deflecting the surface of an otherwise circular cylinder. The deflection may be approximated by a controlled frequency and amplitude sinusoidal wave propagating around the circumference of the cylinder.

Figure 69A:
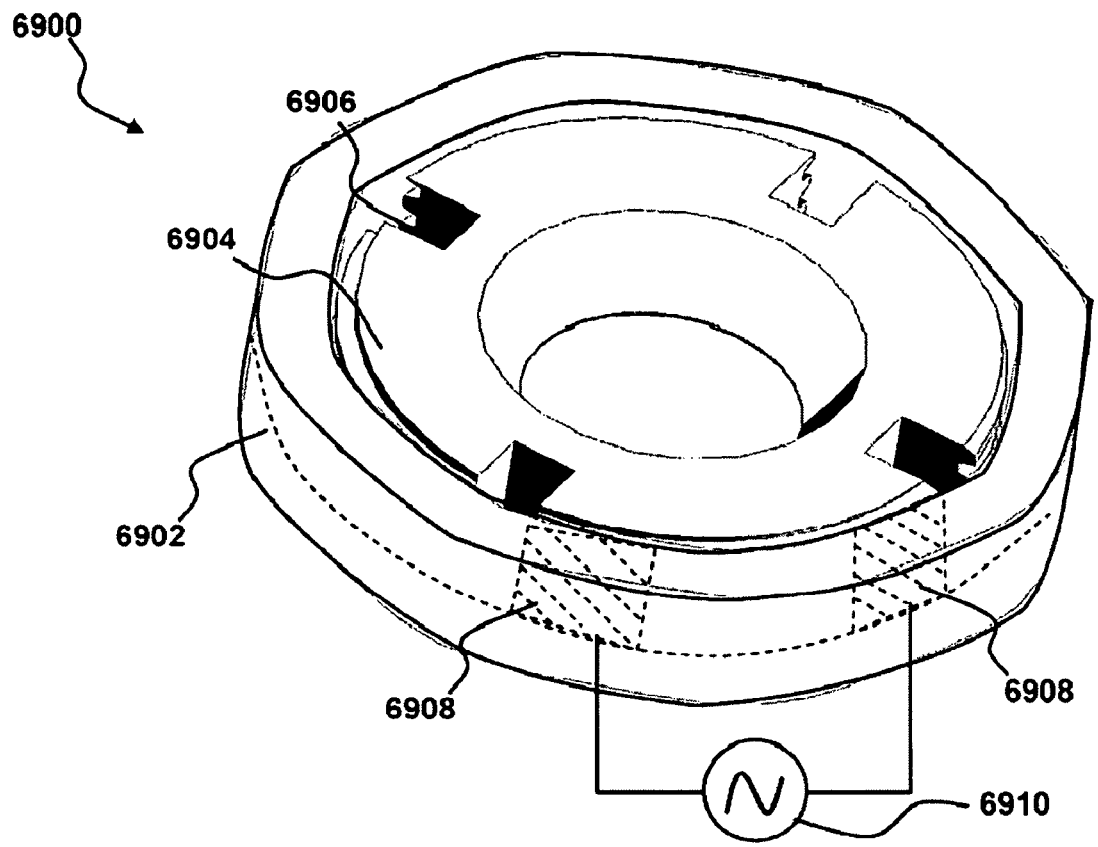
FIG. 69A is a three-dimensional assembly diagram of an ultrasonic motor actuator that may be used in embodiments of the present invention.

As an example, FIG. 69A shows the annular piston 6904 with a helical thread-like feature on its outer surface. Another suitable arrangement consists of an array of nearly axially oriented ridges evenly distributed on the piston's outer surface. Alternatively, the internal surface of the actuator cylinder may have similar features. The common characteristic of these and other possible surface configurations is the production of peripheral drag forces with out-of-plane orientation. Since the piston is constrained by guiding features (e.g., slots 6906 that engage guide pins) to move only axially, the tangential force components are cancelled by guide pin reaction forces, while the axial components result in useful movement.

The wave-like deflection of the actuator can be excited by building into the actuator cylinder 6902 a segmented piezoelectric ceramic structure. This structure may follow the example of certain existing ultrasonic motor designs wherein patterned electrodes are provided. By electrically stimulating each of the piezoelectric segments in suitably phased relationship to each other, it is possible to excite a resonant or nearly resonant vibrational wave as described above. It is envisioned that the electrical interface to the actuator 6902 would be supplied by compliant or low mass conductors which would not provide an excessive parasitic load to the actuator 6902, but would restrain it from counter rotating. It is also envisioned that the portion of the piston 6904 in contact with the actuator 6902 would include elastic links with the rest of the piston 6904 such that the mechanical interface between the two finds itself under a static preload. This would assist with both operation as well assembly of the system.

Figure 69B:
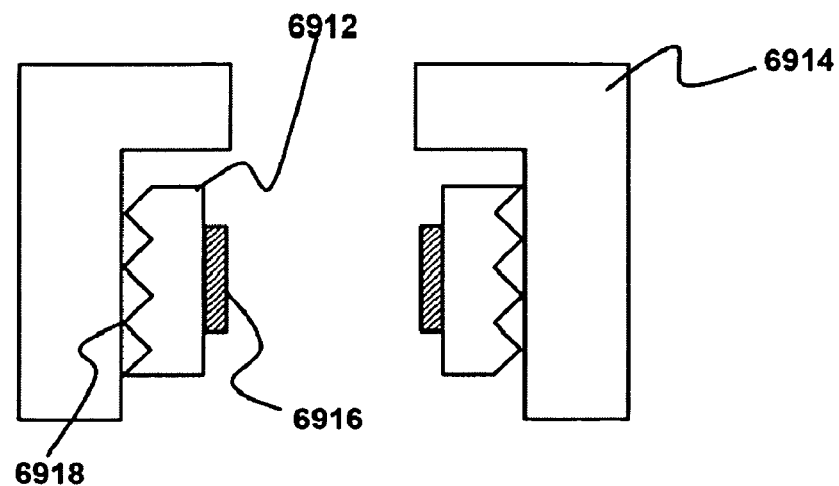
FIG. 69B is a cross-sectional diagram of an alternative ultrasonic motor actuator.

Although a threaded piston is depicted in FIG. 69, the interface between the piston 6904 and the actuator 6902 need not have threads per se. Projections on the actuator 6902 or piston 6904 that lack mirror symmetry are sufficient. A thread on either the actuator 6902 or the piston 6904 obviously meets that requirement, but not uniquely so. In order for a circumferential surface wave in the actuator 6902 to induce an axial translation in the piston 6904, it is necessary that the latter be endowed with either a uniform or average helicity (or handedness). One way to embody that is by way of inclined ridges or corrugations. A surface wave first meets a ridge either near the top surface or near the bottom of the piston 6904, depending on the wave propagation direction. Axial motion of the piston 6904 may be thought of as the effect of the ridges "surfing" on the actuator waves.

In operation, one or more nearly degenerate vibrational modes would be excited in the actuator cylinder 6902. Each mode has several peaks and valleys where the surface shape departs from the static cylinder shape. Degenerate modes have the same number of peaks and valleys but differ in their location along the circumference. To excite such modes, it is necessary to have independent mechanical drivers distributed along the circumference of the actuator cylinder 6902. One way to accomplish that is to have a thin-walled metallic cylinder on which substantially rectangular, slightly curved piezoelectric "patches" 6908 are glued. The metal cylinder would be at ground potential and electrically contact one side of each piezo "patch". The metal cylinder would also serve the function of bearing the mechanical oscillations. The other side of each patch would be contacted by compliant or light weight flexible conductors to supply the addressable signal from an oscillator unit 6910. The inside of the cylinder 6902 would thus mechanically contact the outside surface of the piston 6904. As mentioned above, there would have to be an elastic pre-load or compression between the two surfaces, which means no clearance. In order to assemble such a device, the piston 6904 would have to have sufficient elasticity to temporarily compress its circumference while inserting into the actuator cylinder.

It's useful to realize that the configuration of a piezoelectric "patch" bonded to a passive elastic member forms a classical actuator form called generically a bender of more specifically (for piezos) a unimorph. Here are a couple more ways of forming actuators of the type described above:

Start with a finished piezoelectric cylindrical shell. Place a mandrel (or core) made of a reducing material (such as graphite) inside and in intimate contact with the shell. Place the structure in an anneal oven and treat at high temperature (near 1000° C.) to cause an inside layer of the piezo material to become reduced (conductive and piezoelectrically inert). This method was previously invented by Gene Haertling of Clemson University to create the so called "Rainbow" wafers. This technique is described in U.S. Pat. No. 5,471,721, which is incorporated herein by reference. The outside of the "rainbowed" cylinder could have a thin film electrode patterned either photo-lithographically or a thick film electrode by screen printing and firing a conductive paste.

Alternatively, one may start by coating a suitable elastic metal sleeve with piezoelectric green ceramic paste. Such a sleeve may have to be made of or coated with a precious metal such as platinum to withstand piezo firing temperatures. The green paste may itself be coated with a pre-patterned fireable electrode. Alternatively, the electrodes may be formed after the ceramic is formed by methods outlined earlier.

Methods, that include a metallic cylinder are probably more favorable since a metallic cylinder would better withstand tensile stressed imposed by preloading an elastic member in its interior. On the other hand, the entire configuration could be turned inside-out, thus forming another embodiment. In an example of this embodiment, depicted in FIG. 69B, the piston 6914 takes the form of a cup with cylindrical surfaces compressing a cylindrical actuator 6912 coaxially located inside the cup 6914. Piezoelectric patches 6916 are located on the inside of the cylindrical actuator 6912. In this configuration, the actuating cylinder 6912 finds itself preloaded with a compressive stress, which is more compatible with a ceramic cylinder. One could then use a "rainbowed" ceramic cylinder as described above, although it would be modified by reducing its external surface and patterning its interior electrodes. By way of example, the external wall of the actuator 6912 includes projections 6918 that lack mirror symmetry, e.g., threads that contact the inner wall of the piston 6914. Alternatively, projections on the internal wall of the piston 6914 may contact an outer wall of the actuator 6912.

Figure 70A:
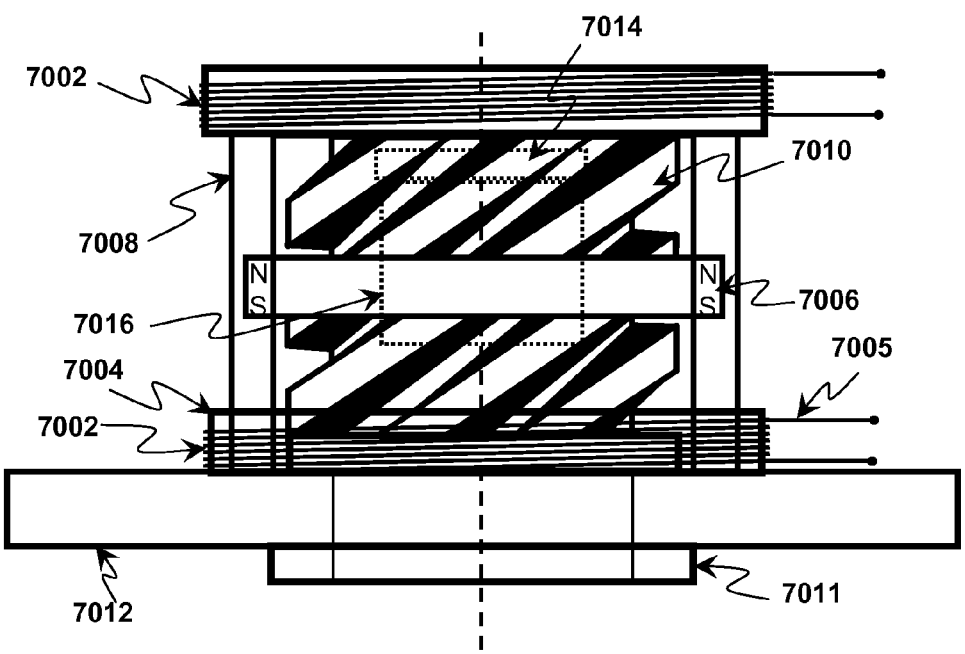
FIG. 70A is a side view elevation schematic diagram of a solenoid actuated fluidic optical device according to an alternative embodiment of the present invention.
Figure 70B:
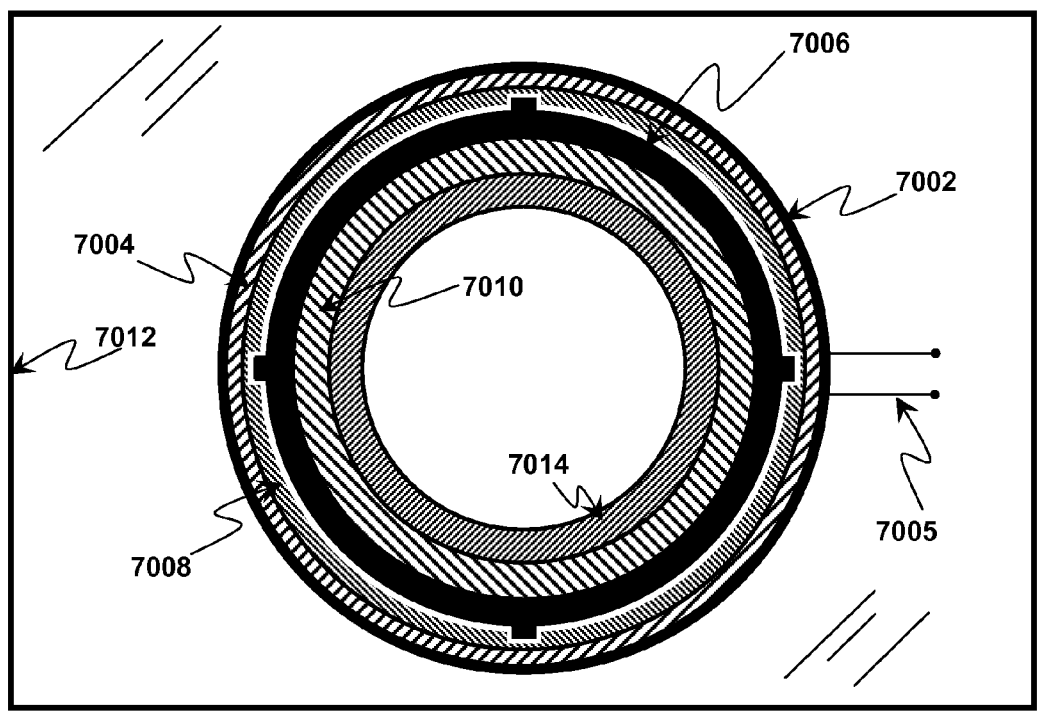
FIG. 70B is a top plan view schematic diagram of the solenoid actuated fluidic optical device of FIG. 70A.
Figure 70C:
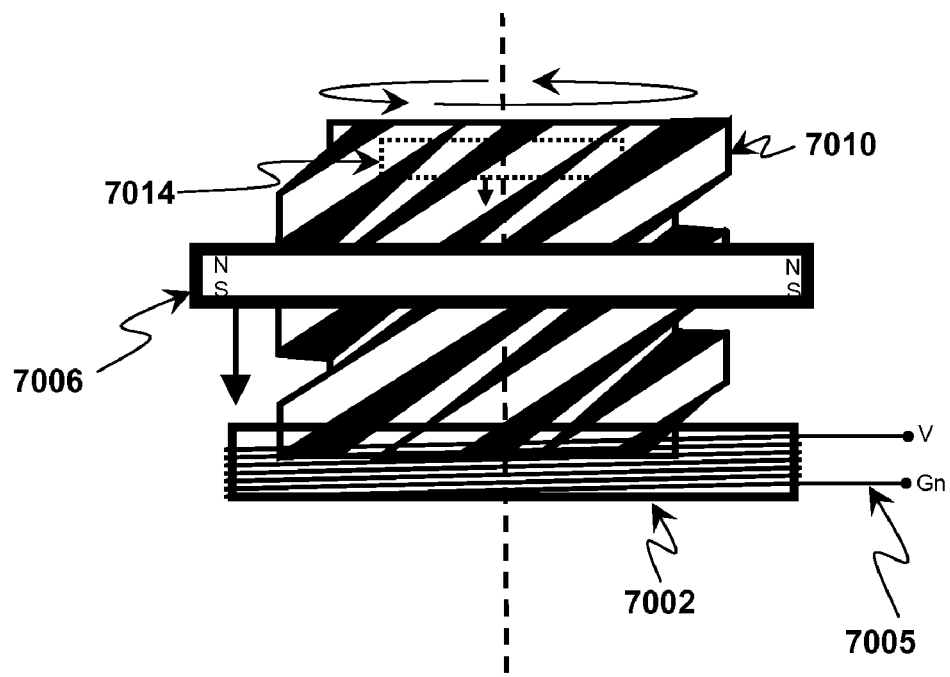
FIG. 70C is a side view elevation schematic diagram of a portion of the fluidic optical device of FIG. 70A.

It is often desirable to provide a "self-locking" actuation to a fluidic lens of the types described herein. Such a self-locking feature would prevent unwanted counter movement of the actuator once a desired actuating force and membrane curvature have been achieved. According to an alternative embodiment of the invention, depicted, e.g., in FIGS. 70A-70C, a fluidic optical device 7000 may include a self-locking actuator that uses a solenoid, 7002, a magnetic worm gear nut 7006 and worm gear lead screw 7010 in place of the spur gear lead screw 6719.

The worm gear lead screw has external threads and internal threads. The internal threads engage an externally threaded depressor ring lead screw 7014 similar to the lead screw 6922 described above. The depressor ring lead screw 7014 is part of a fluidic optical device 7016, which may have construction similar to that described above with respect to FIG. 67A or FIG. 67B. The magnetic worm gear nut 7006 is internally threaded with threads that mate to the external threads on the worm lead screw 7010. One or more solenoid coils 7002 and a solenoid core 7004 may be used to apply linear thrust to the magnetic nut. The coils 7002 are coaxial with the magnetic worm gear nut 7006. The coils 7002, core 7004, sleeve 7008 and worm gear lead screw 7010 are mounted to a base 7012. A retainer 7011 holds the lead screw 7010 while allowing it to turn freely about its axis.

When sufficient electric current is supplied to the coils 7002, e.g., through leads 7005, the nut is driven linear along the common axis of the magnetic nut 7006, worm gear lead screw 7010 and depressor ring lead screw 7014. Engagement between the internal threads on the worm gear nut 7006 and the worm gear lead screw 7010 causes the worm gear 7010 to rotate. The pitch of the worm gear nut 7006 should be sufficiently so that the actuation force supplied by the solenoids 7002 can provide the required rotation. As the worm gear 7010 rotates its internal threads engage the external threads on the depressor ring lead screw 7014 causing the depressor ring lead screw 7014 to rotate and actuate the fluidic lens 7016. The magnetic nut 7006 fits inside a sleeve housing 7008. The sleeve housing 7008 includes internal slots that engage the worm gear nut 7006 and prevent it from rotating while allowing it to move linearly. Due to the conversion of thrust-to-rotation-to-thrust, the fluidic optical device 7000 can be self-locking.

Figure 71A:
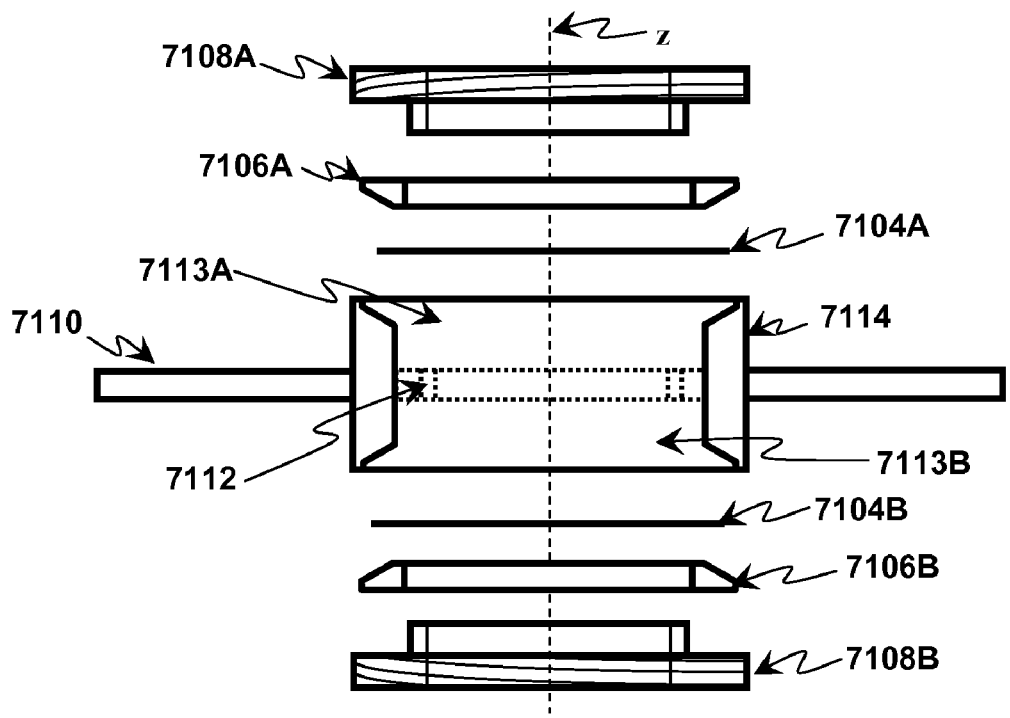
FIG. 71A is a cross-sectional exploded view schematic diagram of a dual membrane fluidic lens according to an embodiment of the present invention.

The concepts described above may also be applied to actuation of fluidic optical devices having two deformable optical surfaces. For example, FIG. 71A depicts a dual membrane fluidic lens device 7100 according to an embodiment of the present invention. In the device 7100, the above fluid lens device design (e.g., "single rim" FIG. 54 or 67A) is adapted with two elastic membranes and two depressor ring lead screws (i.e., the fluidic lens can now vary from double-convex to double-concave). For example FIGS. 71A-71F illustrate an example of a dual membrane fluidic lens device 7100 according to an embodiment of the present invention. The device 7100 includes a cylindrical dual-membrane outer rim 7102 that separates two membranes 7104A, 7104B and provides a fluid reservoir and optical aperture. An actuating force applied to an upper ring 7106A and a lower ring 7106B squeezes fluid contained between the membranes 7104A, 7104B and outer rim 7102. The upper ring 7106A and lower ring 7106B may be similar or identical in form to the inner ring 6708 of FIG. 67A. In the example depicted in FIGS. 71A-71F, the actuating forces on the upper ring 7106A and lower ring 7106B are respectively applied by upper and lower depressor ring lead screws 7108A, 7108B. The depressor ring lead screws 7108A, 7108B may be similar or identical in form to the externally-threaded lead screws 6702, 6722 shown in FIGS. 67A-67B. The outer rim 7102, rings 7106A, 7106B, and depressor ring lead screws 7108A, 7108B may all have cylindrical symmetry with respect to an optical axis z. A rigid baseplate 7110 is attached to a side wall of the dual membrane outer rim 7102. An optional rigid transparent chamber separator 7112 can be placed within the outer rim 7102 to separate the interior of the outer rim 7102 into an upper lens section 7113A and a lower lens section 7113B. In this fashion, the transparent chamber separator 7112 can serve to isolate the pressure in the upper lens section 7113A and lower lens section 7113B from each other. Such isolation of pressure between lens sections can allow greater independent control of the two lens sections. For example, the depressor ring lead screws 7108A, 7108B can be geared differently, or the inner diameters of the depressor ring lead screws 7108A, 7108B can have different sizes or shapes, in order to get a "best shape" lens. Alternatively, the transparent chamber separator 7112 can be perforated with flow holes in order to allow limited fluid flow between the upper lens section 7113A and lower lens section 7113B. Such limited flow between lens sections may be useful in certain applications where the fluidic lens may be subject to undesirable forces such as gravity or acceleration that may tend to cause unwanted fluid flow thereby and unwanted distortions in the shape and optical properties of the fluidic lens.

Figure 71B:
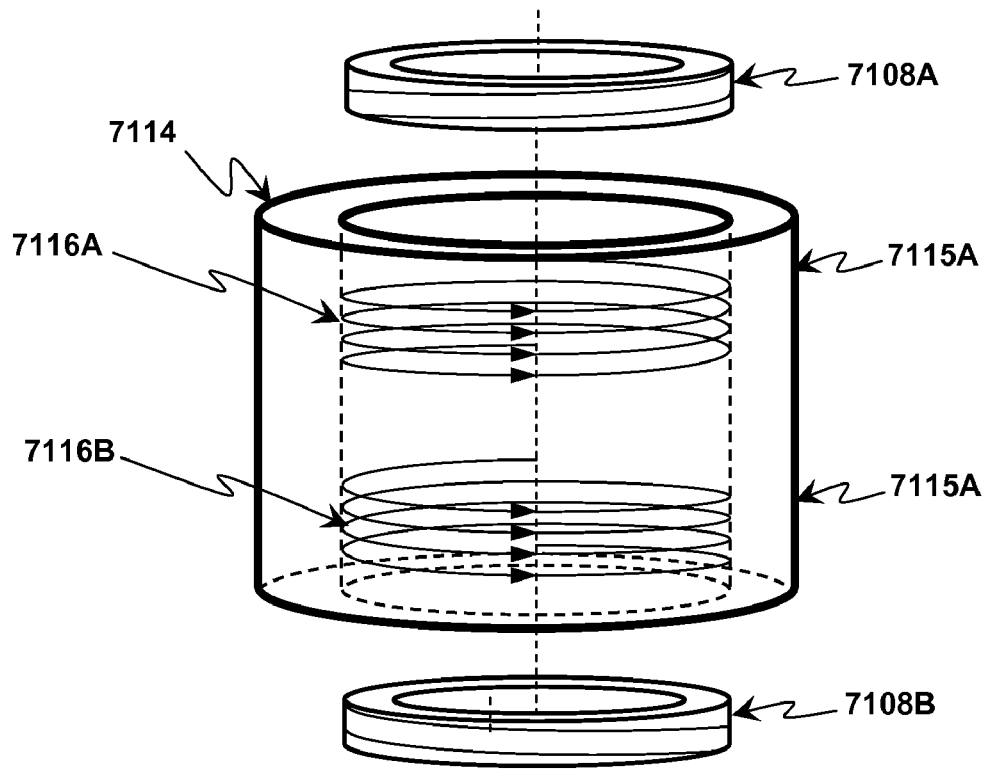
FIG. 71B is a three-dimensional exploded view schematic diagram of a dual actuator for use with the fluidic lens of FIG. 71A.

One depressor ring lead screw (e.g., the upper lead screw 7108A) has a right-hand (RH) thread and the other (e.g., the lower lead screw 7108B) has a left-hand (LH) thread. As shown in FIG. 71B, a single internally threaded lead screw 7114 has an upper section 7115A with an internal RH threaded section 7116A and a lower section 7115B with an internal LH threaded section 7116B. The RH internal threaded section 7116A engages external RH threads on the upper depressor ring lead screw 7108A. The LH internal threaded section 7116B engages the external LH threads on the lower depressor ring lead screw 7108B. Both depressor ring lead screws 7108A, 7108B are restrained from rotating as the internally threaded lead screw rotates 7114.

Figure 71C:
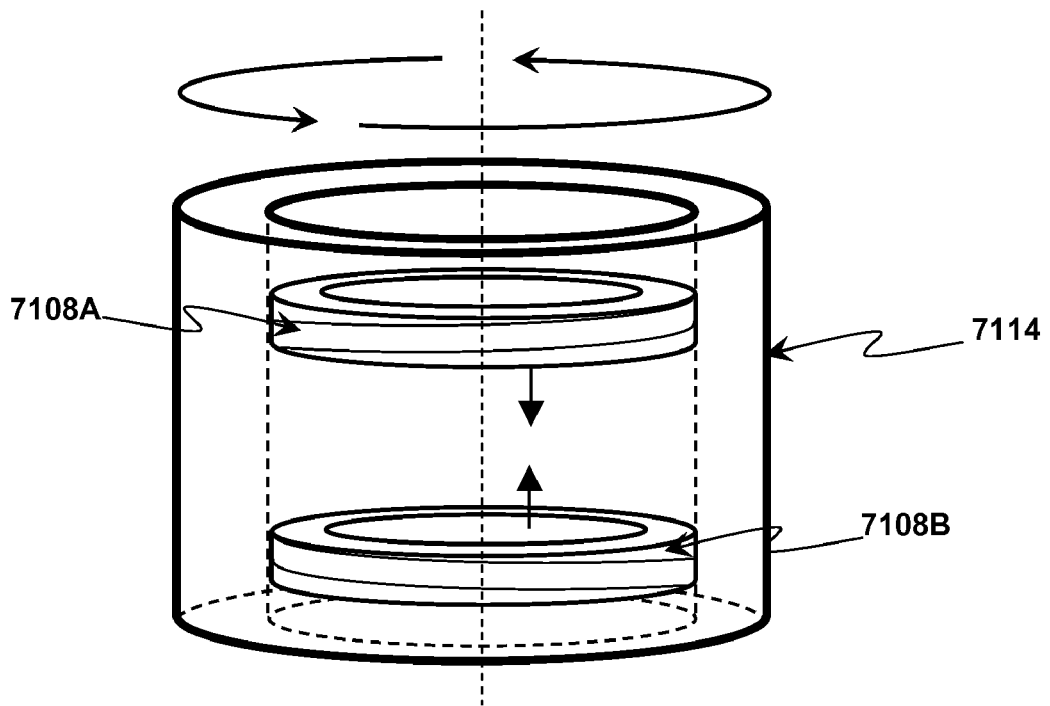
FIG. 71C is a three-dimensional schematic diagram illustrating operation of the dual actuator of FIG. 71B.

As shown in FIG. 71C, due to the opposite threads of the upper and lower sections 7115A, 7115B of the internally threaded lead screw and corresponding external threads on the depressor ring lead screws 7108A, 7108B, the internally threaded lead screw 7114 can simultaneously drive both depressor ring lead screws 7108A, 7108B in opposing directions.

Figure 71D:
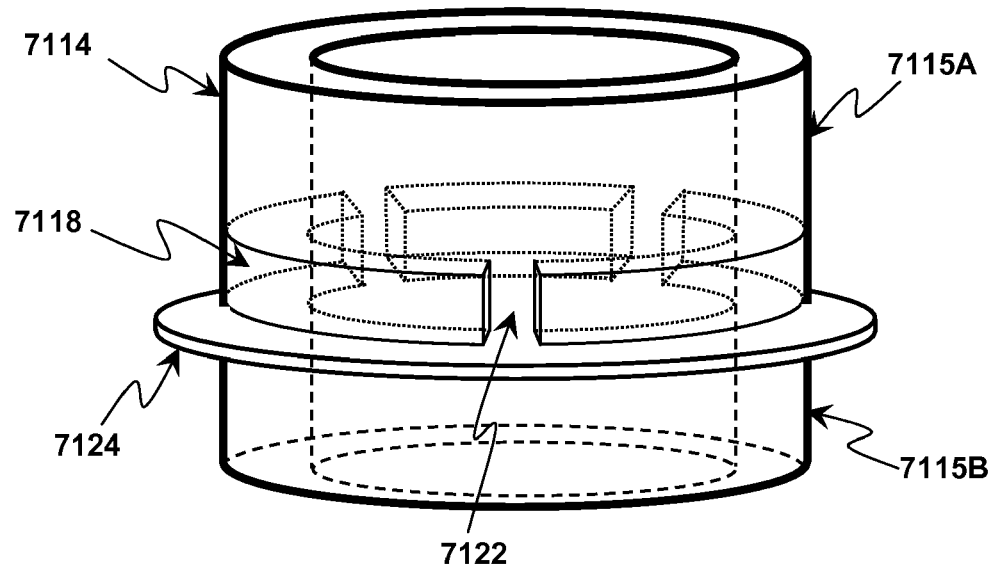
FIG. 71D is a three-dimensional cutaway view of an internal threaded lead screw used in the actuator of FIG. 71B.
Figure 71E:
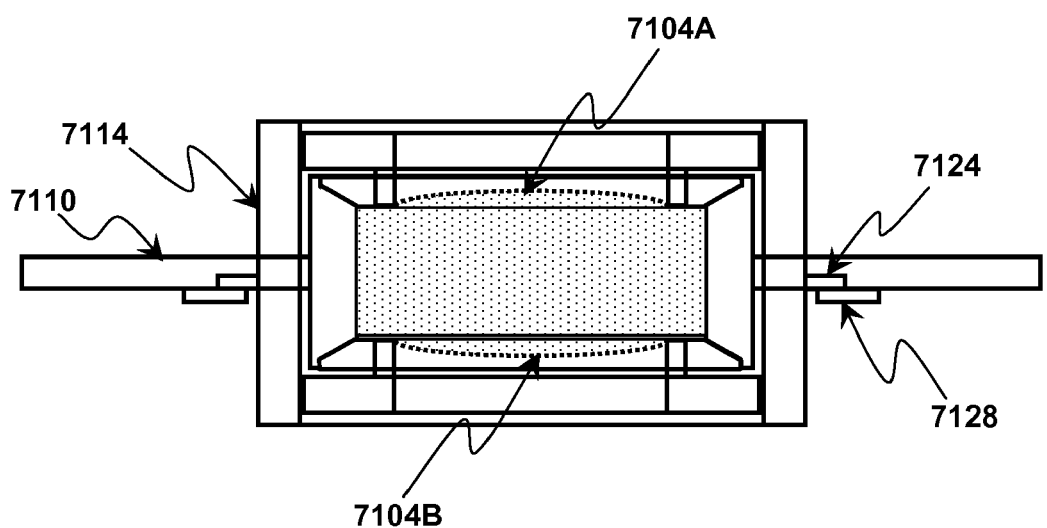
FIG. 71E is a cross-sectional schematic assembly diagram of the fluidic lens of FIG. 71A.

As shown in FIG. 71E, the upper and lower membranes 7104A, 7104B distort as a result of thrust forces exerted on them (and the enclosed fluid 7103) by the upper and lower depressor ring lead screws 7108A, 7108B. By rotating the RH/LH internally threaded lead screw, both depressor ring lead screws can apply thrust to their respective membranes, thereby increasing range of focal power of the fluidic lens. Changes in curvature of the membranes 7104A, 7104B can be controlled further by varying the internal diameter of depressor rings 7108A, 7108B, the angle of the threads on the depressor rings 7108A, 7108B and internally threaded lead screw 7114, and the addition of the separator plate 7112.

Figure 71F:
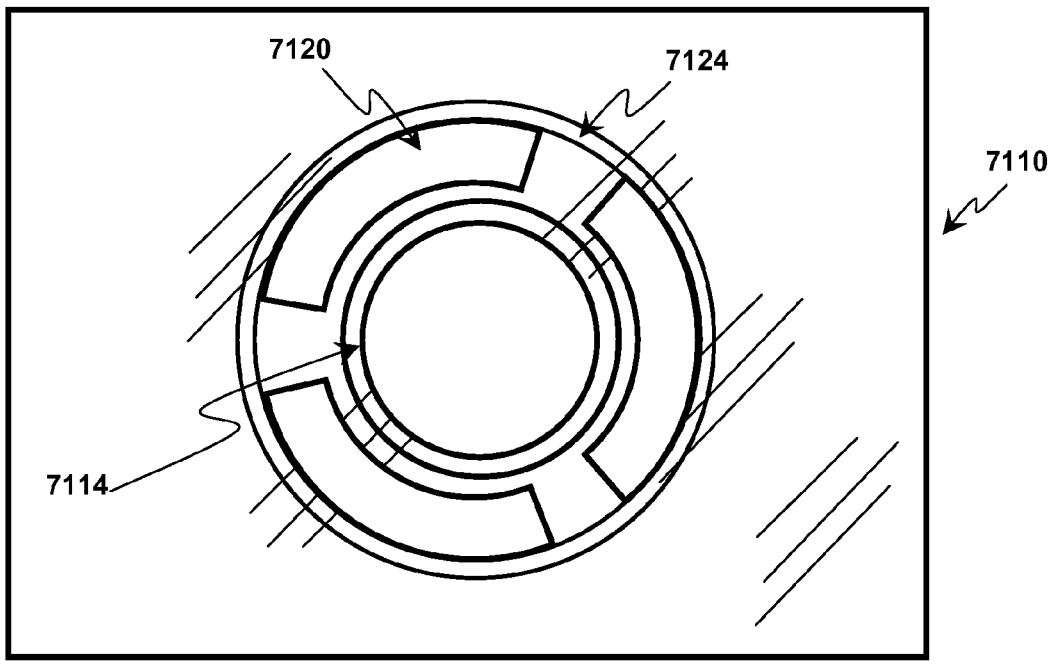
FIG. 71F is a plan view schematic diagram of a baseplate and dual membrane outer rim for the fluidic lens of FIG. 71A.

The internally threaded lead screw 7114 may have slots 7118 cut out of its sidewall as shown in FIG. 71D. Corresponding annular segmented slots 7120 cut from the baseplate 7110 as shown in FIG. 71F. The slots 7118, 7120 allow the lead screw 7114 to straddle baseplate 7110 and rotate. Remaining segmented annular sections 7122 are not removed from sidewall of lead screw 7114. The remaining sections 7122 connect the upper section 7115A to the lower section 7115B of lead screw 7114 to each other. A flange 7124 that engages a corresponding counter-stepped shelf 7126 on the baseplate 7110. The flange 7124, shelf 7126 and a ring-shaped flange retainer 7128 allow the lead screw 7114 to rotate while restricting its axial movement. Either the baseplate 7110 or the lead screw 7114 may be made in two separate pieces in order to facilitate assembly. Alternatively, the baseplate 7110 and lead screw 7114 may be assembled as interlocked single-piece components, e.g., using stereolithography.

The dual depressor ring design of the device 7100 can increase the efficiency of actuation motion compared to a single compressor ring design. The device 7100 allows roughly a factor of 2× increase in diopter range for the same actuation stroke as single-membrane design. In alternative embodiments, changes in curvature of the membranes 7104A, 7104B can be controlled quasi-independently from each other, e.g., by using two separate internal threaded lead screws in place of the single lead screw 7114. Counter-rotation can also be applied to other actuation methods (e.g., piezo motor, etc).

Figure 72A:
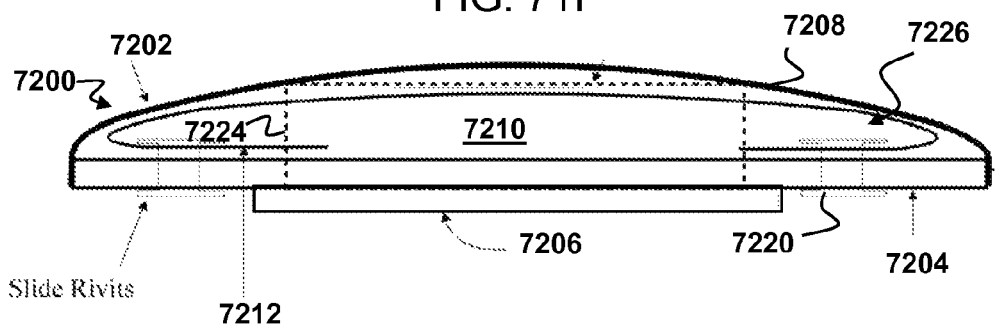
FIGS. 72A-72B are side view cross-sectional schematic diagrams of a bi-metallic actuated fluidic lens according to an embodiment of the present invention.
Figure 72B:
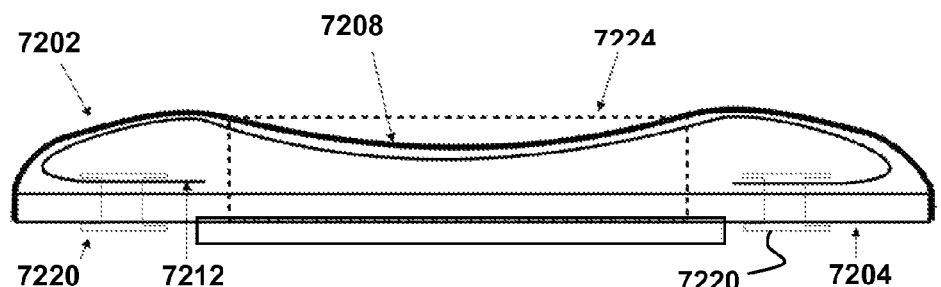
Figure 72C:
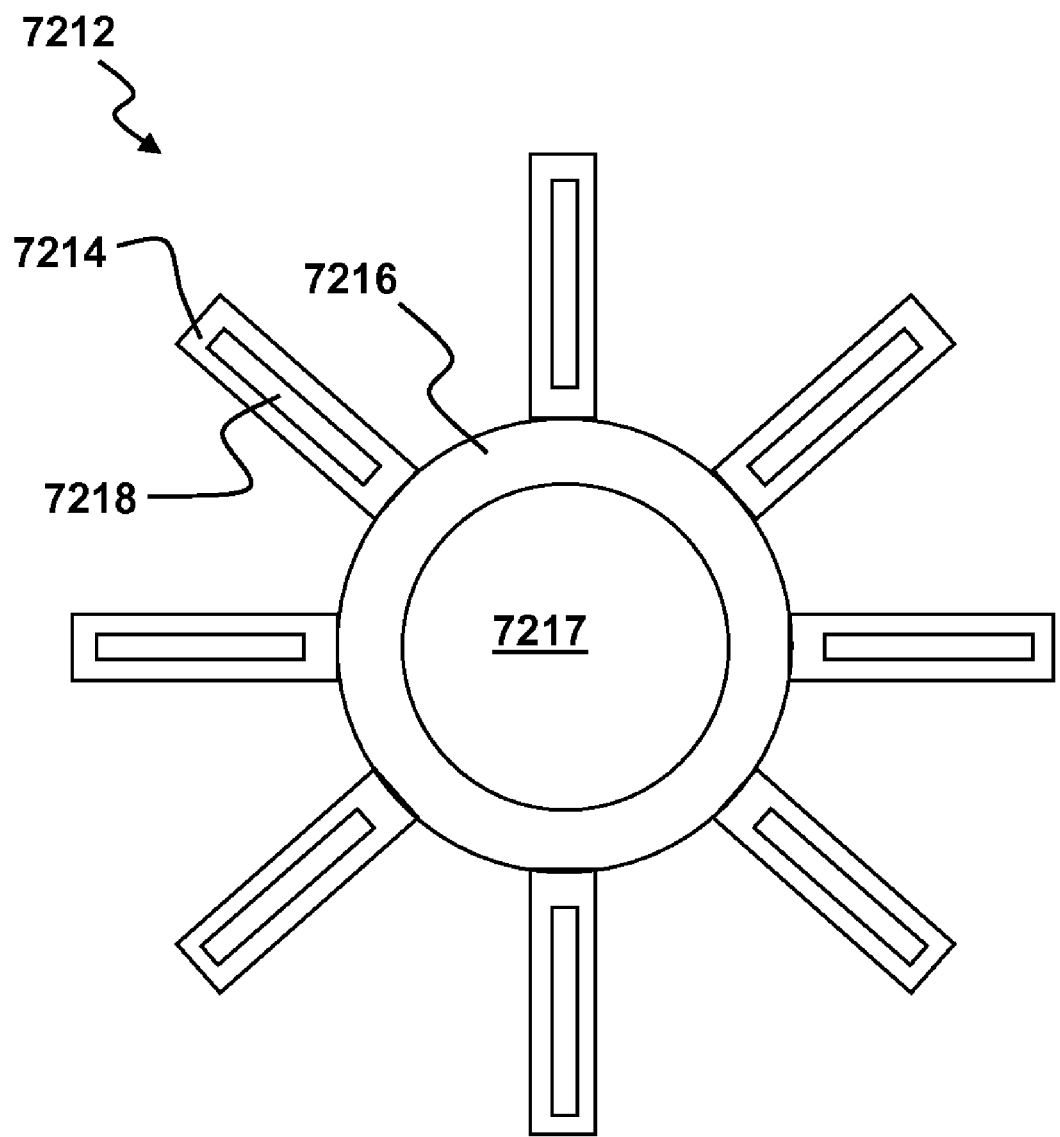
FIG. 72C is a top plan view schematic diagram of a bi-metallic actuator for use with the fluidic lens of FIGS. 72A-72B.

In embodiments of the present invention it is possible for the aperture and the reservoir to be different yet integral portions of the same fluid-filled volume. For example, FIGS. 72A-72C illustrate an embodiment of a fluidic lens 7200 having a transparent resilient membrane 7202 and a base 7204. The base 7204 may include an opening that can be sealed using a transparent puck or lens element 7206. The resilient membrane 7202 curves to provide a lens surface 7208. A volume enclosed between the membrane 7202, base 7204 and puck 7206 is filled with a fluid 7210. A bi-metallic interface 7212 having one or more bi-metallic strips is placed within the enclosed volume. As shown in FIG. 72C, the bi-metallic interface 7212 may have a spider-like shape, with multiple legs 7214 extending from an annular ring 7216. An opening 7217 in the ring 7216 may define an optical aperture for the lens 7200. The legs 7214 may be bent back underneath the ring 7216 as shown in FIGS. 72A-72B. Each leg 7214 may have a slot 7218 to accommodate a slide rivet 7220 that is attached to the base 7204. The rivets 7220 hold the bi-metal legs 7214 down, so they can slide when the voltage is applied and they try to bend. As shown in FIG. 72B, flexing of the bi-metallic interface causes the resilient membrane 7202 to stretch and the fluidic lens 7200 to deform as the fluid 7210 is drawn away under the resilient membrane 7202 and the lens surface 7208 is drawn towards a central aperture region 7224 bounded by the dashed line. The fluid-filled region 7226 of the fluid outside the aperture region 7224 may be regarded as the reservoir. Un-bending the bi-metallic interface 7212 can cause the lens surface 7208 to return to the shape indicated in FIG. 72A. Note that at some intermediate degree of bending, the bi-metallic interface 7212 can draw the lens surface 7208 (or a portion thereof) into a substantially flat configuration.

Figure 73:
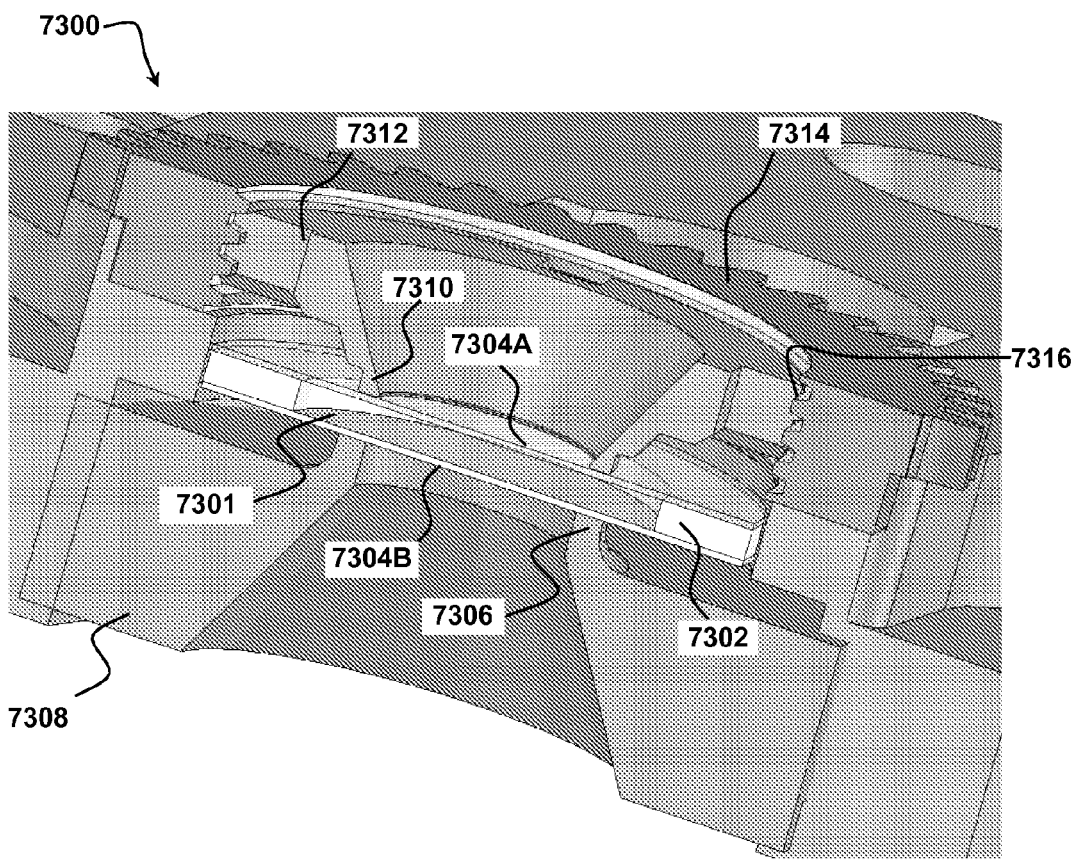

Other embodiments of the present invention may utilize a fluidic lens having a structure referred to herein as a liquid pill. The liquid pill is an example of a fluidic optical device wherein the aperture and reservoir are fully integrated with each other. As shown in FIG. 73, the structure of the liquid pill is very simple. A liquid pill lens 7300 includes a cavity formed by a perforated spacer 7302 and two membranes 7304A, 7304B. The spacer 7302 may be similar or identical in form to the inner ring 6708 of FIG. 67A. An interior volume 7301 enclosed between the spacer 7302 and upper and lower membranes 7304A, 7304B is filled with a fluid having convenient optical, mechanical and chemical properties. Although in the example depicted in FIG. 73 the interior volume 7301 is shaped as a circular cylinder, the outer boundary may take various shapes such as circular, square, rectangular or odd. The liquid pill lens 7300 may be mechanically actuated using a mechanism similar to that described above. For example, a circular rim 7306 protruding from a passive retainer 7308 (shown near the bottom of FIG. 73) may contact the lower compliant membrane 7304B. Another circular rim 7310 protrudes from an actuated top ring 7312 (shown just above the center of FIG. 73A) to contact the upper compliant membrane 7304A. The actuated to ring 7312 may be similar or identical in form to the externally-threaded lead screws 6702, 6722 shown in FIGS. 67A-67B.

The operation of the liquid pill lens 7300 is readily understood from FIG. 73. The top ring 7312 may be lowered or raised at will by any suitable actuator. By way of example, the top ring may include an external thread. The actuator may include a lead screw 7314 that having an internal thread 7316 that engages the external thread on the top ring 7312. The lead screw 7314 is coupled to a rotating motor—not shown. The circular rims 7306, 7310 press against the membranes 7304A, 7304B respectively. The circular rims 7306, 7310 divide the fluid-filled interior volume 7301 into reservoir and aperture portions as they engage the two membranes 7304A, 7304B. The squeezing action of the retainer 7308 and top ring 7312 causes an aperture portion of both membranes 7304A, 7304B within the circular rims 7306,7310 to bulge outward, thus controlling the refractive power of the liquid pill lens 7300.

Figure 74:
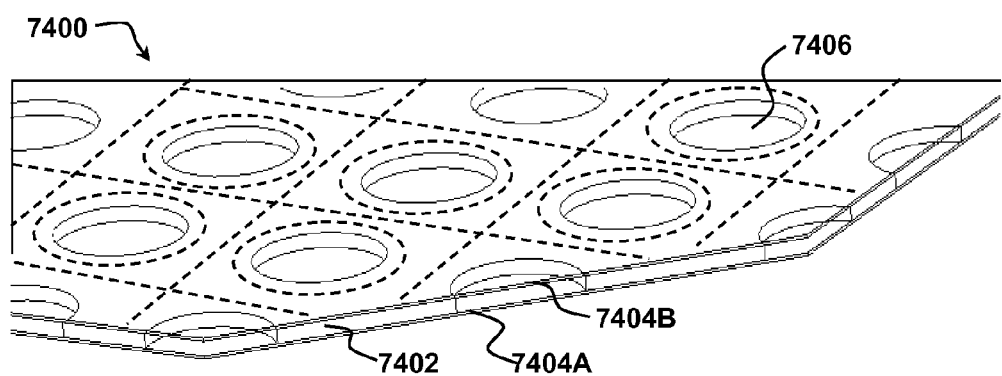

Fabrication of the liquid pill lens 7300 can follow well-known industrial methods. By way of example, the following sequence may be used. As shown in FIG. 74, a perforated plastic spacer sheet 7402 and a bottom transparent plastic membrane 7404A are laminated using one or more of the following techniques: thermal, ultrasonic, adhesive or solvent welding. An automated precision dispensing system, meters a precisely known quantity of fluid in each well formed by a perforation 7406 of the spacer sheet 7402 and the bottom membrane 7404A. The fluid amount is determined by the desired shape of the liquid pill in the relaxed state (ranging from flat to concave membranes). A top membrane 7404B is vacuum laminated onto the spacer sheet 7402. Vacuum lamination and similar methods are employed in the food industry to eliminate air from packages. This step would typically involve first sealing the edges of the upper membrane 7404B on all sides except for a vacuum passage on one side. Once the air has been evacuated, thermal, ultrasonic or thermosonic welding action can be applied onto the interstitial areas (between perforations 7406). The result is a finished liquid pill sheet 7400 containing multiple liquid pill structures. A singulation process separates the finished sheet 7400 into individual liquid pill lenses. The singulation process may separate the finished sheet 7400 into rectangular die as indicated by the straight dashed lines or into circular liquid pills as indicated by the dashed circles. This may be done by mechanical shearing, steel rule die cutting, laser cutting, etc. The cutting tool width should produce a narrow enough kerf (or material loss) to leave enough material for adequate bonding and sealing of the membranes in individual Liquid Pills.

In the design of the perforated sheet 7402, sufficient space may be allocated between perforations 7406 to allow for: (a) adequate membrane bonding area, (b) some clearance between the welding head and the edge of the perforation to prevent forceful evaporation of the filling fluid, and (c) space for cuts separating individual Liquid Pills (see next step).

As mentioned above, the shape of the liquid pills may be other than circular. This would create additional spacer area, which could be used for locating features such as registration pins and anti-rotation keys.

Figure 31:
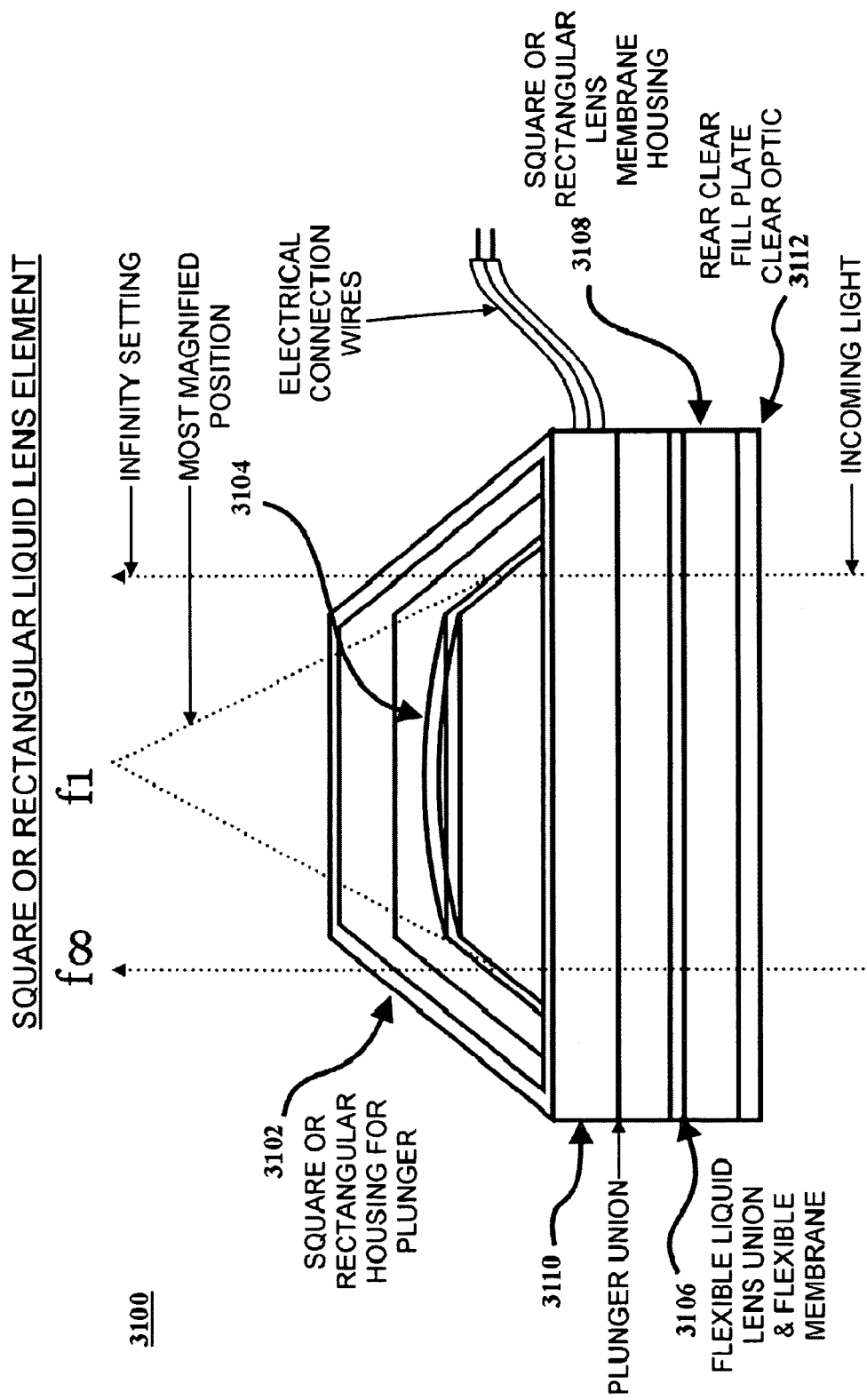
FIG. 31 is a three-dimensional view of a rectangular liquid lens element according to an embodiment of the present invention.

Additional variations on the embodiments depicted herein include:

1. Fluidic optical devices wherein one or more of the skeleton, membrane, reservoir and aperture are symmetric with respect to an axis parallel to a plane of the membrane, whereby the device is a fluidic cylindrical or anamorphic lens having variable focal length. FIG. 31 depicts an example of such a lens 3100. The lens 3100 includes a square or rectangular plunger housing 3102, a square or rectangular lens membrane housing 3104 a flexible liquid lens union and flexible membrane 3106 and a square or rectangular base housing 3108 for both lens elements and a liquid reservoir. A clear fill plate or optic 3110 may serve to enclose the fluid within the base housing 3112. Except for the rectangular shape of the housings, the construction of the lens 3100 may be similar to that depicted above with respect to FIGS. 10A-10F, 11A-11C, 25, 26 and 28. The rectangular shape of the housings allows the membrane 3106 to deform as a cylindrical or anamorphic lens.

Figure 32:
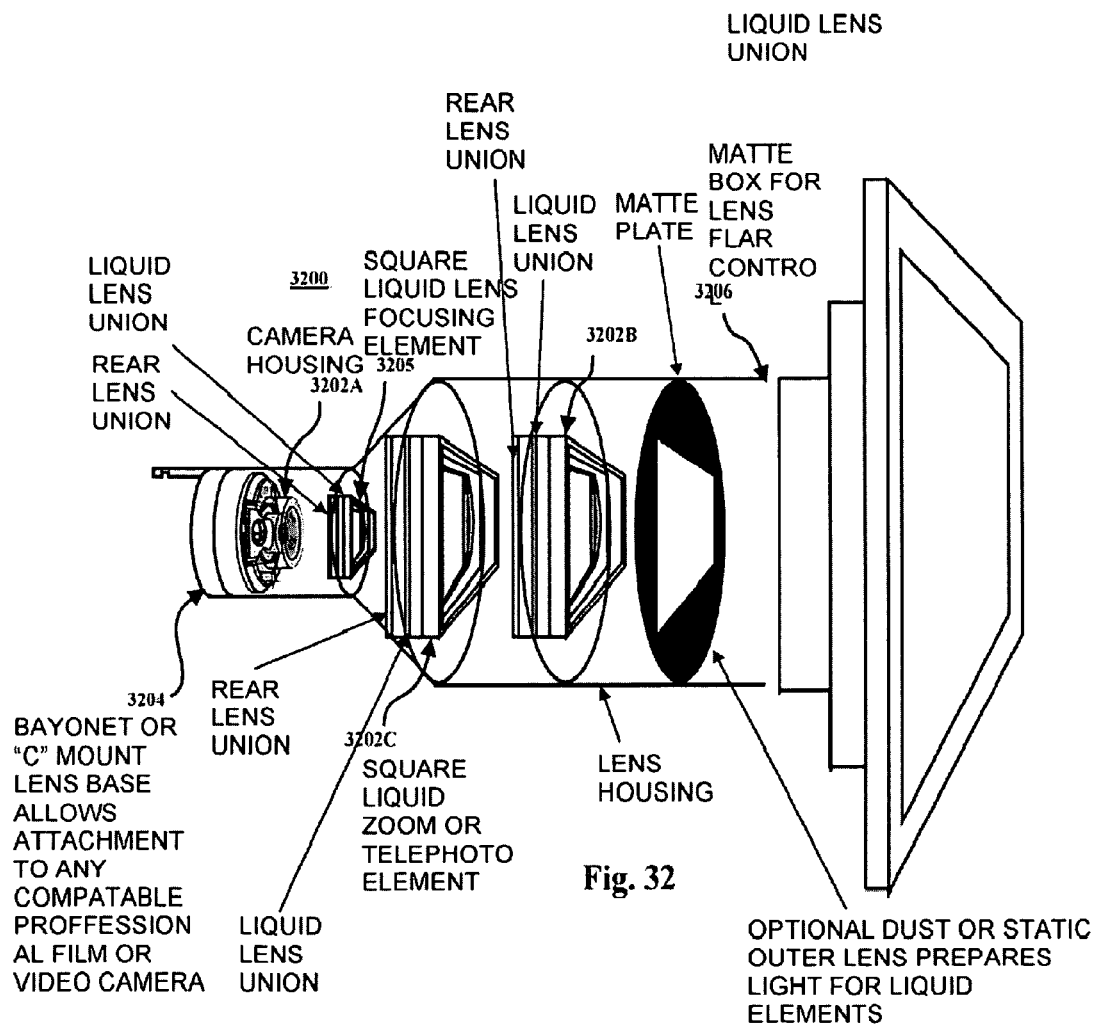
FIG. 32 is a three dimensional schematic diagram of an anamorphic aspect ratio lens according to an embodiment of the present invention.

Two or more lenses of the type shown in FIG. 31 may be combined together in an anamorphic aspect ratio lens for use, e.g., in a professional film or video camera. For example, FIG. 32 illustrates an example of a professional lens 3200. The lens 3200 generally includes two or more anamorphic fluidic lens elements 3202A, 3202B 3202C of the type depicted in FIG. 31 mounted within a housing 3204. A rear end of the housing may include a bayonet or "C" mount lens base to allow attachment of the lens 3200 to a compatible professional film or video camera housing 3205. A front end of the housing may include a matte plate, dust or static outer lens that prepares light for transformation by the fluidic lenses 3202A, 3202B 3202C. A matte box 3206 may be used for lens flair control. The three anamorphic lenses may include a focusing lens 3202A mounted near the rear end of the housing and a main lens 3202B mounted closer to the front end of the housing 3204. An anamorphic fluid zoom or telephoto lens element 3202C may be mounted within the housing between the focusing lens 3202B and main lens 3202B.

Figure 55:
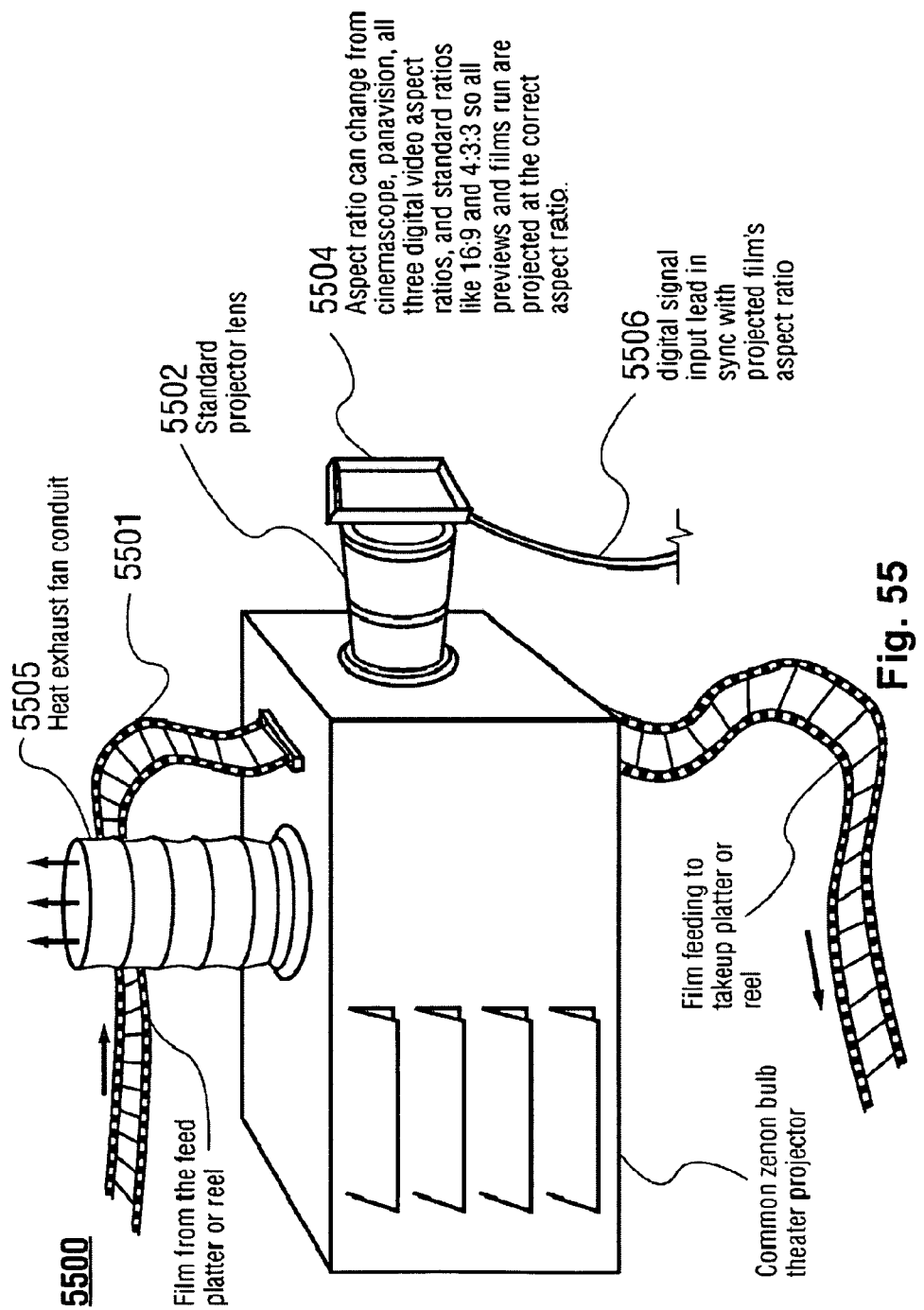
FIG. 55 depicts a projector employing fluidic optical elements according to an embodiment of the present invention.

Cylindrical, astigmatic or anamorphic lenses of the type shown in FIG. 31 may also be used in conjunction with a projector 5500, e.g., as depicted in FIG. 55. The projector 5500 may be a common xenon bulb theater projector in which light is projected through film 5501 that passes in front of a projector lens 5502 as it travels from a feed platter or reel to a take-up platter or reel. Heat from the projector bulb may be exhausted through a conduit 5505 using an exhaust fan. A fluidic cylindrical, astigmatic or anamorphic lens 5504 is optically coupled in front of the standard projector lens 5502. The aspect ration of the fluidic lens 5504 can be controlled by a digital signal input lead 5506 carrying signals that are in sync with the film 5501's aspect ration. can project images in Cinemascope, Panavision, all three digital aspect ratios, standard ratios such as 16:9, and 4:3:3 so that all previews and films are run at the correct aspect ratio without having to change lenses or projectors.

2. Fluidic optical devices wherein one or more of the skeleton, membrane, reservoir and aperture are symmetric with respect to an axis parallel to a plane of the membrane, whereby the device is a fluidic cylindrical lens having a variable cylindrical-lens focal length, whereby the device is a fluidic astigmatic lens having one or more variable astigmatic-lens focal lengths, and whereby the device is a fluidic prism having a variable prism apex angle.

3. Fluidic optical devices wherein each can include a plurality of actuators. FIGS. 2D-2F and FIG. 23 illustrate a few examples of many possible configurations of devices with multiple actuators. Each actuator may be capable of being actuated independently or the actuators may be actuated in unison with one another. Furthermore the actuators may be capable of continuous actuation wherein optical performance of device (e.g., focal length, prism apex angle, etc) can be continuously controlled between a first state and a second state. Alternatively, the actuators may be capable of discrete actuation wherein optical performance of device (e.g., focal length, prism apex angle, etc) can be controlled in a number of discrete steps between a first state and a second state.

Figure 48:
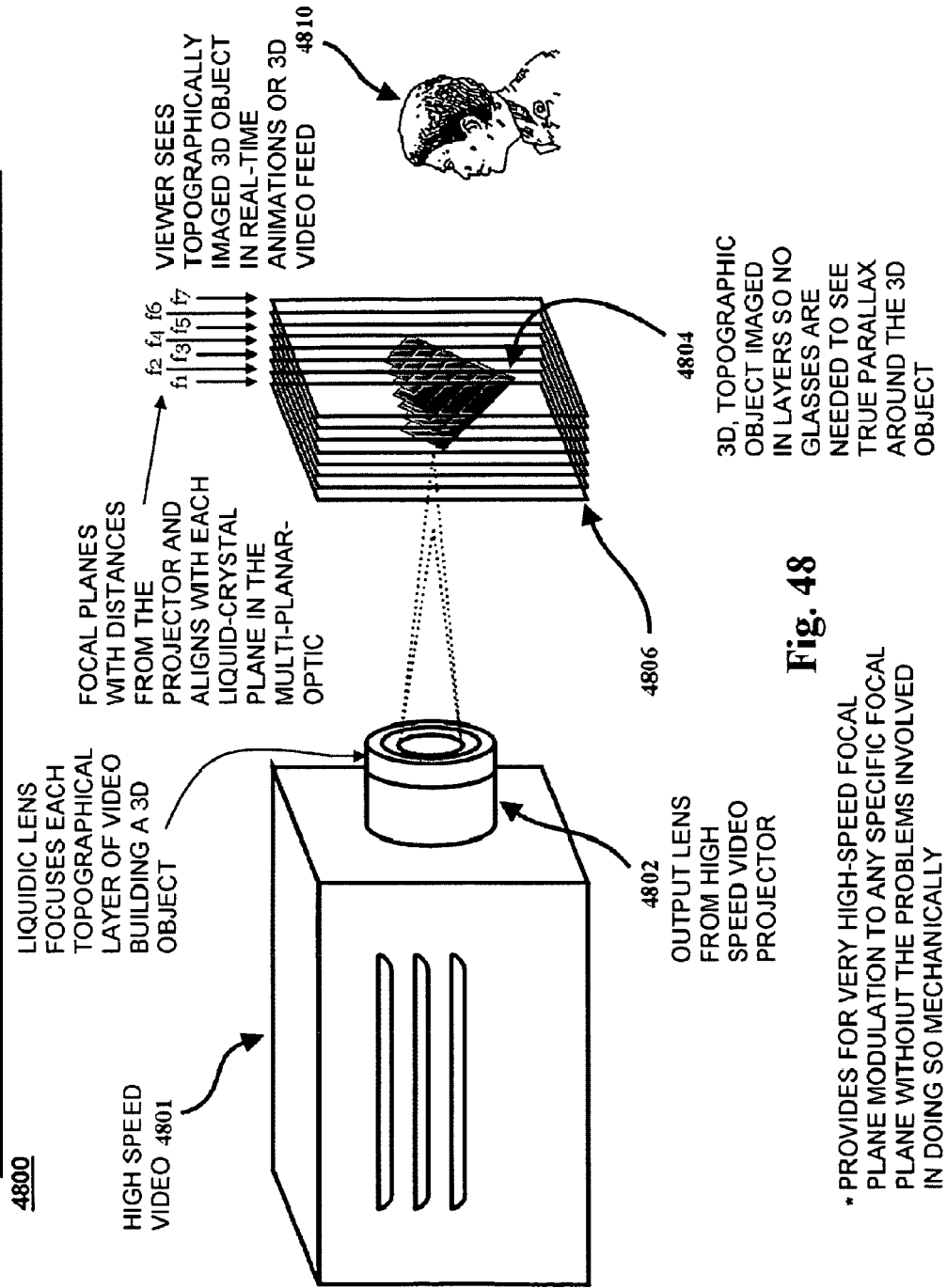
FIG. 48 is a schematic diagram of a multiplanar display system employing fluidic optical devices according to an embodiment of the present invention.

4. A digitally addressable fluidic optical device including a number N actuators, wherein the N actuators are capable of being independently actuated, wherein the value of the maximum change in focal power (or the volume of fluid that can be displaced, actuation stroke or other parameters corresponding to the actuators) of each actuator utilizes binary weighting with respect to at least one other of the N actuators, wherein the device is capable of being selectively activated in a number $2^N$ states, wherein the states may include discrete values of focal length, prism apex angle, focal power, etc, wherein the discrete values of focal power form a linear progression. Examples of combinations of optical devices to achieve $2^N$ states are described e.g., in U.S. Patent Application Publication 20020158866 A1 published Oct. 31, 2002 to Robert G. Batchko entitled "Combinatorial Optical Processor" and US Patent Application Publication 20040114203 A1 published June, 2004 to Robert G. Batchko entitled "Digital Focus Lens System" the disclosures of both of which are incorporated herein by reference. One possible application for such a device is in a multiplanar display system 4800, such as that depicted in FIG. 48. The multiplanar display system 4800 generally includes a high speed video projector 4801 having an output lens 4802 made up of a plurality of fluidic lens elements. The fluidic lens elements focus light from the projector 4801 on focal planes $f_1, \ldots f_8$ at discrete distances from the projector 4801 and aligned with corresponding liquid crystal planes 4806 in a multi-planar optic 4808 a different topographical layer of a video image thereby building a three-dimensional object 4804. Because the object 4804 is imaged in layers, no glasses are needed to see true parallax around the three-dimensional object 4804. A viewer 4810 can therefore see topographically imaged three-dimensional objects in real-time animations or 3D video feed. The system 4800 thus provides for very high-speed focal plane modulation and resolution to any specific focal plane without the problems associated with doing so mechanically.

Figure 22:
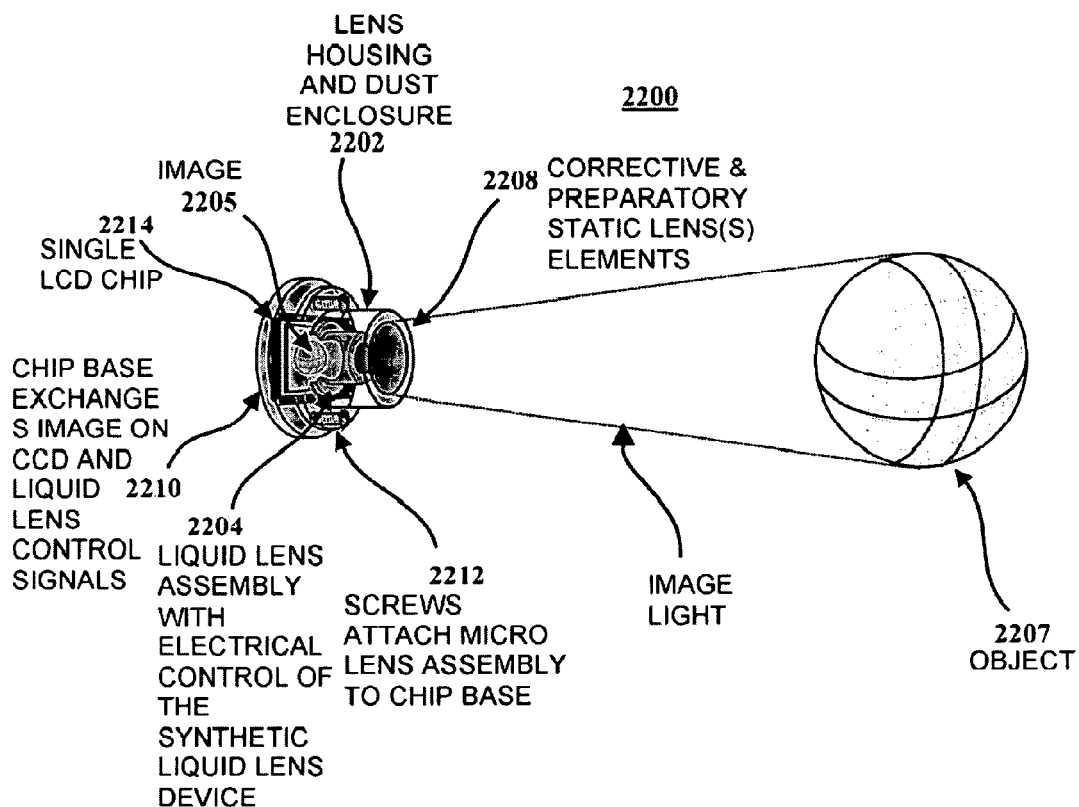
FIG. 22 is a three-dimensional schematic diagram of a fluidic device used with an image sensor element according to an embodiment of the present invention.

8. Fluidic optical devices of the types described herein may be used as part of an optical system such as a camera, zoom lens, lens system, eyeglasses, binoculars, telescope, microscope, etc. In a particular example, the device may include an image sensor, e.g., a charge coupled device (CCD) or complementary metal oxide semiconductor (CMOS) chip optically coupled to the aperture. The fluidic device, e.g., a fluidic lens, may be positioned to form an image of an object on the image sensor. Actuation, e.g., as described above, can allow variation of the focusing properties of the lens to optimize the image. Such a device can be used, e.g., as a cell phone camera. FIG. 22 depicts an example of a microlens assembly 2200 that may be used in hand held devices such as cell phones and handheld, wireless e-mail and communication devices such as the BlackBerry™ manufactured by Research in Motion Limited (RIM). The microlens assembly 2200 includes a lens housing and dust enclosure 2202, a fluidic lens 2204 with electronic control of the optical properties (e.g., focus, zoom, and the like) of the fluidic lens. The fluidic lens 2204 is kept within the lens housing and dust enclosure 2202. Corrective and/or preparatory static lenses 2208 or other optical elements may be optically coupled to the fluidic lens and mechanically attached to the housing. The housing attaches to a chip base 2210, e.g., using screws 2212. The fluidic lens 2204 forms an image 2205 of an object 2207 at an imaging device 2214, such as a CCD or CMOS chip mounted to the chip base 2210. The chip base 2210 may also contain control electronics that exchange control signals between a user interface and the fluidic lens and/or CCD/CMOS.

Figure 23A:
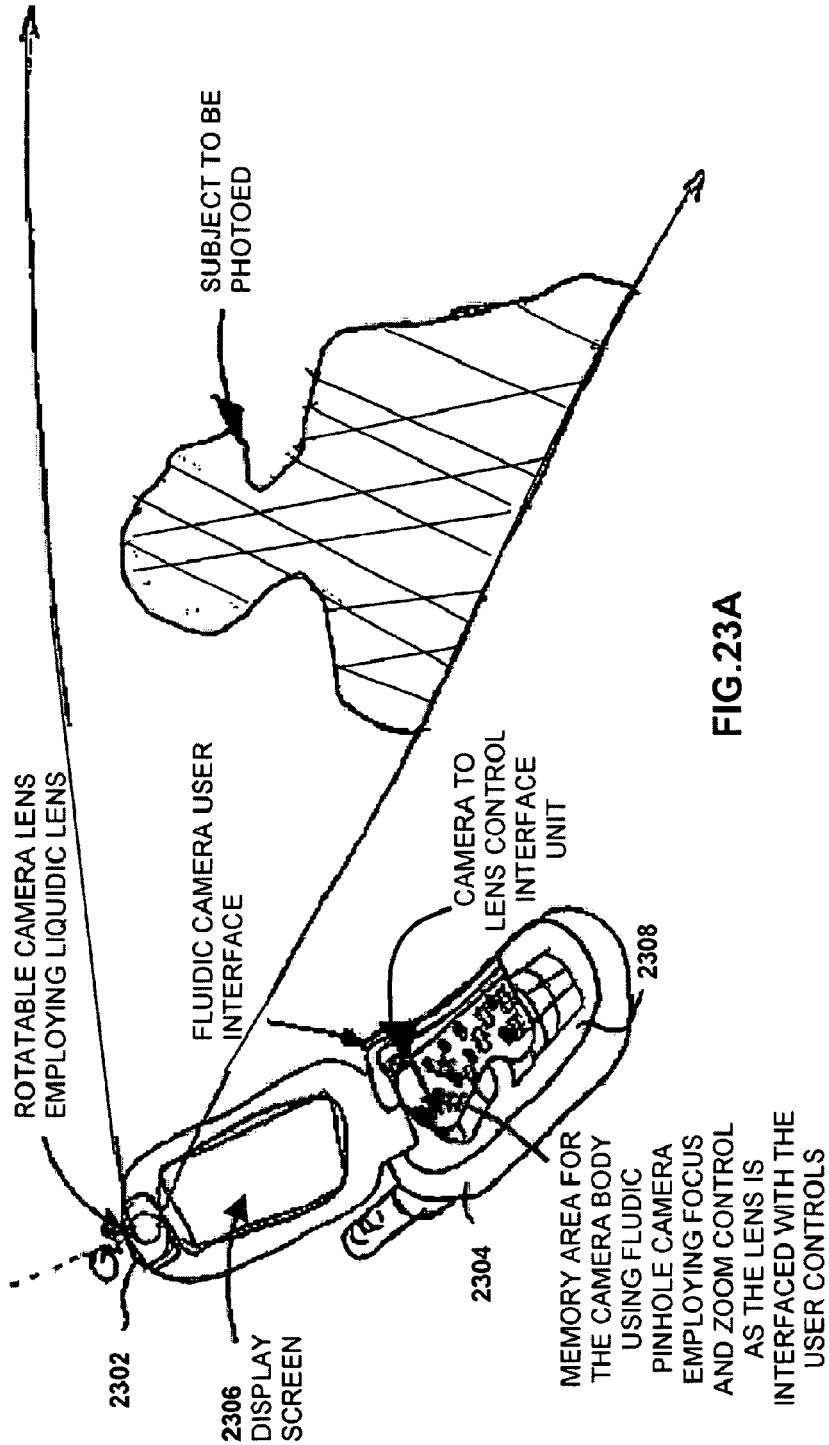
FIG. 23A illustrates an example of a camera phone employing a fluidic lens according to an embodiment of the present invention.

FIG. 23A depicts a cell phone 2300 having a camera employing a fluidic lens device of the type depicted in FIG. 22. The cell phone 2300 is, e.g., a flip-phone having a handset 2304 with a screen 2306 that can be flipped from a storage position to a viewing position. A rotatable pinhole camera 2302 using a fluidic lens can be incorporated into the handset 2304 or screen 2306. A user interface 2308, such as a keypad can control focus and zoom of the fluidic lens. The handset may include a memory area 2310 for storing images or messages sent from or received by the cell phone 2300.

Figure 23B:
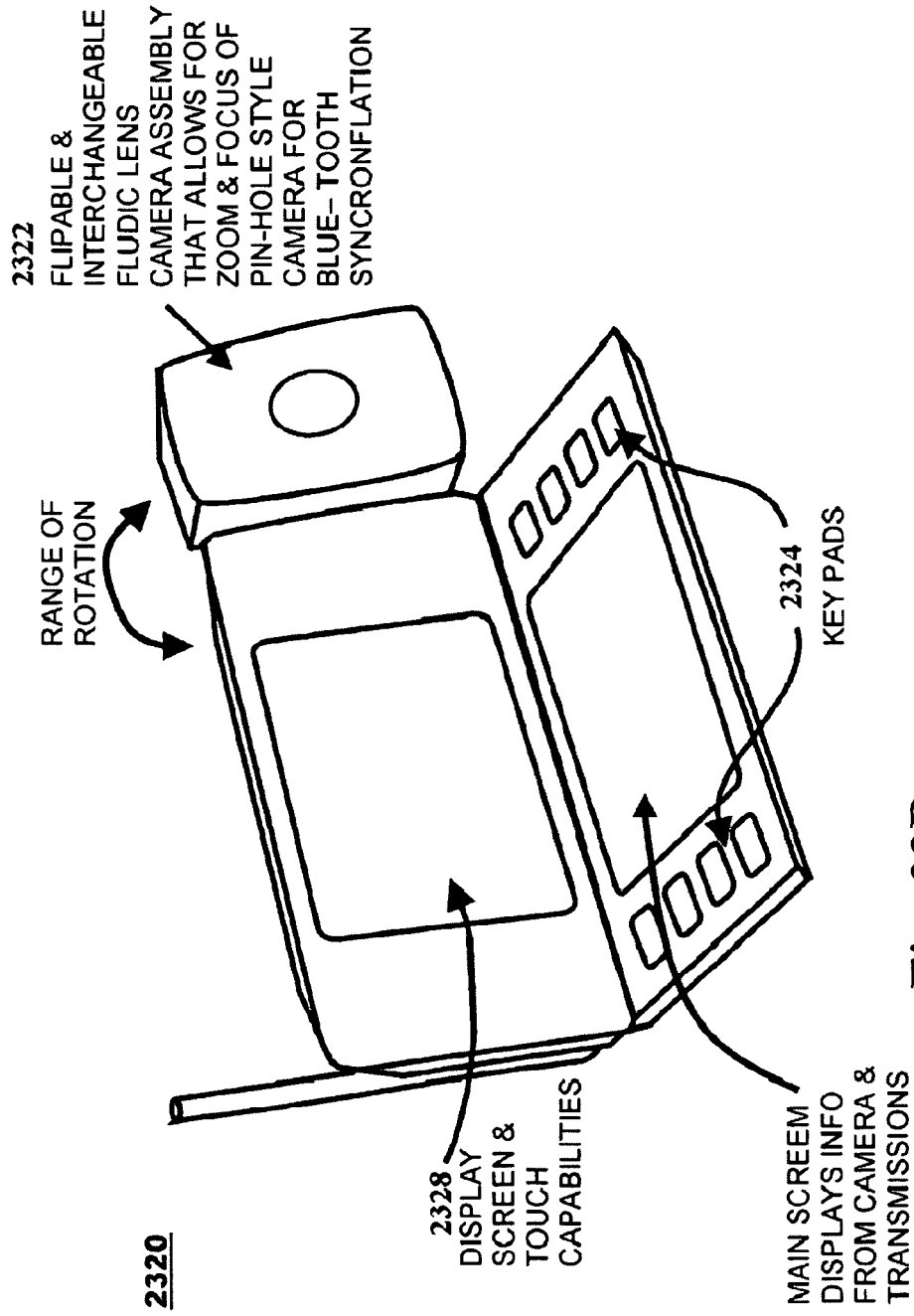
FIG. 23B illustrates an example of a mobile e-mail device employing a fluidic lens according to an embodiment of the present invention.
Figure 51:
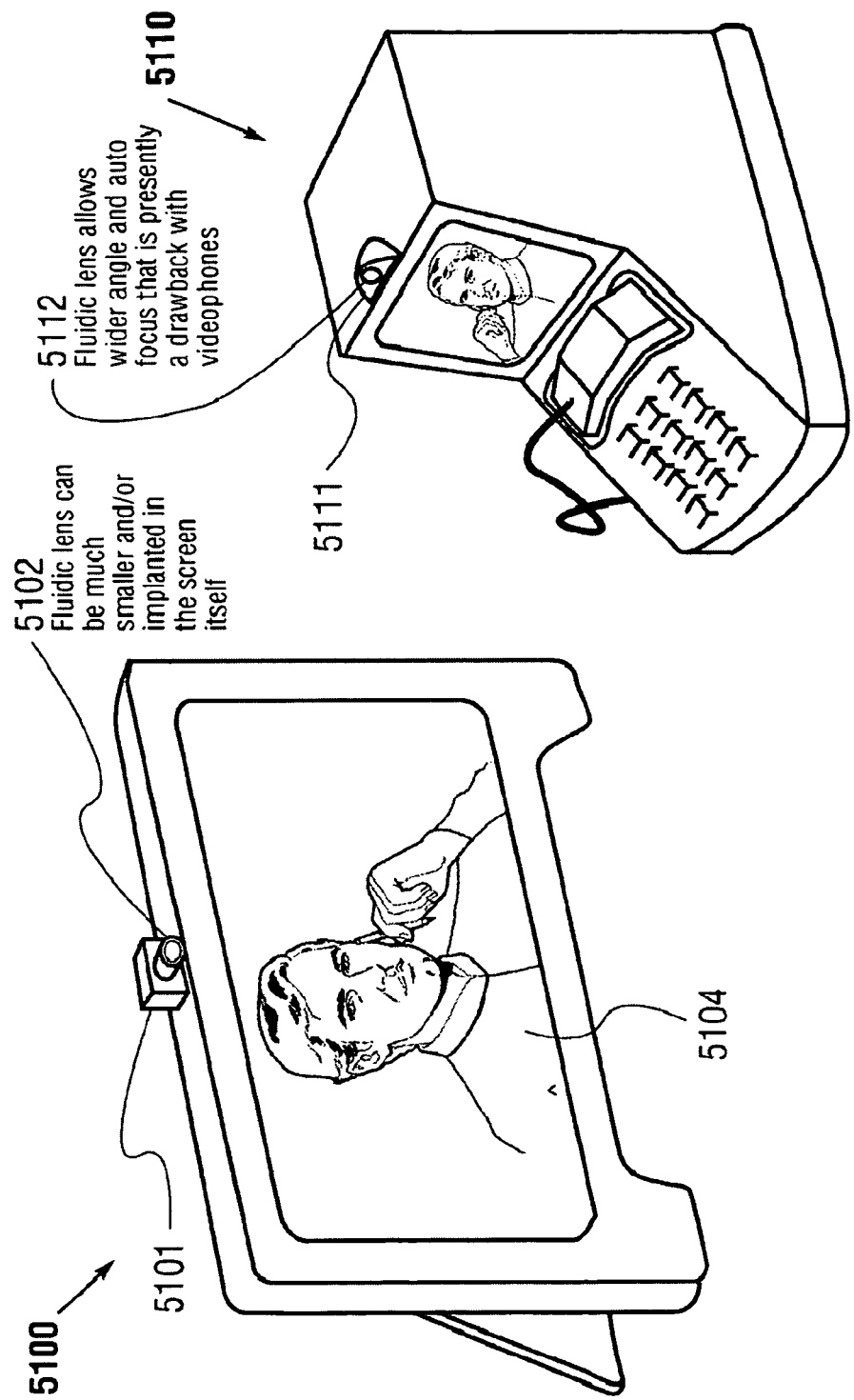
FIG. 51 depicts web cameras and video phones employing fluidic optical devices according to an embodiment of the present invention.

FIG. 23B depicts a mobile e-mail device 2320, similar to a BlackBerry™ device commercially available from Research In Motion (RIM). The e-mail device 2320 includes a flippable and interchangeable fluidic lens camera assembly 2322 that allows for zoom and focus of a pin-hole style camera for synchronization with short-range radio technology, such as Bluetooth, aimed at simplifying communications among Internet devices and between devices and the Internet. The device includes one or more key pads 2324 and a main screen 2326 that displays information from the camera and transmissions. The device 2320 screen may further include a display screen 2328 with optional touch pad capabilities. Devices of the type depicted in FIG. 22 may also find use in video phones 5100 and web cameras 5110 as depicted in FIG. 51. The video phone 5100 and web camera 5110 can use cameras 5101, 5111 having a fluidic lenses 5102, 5112. The fluidic lens 5102 can be much smaller and/or may be implanted in a screen 5104 of the video phone 5100. The fluidic lens 5112 allows a wider angle and auto focus than is presently a possible with videophones.

Figure 34:
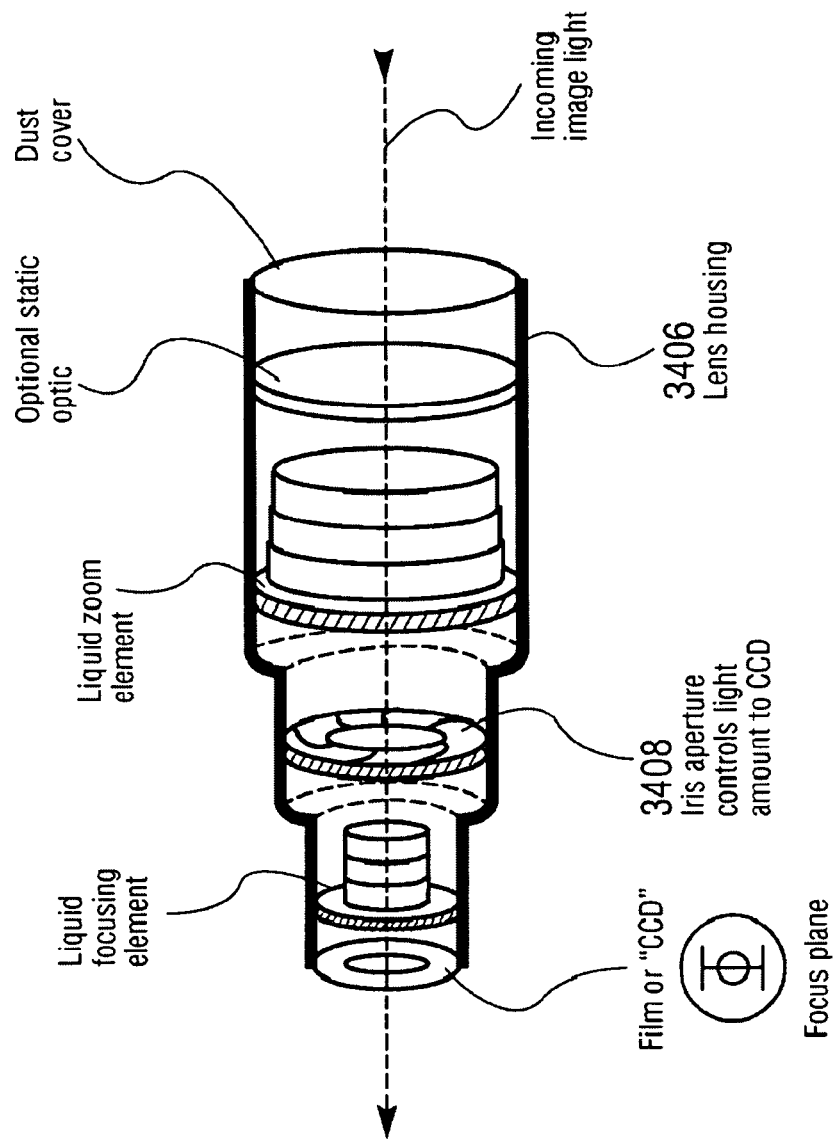
FIG. 34 is a three-dimensional schematic diagram of a still camera lens incorporating fluidic optical devices according to an embodiment of the present invention.

9. A fluidic optical system may include a number of fluidic optical devices of the types described herein, wherein devices are stacked as set forth in U.S. Patent Application Publications 20020158866 A1 and 20040114203 A1. The devices may be stacked generally collinear to an optical axis. Examples of optical systems that include stacks of fluidic devices includes combinations of fluid optical devices and static optical components. By way of example, as depicted in FIG. 34, an optical system 3300 may include fluidic lens elements 3302A, 3302B, 3302C and one or more static lens elements 3304A, 3304B mounted to a lens housing 3306. A photographic film, CCD or CMOS sensor may be placed at a main focus of the system 3300. Normally, static lenses must move closer or farther away from each other to effect focus and/or telephoto or zoom capabilities. With fluidic optical devices, these capabilities can be implemented without having to translate the lenses with respect to each other. Deformation of the lens membrane of a given fluidic element changes its focal length, magnification or zoom. Such fluidic lens optical systems may be used e.g., as microscopes, telescopes, camera lenses (for providing features including variable optical zoom and autofocus) and the like.

Figure 33:
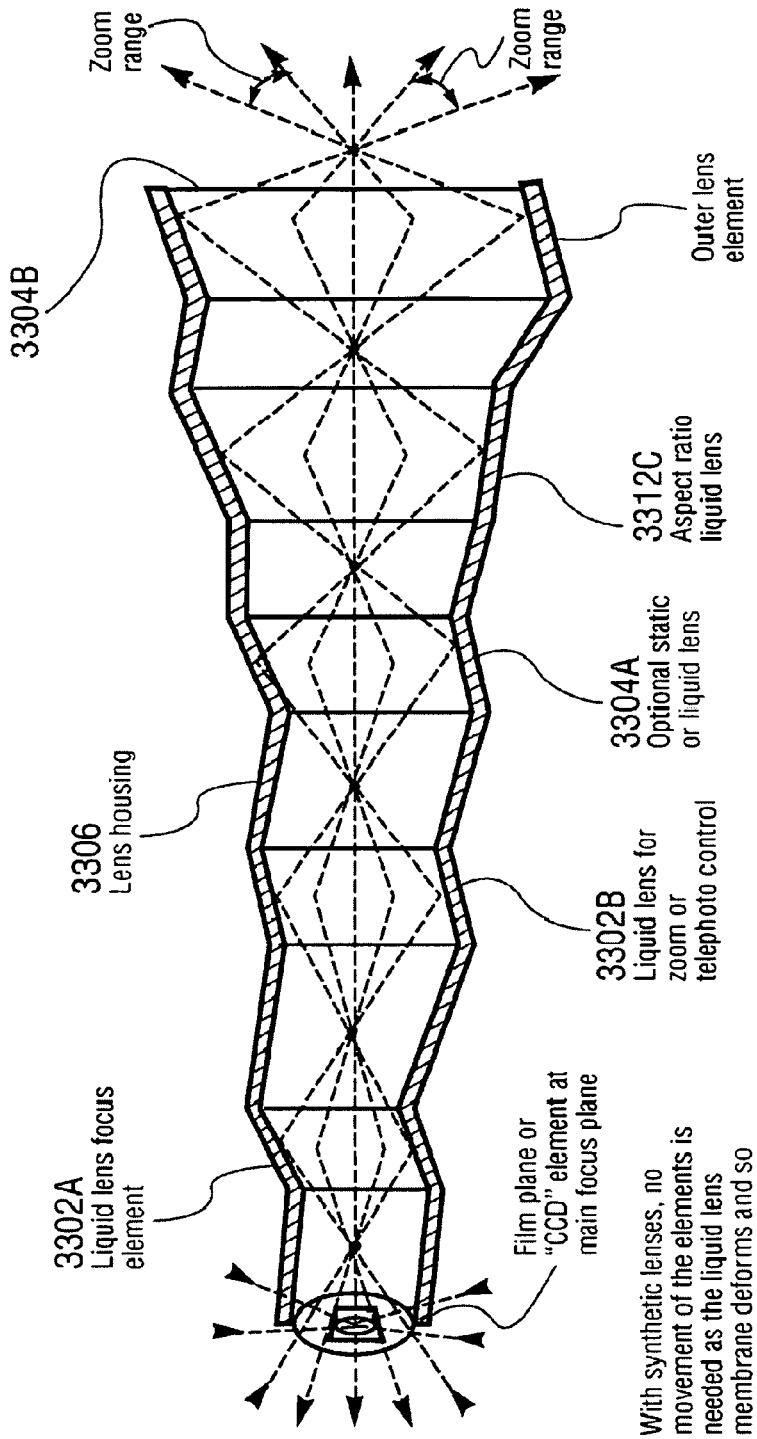
FIG. 33 is a schematic diagram of a compound lens having a combination of static and fluidic lens elements according to an embodiment of the present invention.

A fluidic lens optical system of the type depicted in FIG. 33 may be used as a professional still camera lens. For example, in FIG. 34 a still camera lens 3400 includes a fluidic lens focusing element 3402 and a fluidic lens zoom element (and/or an autofocus element) 3404 mounted within a housing 3406. A variable iris aperture 3408 between the focusing element 3402 and zoom element 3404 controls the amount of light that reaches a focus plane where a film or charge coupled device may be located. The lens 3400 may further include an optional static optic (e.g., a lens) 3410 and dust cover 3412 mounted to the housing 3406.

Figure 35:
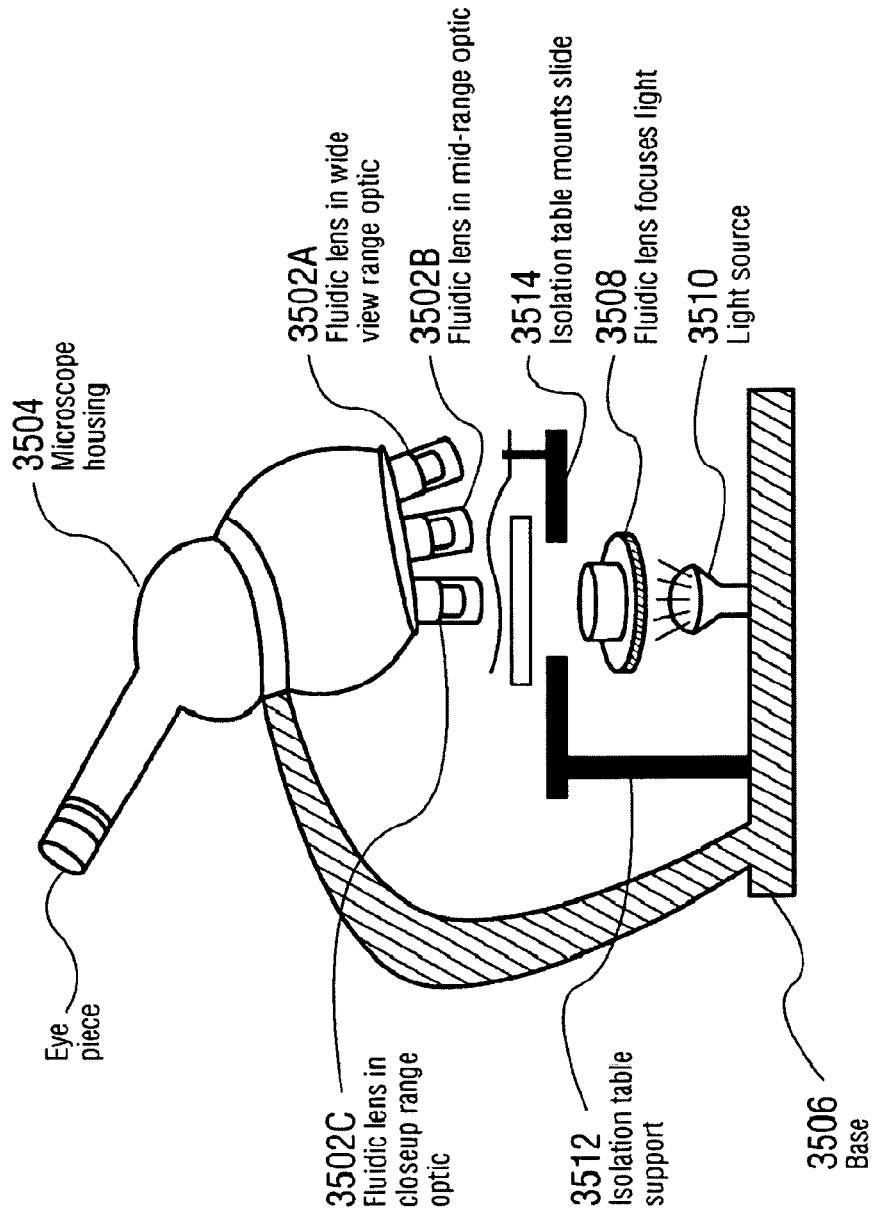
FIG. 35 is a schematic diagram of a microscope incorporating fluidic optical devices according to an embodiment of the present invention.

FIG. 35 depicts an example of microscope 3500 incorporating fluidic optical devices. The microscope 3500 includes fluidic objective lenses 3502A, 3502B, 3502C of any of the types described herein. The fluidic objective lenses 3502A, 3502B, 3502C may respectively provide for wide view, mid-range and close-up optics. The objectives 3502A, 3502B, 3502C may be mounted to a microscope housing 3504 in a conventional selective mount that allows the different objectives to be mechanically rotated into the microscope optical column. The housing may be mounted to a base 3506.

Another fluidic lens 3508 may focus light from a source 3510 onto a slide 3512 mounted on an isolation table 3514 mounted to the base by a support 3516.

Figure 36:
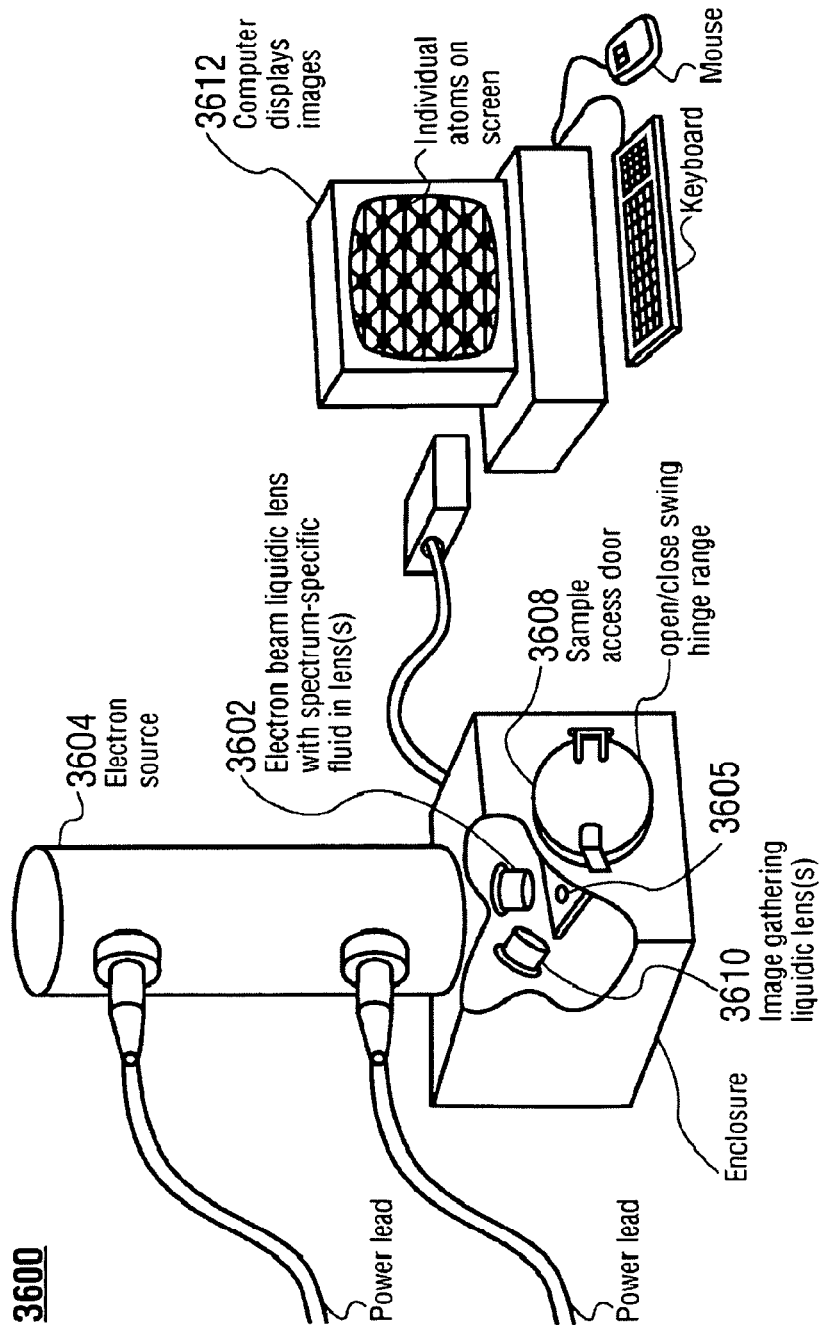
FIG. 36 is a schematic diagram of an electron microscope incorporating fluidic optical devices according to an embodiment of the present invention.

Microscope applications of fluidic optical devices may also be used in an electron microscope 3600 as depicted in FIG. 36. The microscope 3600 generally includes a fluidic electron beam lens 3602 coupled to an electron source 3604. The fluidic electron beam lens 3602 focuses electrons from the source 3604 onto a sample 3605 within an enclosure 3606. The enclosure 3606 may be evacuated during operation. A door 3608 allows access to the enclosure. Electrons scattered from the sample 3605 are collected by one or more fluidic image gathering lenses 3610 and focused onto an electron imaging device. Images of the sample may be displayed using a computer 3612.

Figure 52:
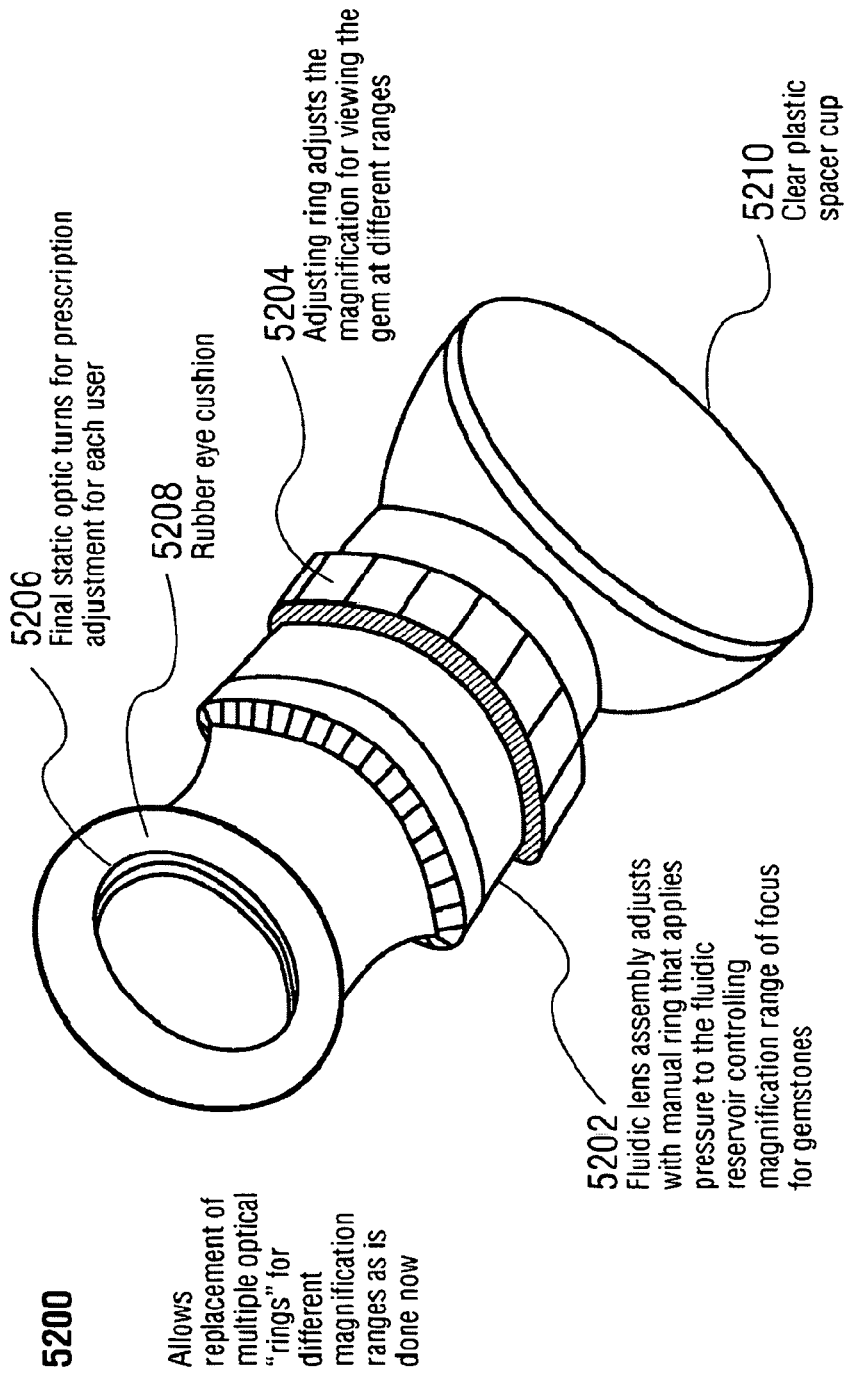
FIG. 52 depicts a magnification device employing fluidic optical elements according to an embodiment of the present invention.

Fluidic lenses of the types described herein can also be used in hand held magnification devices 5200, e.g., of a type commonly used in cutting and polishing gemstones as depicted in FIG. 52. The magnification device 5200 generally includes a fluidic lens assembly 5202 that adjusts, e.g., with a manual ring 5204 that applies pressure to a fluidic reservoir as described above to control the magnification range or range of focus for gemstones. The device 5200 many optional include a final static optic 5206 that turns for prescription adjustment of the device for each user. The device 5200 may also include a rubber eye cushion 5208 and a clear plastic spacer cup 5210. The use of the fluidic lens assembly 5202 allows for replacement of multiple optical rings for different magnification ranges as is done in conventional magnifiers.

Figure 53:
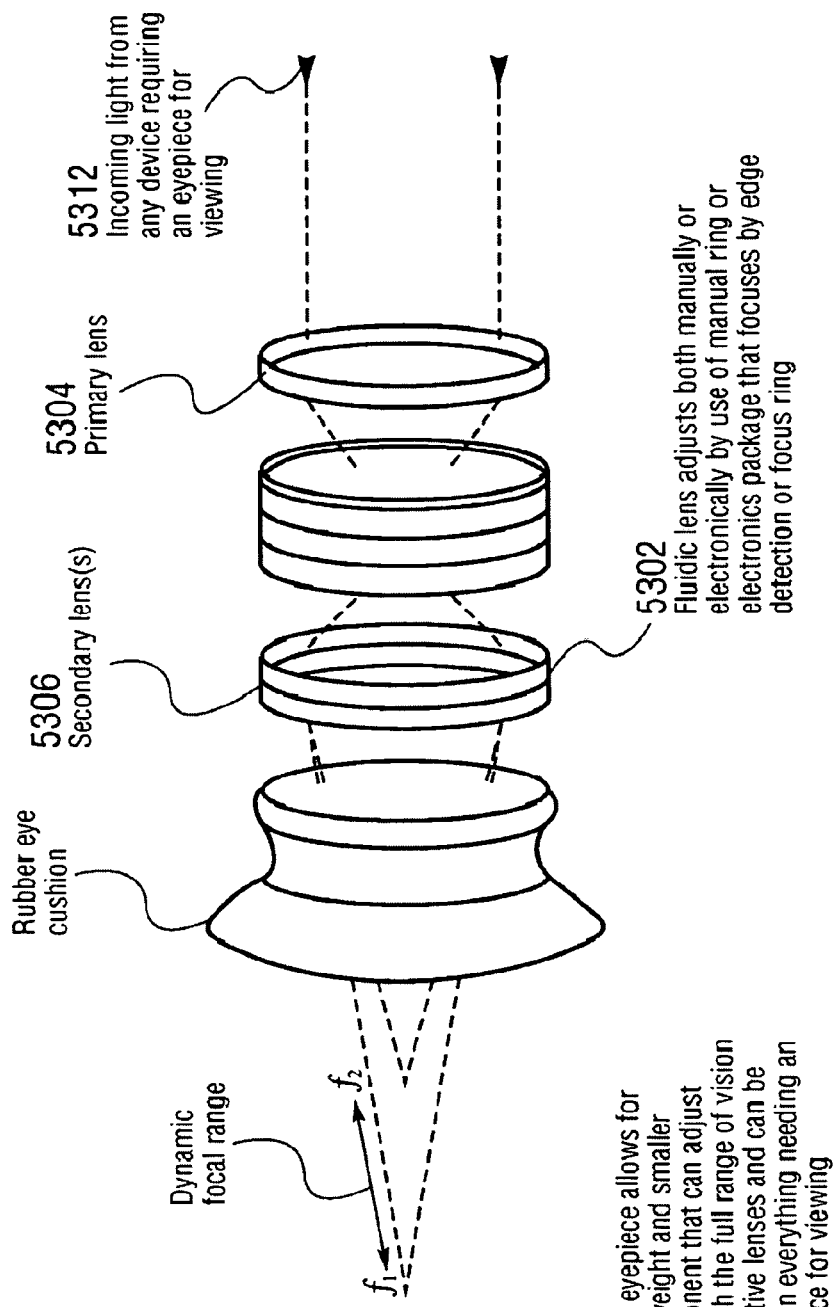
FIG. 53 depicts an eyepiece employing fluidic optical elements according to an embodiment of the present invention.

Further applications of fluidic lenses include eyepieces 5300 for optical instruments, e.g., as depicted in FIG. 53. The eyepiece 5300 generally includes a fluidic lens 5302 disposed between a primary lens 5304 and a secondary lens 5306. The eyepiece may optionally include a rubber eye cushion 5308. The lenses 5302, 5304, 5306 are configured to focus parallel incoming light 5312 from any device requiring an eyepiece for viewing. The fluidic lens 5302 may adjust manually, e.g., by use of a manual ring and/or electronically, e.g., by use of an electronics package that focuses by edge detection or focus ring. The fluidic lens 5302 allows the eyepiece 5300 to be a relatively small and lightweight component that can adjust through a full range of vision-corrective lenses and can be used on any optical instrument needing an eyepiece for viewing.

Figure 37:
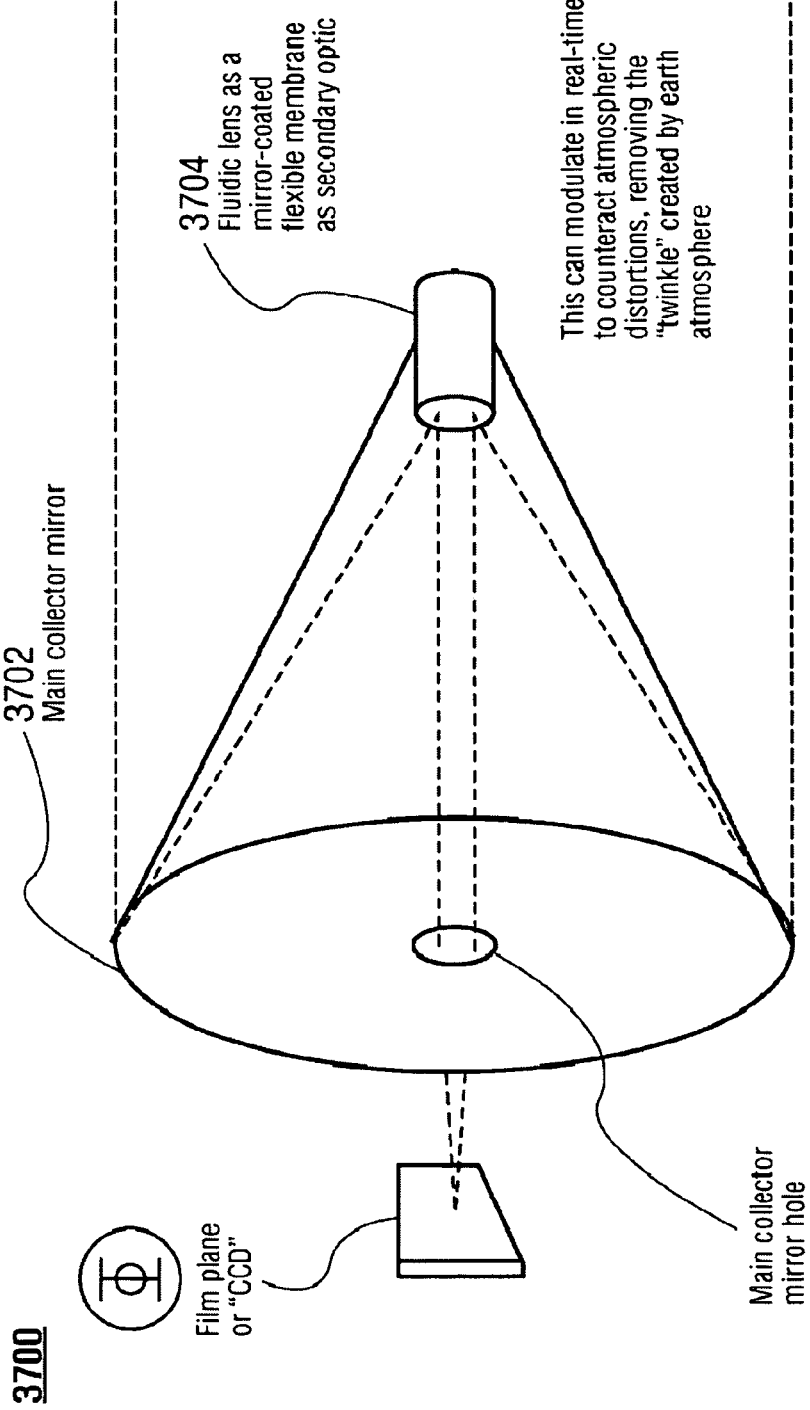
FIG. 37 is a schematic diagram of a deformable mirror optical system according to an embodiment of the present invention.
Figure 38:
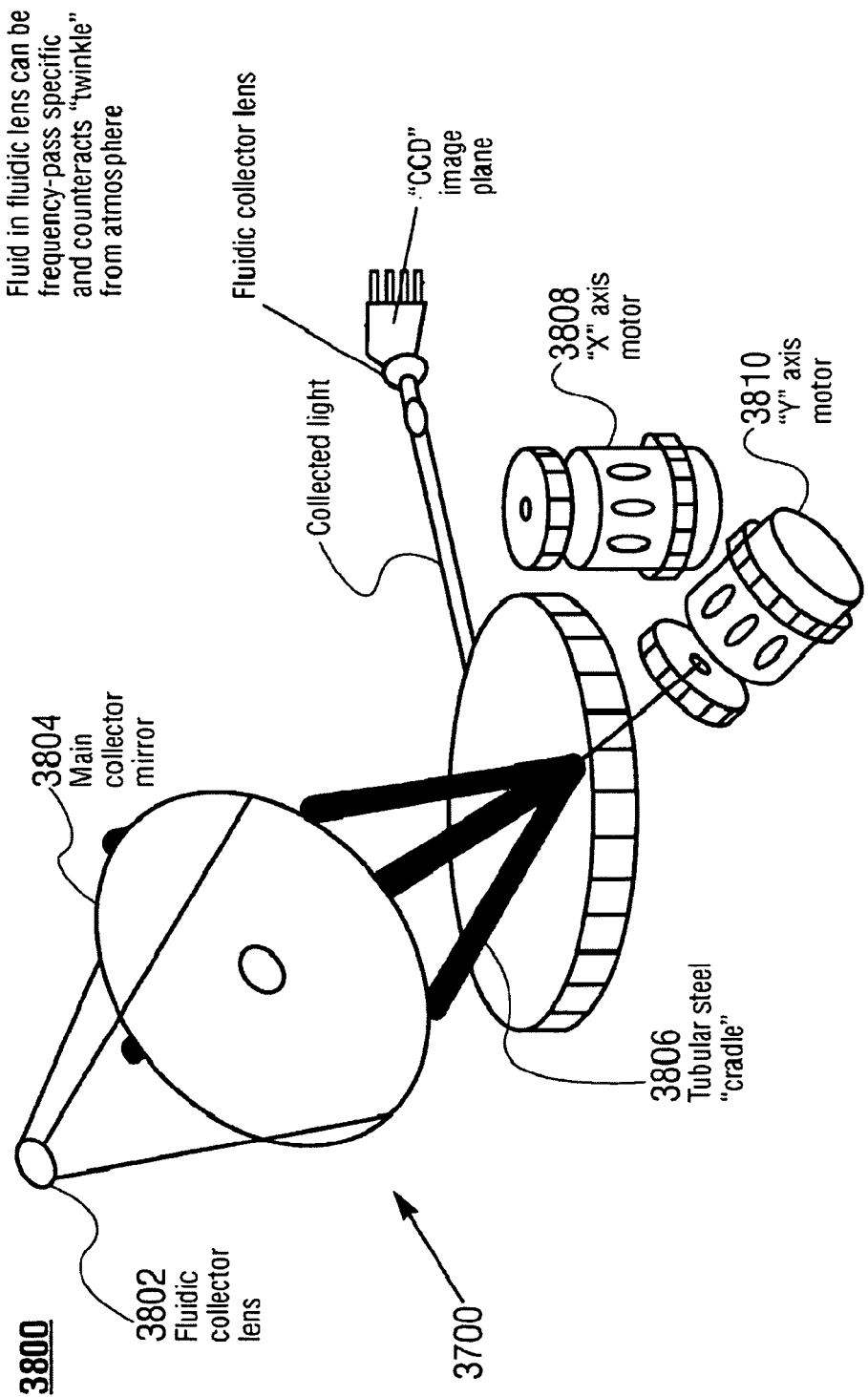
FIG. 38 is a schematic diagram of a telescope using the deformable mirror optical system of FIG. 37.

Embodiments of the invention include fluidic optical devices configured as optical mirrors, e.g., by reflectively coating a deformable membrane optical surface. Such deformable mirrors find application in optical systems such as astronomical telescopes. For example FIG. 37 depicts an optical system 3700 having a main collector mirror 3702 (which may be a conventional static mirror) optically coupled to a mirror coated fluidic lens 3704. The fluidic mirror/lens 3704 focuses light from the main mirror 3702 through a central hole and onto a film plane or CCD. The variable curvature of the fluidic mirror/lens allows modulation in real-time to counteract for atmospheric distortion of images of distant objects. Such modulation can be used to counteract the "twinkle" effect or aberration created by the earth's atmosphere. FIG. 38 depicts an example of an astronomical telescope 3800 that may incorporate the optical system 3700. The telescope 3800 generally includes a fluidic collector lens 3802 optically coupled and mechanically mounted to a main collector mirror 3804. The main collector mirror may, in turn, be mounted to a tubular steel "cradle" 3806 that can be turned about x and y axes by motors 3808, 3810. Light collected by the main collector mirror 3804 and focused by the fluidic collector lens 3802 may be transmitted to an imaging device 3312, e.g., a CCD. A second fluidic collector lens 3314 may focus the collected light onto the imaging device 3312. Either or both of the fluidic collector lenses 3802, 3814 may be filled with a fluid that can be frequency-pass specific and/or may counteract the "twinkle" effect due to refraction of light by the earth's atmosphere.

Figure 39:
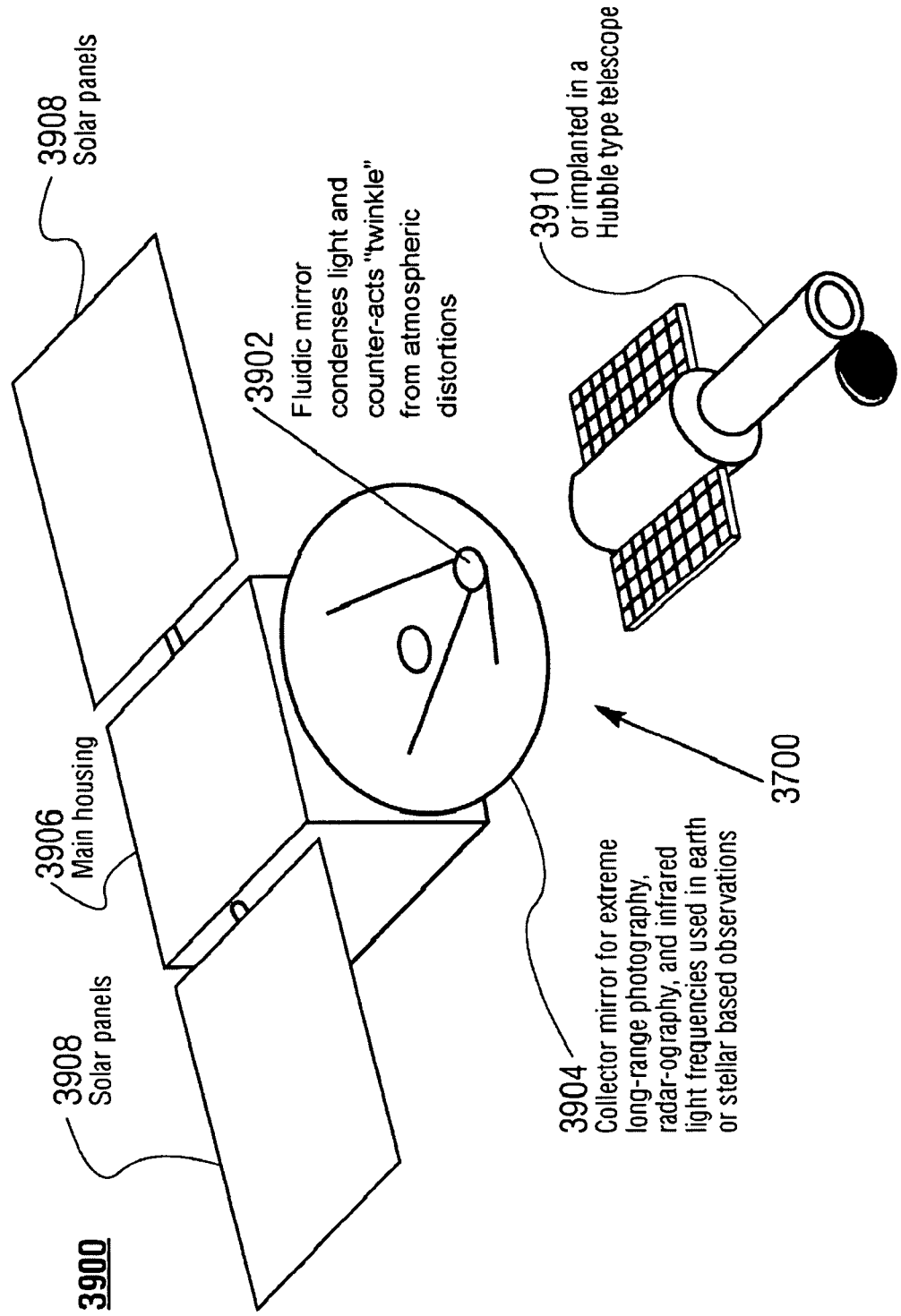
FIG. 39 is a schematic diagram of a satellite imaging system using the deformable mirror optical system of FIG. 37.

FIG. 39 depicts an example of a satellite imaging system 3900 incorporating the optical system 3700. The system 3900 generally includes a fluidic mirror 3902 optically and mechanically coupled to a main collector mirror 3904. The fluidic mirror 3902 condenses light collected by the main collector mirror 3904 and may also counteract "twinkle" from atmospheric distortions. Light condensed by the fluidic mirror may then be transmitted to imaging or analytical instruments within a main housing 3906. Electrical power for these instruments may be provided by solar panels 3908. Such a system may be used for extreme long range photography, radar-ography and imaging of infrared light frequencies used in earth or stellar observations. Alternatively, the system 3900 may be incorporated into a Hubble type orbiting telescope 3910.

Figure 40:
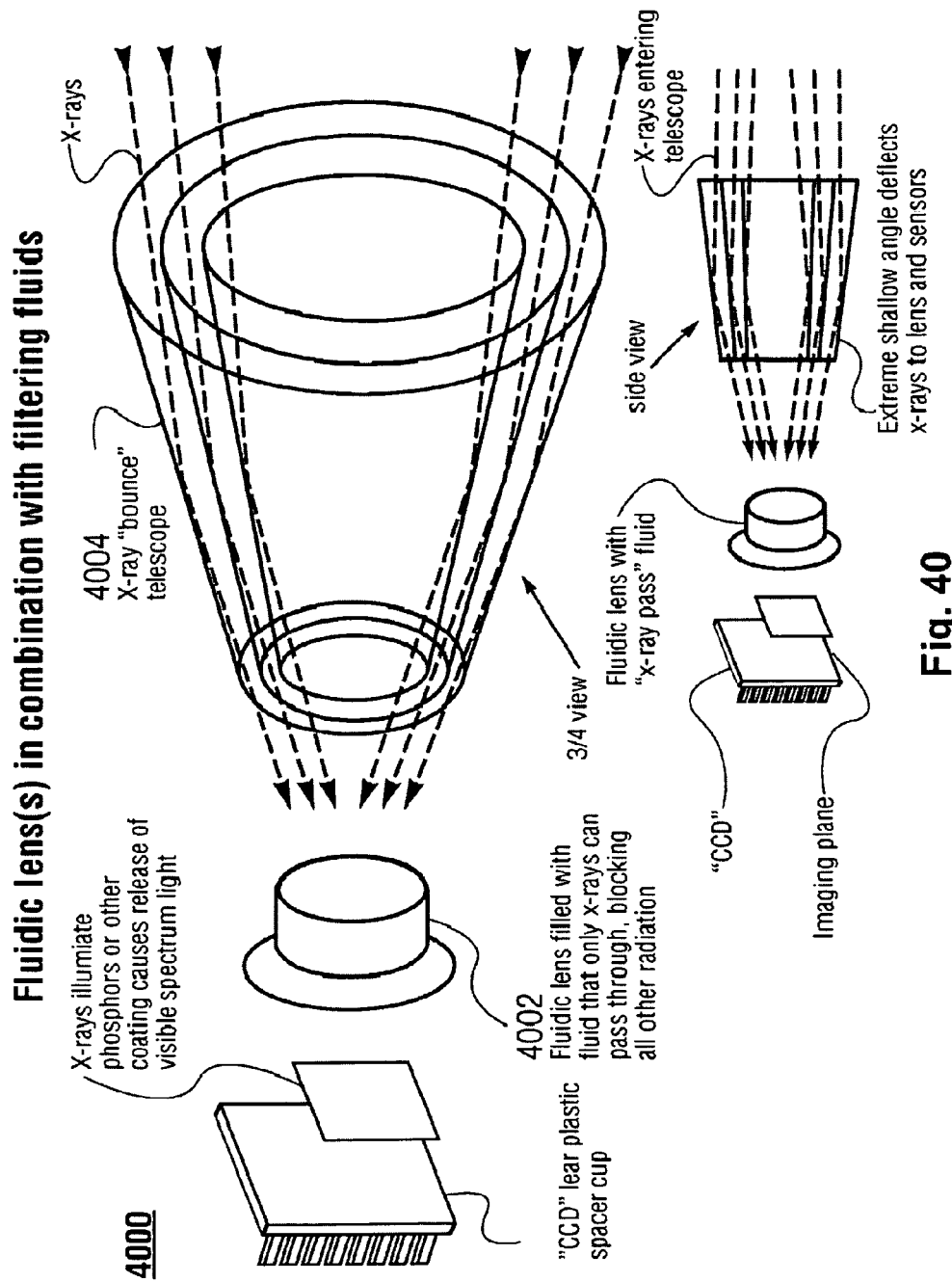
FIG. 40 is a schematic diagram of an X-ray optical system that uses fluidic optical elements according to an embodiment of the present invention.

Optical systems that may use fluidic devices of the types described herein are not limited to those used for focusing visible, ultraviolet (UV), infrared (IR) and radar wavelengths. Such devices may also be used for significantly shorter wavelength radiation such as X-rays. FIG. 40 depicts an X-ray optical system 4000 that uses a fluidic optical device 4002, which may have the general construction of any of the types described above. The device 4002 is filled with a fluid that is transparent only to X-rays and may block all other radiation. An X-ray "bounce" telescope 4004 may be optically coupled to the device 4002. The bounce telescope 4004 includes a series of nested concentric frusta-conical shells that deflect X-rays striking their surfaces at extremely shallow angles. The device 4002 can focus X-rays gathered by the telescope 4004 onto an imaging device 4006 such as a CCD camera chip.

Figure 41:
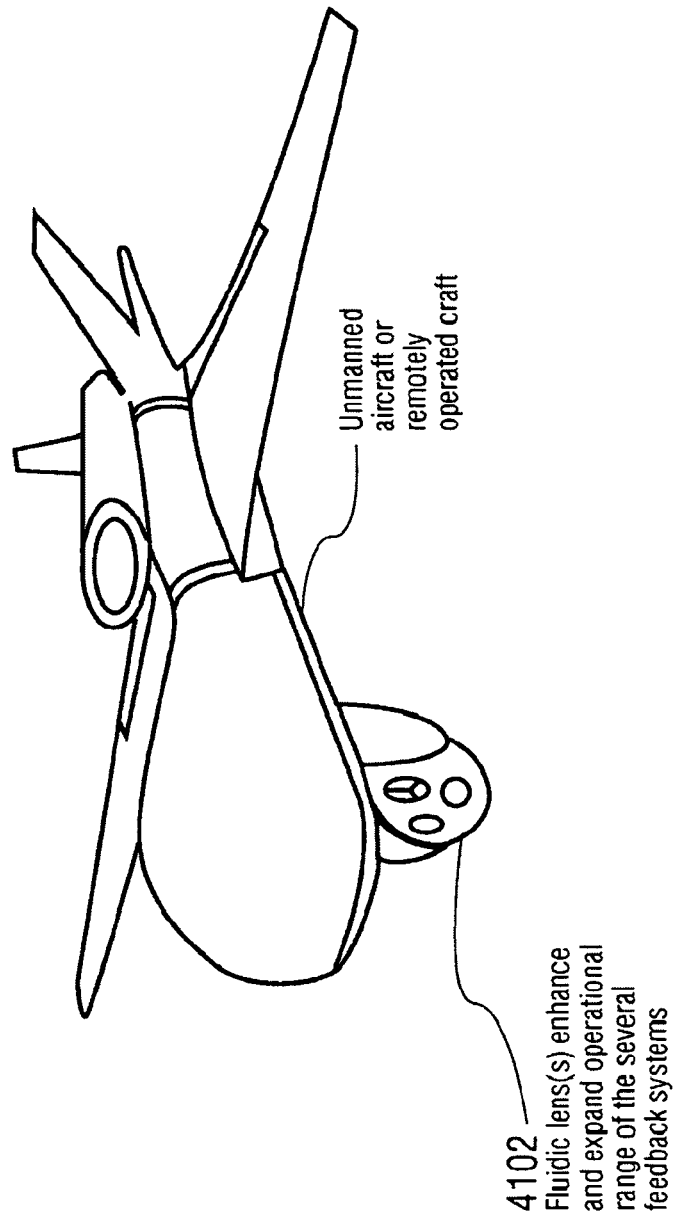
FIG. 41 illustrates application of fluidic optical devices to sensor systems in un-manned or remotely operated aircraft according to an embodiment of the present invention.

Optical systems employing fluidic optical devices as described herein can have the advantage of relatively low weight compact size. Such features make fluidic-device optical systems ideal for applications where low weight and small size are highly desirable. Examples of such applications include, but are not limited to optical sensing systems used in un-manned, robotic or remotely controlled vehicles, such as aircraft, sometimes referred to as UAVs. FIG. 41 depicts an example of a UAV 4100 employing fluidic lens optical systems 4102. The fluidic lenses enhance and expand the operation range of the sensor and feedback systems. Additional applications of fluidic optical devices include so-called "heads-up" displays. FIG. 42 depicts an example of a heads-up display system 4200 having an optical system 4202 that employs fluidic optical devices, e.g., lenses of the types described herein. The optical system 4202 is mounted to a user's helmet 4204. The optical system projects a video image fed, e.g., from systems on an aircraft onto a beam splitter 4206. The beam splitter allows the user to view both his surroundings and the projected video images from the optical system 4202. Fluidic optical devices, such as lenses can reduce both the size and weight of the optical system 4202 compared to conventional video projectors based on static lenses.

Figure 49:
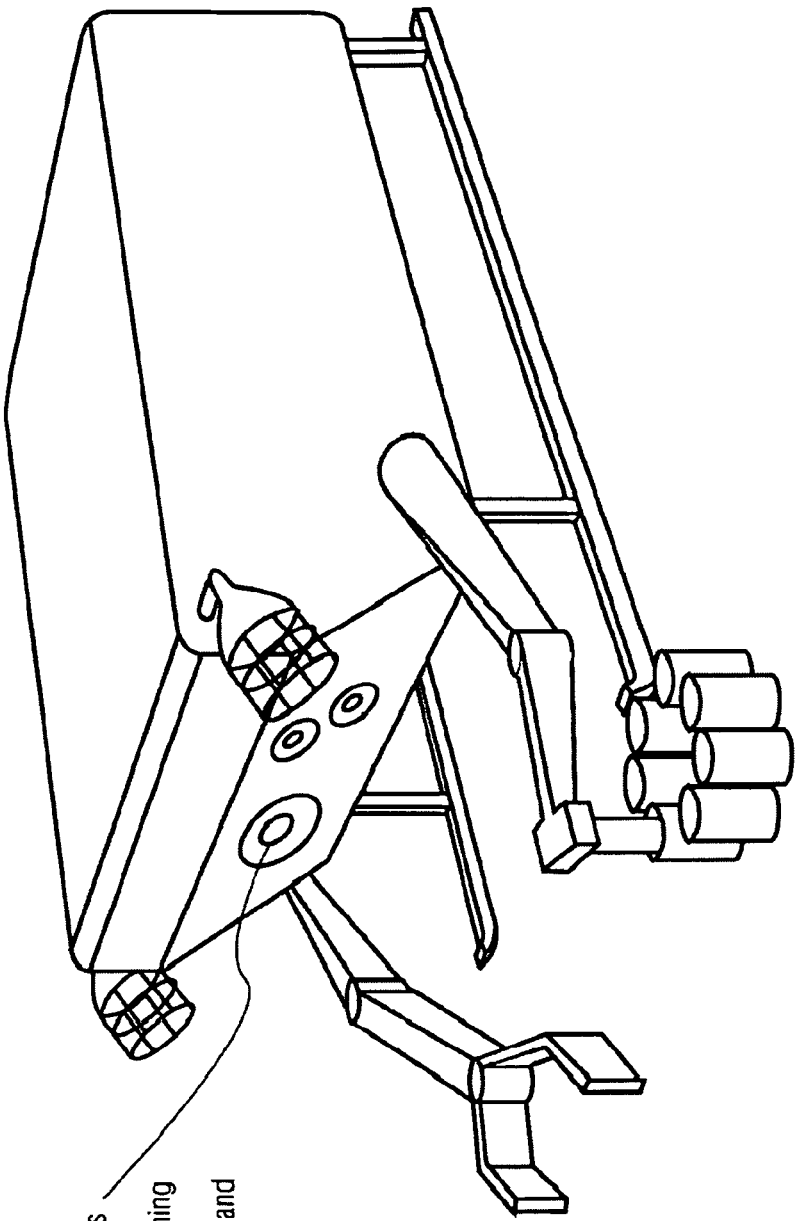
FIG. 49 is a schematic diagram of a robotic vehicle employing fluidic optical devices according to an embodiment of the present invention.
Figure 50:
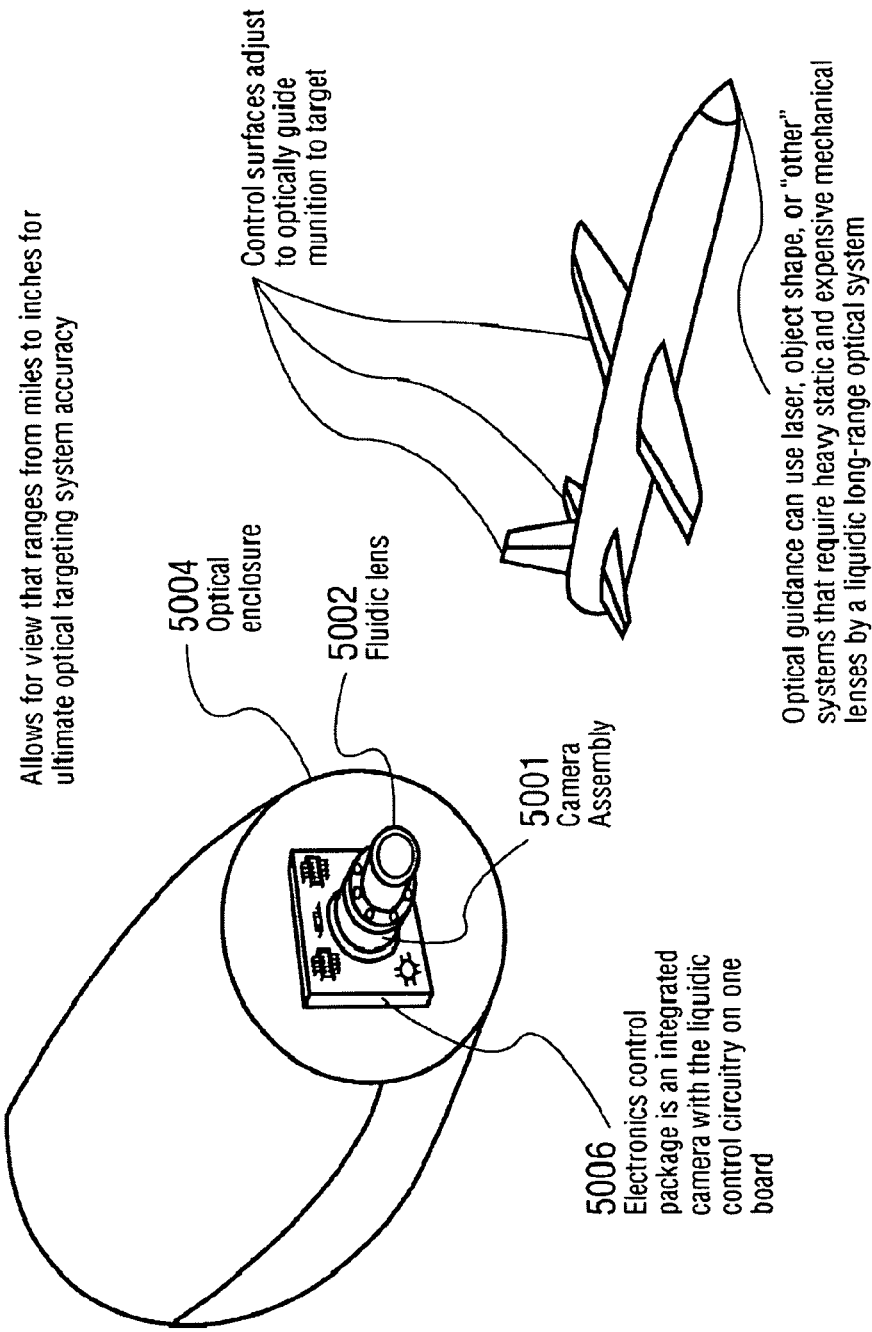
FIG. 50 is a schematic diagram of a self guided ordinance unit employing fluidic optical devices according to an embodiment of the present invention.

Alternatively, fluidic lens optical systems may be employed in remotely operated vehicles other than aircraft as illustrated, e.g., in FIG. 49 or robotic vehicles 4900. A fluidic lens 4902 allows a large focus range increase for optical systems on the robotic vehicle 4900. This can greatly enhance optical scanning while reducing size and weight. Such advantages are particularly useful for robotic vehicles such as "fire and forget" self guiding ordinance 5000 as depicted, e.g., in FIG. 50. The ordinance 5000 includes a camera assembly 5001 having a fluidic lens 5002. The camera assembly is mounted within an optical enclosure 5004 within a nose cone of the ordinance 5000. The fluidic lens 5002 is coupled to an electronics control package 5006 integrated into the camera assembly 5001. The electronics control package 5006 includes both imaging and fluidic lens control components on a single circuit board. Images from the camera assembly 5001 can be processed to adjust control surfaces 5008 of the ordinance 5000 to optically guide the ordinance to a target. The optical guidance, which may be implemented in hardware, software or a combination of both, can use laser, object shape or other systems that would normally require heavy static and expensive mechanical lenses. These lenses can be replaced with a fluidic long-range optical system that allows for a view that ranges from miles to inches for ultimate optical targeting system accuracy.

Figure 43A:
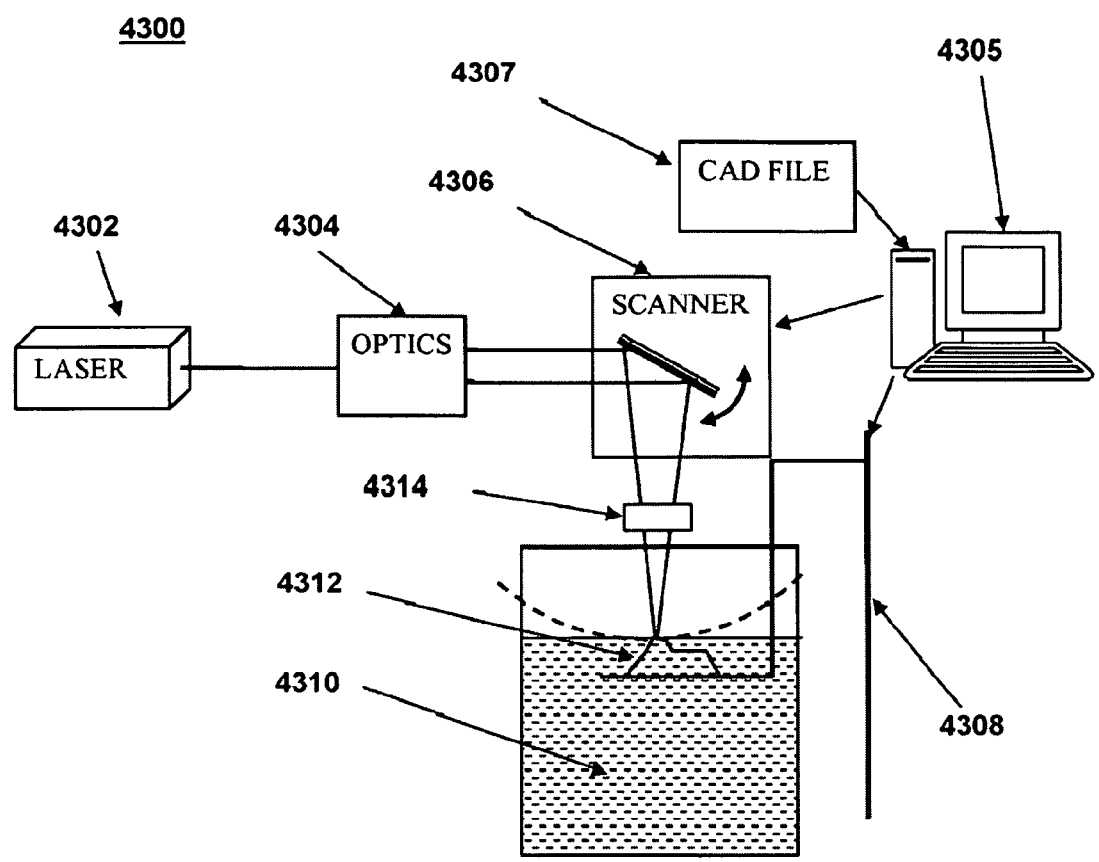
FIGS. 43A-43B are schematic diagrams illustrating application of fluidic optical devices to stereo lithography according to an embodiment of the present invention.
Figure 43B:
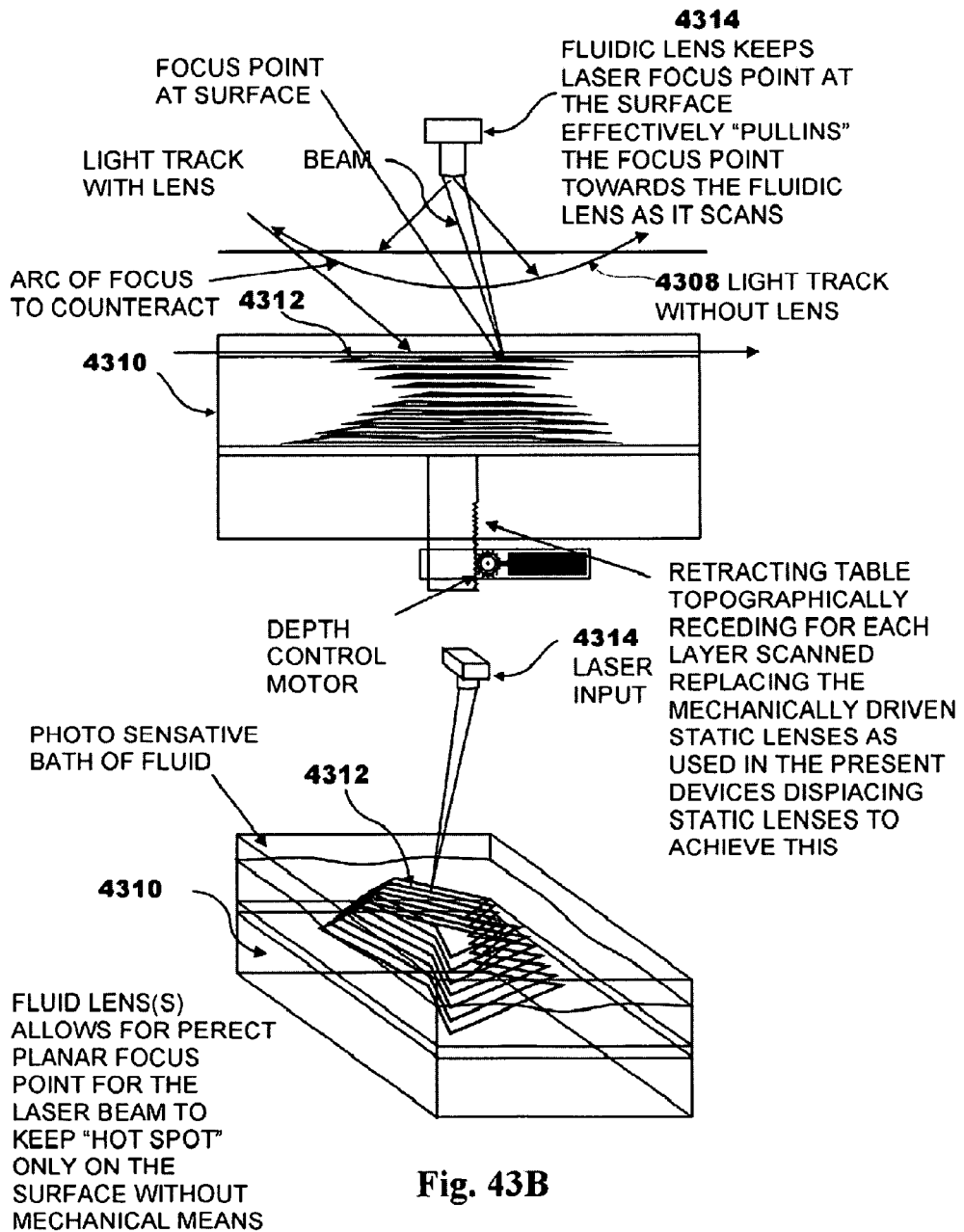

Fluidic optical devices according to embodiments of the present invention also find application in stereolithography, also known as three-dimensional imaging and three-dimensional modeling. Stereolithography is a method of creating real three-dimensional models by using lasers driven by CAD software. In contrast to the normal practice of removing material, this process polymerizes a liquid to quickly produce shapes that are untouched by human hands or cutting tools. As shown in FIGS. 43A-43B a stereolithography system 4300 generally includes a laser 4302, optics 4304, a scanner 4306, and a retracting table 4308. Light from the laser 4302 polymerizes a photo polymer resin 4310 to form a three-dimensional object 4312 on the retracting table 4308. The scanner 4306 scans the laser light across the precursor in an x-y direction while the retracting table 4308. The system 4300 typically includes a computer 4305 that controls the scanner 4306 and retracting table 4308 to reproduce a three-dimensional object stored as an image in a CAD file 4307. The scanner typically scans the laser light in an arc indicated by the dashed line. As a result, the laser light has a different depth of focus for different locations in the x-y plane. A fluidic lens 4314, e.g., between the scanner and retracting table can correct for this depth of focus and keep the laser focus point at the surface of the photopolymer resin, effectively "pulling" the focus point towards the fluidic lens as the beam scans.

Figure 44:
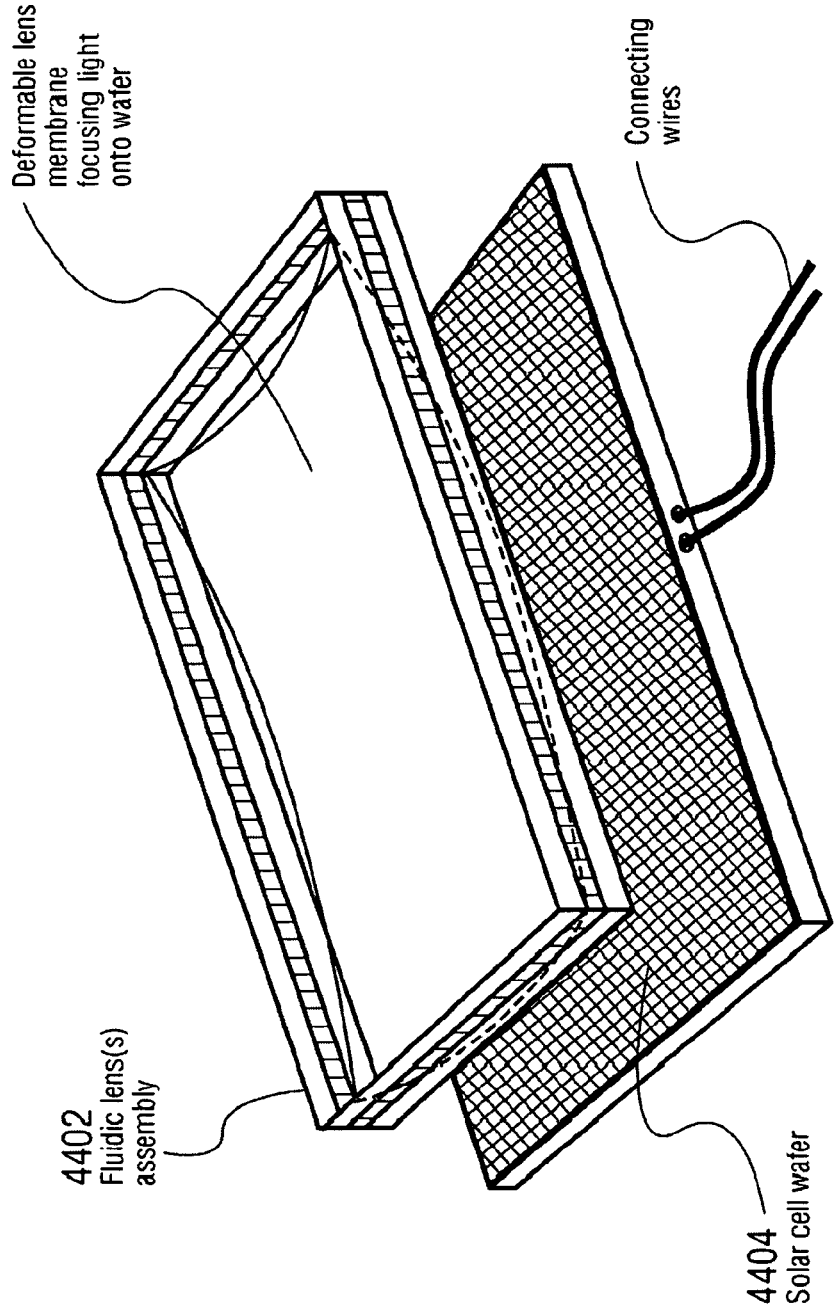
FIG. 44 is a schematic diagram illustrating application of fluidic optical devices to solar power systems according to an embodiment of the present invention.

Additional embodiments utilize fluidic optical devices in conjunction with solar power systems. For example, as depicted in FIG. 44, a fluidic lens assembly 4402 may be used to focus light, e.g., light from the sun, onto a photovoltaic device 4404 such as a solar cell wafer.

Figure 45:
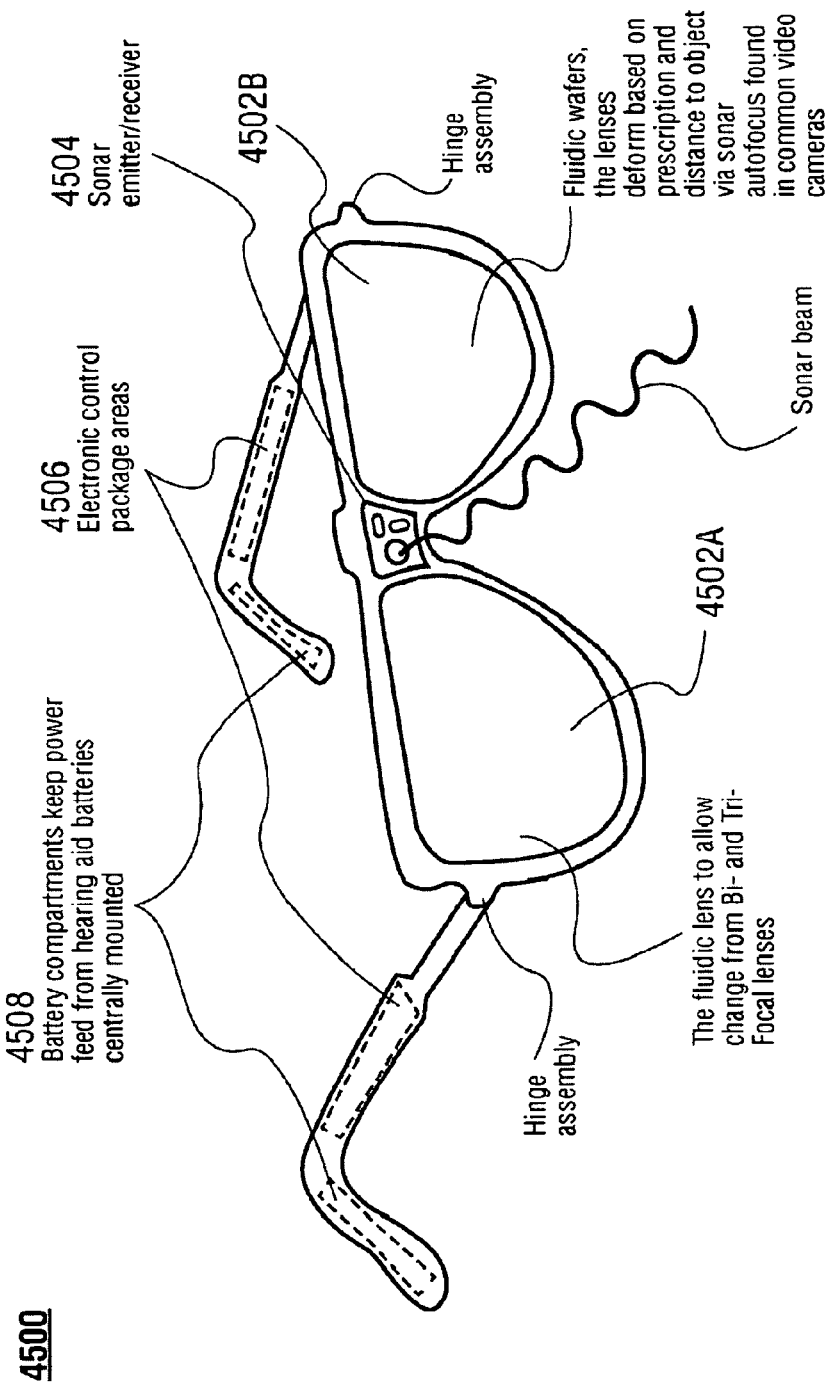
FIG. 45 is a schematic diagram illustrating application of fluidic optical devices to vision aids such as eyeglasses or sunglasses according to an embodiment of the present invention.

Fluidic optical devices according to embodiments of the present invention may also be used in conjunction with vision aids such as eyeglasses and sunglasses. For example, FIG. 45 depicts a pair of eyeglasses 4500 having fluidic lenses 4502A, 4502B. The fluidic lenses can deform based on prescription and distance to objects being viewed. A sonar emitter receiver 4505 can be used in order to determine distances to objects as is commonly done with autofocus features found in video cameras. The fluidic lenses can replace bi-focal and tri-focal lenses currently used in eyeglasses. The fluidic lenses 4502A, 4502B and sonar emitter/receiver 4504 may be controlled by an electronic control package 4506 located, e.g., on the temples of the eyeglasses. A battery 4508, such as a hearing aid battery can provide power for the sonar emitter/receiver and control package.

Figure 46:
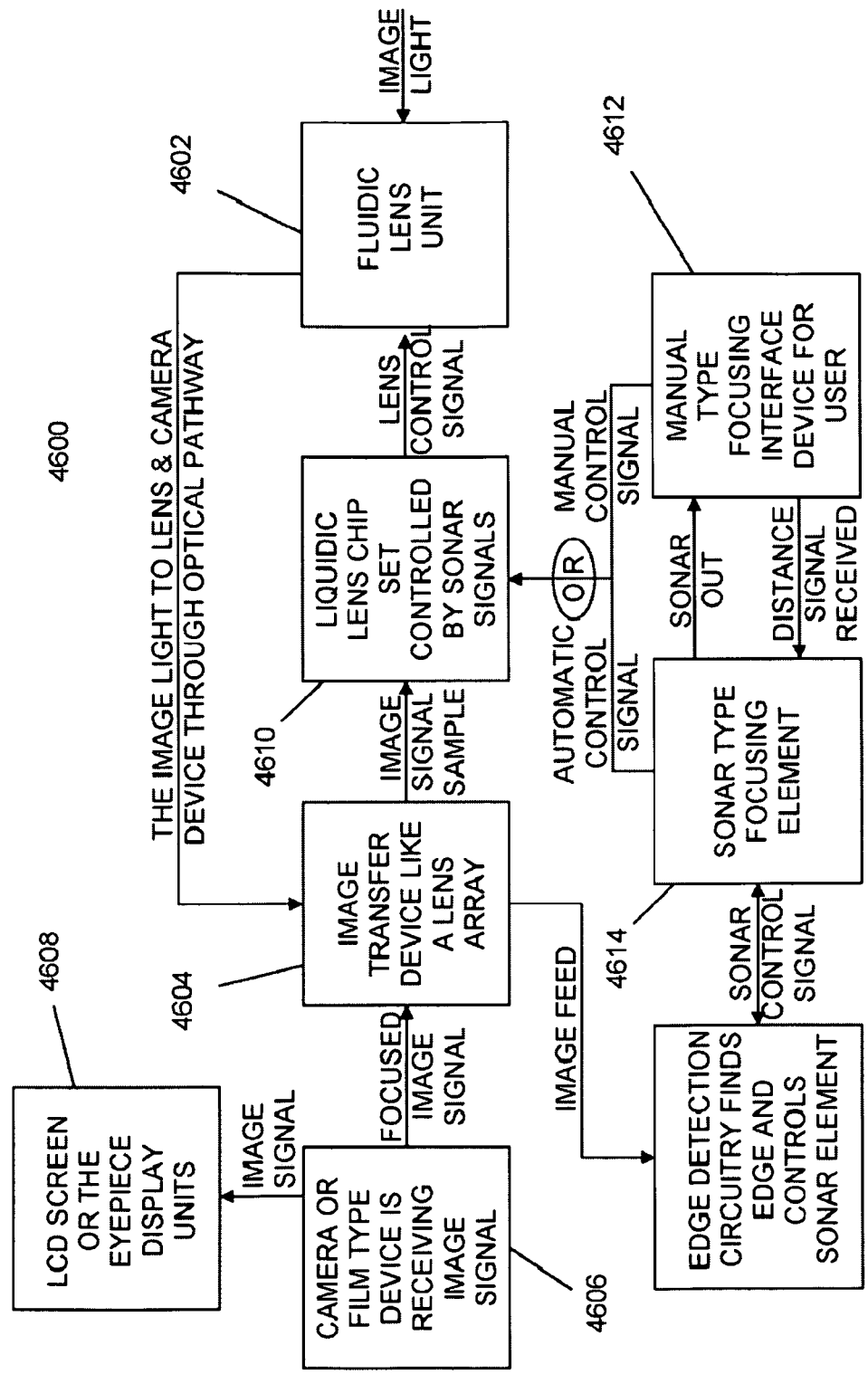
FIG. 46 is a flow diagram showing fluidic lens control logic according to an embodiment of the present invention.

Control of fluidic optical devices may be accomplished as depicted in the flow diagram 4600 of FIG. 46. A fluidic lens unit 4602 receives light for imaging or image acquisition. The fluidic lens unit may be of any of the types described herein and may be used in conjunction with any suitable application, e.g., as described herein. The image light is transmitted from the fluidic lens unit 4602 through an optical pathway (e.g., free-space or fiber optic) to an optional image transfer device 4604, such as a lens array. The image transfer device 4602 focuses an image optical signal onto an image receiving device 4606, such as a camera or film type device. The image receiving device 4606 transmits an image signal (which may be either electronic or optical) to a display unit 4608 such as a screen (e.g., a liquid crystal display (LCD) screen), eyepiece, plasma screen, cathode ray tube (CRT) and the like. A fluidic lens chipset 4610 controls focus and/or other optical properties of the fluidic lens unit 4602. Control may be initiated, e.g. with a manual type focusing interface 4612 (e.g., a focusing knob) controlled by a user or an automatic control signal interface 4614, e.g., generated by a sonar type focusing element. Either or both of the control signal interfaces 4612, 4614 may provide control signals to the chip set 4610. The chipset 4610 may also receive control signals from the image transfer device 4604. The signals may be coupled directly to the chipset or indirectly. For example, an automatic control signal interface 4614 in the form of a sonar focusing element may exchange sonar control signals with edge detection circuitry 4616 that receives an image feed from the image transfer device 4604. The edge detection circuitry finds an edge in the image feed and sends a control signal to the sonar focusing element. The sonar focusing element then adjusts the control signal it sends to the chipset 4610 based on the control signal from the edge detection circuitry 4616.

Figure 47:
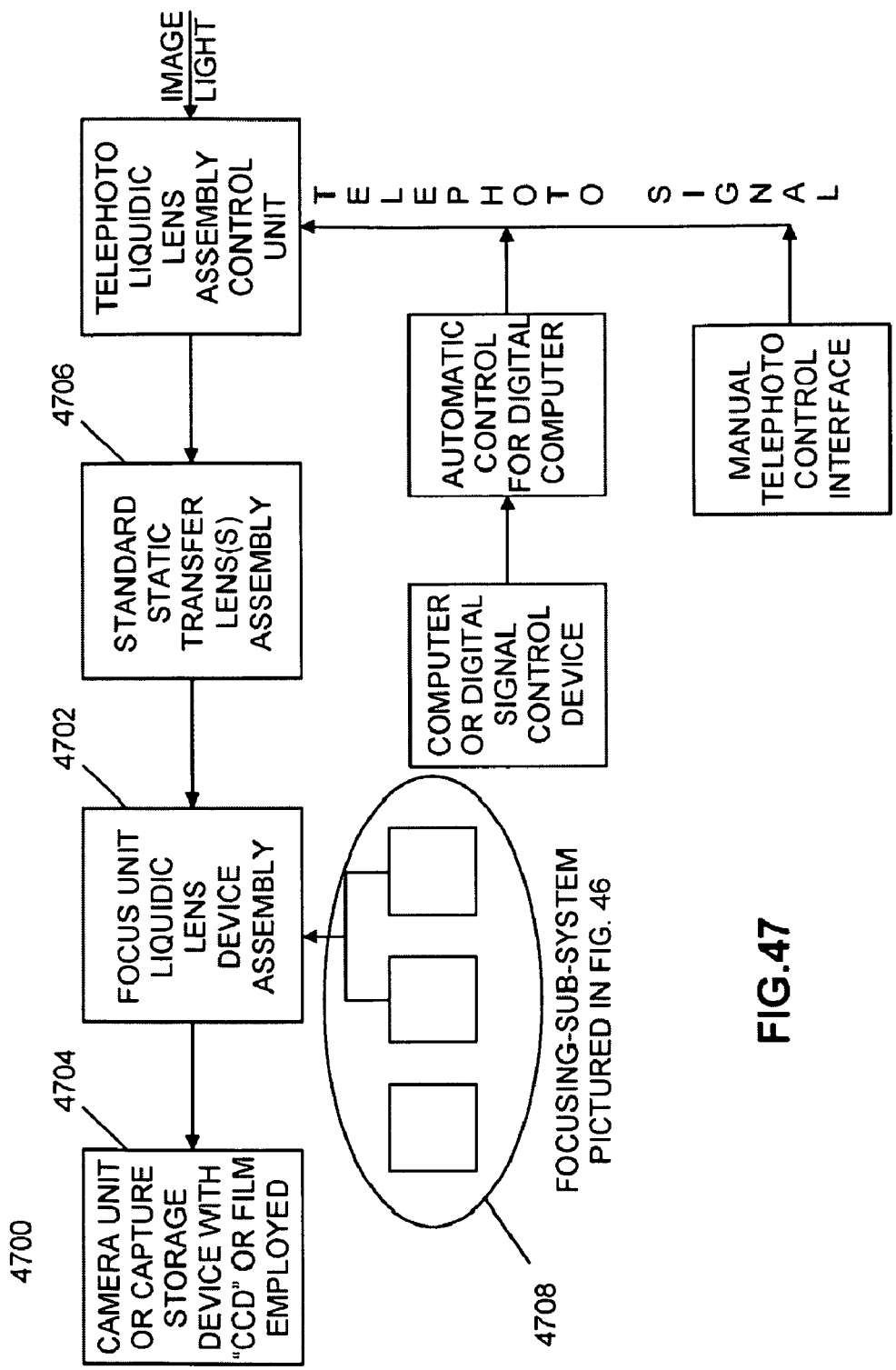
FIG. 47 is a block diagram illustrating a telephoto or zoom system using fluidic lenses according to an embodiment of the present invention.

Focus control as described with respect to FIG. 46 may be implemented as a subsystem of a more complex fluidic optical device control logic. For example, FIG. 47 depicts a flow diagram for control of a telephoto or zoom lens system 4700. A focus unit 4702 having one or more fluidic lens device assemblies as described herein receives image light that is transmitted to a camera unit 4704 or capture/storage deices, e.g., using film or CCD. The image light may also pass through one or more optional standard static lens assemblies 4706. The focus unit 4702 operates under the control of a focusing subsystem 4708 that operates as described with respect to FIG. 46. The system 4700 may operate under the overall control of a control unit 4710 that receives the image light as well as signals from a manual control 4712 and/or automatic control 4714. The automatic control may operate under the direction of signals received from a computer or digital signal control device 4716.

Figure 56:
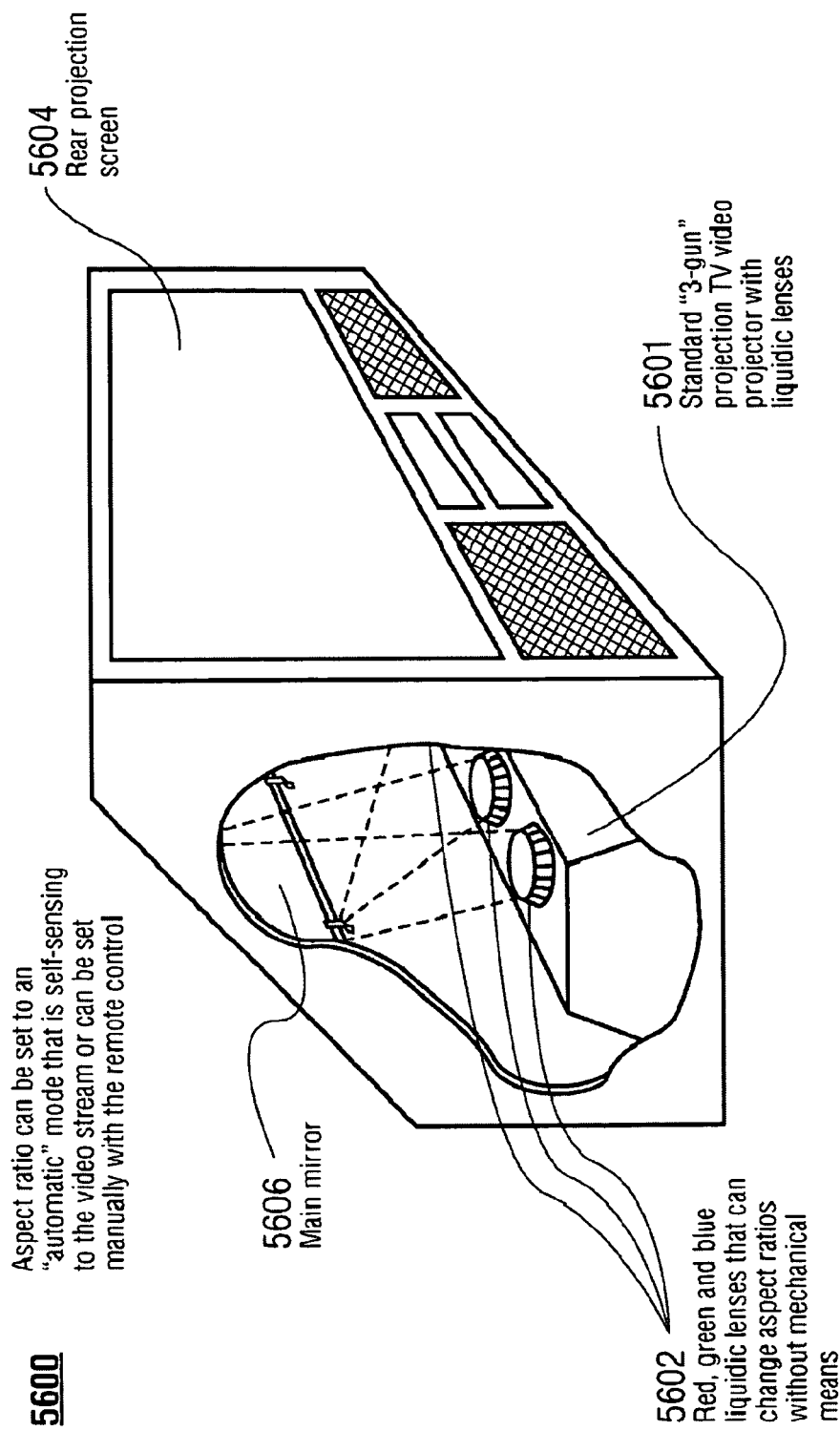
FIG. 56 depicts a projection television employing fluidic optical elements according to an embodiment of the present invention.
Figure 57:
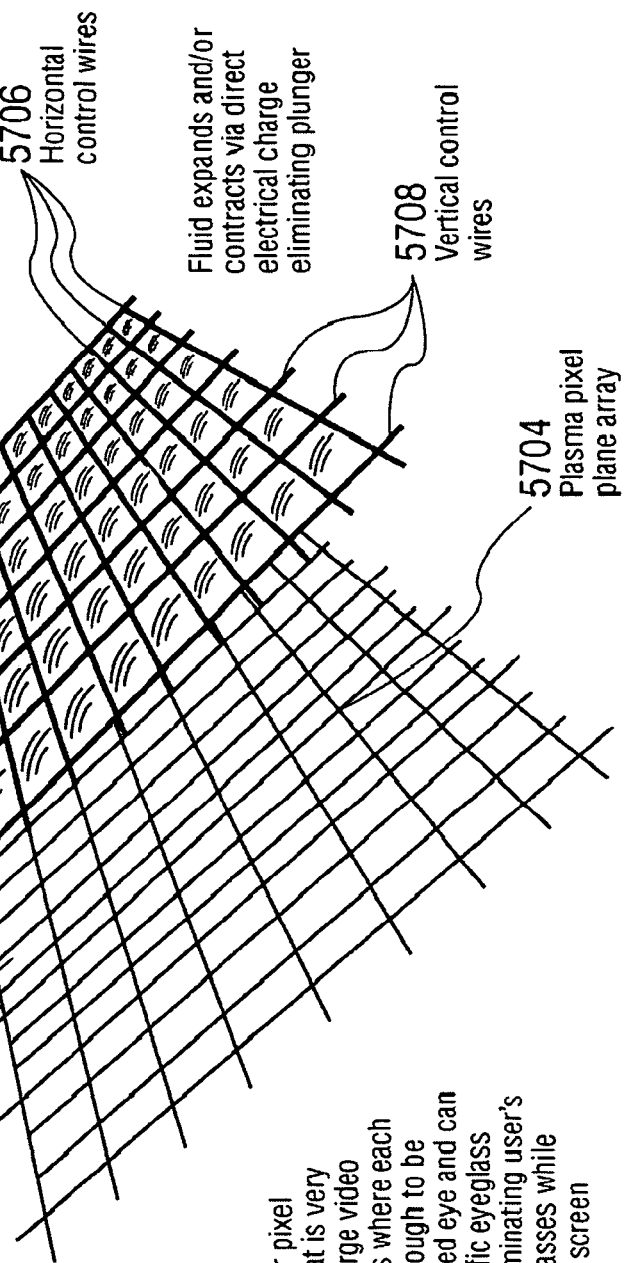
FIG. 57 depicts a plasma display employing fluidic optical elements according to an embodiment of the present invention.

Fluidic optical devices, such as lenses, of the types described herein may also be used in projection televisions (e.g., front and/or rear projection televisions), as illustrated in FIG. 56, and plasma displays, as illustrated in FIG. 57. FIG. 56 illustrates a projection television 5600 having a standard three-gun projection unit 5601 having three fluidic lenses 5602 for focusing red, green and blue light images on a rear projection screen 5604 via a main mirror 5606. The fluidic lenses 5602 can change their aspect ratios without mechanical means. An aspect ratio of the television 5600 may be set to an "automatic" mode that is self-sensing to the vide stream or can be set manually with a remote control.

FIG. 57 depicts a plasma display 5700 having a plane array of fluidic lenses 5702. Each fluidic lens images a different pixel cell 5703 of a plasma pixel plane array 5704. Each fluidic lens 5702 may expand or contract via electrical charge carried by horizontal and vertical control wires 5706, 5708. The electrical control eliminates the need for mechanical plungers in the fluidic lenses 5702. The array of fluidic lenses 5702 allows merger of red, green and blue components of each pixel cell of a film or video image into a single focus point $f_1$ as opposed to seeing individual pixel cells, which can cause deformation of the video or film image. The use of the fluidic lenses 5702 allows full color pixel combination that is very important for large video screens or walls where each pixel is large enough to see by the naked eye. In addition, the pixels 5703 focus point $f_1$ can be set for specific eyeglass prescriptions eliminating a viewers need to wear glasses while viewing the plasma display 5700.

Figure 58:
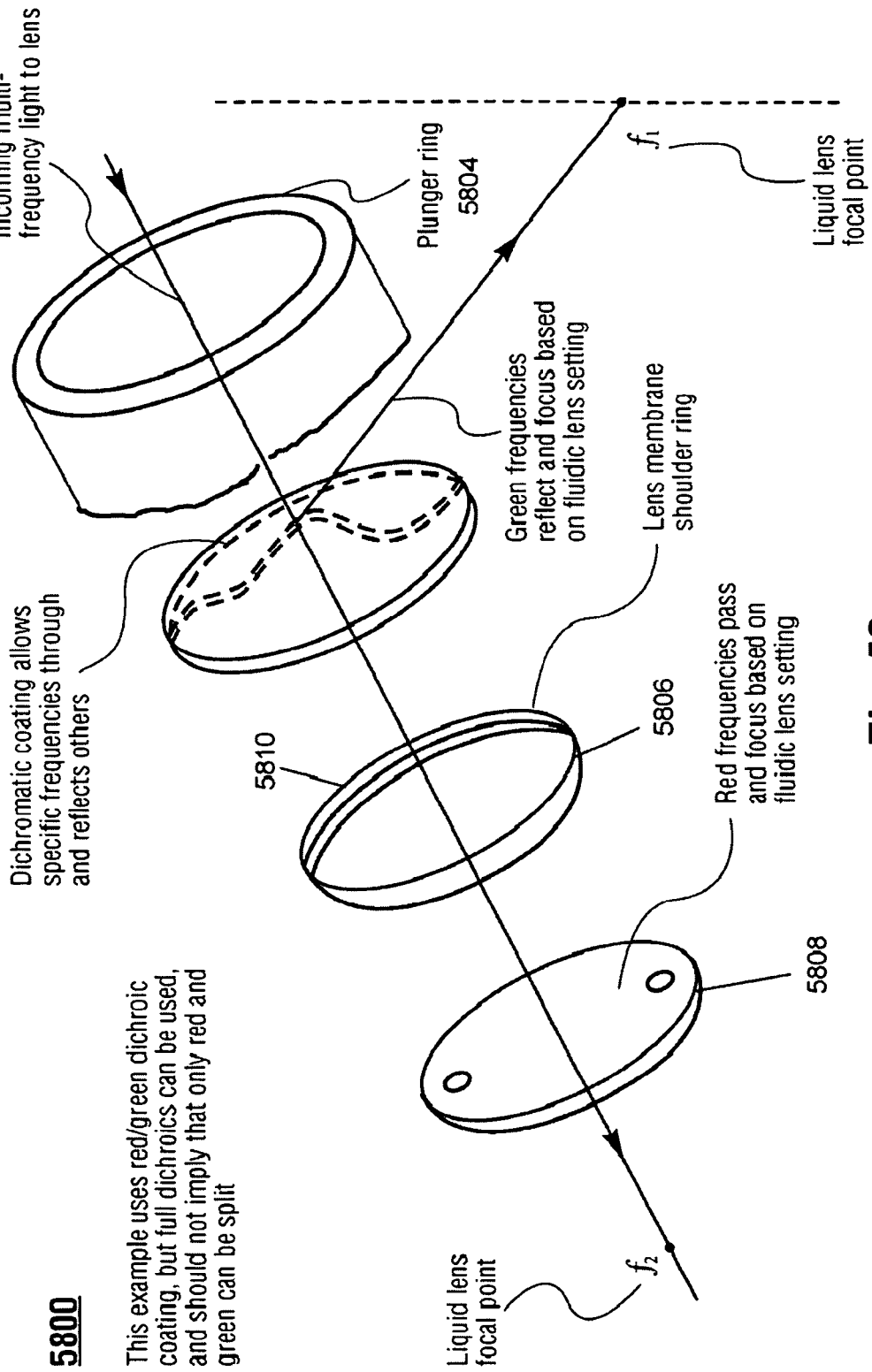
FIG. 58 depicts a dichromatic optical device employing fluidic optical elements according to an embodiment of the present invention.

Other applications of fluidic optical devices include dichromatic elements for wavelength-selective light splitting, e.g., as in the di-chromatic optical system 5800 illustrated in FIG. 58. The system 5800 generally includes a deformable membrane 5802, a plunger ring 5804 a shoulder ring 5806 and static optic base 5808. A fluid is enclosed between the membrane 5802 and static base 5806. These components may be configured in a manner similar to that depicted in FIG. 54. The membrane 5802 includes a dichromatic coating 5810 that allows specific frequencies through and reflects others. By way of example, the system 5800 may use a red/green dichromatic coating 5810. Red frequencies pass through the coating 5810 and focus at a point $f_1$ based on the fluidic setting of the system 5800. Green frequencies are reflected and focused at a point $f_2$ based on the fluidic setting of the system 5800. The coating 5810 may use dichromatic combinations other than red/green and this embodiment is not limited to the splitting of red and green light.

Figure 59:
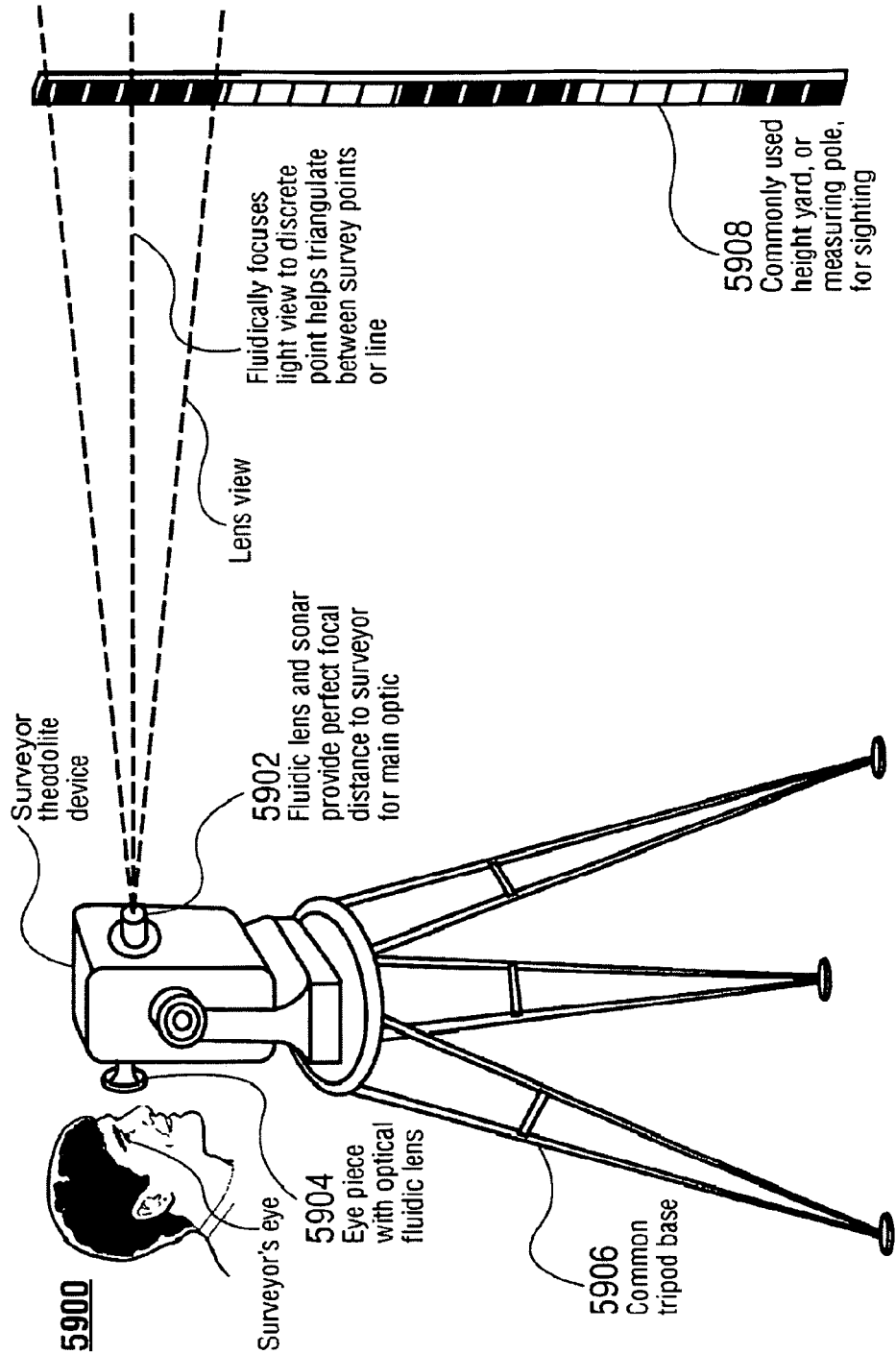
FIG. 59 depicts surveying equipment employing fluidic optical elements according to an embodiment of the present invention.

Furthermore, as depicted in FIG. 59, surveying instruments such as theodolites may use fluidic lenses of the types described herein. FIG. 59 depicts a theodolite 5900 having a fluidic lens 5902. The theodolite 5900 may include an eyepiece 5904 that includes one or more fluidic lenses. The theodolite 5900 may be mounted to a common tripod base 5906 for stability. The fluidic lens 5902 fluidically focuses light to view a discrete point on an object 5908 such as a surveyor's height yard or measuring pole commonly used for sighting in surveying. The fluidic lens 5902 may be augmented with a sonar ranging device to provide the perfect focal distance to a surveyor for the main optic.

Figure 60:
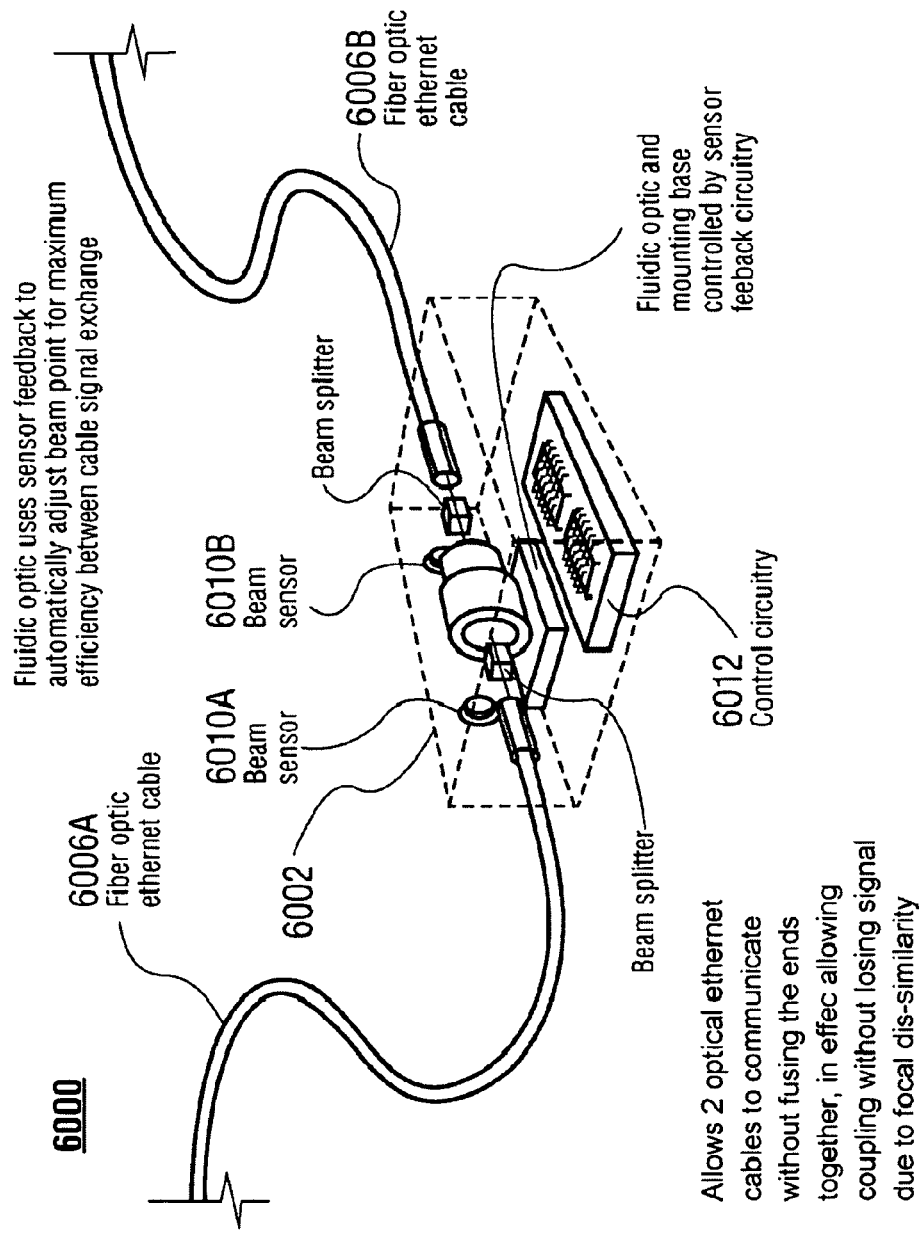
FIG. 60 depicts a portion of an optical network employing fluidic optical elements according to an embodiment of the present invention.

Fluidic lenses as described herein can also be used in combination with optical network cables. For example, FIG. 60 depicts an optical fiber network 6000 that uses a fluidic optical fiber coupler 6002 used in a fiber network. The coupler 6002 includes a fluidic optical device 6004 axially aligned with the ends of first and second fiber optic Ethernet cables 6006A, 6006B. Beam splitters 6008A, 6008B direct part of the signal from each fiber to corresponding sensors 6010A, 6010B. Control circuitry 6012 connected to the sensors and the fluidic lens provides automatic adjustment of the beam point through control of the fluidic optical device 6004 for maximum efficiency signal exchange between cables 6006A, 6006B. Such a system allows two optical cables to communicate without fusing their ends together, in effect allowing dynamic optical coupling while reducing optical loss due to effects such as poor mode matching.

Figure 61:
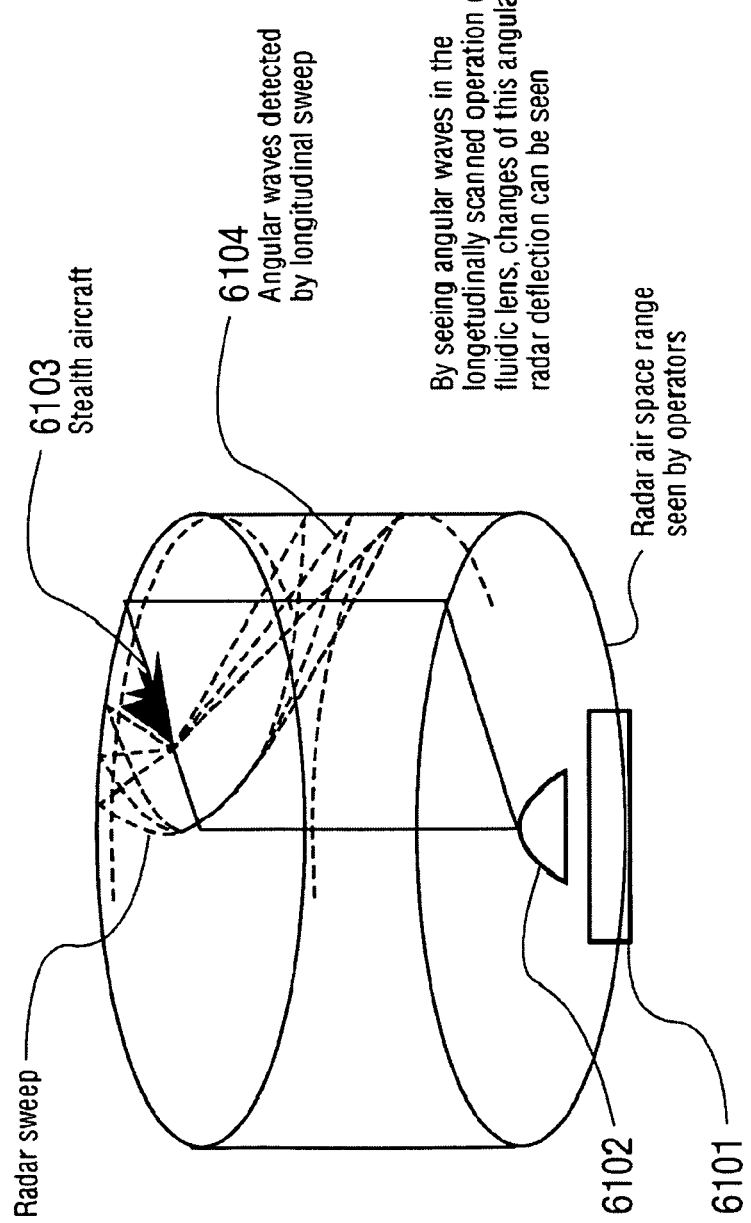
FIG. 61 depicts a radar system employing fluidic optical elements according to an embodiment of the present invention.

Other applications of fluidic optical devices as described herein include radar systems, e.g., as depicted in FIG. 61. By modulating the distance, a radar transceiver 6101 having a fluidic lens system 6102 can "sweep" longitudinally along the length of an aircraft 6103 to receive enough signal to detect aircraft along the longest angular view. By seeing angular waves 6104 in the longitudinally scanned operation of the fluidic lens 6102, changes of the angular radar deflection can be seen.

Figure 62:
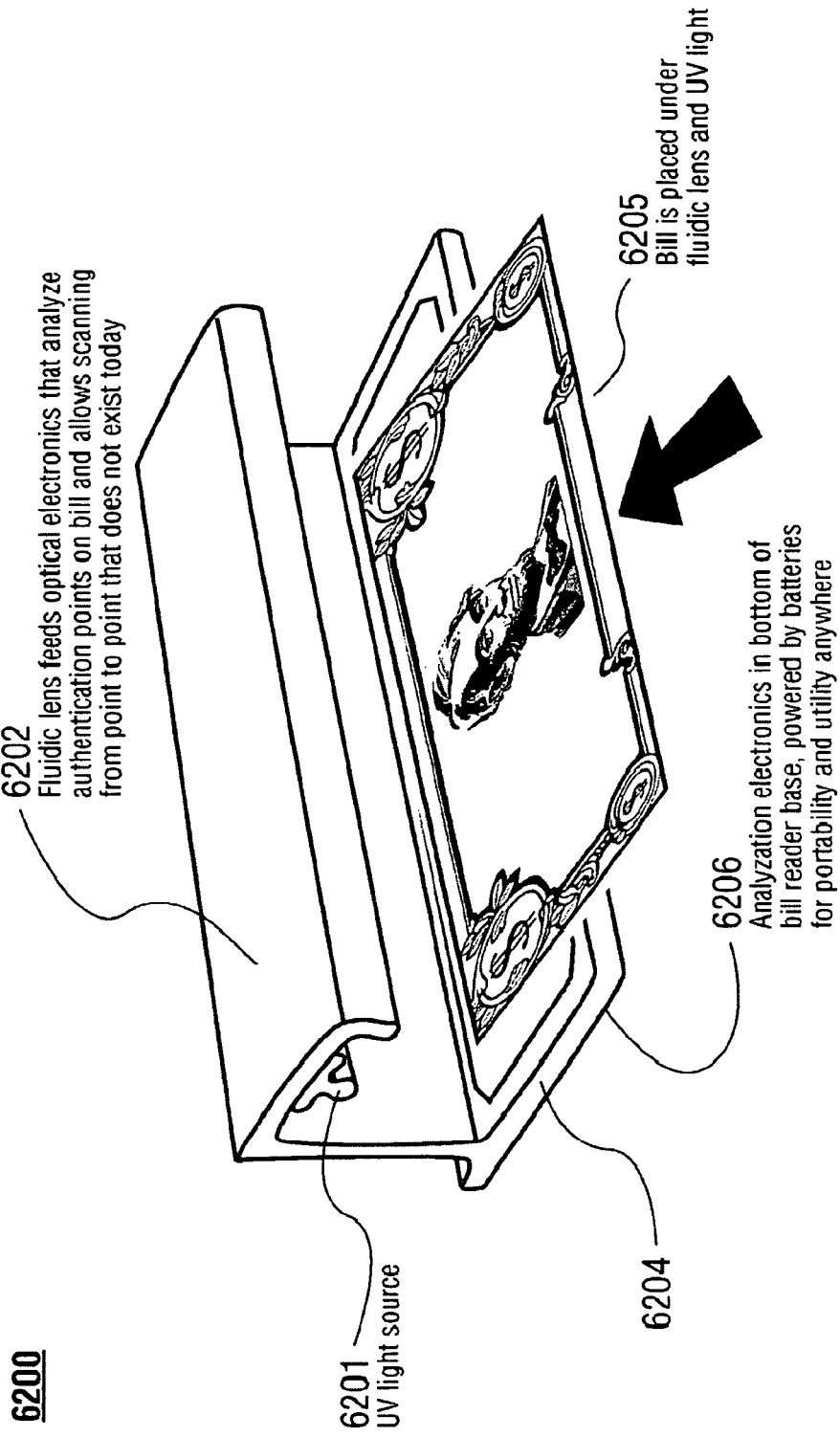
FIG. 62 depicts a currency authentication system employing fluidic optical elements according to an embodiment of the present invention.

Fluidic lenses may be used in currency authentication systems 6200, e.g., as illustrated in FIG. 62. The currency authentication system 6200 generally includes a source UV light source 6201, a fluidic lens 6202 and a bill reader 6204 having optical electronics 6206. The fluidic lens 6202 feeds ultraviolet radiation to the optical electronics and focuses the UV light on a currency bill 6205 placed on the bill reader 6204. The optical electronics 6206 analyze authentication points on the bill 6205. The fluidic lens 6102 allows scanning from point to point on the bill 6205 in a manner that does not currently exist.

Figure 63:
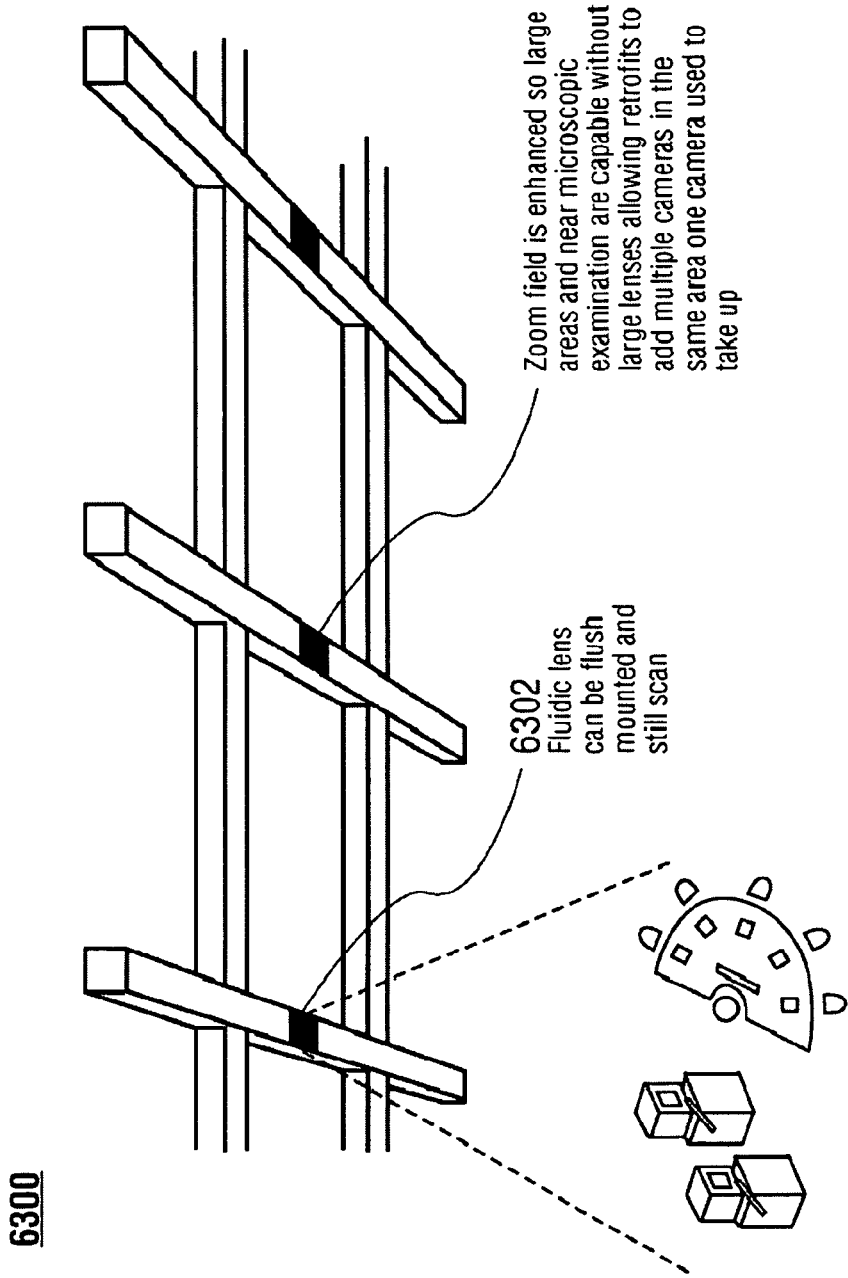
FIG. 63 depicts a video surveillance system employing fluidic optical elements according to an embodiment of the present invention.

In addition, fluidic lenses may be used video surveillance systems 6300, e.g., as illustrated in FIG. 63. The surveillance system 6300 generally includes a plurality of cameras 6302 mounted in a ceiling. Each camera includes a fluidic lens. The fluidic lens can be flush mounted to the ceiling and still scan. The zoom field of the fluidic lenses are enhanced, as described herein, so large areas and near microscopic examination are possible without large lenses. This allows retrofits toad multiple cameras in the same area formerly taken up by a single camera.

Figure 64:
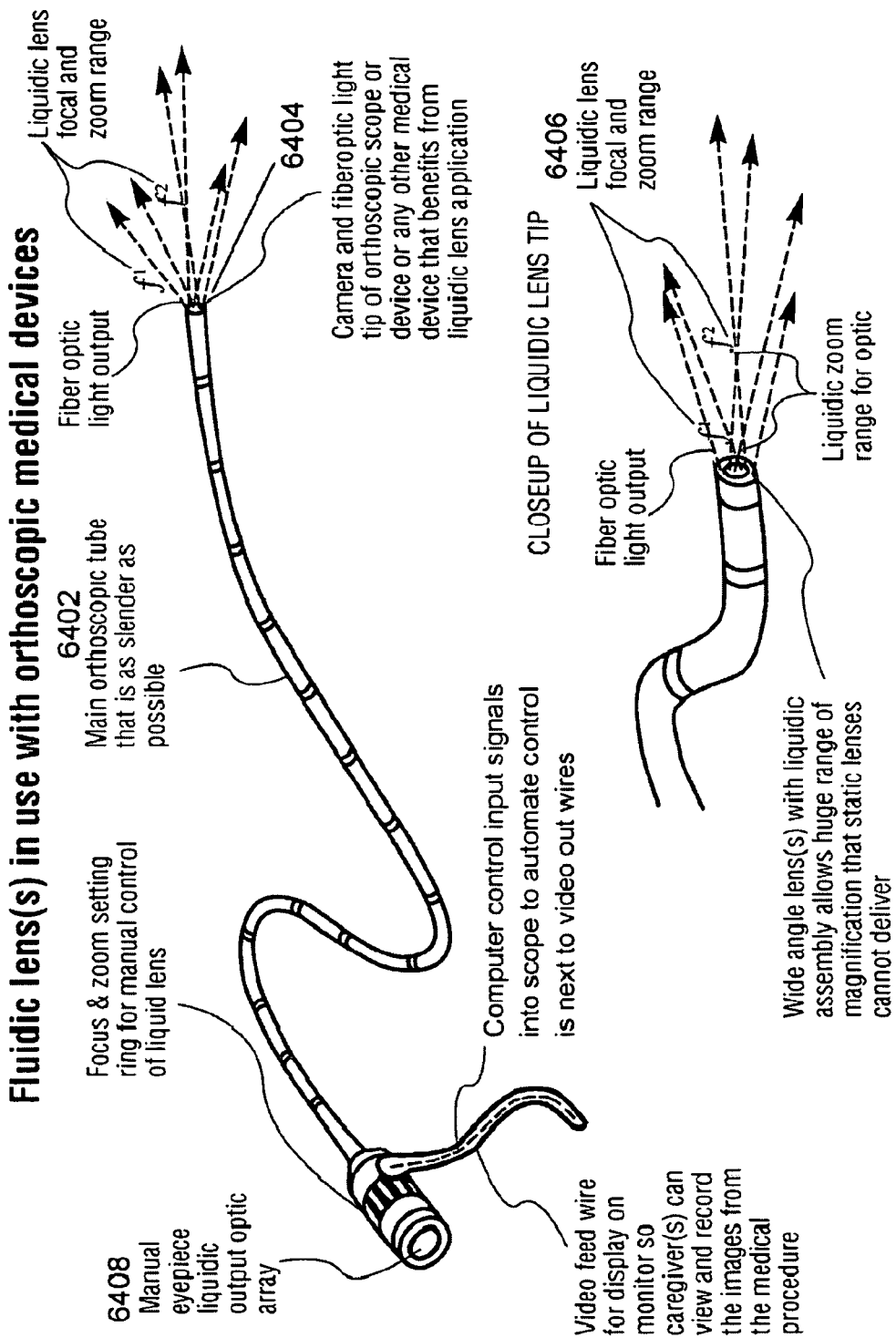
FIG. 64 depicts an example of an orthoscopic medical device employing fluidic optical elements according to an embodiment of the present invention.

Fluidic optical devices as described herein can also be used in an orthoscopic device 6400 as depicted in FIG. 64. The device 6400 generally includes a main orthoscopic tube 6402 that is typically made as slender as possible for incursion into a patient's body, e.g., via the esophagus, trachea, rectum, or a surgical incision. The orthoscopic tube 6402 includes fiber optics that provide light to a tip 6404 that is inserted into the patient's body. A fluidic optical device 6406, e.g., a fluidic objective lens, is optically coupled to the orthoscopic tube. The lens 6406 can be a wide angle lens. An eyepiece 6408 may be optically coupled to one end of the tube 6402. The eyepiece may be optically coupled to a video feed so that images of features within the patient's body can be viewed and recorded. The eyepiece may include fluidic lenses, e.g., having focus and zoom settings that can be manually controlled or controlled by computer instructions fed in by wires, cables or other conduits next to the video feed wires. Fluidic lenses of the types described herein provide for a wide range of magnification and focal power that static lenses cannot deliver.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any feature described herein, whether preferred or not, may be combined with any other feature, whether preferred or not.

What is claimed is:

1. An electrostatically actuated fluidic device, that is capable of providing a variable focal length lens, comprising:
    an elastic capacitor section;
    an elastic lens section in fluid communication with the capacitor section, the elastic lens section being characterized by a focal length;
    a fluid capable of fluid motion disposed at least partially in the capacitor and lens sections;
    wherein a voltage may be applied to the capacitor section causing it to deform;
    wherein the deformation of the capacitor section causes a portion of the fluid to flow into the lens section;

wherein increase in volume of fluid in the lens section causes it to deform resulting in a variation in the focal length of the lens section.

2. The device of claim 1, wherein the device is configured as a variable lens, variable diffractive optic, variable optical phase delay or variable iris.

3. The device of claim 1, wherein the device is configured as an autofocus lens, zoom lens or image stabilization device.

4. The device of claim 1 wherein the fluid is transparent.

5. The device of claim 1 wherein the fluid absorbs infrared light.

6. The device of claim 1 wherein the lens portion includes an annular reservoir defined by inner and outer walls that surround an aperture.

7. The device of claim 6 wherein the fluid fills the aperture and reservoir.

8. The device of claim 7 wherein the inner wall includes one or more channels formed in the inner to provide fluid communication between the aperture and the reservoir.

9. The device of claim 8, further comprising a substrate and a transparent compliant membrane, wherein the substrate includes a first optical surface and the membrane includes a second optical surface, wherein the membrane covers the aperture and the reservoir such that the fluid is enclosed between the membrane and the substrate, wherein the aperture and reservoir and fluid are disposed between the membrane and the substrate.

10. The device of claim 9 wherein at least a portion of the membrane is configured to elastically deform in response to displacement of the fluid, wherein the elastic deformation of the membrane changes a focusing power of the device.

11. The device of claim 9, wherein at least a portion of the membrane is transparent, reflective, opaque or diffractive.

12. The device of claim 9, wherein at least a portion of the substrate is made of a rigid transparent material.

13. The device of claim 9, wherein at least a portion of the substrate is transparent, reflective, opaque or diffractive.

14. The device of claim 9, wherein at least a portion of the substrate is made of an elastic material.

15. The device of claim 8, wherein the elastic capacitor section comprises one or more lower electrodes formed on the substrate proximate the reservoir and one or more corresponding upper electrodes formed on the membrane proximate the reservoir.

16. The device of claim 15, wherein the fluid and membrane are configured such that, with no voltage applied between the lower electrodes, the membrane is in a first state wherein it is substantially planar and the first and second optical surfaces are substantially parallel to each other.

17. The device of claim 15 wherein the membrane, reservoir, aperture, fluid and electrodes are configured such that when a voltage is applied between the lower and upper electrodes, electrostatic forces between the upper and lower electrodes push part of the membrane into the reservoir thereby forcing fluid from reservoir into the optical aperture causing the membrane to deform into a second state in such a way that changes a curvature of one or more of the first and second optical surfaces.

18. The device of claim 17 wherein a voltage can be applied to the device such that the device can be continuously and repeatedly controlled between first and second states.

19. The device of claim 18 wherein the elastic properties of the membrane are such that, when the voltage is removed the membrane provides a restoring force which returns the device to its first state.

\* \* \* \* \*